United States Patent
Huang et al.

(10) Patent No.: US 11,088,708 B2
(45) Date of Patent: Aug. 10, 2021

(54) POLAR CODE ENCODING METHOD AND APPARATUS

(71) Applicant: HUAWEI TECHNOLOGIES CO., LTD., Guangdong (CN)

(72) Inventors: Lingchen Huang, Hangzhou (CN); Rong Li, Hangzhou (CN); Huazi Zhang, Hangzhou (CN); Chen Xu, Hangzhou (CN); Shengchen Dai, Hangzhou (CN); Gongzheng Zhang, Hangzhou (CN); Yunfei Qiao, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 69 days.

(21) Appl. No.: 16/728,594

(22) Filed: Dec. 27, 2019

(65) Prior Publication Data
US 2020/0136650 A1  Apr. 30, 2020

Related U.S. Application Data

(63) Continuation of application No. PCT/CN2018/092943, filed on Jun. 26, 2018.

(30) Foreign Application Priority Data

Jun. 27, 2017  (CN) .......................... 201710502949.5

(51) Int. Cl.
*H03M 13/00* (2006.01)
*H03M 13/11* (2006.01)
*H03M 13/29* (2006.01)

(52) U.S. Cl.
CPC ... *H03M 13/1174* (2013.01); *H03M 13/2906* (2013.01)

(58) Field of Classification Search
CPC ...................... H03M 13/1174; H03M 13/2906
See application file for complete search history.

(56) References Cited

U.S. PATENT DOCUMENTS

| 2019/0020358 A1 | 1/2019 | Li et al. |
| 2019/0268025 A1 | 8/2019 | Shen et al. |

(Continued)

FOREIGN PATENT DOCUMENTS

| CN | 103780329 A | 5/2014 |
| CN | 104219019 A | 12/2014 |

(Continued)

OTHER PUBLICATIONS

Chiu et al, "Reduced-Complexity SCL Decoding of Multi-CRC-Aided Polar Codes," arXiv:1609.08813v1 [cs.IT], Sep. 28, 2016, 9 pages.

(Continued)

*Primary Examiner* — Samir W Rizk
(74) *Attorney, Agent, or Firm* — Fish & Richardson P.C.

(57) ABSTRACT

The present disclosure relates to polar code encoding methods and apparatus. One example method includes separately performing check encoding on the at least two to-be-checked first bit sequences to obtain at least two check bit sequences, where a union set of the at least two to-be-checked first bit sequences includes the K information bits, and K is a positive integer, interleaving the K information bits and the at least two check bit sequences, or interleaving a first part of information bit sequence and a first check bit sequence to obtain an interleaved third bit sequence, where a second check bit sequence, a third check bit sequence, and a second part of information bit sequence in a sequence of all information bits except the first part of information bit sequence form a second bit sequence, and performing polar encoding on the second bit sequence.

19 Claims, 10 Drawing Sheets

(56) References Cited

U.S. PATENT DOCUMENTS

2020/0021393 A1* 1/2020 Noh .................. H04L 1/0075
2020/0228236 A1* 7/2020 Xi ..................... H04L 1/0061

FOREIGN PATENT DOCUMENTS

| CN | 105337696 A | 2/2016 |
|----|-------------|--------|
| CN | 105656604 A | 6/2016 |
| CN | 106230555 A | 12/2016 |
| WO | 2017054164 A1 | 4/2017 |

OTHER PUBLICATIONS

Ericsson, "CRC-based Polar Code Construction," 3GPP TSG RAN WG1 NR Ad-Hoc#2, R1-1710490, Qingdao, P.R. China, Jun. 27-30, 2017, 11 pages.

Extended European Search Report issued in European Application No. 18823331.6 dated May 19, 2020, 11 pages.

Nokia, "Distributed CRC Polar code construction," 3GPP TSG RAN WG1 NR Ad-Hoc #2, R1-1711539, Qingdao, P.R. China, Jun. 27-30, 2017, 4 pages.

Office Action issued in Chinese Application No. 201710502949.5 dated Dec. 18, 2019, 7 pages.

PCT International Search Report and Written Opinion in International Application No. PCT/CN2018/092,943, dated Sep. 18, 2018, 16 pages (With English Translation).

* cited by examiner

POLAR CODE ENCODING METHOD AND APPARATUS

CROSS-REFERENCE TO RELATED APPLICATIONS

This application claims is a continuation of International Application No. PCT/CN2018/092943, filed on Jun. 26, 2018, which claims priority to Chinese Patent Application No. 201710502949.5, filed on Jun. 27, 2017. The disclosures of the aforementioned applications are hereby incorporated by reference in their entireties.

TECHNICAL FIELD

Embodiments of this application relate to the field of communications technologies, and in particular, to a polar code encoding method and apparatus.

BACKGROUND

A cyclic redundancy check (cyclic redundancy check, CRC) code is an error-detecting code most commonly used in the field of data communications. The CRC code features that lengths of an information field and a check field can be randomly selected. In a communications system, the CRC code is used to detect whether data transmission is correct, and control a probability of occurrence of a false alarm (English: false alarm).

In an implementation, CRC code is in a form of a shift register. FIG. 1 shows a common manner for implementing the CRC code in the form of a shift register (briefly referred to as a register). A feedback tap of the register is determined by a CRC polynomial [1 0 1 0 1], and content of the register is initialized to a preset value. During encoding, K information bits are shifted from one side into the register bit by bit, and a bit exclusive-OR operation is performed on the feedback tap and a status that corresponds to the register, so that a status of the register is changed. After all to-be-encoded bits are shifted into the register, bits 0 whose quantity is equal to a quantity of bits of a CRC check length are shifted into the register, a status of the register is read, and the status of the register is used as a CRC check bit and is attached after the K information bits to be used as a CRC encoding codeword. A transmit end performs channel encoding on a CRC code, and a receive end performs corresponding channel decoding. After the channel decoding is completed, CRC check is performed to determine whether the decoding succeeds.

However, for a sequential decoding (that is, serial decoding) scheme, if the foregoing conventional CRC encoding scheme is used, the CRC check can be performed only after the channel decoding is completed. Consequently, a decoding process is complex, a relatively long time is occupied, and a decoding resource is wasted.

SUMMARY

Embodiments of this application provide a polar code encoding method and apparatus, to resolve a problem that decoding resources are wasted due to a complex decoding process of an existing CRC encoding scheme.

Specific technical solutions provided in the embodiments of this application are as follows:

According to a first aspect, a polar code encoding method is provided. Ki information bits are selected from K information bits to obtain n subsets of the K information bits, where i=1 to n, n is a positive integer, and a union set of the n subsets includes all of the K information bits. Check encoding is separately performed on the n subsets to obtain n check bit sequences, where one check bit sequence may be obtained by performing check encoding on one subset. The K information bits and the obtained check bit sequences are combined, and a combined sequence is input into an interleaver for interleaving, where check bits can be alternately arranged in the K information bits through interleaving, and a check bit obtained after interleaving is not necessarily located after a checked information bit. For example, a check bit in a check bit sequence obtained for an $i^{th}$ subset is not necessarily located after an information bit in the $i^{th}$ subset. By using the foregoing operations, when a receive end performs sequential decoding, through segment check, check is performed each time a check bit is decoded. If the check fails, decoding may be terminated in advance. Based on a controllable false alarm probability, a function of early termination of decoding is implemented, to avoid a decoding resource waste caused by check later after channel decoding is terminated, thereby shortening decoding duration and increasing decoding efficiency.

In a possible design, Ki may meet the following relationship: $Ki=Int[K \times Ri]+Ci$, where Int[ ] represents a rounding operation and can represent rounding off, rounding up, or rounding down, Ri is a proportional constant, such as 1/16, 1/8, 1/4, or 1/2, and Ci is a constant, for example, $Ci=-2, -1, 0, 1, 2, 30, 40$, or 50; or Ci is an integer related to i, for example, $Ci=i, 2i$, or $4i$.

In a possible design, check encoding is separately performed on at least two to-be-checked first bit sequences to obtain at least two check bit sequences. A union set of the at least two to-be-checked first bit sequences includes the K information bits, and K is a positive integer. The K information bits and the at least two check bit sequences are interleaved to obtain a second bit sequence. Alternatively, a first part of information bit sequence and the first check bit sequence are interleaved to obtain an interleaved third bit sequence, and the second check bit sequence, the third check bit sequence, and a second part of information bit sequence in the sequence of all information bits except the first part of information bit sequence are sorted to obtain the second bit sequence. Polar code encoding is performed on the second bit sequence.

In a possible design, the at least two to-be-checked first bit sequences in the K information bits are obtained, which are the first part of information bit sequence with a length of $K_1$ and the sequence of all information bits with a length of K. $K_1<K$, and $K_1$ and K are both positive integers. That is, the sequence of all information bits includes the K information bits.

In a possible design, check encoding is performed on the first part of information bit sequence to obtain the first check bit sequence; and check encoding is performed on the sequence of all information bits to obtain the second check bit sequence.

In a possible design, an interleaved sequence S used to perform the interleaving operation includes J subsequences, and an $i^{th}$ subsequence includes a location index value of an element 1 in an immediate result vector Ti and a value of (K+i), where $1 \leq i \leq J$, i is an integer, $T_i=(\sim M) \& (Vi)$, $M=M | (V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AND operation, and | represents a bit-by-bit OR operation.

In a possible design, before the interleaving operation is performed, the interleaved sequence S is calculated.

In a possible design, interleaving a part of information bits in the K information bits and a part of bit sequences in the at least two check bit sequences is implemented in the following manner: reading the stored interleaved sequence S based on a length of the part of information bits in the K information bits and a determined check polynomial, and performing the interleaving operation based on the read interleaved sequence S.

According to a second aspect, a polar code encoding method is provided. Check encoding is performed on an empty set bit sequence with a length of 0 to obtain a first check bit sequence, and check encoding is performed on K information bits to obtain a second check bit sequence; the K information bits, the first check bit sequence, and the second check bit sequence are interleaved; and polar encoding is performed on an interleaved sequence. When a receive end performs sequential decoding, through segment check, check is performed each time a check bit is decoded. If the check fails, decoding may be terminated in advance. Based on a controllable false alarm probability, a function of early termination of decoding is implemented, to avoid a decoding resource waste caused by check performed after channel decoding is terminated, thereby shortening decoding duration and increasing decoding efficiency.

In a possible design, the first check bit sequence is an all-zero vector.

In a possible design, an interleaved sequence S used to perform the interleaving operation implements J subsequences in the following manner, and an $i^d$ subsequence implements a location index value of an element 1 in an immediate result vector Ti and a value of (K+i) in the following manner, where $1 \leq i \leq J$, i is an integer, $T_i=(\sim M)$ & $(V_i)$, $M=M|(V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AND operation, and | represents a bit-by-bit OR operation.

In a possible design, before the interleaving operation is performed, the interleaved sequence S is calculated.

In a possible design, interleaving the K information bits, the first check bit sequence, and the second check bit sequence is implemented in the following manner: reading the stored interleaved sequence S based on a value of K and a determined check polynomial, and performing the interleaving operation based on the read interleaved sequence S.

According to a third aspect, a polar code encoding method is provided. Check encoding is performed on a first part of information bit sequence in K information bits and a codeword obtained after check encoding is interleaved, to obtain a first check encoding codeword, where K is a positive integer, and the first check encoding codeword implements the first part of information bit sequence and a first check bit sequence in the following manner; check encoding is performed on a sequence obtained by combining the first check encoding sequence, and a second part of information bit sequence in the K information bits except the first part of information bit sequence, to obtain a second check encoding codeword, where the second check encoding codeword implements the first part of information bit sequence, the first check bit sequence, the second part of information bit sequence, and a second check bit sequence in the following manner; and polar encoding is performed on the second check encoding codeword. When a receive end performs sequential decoding, through segment check, check is performed each time a check bit is decoded. If the check fails, decoding may be terminated in advance. Based on a controllable false alarm probability, a function of early termination of decoding is implemented, to avoid a decoding resource waste caused by check performed after channel decoding is terminated, thereby shortening decoding duration and increasing decoding efficiency.

In a possible design, an interleaved sequence S used to perform the interleaving operation implements J subsequences in the following manner, and an $i^d$ subsequence implements a location index value of an element 1 in an immediate result vector $T_i$ and a value of (K+i) in the following manner, where $1 \leq i \leq J$, i is an integer, $T_i=(\sim M)$ & $(V_i)$, $M=M|(V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AND operation, and | represents a bit-by-bit OR operation.

In a possible design, before the interleaving operation is performed, the interleaved sequence S is calculated.

In a possible design, performing check encoding on the first part of information bit sequence in the K information bits and interleaving the codewords obtained after check encoding are implemented in the following manners: performing check encoding on the first part of information bit sequence in the K information bits, reading the stored interleaved sequence S based on a length of the first part of information bit sequence and a determined check polynomial, and performing the interleaving operation based on the read interleaved sequence S.

According to a fourth aspect, a polar code encoding method is provided. Check encoding is performed on K information bits based on a set check bit length to obtain a first check bit sequence; a second check bit sequence is selected from the first check bit sequence based on a set encoding parameter; and polar encoding is performed on a sequence obtained by combining the second check bit sequence and the K information bits. In this case, a quantity of CRC bits required for performing check encoding may be flexibly obtained. Only one check encoding setting is required to obtain a CRC bit with a maximum length of Jmax, and then a proper quantity of CRC bits are selected.

In a possible design, the set encoding parameter includes at least one of the following parameters or a derivative parameter of at least one of the following parameters: a length of the K information bits, a mother code length, an encoding length, a bit rate, and a path width.

In a possible design, a second check bit sequence with relatively high reliability may be selected, or a second check bit sequence with relatively low reliability is selected; or a specified second check bit sequence is selected.

In a possible design, check bits in the second check bit sequence are continuously placed before or after locations of the K information bits or at specified locations. Alternatively, check bits in the second check bit sequence are continuously placed at specified locations in the K information bits based on a set cyclic shift value. Alternatively, the second check bit sequence and the K information bits are interleaved.

According to a fifth aspect, a polar code encoding apparatus is provided. The apparatus has functions of implementing the method in any one of the first aspect and the possible designs of the first aspect. The functions may be implemented by hardware, or may be implemented by hardware executing corresponding software. The hardware or the software includes one or more modules corresponding to the foregoing functions.

In a possible design, when some or all of the functions are implemented by hardware, the encoding apparatus includes: an input interface circuit, configured to obtain information bits with a length of K; a logic circuit, configured to perform a behavior of a transmit end in any one of the first aspect and the possible designs of the first aspect; and an output interface circuit, configured to output a bit sequence obtained after polar encoding.

Optionally, the encoding apparatus may be a chip or an integrated circuit.

In a possible design, when some or all of the functions are implemented by software, the encoding apparatus includes: a memory, configured to store a program; and a processor, configured to execute the program stored in the memory. When the program is executed, the encoding apparatus may implement the method in any one of the first aspect and the possible designs of the first aspect.

Optionally, the memory may be a physically independent unit, or may be integrated with the processor.

In a possible design, when some or all of the functions are implemented by software, the encoding apparatus includes a processor. The memory configured to store the program is located outside the encoding apparatus. The processor is connected to the memory by using a circuit/wire, and is configured to read and execute the program stored in the memory.

According to a sixth aspect, an encoding apparatus is provided. The apparatus has functions of implementing the method in any one of the second aspect and the possible designs of the second aspect. The functions may be implemented by hardware, or may be implemented by hardware executing corresponding software. The hardware or the software includes one or more modules corresponding to the foregoing functions.

In a possible design, when some or all of the functions are implemented by hardware, the encoding apparatus includes: an input interface circuit, configured to obtain information bits with a length of K; a logic circuit, configured to perform a behavior of a transmit end in any one of the second aspect and the possible designs of the second aspect; and an output interface circuit, configured to output a bit sequence obtained after polar encoding.

Optionally, the encoding apparatus may be a chip or an integrated circuit.

In a possible design, when some or all of the functions are implemented by software, the encoding apparatus includes: a memory, configured to store a program; and a processor, configured to execute the program stored in the memory. When the program is executed, the encoding apparatus may implement the method in any one of the second aspect and the possible designs of the second aspect.

Optionally, the memory may be a physically independent unit, or may be integrated with the processor.

In a possible design, when some or all of the functions are implemented by software, the encoding apparatus includes a processor. The memory configured to store the program is located outside the encoding apparatus. The processor is connected to the memory by using a circuit/wire, and is configured to read and execute the program stored in the memory.

According to a seventh aspect, an encoding apparatus is provided. The apparatus has functions of implementing the method in any one of the third aspect and the possible designs of the third aspect. The functions may be implemented by hardware, or may be implemented by hardware executing corresponding software. The hardware or the software includes one or more modules corresponding to the foregoing functions.

In a possible design, when some or all of the functions are implemented by hardware, the encoding apparatus includes: an input interface circuit, configured to obtain information bits with a length of K; a logic circuit, configured to perform a behavior of a transmit end in any one of the third aspect and the possible designs of the third aspect; and an output interface circuit, configured to output a bit sequence obtained after polar encoding.

Optionally, the encoding apparatus may be a chip or an integrated circuit.

In a possible design, when some or all of the functions are implemented by software, the encoding apparatus includes: a memory, configured to store a program; and a processor, configured to execute the program stored in the memory. When the program is executed, the encoding apparatus may implement the method in any one of the third aspect and the possible designs of the third aspect.

Optionally, the memory may be a physically independent unit, or may be integrated with the processor.

In a possible design, when some or all of the functions are implemented by software, the encoding apparatus includes a processor. The memory configured to store the program is located outside the encoding apparatus. The processor is connected to the memory by using a circuit/wire, and is configured to read and execute the program stored in the memory.

According to an eighth aspect, an encoding apparatus is provided. The apparatus has functions of implementing the method in any one of the fourth aspect and the possible designs of the fourth aspect. The functions may be implemented by hardware, or may be implemented by hardware executing corresponding software. The hardware or the software includes one or more modules corresponding to the foregoing functions.

In a possible design, when some or all of the functions are implemented by hardware, the encoding apparatus includes: an input interface circuit, configured to obtain information bits with a length of K; a logic circuit, configured to perform a behavior of a transmit end in any one of the fourth aspect and the possible designs of the fourth aspect; and an output interface circuit, configured to output a bit sequence obtained after polar encoding.

Optionally, the encoding apparatus may be a chip or an integrated circuit.

In a possible design, when some or all of the functions are implemented by software, the encoding apparatus includes: a memory, configured to store a program; and a processor, configured to execute the program stored in the memory. When the program is executed, the encoding apparatus may implement the method in any one of the fourth aspect and the possible designs of the fourth aspect.

Optionally, the memory may be a physically independent unit, or may be integrated with the processor.

In a possible design, when some or all of the functions are implemented by software, the encoding apparatus includes a processor. The memory configured to store the program is located outside the encoding apparatus. The processor is connected to the memory by using a circuit/wire, and is configured to read and execute the program stored in the memory.

According to a ninth aspect, a communications system is provided. The system includes a transmit end and a receive end, and the transmit end may perform the method in any one of the first aspect to the fourth aspect.

According to a tenth aspect, a computer storage medium is provided. The computer storage medium stores a computer program, and the computer program includes an instruction used to perform the method in any one of the first aspect to the fourth aspect and the possible implementations of the first aspect to the fourth aspect.

According to an eleventh aspect, a computer program product including an instruction is provided. When the computer program product is run on a computer, the computer is enabled to perform the methods in the foregoing aspects.

DESCRIPTION OF EMBODIMENTS

Figure 1:
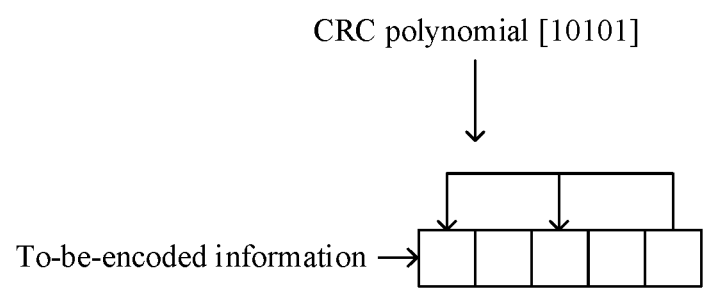
FIG. 1 is a schematic diagram of a CRC encoding scheme in the prior art.

The following describes in detail the embodiments of this application with reference to the accompanying drawings.

The embodiments of this application provide a polar code encoding method and apparatus. A transmit end selects Ki information bits from K information bits to obtain n subsets of the K information bits, where i=1 to n, and n is a positive integer. A union set of the n subsets includes all of the K information bits. The transmit end separately performs check encoding on the n subsets to obtain n check bit sequences, where one check bit sequence may be obtained by performing check encoding on one subset. The transmit end combines the K information bits and the obtained check bit sequences, and inputs a combined sequence into an interleaver for interleaving. Check bits can be alternately arranged in the K information bits through interleaving. A check bit obtained after interleaving is not necessarily located after a checked information bit. For example, a check bit in a check bit sequence obtained for an $i^{th}$ subset is not necessarily located after an information bit in the $i^{th}$ subset. By using the foregoing operations, when the receive end performs sequential decoding, through segment check, check is performed each time a check bit and an information bit checked by the check bit are decoded. If the check fails, decoding may be terminated in advance. Based on a controllable false alarm probability, a function of early termination of the decoding is implemented, to avoid a decoding resource waste caused by check performed after channel decoding is terminated, thereby shortening decoding duration and increasing decoding efficiency.

To facilitate understanding of the embodiments of this application, a polar code is briefly described below.

An encoding scheme of the polar code is to transmit information useful to a user through a noiseless channel, and transmit agreed information or no information through a pure noisy channel. The polar code is also a linear block code, an encoding matrix of the polar code is $G_N$, an encoding process is $x_1^N = u_1^N G_N$, where $u_1^N = (u_1, u_2, \ldots, u_N)$ represents a binary row vector with a length of N (namely, a code length), $G_N$ represents an N×N matrix, and $G_N = F_2^{\oplus(log_2(n))}/F_2^{\oplus(log_2(N))}$ is defined as a kronecker (Kronecker) product of $log_2 N$ matrices $F_2$. The matrix $$F_2 = \begin{bmatrix} 1 & 0 \\ 1 & 1 \end{bmatrix}.$$

In the encoding process of the polar code, some bits in $u_1^N$ are used to carry information and are referred to as information bit sets, and an index set of these bits is denoted as A. Other bits are set to fixed values agreed on by a transmit end and a receive end in advance, and are referred to as a fixed-bit set or a frozen-bit set (frozen bits), and an index set of the bits is represented by using a complementary set $A^c$ of A The encoding process of the polar code is equivalent to: $x_1^N = u_A G_N(A) \oplus u_{A^c} G_N(A^c)$. Herein, $G_N(A)$ represents a submatrix obtained by using rows corresponding to the indexes in the set A in $G_N$, and $G_N(AC)$ represents a submatrix obtained by using rows corresponding to the indexes in the set $A^c$ in $G_N$. $u_A$ is an information bit set in $u_1^N$, and a quantity of information bits is K. $u_{A^c}$ is a fixed bit set in $u_1^N$, a quantity of fixed bits is (N−K), and the fixed bits are known bits. The fixed bits are usually set to 0. However, the fixed bits may be randomly set provided that the transmit end and the receive end reach an agreement in advance. Therefore, encoding output of the polar code may be simplified as $x_1^N = u_A G_N(A)$. Herein, $u_A$ represents an information bit set in $u_1^N$, $u_A$ is a row vector with a length of K, namely, |A|=K, |•| represents a quantity of elements in the set, K represents a size of an information block, $G_N(A)$ represents the submatrix, in the matrix $G_N$, that is obtained by using the rows corresponding to the indexes in the set A, and $G_N(A)$ represents a K×N matrix.

A construction process of the polar code is a selection process of the set A, and determines performance of the polar code. The construction process of the polar code is usually as follows: determining, based on a code length N of a mother code, that N polarized channels exist in total and are respectively corresponding to N rows of the encoding matrix; calculating reliability of the polarized channels; and using indexes of the first K polarized channels with relatively high reliability as elements of the set A, and using indexes corresponding to remaining (N−K) polarized channels as elements of the index set $A^c$ of the fixed bits. The set A determines a location of an information bit, and the set $A^c$ determines a location of a fixed bit.

Figure 2:
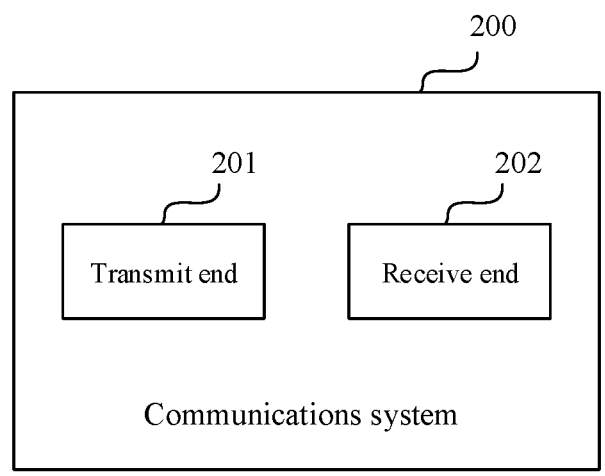
FIG. 2 is a schematic diagram of a communications system architecture according to an embodiment of this application.

As shown in FIG. 2, a communications system 200 applied to an embodiment of this application includes a transmit end 201 and a receive end 202. The transmit end 201 may alternatively be referred to as an encoder side, and the receive end 202 may alternatively be referred to as a decoder side. The transmit end 201 may be a base station, and the receive end 202 is a terminal; or the transmit end 201 is a terminal, and the receive end 202 is a base station. The base station is an apparatus that is deployed in a radio access network and that is configured to provide a wireless communication function for the terminal. The base station may include various forms of macro base stations, micro base stations, relay nodes, access points, and the like. The base station may be applied to systems with different wireless access technologies, such as a long term evolution (long term evolution, LTE) system, or more possible communications systems such as a $5^{th}$ generation ($5^{th}$ generation, 5G) communications system. The base station may further be another network device that has a function of a base station, and particularly, the base station may further be a terminal that serves as a base station in D2D communication. The terminal may include various handheld devices, vehicle-mounted devices, wearable devices, or computing devices that have a wireless communication function, or another processing device connected to a wireless modem, and user equipment (user equipment, UE), a mobile station (mobile station, MS), or the like in various forms.

Based on the communications system architecture shown in FIG. 2, in this embodiment of this application, the transmit end 201 performs check encoding and polar encoding on K information bits. The transmit end 201 performs segment check encoding on the K information bits, and interleaves obtained check encoding codewords. The check encoding codewords include the K information bits and a check bit sequence that is obtained by the segment check encoding. The transmit end 201 sends an encoded polar code to the receive end 202, and the receive end 202 performs decoding and deinterleaving.

Specifically, the transmit end 201 may perform check encoding by using any encoding method for checking a polar code in the prior art, for example, in an existing CRC encoding scheme or a hash hash check encoding scheme.

Figure 3:
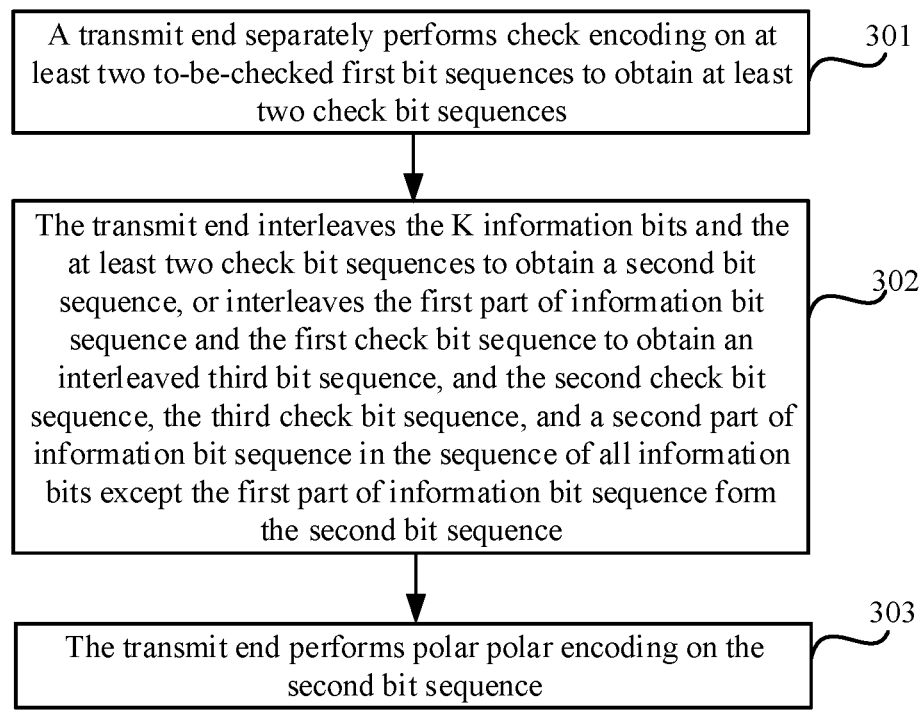
FIG. 3 is a schematic flowchart of an encoding method according to an embodiment of this application.

Based on the communications system architecture shown in FIG. 2, the following describes in detail the encoding method provided in an embodiment of this application with reference to FIG. 3. In this embodiment of this application, an example in which the encoding method is executed by a transmit end is used for description.

As shown in FIG. 3, a specific process of the polar code encoding method provided in this embodiment of this application is described as follows:

Step 301: Separately perform check encoding on at least two to-be-checked first bit sequences to obtain at least two check bit sequences.

A union set of the at least two to-be-checked first bit sequences is a sequence of all information bits. The sequence of all information bits is a sequence including all K information bits.

One corresponding check bit sequence can be obtained by performing check encoding on one first bit sequence.

Step 302: Interleave a sequence of all information bits and the at least two check bit sequences to obtain a second bit sequence, or interleave a first part of information bit sequence and a first check bit sequence to obtain an interleaved third bit sequence. A second check bit sequence, a third check bit sequence, and a second part of information bit sequence in the sequence of all information bits except the first part of information bit sequence form the second bit sequence.

Step 303. Perform polar encoding on the second bit sequence.

An information bit set for the polar encoding is selected based on a length of the second bit sequence. In addition, channels corresponding to the information bit set are set to bit values of the second bit sequence. Then a codeword sequence is obtained through calculation based on a polar code encoding matrix.

A to-be-decoded sequence is obtained on a receive end or a decoder side, and polar code decoding is performed on the to-be-decoded sequence. In addition, the decoded sequence is deinterleaved.

Alternatively, a sequential decoding manner may be used. In a decoding process, the receive end may perform segment decoding, and check, based on a part of check bits obtained by decoding, a part of information bits obtained by decoding. If an existing decoding result fails to pass the check, decoding is terminated immediately, and the decoding failure is fed back. If an existing decoding result passes the check, decoding continues.

Figure 4:
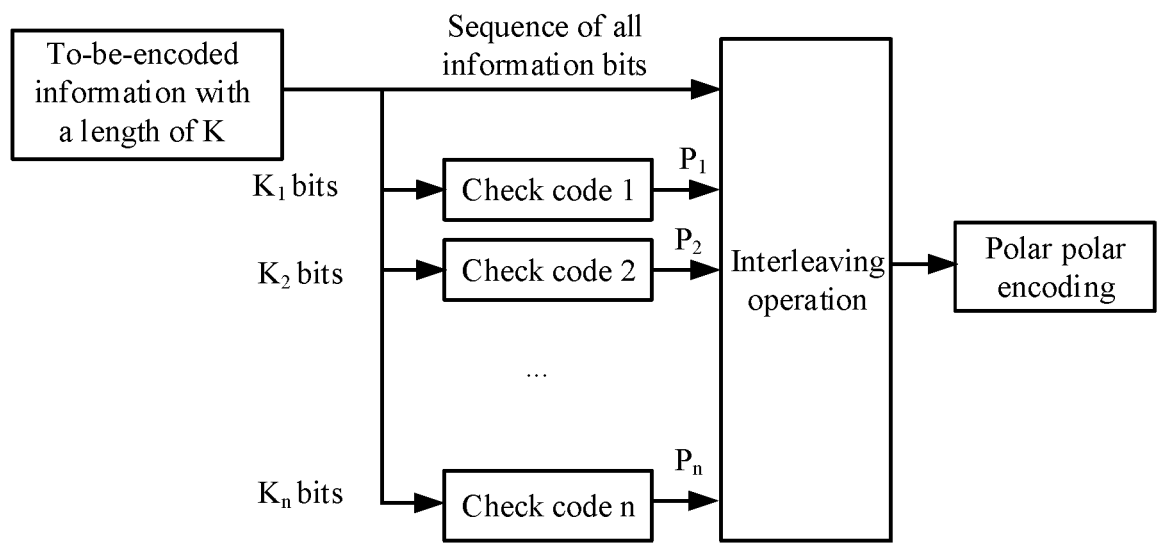
FIG. 4 is a schematic diagram 1 of a polar code encoding method according to an embodiment of this application.

For example, FIG. 4 is a schematic diagram of the polar code encoding method according to this embodiment of this application.

Specifically, n subsets are selected from the K information bits, where n is a positive integer, a length of an information bit included in an $i^{th}$ subset is Ki, and i=1, 2, ... , or n, and n bit sequences are obtained and are denoted as first bit sequences. Ki may meet the following relationship: Ki=Int [K×Ri]+Ci, where Int[ ] represents a rounding operation and can represent rounding off, rounding up, or rounding down, Ri is a proportional constant, such as 1/16, 1/8, 1/4, or 1/2, and Ci is a constant, for example, Ci=−2, −1, 0, 1, 2, 30, 40, or 50; or Ci is an integer related to i, for example, Ci=i, 2i, or 4i. Before the polar code encoding is performed, the transmit end performs check encoding on the n first bit sequences respectively by using n check codes, and correspondingly obtains n check bit sequences. For example, check encoding is performed on a first bit sequence with a length of K1 by using a check code 1, and check encoding is performed on a first bit sequence with a length of K2 by using a check code 2. Obtained n check bit sequences are represented respectively by using P1, P2, ... , and Pn. Lengths of the n check bit sequences are respectively J1, J2, ... , and Jn. A check bit sequence length Ji is a positive integer, and i=1 to n. The check code may be a CRC code, a hash code, or the like. Through bit collection, the sequence of all information bits and the n check bit sequences are sorted. An optional arrangement manner is as follows: The sequence of all information bits and the n check bit sequences are sorted in an order of the K information bits, P1, P2, . . . , and Pn. The sorted bit sequences are interleaved to obtain the second bit sequence. By using the interleaving operation, some check bits may be located among information bits. In this embodiment of this application, each check bit is not limited to be located after an information bit checked by the check bit, and a location of the check bit may be randomly arranged. Finally, an interleaved second bit sequence is sent to a polar encoder for encoding.

The interleaving operation in this embodiment of this application may be defined by an interleaved sequence. A method for calculating the interleaved sequence is: based on a combined matrix of check matrices corresponding to some or all check codes, switching rows of the combined matrix column by column in a specific order, where the order may be a natural order or a column-based resorted order, for a column, an objective of row switching is that after switching, all elements 1 in the column are located at a top of the combined matrix, and a quantity of operated columns is less than a total quantity of columns; and finally, obtaining the interleaved sequence based on a result of the row switching. An interleaved sequence S includes J subsequences, and an ith subsequence includes a location index value of an element 1 in an immediate result vector Ti and a value of (K+i), where 1≤i≤J, i is an integer, Ti=(~M) & ($V_i$), M=M| ($V_i$), M represents a mask vector, $V_i$ represents a column vector of a check part matrix P, P represents a submatrix of a systematic generator matrix G of check encoding, ~ represents a bit-by-bit NOT operation, & represents a bit-by-bit AND operation, and | represents a bit-by-bit OR operation. In this embodiment of this application, the interleaved sequence S may be calculated in another manner, or the interleaved sequence S may be obtained by looking up a table. It should be noted that the location corresponding to the check bit in the interleaved sequence is not limited, and does not need to be located after the information bit checked by the check bit.

In a possible implementation, a first part of information bit sequence with a length of $K_1$ is selected from the K information bits. Optionally, the first $K_1$ information bits are selected. The two to-be-checked first bit sequences in step 301 are obtained based on the first part of information bit sequence with a length of $K_1$ and the sequence of all information bits with a length of K, where $K_1$<K, and $K_1$ and K are both positive integers.

In step 302, the transmit end performs check encoding on the first part of information bit sequence to obtain the first check bit sequence; and the transmit end performs check encoding on the sequence of all information bits to obtain the second check bit sequence.

In step 303, there may be two interleaving modes: complete interleaving and partial interleaving. The complete interleaving mode is as follows: The transmit end interleaves the sequence of all information bits, the first check bit sequence, and the second check bit sequence to obtain the second bit sequence.

A partial interleaving mode is: The transmit end interleaves the first part of information bit sequence and the first check bit sequence to obtain the interleaved third bit sequence, and the transmit end sorts the second check bit sequence, the third check bit sequence, and the second part of information bit sequence in the sequence of all information bits except the first part of information bit sequence to obtain the second bit sequence.

Figure 5:
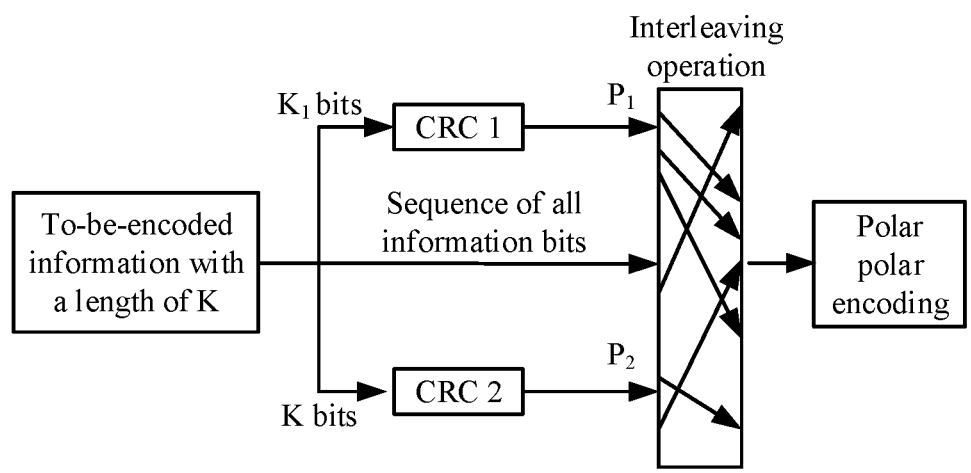
FIG. 5 is a schematic diagram 2 of a polar code encoding method according to an embodiment of this application.

For example, FIG. 5 is a schematic diagram of encoding in the complete interleaving mode. For another example, FIG. 6 is a schematic diagram of encoding in the partial interleaving mode.

Figure 6:
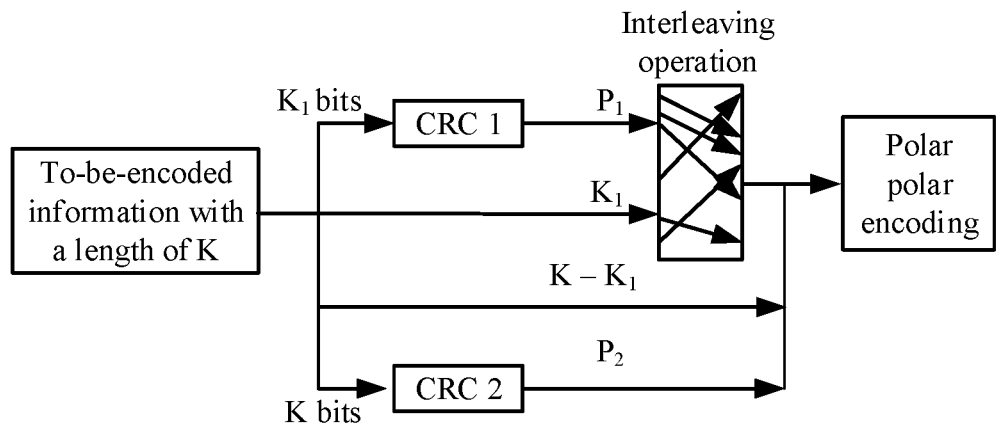
FIG. 6 is a schematic diagram 3 of a polar code encoding method according to an embodiment of this application.

In FIG. 5 and FIG. 6, it is assumed that an example in which check encoding is CRC encoding is used. Specific steps are as follows:

I. Check

The transmit end performs check encoding on the first part of information bit sequence with a length of K1 and the sequence of all information bits with a length of K respectively by using two CRC codes (CRC 1 and CRC 2). Obtained check bit sequences are respectively P1 and P2. Lengths of P1 and P2 are respectively J1 and J2. K1=Int [K×R]+C, where Int[ ] represents a rounding operation, K represents a quantity of all information bits, and an optional combination of R and C includes {R, C}={0.5, 0}, {0, 40}, and the like. J1 and J2 may meet a specific relationship. For example, J1+J2=C and J1=3, 4, 5, 6, 7, 8, or the like. C is a constant, and is determined based on a system false alarm probability requirement. For example, C=19, 20, or the like. Generator polynomials of the CRC 1 and the CRC 2 are shown in Table 1.

II. Interleaving

In the complete interleaving shown in FIG. 5, the sequence of all information bits with a length of K, the check bit sequence P1 obtained by using the CRC 1, and the check bit sequence P2 obtained by using the CRC 2 are all input into an interleaver for interleaving.

In the partial interleaving shown in FIG. 6, the $K_1$ information bits checked by using the CRC 1 and the check bit sequence P1 obtained by using the CRC 1 are sorted to obtain a codeword sequence CW 1. For example, one arrangement manner is that the first $K_1$ bits of CW 1 are $K_1$ information bits, and the last J1 bits are check bits P1. The sequence CW 1 is interleaved. The interleaving operation is defined by the interleaved sequence shown in Table 2. A length of the interleaved sequence is ($K_1$+J1), and CW 1' is obtained after interleaving. Remaining (K–$K_1$) information bits, the check bits P2, and CW 1' are sorted. An arrangement corresponding to an arrangement manner is: CW 1', the (K–K1) information bits, and the J2 check bits P2, to obtain a codeword CW 2.

III. Polar Encoding

Polar encoding is performed on an interleaved codeword shown in FIG. 5.

Alternatively, polar encoding is performed on the codeword CW 2 obtained in FIG. 6.

TABLE 1

| CRC length | CRC polynomial (hexadecimal) |
|---|---|
| 1 | 0x3 |
| 2 | 0x5, 0x7, |
| 3 | 0x9, 0xd, |
| 4 | 0x19, 0x1d, 0x17, 0x1f, |

TABLE 1-continued

| CRC length | CRC polynomial (hexadecimal) |
|---|---|
| 5 | 0x29, 0x2f, 0x35, |
| 6 | 0x73, 0x61, 0x71, 0x4d, 0x7b, 0x5d, |
| 7 | 0xd3, 0xf7, 0xa7, 0xc1, 0x91, 0xed, 0xa3, 0xa9, 0xd9, 0x8b, 0xf3, |
| 8 | 0x1e7, 0x165, 0x171, 0x18d, 0x1fd, 0x1c1, 0x1e9, 0x119, 0x1b3, 0x1d9, 0x157, 0x1b1, 0x139, 0x1d7, 0x101 |
| 11 | 0xedd, 0xd93, 0xea3, 0xe71, 0xf5d, 0xa01, 0xfdf, 0xe0d, 0xfbd, 0xd79, 0xd01, 0xeeb, 0xa65, 0xdfb, 0xa1d, 0xc75 |
| 12 | 0x1e19, 0x1cc5, 0x1941, 0x1fbb, 0x1fbd, 0x17c1, 0x1aed, 0x1cf1, 0x191f, 0x1e81, 0x1e03, 0x1ffd, 0x182d, 0x189d, 0x1a03, 0x1c99, 0x1f65, 0x1603, 0x175d, 0x11f1, 0x1f25 |
| 13 | 0x3fab, 0x3c5d, 0x3525, 0x3601, 0x3691, 0x3ffd, 0x3dc3, 0x3d95, 0x2ce9, 0x3aeb, 0x3df7, 0x3681, 0x3ac7, 0x2a81, 0x3711, 0x2bcf, 0x34a9, 0x3d2f, 0x3213, 0x3da1 |
| 14 | 0x7cf9, 0x6545, 0x7dfb, 0x6a01, 0x7757, 0x7a4b, 0x65b9, 0x7c95, 0x5131, 0x5e31, 0x7573, 0x7001, 0x7ffb, 0x5009, 0x753b, 0x77fd, 0x45e1, 0x5dc5, 0x5cd5, 0x7ddf, 0x6d21, 0x63b1, 0x6fdd |
| 15 | 0xe279, 0xfffd, 0xc579, 0xf56d, 0xcfe9, 0x9e59, 0xb595, 0xc001, 0xf12d, 0xb061, 0xf3f5, 0xfef7, 0xd2f3, 0xe863, 0x9401, 0xbd9d, 0xb749, 0xd359, 0xd5ed, 0xd8ab, 0xae75, 0x99a3, 0x9d09, 0xa817 |
| 16 | 0x1a9b1, 0x1fdbf, 0x16801, 0x1d5e3, 0x179e9, 0x1e469, 0x1cc27, 0x1dba3, 0x1f635, 0x1b41d, 0x19f11, 0x14f61, 0x151e9, 0x1ae8b, 0x1dbf1, 0x1f4b7, 0x1bd23, 0x1bead, 0x1fff7, 0x18005, 0x1c001, 0x10811, 0x1e2e9, 0x1d20b, 0x1b101, 0x15ac9, 0x17085, 0x1d169, 0x1b55d, 0x197cb, 0x1a80b, 0x1e771, 0x1d5d3, 0x1f29f, 0x15935, 0x18ded, 0x1aae5, 0x193b5, 0x12341, 0x14d79, 0x13613, 0x1f497 |
| 17 | 0x3cbed, 0x3d173, 0x38355, 0x3b43b, 0x3d5f3, 0x32861, 0x37b89, 0x24001, 0x374d1, 0x3b001, 0x3cadd, 0x2e49d, 0x3685b, 0x35fb1, 0x3b15d |
| 18 | 0x67a71, 0x72001, 0x5f471, 0x7e42d, 0x75761, 0x5adf5, 0x649dd, 0x6f159, 0x67785, 0x46001, 0x72be9, 0x5e19d, 0x4f779, 0x658d3, 0x72aa7, 0x55be9 |
| 19 | 0xf56fb, 0xfc809, 0xaec81, 0xe645b, 0x9c7d1, 0xfe757, 0xa2b79, 0xe4001, 0x99ae9, 0xf86f7, 0x94001, 0xcf5c5, 0xd7791, 0xad0b5, 0xc9685, 0xf1cf7, 0xBBBCF, 0x90CBF |

In Table 1, a CRC polynomial is reversed. For example, a CRC polynomial Ox 19 whose CRC length is 4 is corresponding to $x^\infty+x+1$.

TABLE 2

| Typical K1, typical CRC polynomial | Typical K1, typical CRC polynomial |
|---|---|
| 30, 0x9 | [3, 6, 9, 12, 15, 18, 21, 24, 27, 30, 31, 2, 5, 8, 11, 14, 17, 20, 23, 26, 29, 32, 1, 4, 7, 10, 13, 16, 19, 22, 25, 28, 33]; |
| 30, 0xD | [2, 3, 4, 7, 9, 10, 11, 14, 16, 17, 18, 21, 23, 24, 25, 28, 30, 31, 1, 6, 8, 13, 15, 20, 22, 27, 29, 32, 5, 12, 19, 26, 33]; or [2, 3, 4, 7, 9, 10, 11, 14, 16, 17, 18, 21, 23, 24, 25, 28, 30, 31, 1, 5, 8, 12, 15, 19, 22, 26, 29, 33, 6, 13, 20, 27, 32]; |
| 30, 0x19 | [3, 4, 6, 8, 9, 10, 11, 15, 18, 19, 21, 23, 24, 25, 26, 30, 31, 2, 5, 7, 14, 17, 20, 22, 29, 32, 1, 13, 16, 28, 33, 12, 27, 34]; |
| 30, 0x1D | [2, 3, 7, 9, 10, 14, 16, 17, 21, 23, 24, 28, 30, 31, 1, 6, 8, 13, 15, 20, 22, 27, 29, 32, 5, 12, 19, 26, 33, 4, 11, 18, 25, 34]; or [2, 3, 7, 9, 10, 14, 16, 17, 21, 23, 24, 28, 30, 31, 1, 4, 8, 11, 15, 18, 22, 25, 29, 34, 6, 13, 20, 27, 32, 5, 12, 19, 26, 33]; |

TABLE 2-continued

| Typical K1, typical CRC polynomial | Typical K1, typical CRC polynomial |
|---|---|
| 30, 0x17 | [1, 3, 7, 8, 10, 14, 15, 17, 21, 22, 24, 28, 29, 31, 2, 6, 9, 13, 16, 20, 23, 27, 30, 32, 5, 12, 19, 26, 33, 4, 11, 18, 25, 34]; or [1, 3, 7, 8, 10, 14, 15, 17, 21, 22, 24, 28, 29, 31, 2, 5, 9, 12, 16, 19, 23, 26, 30, 33, 4, 11, 18, 25, 34, 6, 13, 20, 27, 32]; |
| 30, 0x1F | [1, 5, 6, 10, 11, 15, 16, 20, 21, 25, 26, 30, 31, 4, 9, 14, 19, 24, 29, 32, 3, 8, 13, 18, 23, 28, 33, 2, 7, 12, 17, 22, 27, 34]; |
| 30, 0x29 | [3, 5, 6, 9, 10, 11, 12, 13, 17, 18, 20, 21, 22, 24, 26, 31, 2, 4, 8, 16, 19, 23, 25, 30, 32, 1, 7, 15, 29, 33, 14, 28, 34, 27, 35]; |
| 30, 0x2F | [1, 4, 7, 8, 9, 10, 11, 13, 14, 15, 19, 21, 23, 24, 26, 31, 3, 6, 12, 18, 20, 22, 25, 30, 32, 2, 5, 17, 29, 33, 16, 28, 34, 27, 35]; |
| 30, 0x35 | [2, 5, 6, 8, 9, 10, 15, 17, 20, 21, 23, 24, 25, 30, 31, 1, 4, 7, 14, 16, 19, 22, 29, 32, 3, 13, 18, 28, 33, 12, 27, 34, 11, 26, 35]; or [2, 5, 6, 8, 9, 10, 15, 17, 20, 21, 23, 24, 25, 30, 31, 1, 4, 7, 14, 16, 19, 22, 29, 32, 3, 11, 18, 26, 35, 13, 28, 33, 12, 27, 34]; |
| 30, 0x73 | [1, 2, 3, 6, 9, 11, 13, 16, 17, 19, 24, 28, 30, 31, 5, 8, 10, 12, 15, 18, 23, 27, 29, 32, 4, 7, 14, 22, 26, 33, 21, 25, 34, 20, 35, 36]; or [1, 2, 3, 6, 9, 11, 13, 16, 17, 19, 24, 28, 30, 31, 4, 7, 10, 12, 14, 18, 20, 25, 29, 36, 5, 8, 15, 23, 27, 32, 21, 26, 35, 22, 33, 34]; |
| 30, 0x61 | [5, 6, 10, 12, 15, 16, 17, 18, 20, 24, 25, 26, 29, 31, 4, 9, 11, 14, 19, 23, 28, 32, 3, 8, 13, 22, 27, 30, 33, 2, 7, 21, 34, 1, 35, 36]; or [5, 6, 10, 12, 15, 16, 17, 18, 20, 24, 25, 26, 29, 31, 4, 9, 11, 14, 19, 23, 28, 32, 3, 8, 13, 22, 27, 30, 33, 2, 7, 21, 34, 1, 36, 35]; |
| 30, 0x71 | [4, 5, 6, 8, 10, 13, 15, 16, 17, 18, 21, 22, 24, 25, 31, 3, 7, 9, 12, 14, 20, 23, 30, 32, 2, 11, 19, 29, 33, 1, 28, 34, 27, 35, 26, 36]; or [4, 5, 6, 8, 10, 13, 15, 16, 17, 18, 21, 22, 24, 25, 31, 3, 7, 9, 12, 14, 20, 23, 30, 32, 2, 11, 19, 29, 33, 1, 28, 34, 26, 36, 27, 35]; |
| 30, 0x4D | [2, 3, 4, 6, 7, 9, 11, 14, 15, 16, 17, 21, 22, 25, 31, 1, 5, 8, 10, 13, 20, 24, 30, 32, 12, 19, 23, 29, 33, 18, 28, 34, 27, 35, 26, 36]; or [2, 3, 4, 6, 7, 9, 11, 14, 15, 16, 17, 21, 22, 25, 31, 1, 5, 8, 10, 13, 20, 24, 30, 32, 12, 18, 19, 28, 34, 23, 27, 35, 26, 36, 29, 33]; |
| 30, 0x7B | [1, 2, 5, 9, 11, 13, 14, 15, 16, 18, 19, 21, 24, 25, 31, 4, 8, 10, 12, 17, 20, 23, 30, 32, 3, 7, 22, 29, 33, 6, 28, 34, 27, 35, 26, 36]; or [1, 2, 5, 9, 11, 13, 14, 15, 16, 18, 19, 21, 24, 25, 31, 3, 6, 7, 8, 10, 17, 23, 28, 34, 12, 20, 22, 26, 36, 4, 30, 32, 29, 33, 27, 35]; |
| 30, 0x5D | [2, 3, 6, 7, 9, 15, 17, 18, 21, 22, 24, 30, 31, 1, 5, 8, 14, 16, 20, 23, 29, 32, 4, 13, 19, 28, 33, 12, 27, 34, 11, 26, 35, 10, 25, 36]; or [2, 3, 6, 7, 9, 15, 17, 18, 21, 22, 24, 30, 31, 1, 5, 8, 14, 16, 20, 23, 29, 32, 4, 11, 19, 26, 35, 10, 25, 36, 13, 28, 33, 12, 27, 34]; |
| 30, 0xD3 | [1, 2, 3, 5, 6, 9, 10, 14, 17, 20, 21, 22, 25, 26, 27, 28, 29, 31, 4, 8, 13, 16, 19, 24, 32, 7, 12, 15, 18, 23, 30, 33, 11, 34, 35, 36, 37]; or [3, 4, 6, 8, 10, 13, 14, 16, 17, 19, 22, 24, 29, 32, 2, 7, 9, 11, 20, 25, 27, 35, 1, 5, 12, 15, 18, 21, 26, 36, 23, 28, 30, 33, 34, 31, 37]; |
| 30, 0xF7 | [1, 3, 5, 6, 7, 9, 12, 14, 16, 18, 19, 21, 22, 23, 26, 31, 2, 4, 8, 11, 13, 15, 17, 20, 25, 30, 32, 10, 24, 29, 33, 28, 34, 27, 35, 36, 37]; or [1, 5, 8, 11, 12, 13, 14, 16, 18, 24, 26, 27, 28, 29, 35, 3, 6, 7, 9, 19, 21, 22, 23, 31, 2, 10, 15, 25, 30, 33, 4, 20, 34, 17, 37, 32, 36]; |
| 30, 0xA7 | [1, 3, 4, 5, 6, 7, 13, 15, 16, 21, 26, 27, 28, 30, 31, 2, 12, 14, 20, 25, 29, 32, 11, 19, 24, 33, 10, 18, 23, 34, 9, 17, 22, 35, 8, 36, 37]; or [1, 2, 7, 12, 13, 14, 16, 20, 21, 25, 28, 29, 30, 32, 3, 4, 5, 6, 15, 26, 27, 31, 11, 19, 24, 33, 10, 18, 23, 34, 8, 9, 17, 36, 22, 37, 35]; |
| 30, 0xC1 | [6, 7, 12, 14, 18, 19, 20, 21, 24, 28, 30, 31, 5, 11, 13, 17, 23, 27, 29, 32, 4, 10, 16, 22, 26, 33, 3, 9, 15, 25, 34, 2, 8, 35, 1, 36, 37]; or [6, 7, 12, 14, 18, 19, 20, 21, 24, 28, 30, 31, 1, 8, 13, 15, 22, 25, 29, 37, 5, 11, 17, 23, 27, 32, 4, 10, 16, 26, 33, 3, 9, 34, 2, 35, 36]; |
| 30, 0x91 | [4, 7, 8, 12, 14, 15, 16, 18, 20, 21, 23, 24, 30, 31, 3, 6, 11, 13, 17, 19, 22, 29, 32, 2, 5, 10, 28, 33, 1, 9, 27, 34, 26, 35, 25, 36, 37]; or [4, 7, 8, 12, 14, 15, 16, 18, 20, 21, 23, 24, 30, 31, 3, 10, 11, 17, 19, 26, 27, 35, 2, 6, 9, 22, 25, 36, 1, 5, 13, 37, 29, 32, 28, 33, 34]; |
| 30, 0xED | [2, 3, 4, 5, 6, 10, 11, 12, 13, 15, 16, 18, 19, 20, 23, 26, 27, 29, 31, 1, 9, 14, 17, 22, 25, 28, 32, 8, 21, 24, 30, 33, 7, 34, 35, 36, 37]; or [2, 3, 6, 7, 8, 10, 12, 14, 15, 22, 24, 25, 26, 27, 28, 34, 1, 5, 9, 11, 13, 21, 23, 35, 16, 18, 19, 29, 30, 36, 4, 20, 31, 17, 32, 33, 37]; |
| 30, 0xA3 | [1, 2, 3, 4, 6, 7, 8, 9, 12, 13, 14, 16, 18, 19, 24, 26, 27, 28, 31, 5, 11, 15, 17, 23, 25, 32, 10, 22, 30, 33, 21, 29, 34, 20, 35, 36, 37]; or [4, 5, 9, 11, 14, 15, 16, 17, 19, 23, 24, 25, 28, 32, 3, 8, 10, 13, 18, 22, 27, 30, 33, 2, 7, 12, 21, 26, 29, 34, 1, 6, 20, 35, 31, 36, 37]; |
| 30, 0xA9 | [3, 5, 6, 7, 9, 10, 11, 12, 14, 17, 18, 20, 22, 24, 25, 27, 28, 31, 2, 4, 8, 13, 16, 19, 21, 23, 26, 32, 1, 15, 33, 30, 34, 29, 35, 36, 37]; or [2, 4, 5, 8, 10, 12, 15, 18, 19, 20, 21, 27, 28, 30, 34, 1, 3, 7, 9, 11, 14, 17, 26, 29, 35, 6, 22, 24, 25, 31, 13, 16, 23, 32, 33, 36, 37]; |
| 30, 0xD9 | [3, 4, 7, 8, 9, 10, 11, 13, 15, 16, 17, 19, 20, 22, 26, 27, 28, 31, 2, 6, 12, 14, 18, 21, 25, 32, 1, 5, 24, 33, 23, 34, 35, 30, 36, 29, 37]; or [2, 3, 5, 7, 9, 14, 15, 16, 17, 20, 21, 23, 24, 25, 28, 35, 1, 4, 6, 8, 13, 19, 22, 27, 30, 36, 10, 11, 26, 31, 12, 18, 32, 33, 34, 29, 37]; |

TABLE 2-continued

| Typical K1, typical CRC polynomial | Typical K1, typical CRC polynomial |
|---|---|
| 30, 0x8B | [1, 2, 4, 8, 15, 16, 17, 19, 23, 30, 31, 3, 7, 14, 18, 22, 29, 32, 6, 13, 21, 28, 33, 5, 12, 20, 27, 34, 11, 26, 35, 10, 25, 36, 9, 24, 37]; or [1, 2, 4, 8, 15, 16, 17, 19, 23, 30, 31, 5, 6, 12, 20, 21, 27, 34, 3, 7, 11, 18, 22, 26, 35, 10, 25, 36, 9, 24, 37, 14, 29, 32, 13, 28, 33]; |
| 30, 0xF3 | [1, 2, 3, 6, 7, 14, 15, 16, 17, 20, 21, 28, 29, 30, 31, 5, 13, 19, 27, 32, 4, 12, 18, 26, 33, 11, 25, 34, 10, 24, 35, 9, 23, 36, 8, 22, 37]; or [3, 5, 7, 13, 17, 19, 21, 27, 32, 2, 4, 6, 12, 16, 18, 20, 26, 30, 33, 1, 11, 15, 25, 29, 34, 9, 23, 36, 10, 24, 35, 14, 28, 31, 8, 22, 37]; |
| 30, 0x1E7 | [1, 3, 4, 5, 7, 10, 14, 15, 16, 17, 18, 19, 25, 26, 27, 29, 31, 2, 6, 9, 13, 24, 28, 30, 32, 8, 12, 23, 33, 11, 22, 34, 21, 35, 20, 36, 37, 38]; or [1, 3, 4, 7, 8, 9, 11, 12, 15, 21, 26, 29, 30, 37, 2, 5, 6, 10, 13, 19, 24, 27, 28, 32, 17, 18, 20, 22, 36, 14, 16, 25, 31, 23, 33, 34, 38, 35]; |
| 30, 0x165 | [2, 4, 5, 9, 10, 13, 14, 15, 22, 23, 24, 25, 26, 28, 31, 1, 3, 8, 12, 21, 27, 30, 32, 7, 11, 20, 29, 33, 6, 19, 34, 18, 35, 17, 36, 16, 37, 38]; or [2, 4, 5, 9, 10, 13, 14, 15, 22, 23, 24, 25, 26, 28, 31, 1, 3, 8, 12, 21, 27, 30, 32, 6, 7, 11, 17, 18, 36, 16, 37, 29, 38, 20, 33, 19, 34, 35]; |
| 30, 0x171 | [4, 5, 6, 10, 13, 15, 16, 17, 24, 25, 28, 31, 3, 9, 12, 14, 23, 27, 30, 32, 2, 8, 11, 22, 26, 29, 33, 1, 7, 21, 34, 20, 35, 19, 36, 18, 37, 38]; or [4, 5, 6, 10, 13, 15, 16, 17, 24, 25, 28, 31, 3, 9, 12, 14, 23, 27, 30, 32, 2, 8, 11, 22, 26, 29, 33, 1, 7, 21, 34, 18, 19, 37, 38, 20, 35, 36]; |
| 30, 0x18D | [2, 3, 4, 8, 9, 10, 12, 13, 14, 15, 19, 21, 22, 25, 26, 28, 29, 31, 1, 7, 11, 18, 20, 24, 27, 32, 6, 17, 23, 33, 5, 16, 34, 30, 35, 36, 37, 38]; or [4, 5, 6, 9, 12, 15, 16, 20, 23, 24, 25, 27, 29, 34, 3, 8, 11, 14, 19, 22, 26, 28, 30, 35, 2, 7, 10, 13, 18, 21, 36, 1, 17, 37, 31, 32, 38, 33]; |
| 30, 0x1FD | [2, 3, 5, 6, 8, 10, 14, 16, 18, 20, 21, 25, 26, 27, 30, 31, 1, 4, 7, 9, 13, 15, 17, 19, 24, 29, 32, 12, 23, 28, 33, 11, 22, 34, 35, 36, 37, 38]; or [1, 2, 10, 12, 13, 15, 16, 18, 20, 24, 26, 28, 30, 36, 3, 5, 6, 8, 14, 21, 25, 27, 31, 4, 7, 9, 22, 29, 35, 11, 17, 19, 38, 32, 23, 33, 34, 37]; |
| 30, 0x1C1 | [6, 7, 8, 12, 14, 16, 18, 19, 21, 23, 28, 30, 31, 5, 11, 13, 15, 17, 20, 22, 27, 29, 32, 4, 10, 26, 33, 3, 9, 25, 34, 2, 24, 35, 1, 36, 37, 38]; or [6, 7, 8, 12, 14, 16, 18, 19, 21, 23, 28, 30, 31, 1, 9, 13, 15, 17, 20, 22, 24, 29, 38, 5, 11, 27, 32, 4, 10, 26, 33, 3, 25, 34, 2, 35, 36, 37]; |
| 30, 0x1E9 | [3, 5, 7, 8, 9, 10, 11, 12, 15, 21, 22, 23, 24, 25, 27, 30, 31, 2, 4, 6, 14, 20, 26, 29, 32, 1, 13, 19, 28, 33, 18, 34, 17, 35, 16, 36, 37, 38]; or [2, 3, 4, 6, 10, 11, 15, 18, 19, 20, 23, 25, 28, 29, 34, 1, 5, 7, 8, 14, 16, 17, 22, 27, 37, 9, 24, 30, 35, 12, 21, 31, 13, 26, 38, 32, 33, 36]; |
| 30, 0x119 | [3, 4, 6, 9, 10, 11, 14, 15, 18, 21, 23, 24, 25, 31, 2, 5, 8, 13, 17, 20, 22, 30, 32, 1, 7, 12, 16, 19, 29, 33, 28, 34, 27, 35, 26, 36, 37, 38]; or [3, 4, 6, 9, 10, 11, 14, 15, 18, 21, 23, 24, 25, 31, 2, 5, 8, 13, 17, 20, 22, 30, 32, 7, 19, 27, 28, 29, 35, 12, 26, 36, 16, 37, 1, 38, 33, 34]; |
| 30, 0x1B3 | [1, 2, 3, 7, 12, 13, 15, 18, 19, 21, 22, 24, 25, 26, 27, 28, 29, 31, 6, 11, 14, 17, 20, 23, 30, 32, 5, 10, 16, 33, 4, 9, 34, 8, 35, 36, 37, 38]; or [2, 6, 9, 10, 14, 16, 17, 18, 20, 22, 23, 25, 26, 36, 1, 5, 8, 13, 15, 19, 21, 24, 37, 3, 7, 11, 29, 30, 32, 12, 28, 33, 4, 27, 34, 31, 38, 35]; |
| 30, 0x1D9 | [3, 4, 7, 9, 10, 11, 13, 14, 15, 16, 17, 22, 23, 27, 28, 30, 31, 2, 6, 8, 12, 21, 26, 29, 32, 1, 5, 20, 25, 33, 19, 24, 34, 18, 35, 36, 37, 38]; or [1, 2, 4, 6, 8, 9, 10, 13, 14, 19, 23, 25, 28, 30, 37, 3, 5, 17, 18, 21, 24, 27, 29, 35, 7, 12, 16, 20, 26, 36, 11, 15, 22, 31, 38, 32, 34, 33]; |
| 30, 0x157 | [1, 3, 6, 7, 8, 13, 14, 15, 16, 17, 18, 20, 24, 26, 27, 29, 30, 31, 2, 5, 12, 19, 23, 25, 28, 32, 4, 11, 22, 33, 10, 21, 34, 9, 35, 36, 37, 38]; or [1, 2, 3, 5, 8, 12, 18, 19, 20, 23, 24, 25, 27, 28, 32, 4, 6, 11, 13, 14, 15, 16, 22, 29, 33, 7, 10, 21, 34, 9, 26, 30, 35, 36, 17, 37, 31, 38]; |
| 30, 0x1B1 | [4, 5, 7, 10, 12, 13, 16, 17, 19, 20, 21, 22, 25, 26, 27, 29, 30, 31, 3, 6, 9, 11, 15, 18, 24, 28, 32, 2, 8, 14, 23, 33, 1, 34, 35, 36, 37, 38]; or [1, 3, 4, 5, 6, 7, 8, 9, 10, 15, 18, 19, 20, 23, 27, 30, 35, 2, 12, 13, 14, 16, 21, 25, 36, 17, 22, 26, 29, 31, 11, 24, 28, 32, 33, 37, 38, 34]; |
| 30, 0x139 | [3, 4, 5, 6, 9, 17, 20, 21, 22, 23, 26, 31, 2, 8, 16, 19, 25, 32, 1, 7, 15, 18, 24, 33, 14, 34, 13, 30, 35, 12, 29, 36, 11, 28, 37, 10, 27, 38]; |
| 30, 0x1D7 | [1, 3, 6, 8, 9, 17, 18, 20, 23, 25, 26, 31, 2, 5, 7, 16, 19, 22, 24, 32, 4, 15, 21, 33, 14, 34, 13, 30, 35, 12, 29, 36, 11, 28, 37, 10, 27, 38]; or [1, 3, 6, 8, 9, 17, 18, 20, 23, 25, 26, 31, 2, 4, 5, 15, 19, 21, 22, 33, 14, 34, 7, 13, 24, 30, 35, 12, 29, 36, 10, 27, 38, 16, 32, 11, 28, 37]; |
| 30, 0x101 | [8, 16, 24, 31, 7, 15, 23, 32, 6, 14, 22, 30, 33, 5, 13, 21, 29, 34, 4, 12, 20, 28, 35, 3, 11, 19, 27, 36, 2, 10, 18, 26, 37, 1, 9, 17, 25, 38]; |
| 32, 0x9 | [3, 6, 9, 12, 15, 18, 21, 24, 27, 30, 33, 2, 5, 8, 11, 14, 17, 20, 23, 26, 29, 32, 34, 1, 4, 7, 10, 13, 16, 19, 22, 25, 28, 31, 35]; |
| 32, 0xD | [2, 3, 4, 7, 9, 10, 11, 14, 16, 17, 18, 21, 23, 24, 25, 28, 30, 31, 32, 33, 1, 6, 8, 13, 15, 20, 22, 27, 29, 34, 5, 12, 19, 26, 35]; |
| 32, 0x19 | [3, 4, 6, 8, 9, 10, 11, 15, 18, 19, 21, 23, 24, 25, 26, 30, 33, 2, 5, 7, 14, 17, 20, 22, 29, 32, 34, 1, 13, 16, 28, 31, 35, 12, 27, 36]; or [3, 4, 6, 8, 9, 10, 11, 15, 18, 19, 21, 23, 24, 25, 26, 30, 33, 2, 5, 7, 14, 17, 20, 22, 29, 32, 34, 1, 12, 16, 27, 31, 36, 13, 28, 35]; |
| 32, 0x1D | [2, 3, 7, 9, 10, 14, 16, 17, 21, 23, 24, 28, 30, 31, 33, 1, 6, 8, 13, 15, 20, 22, 27, 29, 34, 5, 12, 19, 26, 35, 4, 11, 18, 25, 32, 36]; or [2, 3, 7, 9, 10, 14, 16, 17, 21, 23, 24, 28, 30, 31, 33, 1, 6, 8, 13, 15, 20, 22, 27, 29, 34, 4, 11, 18, 25, 32, 36, 5, 12, 19, 26, 35]; |

TABLE 2-continued

| Typical K1, typical CRC polynomial | Typical K1, typical CRC polynomial |
|---|---|
| 32, 0x17 | [1, 3, 7, 8, 10, 14, 15, 17, 21, 22, 24, 28, 29, 31, 33, 2, 6, 9, 13, 16, 20, 23, 27, 30, 34, 5, 12, 19, 26, 35, 4, 11, 18, 25, 32, 36]; or [1, 3, 7, 8, 10, 14, 15, 17, 21, 22, 24, 28, 29, 31, 33, 2, 5, 9, 12, 16, 19, 23, 26, 30, 35, 4, 11, 18, 25, 32, 36, 6, 13, 20, 27, 34]; |
| 32, 0x1F | [1, 5, 6, 10, 11, 15, 16, 20, 21, 25, 26, 30, 31, 33, 4, 9, 14, 19, 24, 29, 34, 3, 8, 13, 18, 23, 28, 35, 2, 7, 12, 17, 22, 27, 32, 36]; |
| 32, 0x29 | [3, 5, 6, 9, 10, 11, 12, 13, 17, 18, 20, 21, 22, 24, 26, 31, 33, 2, 4, 8, 16, 19, 23, 25, 30, 34, 1, 7, 15, 29, 32, 35, 14, 28, 36, 27, 37]; or [3, 5, 6, 9, 10, 11, 12, 13, 17, 18, 20, 21, 22, 24, 26, 31, 33, 2, 4, 8, 16, 19, 23, 25, 30, 34, 7, 14, 15, 28, 36, 1, 29, 32, 35, 27, 37]; |
| 32, 0x2F | [1, 4, 7, 8, 9, 10, 11, 13, 14, 15, 19, 21, 23, 24, 26, 31, 32, 33, 3, 6, 12, 18, 20, 22, 25, 30, 34, 2, 5, 17, 29, 35, 16, 28, 36, 27, 37]; or [2, 3, 6, 9, 10, 11, 12, 13, 15, 16, 17, 21, 23, 25, 26, 28, 36, 1, 4, 7, 8, 14, 19, 24, 31, 32, 33, 18, 20, 22, 30, 34, 5, 29, 35, 27, 37]; |
| 32, 0x35 | [2, 5, 6, 8, 9, 10, 15, 17, 20, 21, 23, 24, 25, 30, 32, 33, 1, 4, 7, 14, 16, 19, 22, 29, 31, 34, 3, 13, 18, 28, 35, 12, 27, 36, 11, 26, 37]; or [2, 5, 6, 8, 9, 10, 15, 17, 20, 21, 23, 24, 25, 30, 32, 33, 1, 4, 7, 14, 16, 19, 22, 29, 31, 34, 3, 11, 18, 26, 37, 13, 28, 35, 12, 27, 36]; |
| 32, 0x73 | [1, 2, 3, 6, 9, 11, 13, 16, 17, 19, 24, 28, 30, 31, 33, 5, 8, 10, 12, 15, 18, 23, 27, 29, 32, 34, 4, 7, 14, 22, 26, 35, 21, 25, 36, 20, 37, 38]; or [1, 2, 3, 6, 9, 11, 13, 16, 17, 19, 24, 28, 30, 31, 33, 4, 7, 10, 12, 14, 18, 20, 25, 29, 32, 38, 5, 8, 15, 21, 26, 37, 23, 27, 34, 22, 35, 36]; |
| 32, 0x61 | [5, 6, 10, 12, 15, 16, 17, 18, 20, 24, 25, 26, 29, 32, 33, 4, 9, 11, 14, 19, 23, 28, 31, 34, 3, 8, 13, 22, 27, 30, 35, 2, 7, 21, 36, 1, 37, 38]; or [5, 6, 10, 12, 15, 16, 17, 18, 20, 24, 25, 26, 29, 32, 33, 4, 9, 11, 14, 19, 23, 28, 31, 34, 1, 7, 13, 21, 27, 30, 38, 3, 8, 22, 35, 2, 36, 37]; |
| 32, 0x71 | [4, 5, 6, 8, 10, 13, 15, 16, 17, 18, 21, 22, 24, 25, 31, 33, 3, 7, 9, 12, 14, 20, 23, 30, 34, 2, 11, 19, 29, 35, 1, 28, 32, 36, 27, 37, 26, 38]; or [4, 5, 6, 8, 10, 13, 15, 16, 17, 18, 21, 22, 24, 25, 31, 33, 3, 7, 9, 12, 14, 20, 23, 30, 34, 2, 11, 19, 29, 35, 1, 28, 32, 36, 26, 38, 27, 37]; |
| 32, 0x4D | [2, 3, 4, 6, 7, 9, 11, 14, 15, 16, 17, 21, 22, 25, 31, 33, 1, 5, 8, 10, 13, 20, 24, 30, 32, 34, 12, 19, 23, 29, 35, 18, 28, 36, 27, 37, 26, 38]; or [2, 3, 4, 6, 7, 9, 11, 14, 15, 16, 17, 21, 22, 25, 31, 33, 5, 10, 12, 18, 19, 20, 24, 28, 36, 8, 13, 23, 27, 37, 1, 30, 32, 34, 26, 38, 29, 35]; |
| 32, 0x7B | [1, 2, 5, 9, 11, 13, 14, 15, 16, 18, 19, 21, 24, 25, 31, 32, 33, 4, 8, 10, 12, 17, 20, 23, 30, 34, 3, 7, 22, 29, 35, 6, 28, 36, 27, 37, 26, 38]; or [1, 2, 5, 9, 11, 13, 14, 15, 16, 18, 19, 21, 24, 25, 31, 32, 33, 4, 8, 10, 12, 17, 20, 23, 30, 34, 3, 6, 7, 28, 36, 22, 26, 38, 29, 35, 27, 37]; |
| 32, 0x5D | [2, 3, 6, 7, 9, 15, 17, 18, 21, 22, 24, 30, 32, 33, 1, 5, 8, 14, 16, 20, 23, 29, 31, 34, 4, 13, 19, 28, 35, 12, 27, 36, 11, 26, 37, 10, 25, 38]; or [2, 3, 6, 7, 9, 15, 17, 18, 21, 22, 24, 30, 32, 33, 4, 5, 8, 11, 19, 20, 23, 26, 37, 1, 10, 16, 25, 31, 38, 14, 29, 34, 12, 27, 36, 13, 28, 35]; |
| 32, 0xD3 | [1, 2, 3, 5, 6, 9, 10, 14, 17, 20, 21, 22, 25, 26, 27, 28, 29, 32, 33, 4, 8, 13, 16, 19, 24, 31, 34, 7, 12, 15, 18, 23, 30, 35, 11, 36, 37, 38, 39]; or [2, 6, 7, 9, 11, 13, 16, 17, 19, 20, 22, 25, 27, 32, 37, 1, 5, 8, 10, 12, 15, 18, 21, 24, 26, 31, 38, 3, 4, 14, 29, 34, 23, 28, 30, 35, 36, 33, 39]; |
| 32, 0xF7 | [1, 3, 5, 6, 7, 9, 12, 14, 16, 18, 19, 21, 22, 23, 26, 31, 33, 2, 4, 8, 11, 13, 15, 17, 20, 25, 30, 34, 10, 24, 29, 35, 28, 32, 36, 27, 37, 38, 39]; or [1, 5, 8, 11, 12, 13, 14, 16, 18, 24, 26, 27, 28, 29, 32, 37, 3, 6, 7, 9, 19, 21, 22, 23, 31, 33, 2, 10, 15, 25, 30, 35, 4, 20, 36, 17, 39, 34, 38]; |
| 32, 0xA7 | [1, 3, 4, 5, 6, 7, 13, 15, 16, 21, 26, 27, 28, 30, 33, 2, 12, 14, 20, 25, 29, 34, 11, 19, 24, 32, 35, 10, 18, 23, 31, 36, 9, 17, 22, 37, 8, 38, 39]; or [1, 2, 7, 12, 13, 14, 16, 20, 21, 25, 28, 29, 30, 34, 3, 4, 5, 6, 15, 26, 27, 33, 11, 19, 24, 32, 35, 10, 18, 23, 31, 36, 9, 17, 22, 37, 8, 38, 39]; |
| 32, 0xC1 | [6, 7, 12, 14, 18, 19, 20, 21, 24, 28, 30, 31, 33, 5, 11, 13, 17, 23, 27, 29, 34, 4, 10, 16, 22, 26, 32, 35, 3, 9, 15, 25, 36, 2, 8, 37, 1, 38, 39]; or [6, 7, 12, 14, 18, 19, 20, 21, 24, 28, 30, 31, 33, 5, 11, 13, 17, 23, 27, 29, 34, 4, 10, 16, 22, 26, 32, 35, 1, 8, 15, 25, 39, 3, 9, 36, 2, 37, 38]; |
| 32, 0x91 | [4, 7, 8, 12, 14, 15, 16, 18, 20, 21, 23, 24, 30, 31, 33, 3, 6, 11, 13, 17, 19, 22, 29, 34, 2, 5, 10, 28, 32, 35, 1, 9, 27, 36, 26, 37, 25, 38, 39]; or [3, 7, 10, 11, 15, 17, 18, 19, 21, 23, 24, 26, 27, 37, 4, 8, 12, 14, 16, 20, 30, 31, 33, 6, 13, 22, 29, 34, 2, 9, 25, 32, 38, 5, 28, 35, 1, 39, 36]; |
| 32, 0xED | [2, 3, 4, 5, 6, 10, 11, 12, 13, 15, 16, 18, 19, 20, 23, 26, 27, 29, 32, 33, 1, 9, 14, 17, 22, 25, 28, 31, 34, 8, 21, 24, 30, 35, 7, 36, 37, 38, 39]; or [2, 3, 6, 7, 8, 10, 12, 14, 15, 22, 24, 25, 26, 27, 28, 32, 36, 1, 11, 16, 18, 19, 29, 30, 31, 38, 5, 9, 13, 21, 23, 37, 17, 20, 35, 4, 33, 34, 39]; |

TABLE 2-continued

| Typical K1, typical CRC polynomial | Typical K1, typical CRC polynomial |
|---|---|
| 32, 0xA3 | [1, 2, 3, 4, 6, 7, 8, 9, 12, 13, 14, 16, 18, 19, 24, 26, 27, 28, 32, 33, 5, 11, 15, 17, 23, 25, 31, 34, 10, 22, 30, 35, 21, 29, 36, 20, 37, 38, 39]; or [4, 5, 9, 11, 14, 15, 16, 17, 19, 23, 24, 25, 28, 31, 34, 3, 8, 10, 13, 18, 22, 27, 30, 32, 35, 2, 7, 12, 21, 26, 29, 36, 1, 6, 20, 37, 33, 38, 39]; |
| 32, 0xA9 | [3, 5, 6, 7, 9, 10, 11, 12, 14, 17, 18, 20, 22, 24, 25, 27, 28, 33, 2, 4, 8, 13, 16, 19, 21, 23, 26, 32, 34, 1, 15, 31, 35, 30, 36, 29, 37, 38, 39]; or [2, 4, 5, 8, 10, 12, 15, 18, 19, 20, 21, 27, 28, 30, 31, 32, 36, 1, 3, 7, 9, 11, 14, 17, 26, 29, 37, 6, 22, 24, 25, 33, 13, 16, 23, 34, 38, 39, 35]; |
| 32, 0xD9 | [3, 4, 7, 8, 9, 10, 11, 13, 15, 16, 17, 19, 20, 22, 26, 27, 28, 33, 2, 6, 12, 14, 18, 21, 25, 34, 1, 5, 24, 35, 23, 32, 36, 31, 37, 30, 38, 29, 39]; or [2, 3, 5, 7, 9, 14, 15, 16, 17, 20, 21, 23, 24, 25, 28, 31, 37, 1, 4, 6, 8, 13, 19, 22, 27, 30, 38, 10, 11, 26, 33, 12, 18, 34, 35, 32, 36, 29, 39]; |
| 32, 0x8B | [1, 2, 4, 8, 15, 16, 17, 19, 23, 30, 31, 32, 33, 3, 7, 14, 18, 22, 29, 34, 6, 13, 21, 28, 35, 5, 12, 20, 27, 36, 11, 26, 37, 10, 25, 38, 9, 24, 39]; or [4, 5, 6, 8, 12, 19, 20, 21, 23, 27, 36, 3, 7, 11, 18, 22, 26, 37, 2, 10, 17, 25, 32, 38, 1, 15, 16, 30, 31, 33, 9, 24, 39, 14, 29, 34, 13, 28, 35]; |
| 32, 0xF3 | [1, 2, 3, 6, 7, 14, 15, 16, 17, 20, 21, 28, 29, 30, 31, 33, 5, 13, 19, 27, 34, 4, 12, 18, 26, 32, 35, 11, 25, 36, 10, 24, 37, 9, 23, 38, 8, 22, 39]; or [3, 5, 7, 13, 17, 19, 21, 27, 31, 34, 1, 9, 15, 23, 29, 38, 2, 4, 6, 12, 16, 18, 20, 26, 30, 32, 35, 11, 25, 36, 14, 28, 33, 10, 24, 37, 8, 22, 39]; |
| 32, 0x1E7 | [1, 3, 4, 5, 7, 10, 14, 15, 16, 17, 18, 19, 25, 26, 27, 29, 31, 33, 2, 6, 9, 13, 24, 28, 30, 34, 8, 12, 23, 32, 35, 11, 22, 36, 21, 37, 20, 38, 39, 40]; or [1, 2, 5, 6, 7, 9, 10, 13, 19, 24, 27, 28, 29, 30, 31, 34, 3, 4, 8, 11, 12, 15, 21, 26, 32, 39, 17, 18, 20, 22, 38, 14, 16, 25, 33, 23, 35, 36, 37, 40]; |
| 32, 0x165 | [2, 4, 5, 9, 10, 13, 14, 15, 22, 23, 24, 25, 26, 28, 31, 33, 1, 3, 8, 12, 21, 27, 30, 32, 34, 7, 11, 20, 29, 35, 6, 19, 36, 18, 37, 17, 38, 16, 39, 40]; or [2, 4, 5, 9, 10, 13, 14, 15, 22, 23, 24, 25, 26, 28, 31, 33, 6, 7, 11, 12, 16, 17, 27, 30, 39, 1, 3, 8, 21, 32, 34, 20, 29, 35, 19, 36, 18, 37, 40, 38]; |
| 32, 0x171 | [4, 5, 6, 10, 13, 15, 16, 17, 24, 25, 28, 31, 33, 3, 9, 12, 14, 23, 27, 30, 34, 2, 8, 11, 22, 26, 29, 32, 35, 1, 7, 21, 36, 20, 37, 19, 38, 18, 39, 40]; or [4, 5, 6, 10, 13, 15, 16, 17, 24, 25, 28, 31, 33, 3, 9, 12, 14, 23, 27, 30, 34, 2, 7, 8, 18, 19, 26, 39, 11, 22, 29, 32, 35, 1, 40, 21, 36, 20, 37, 38]; |
| 32, 0x18D | [2, 3, 4, 8, 9, 10, 12, 13, 14, 15, 19, 21, 22, 25, 26, 28, 29, 33, 1, 7, 11, 18, 20, 24, 27, 34, 6, 17, 23, 32, 35, 5, 16, 31, 36, 30, 37, 38, 39, 40]; or [4, 5, 6, 9, 12, 15, 16, 20, 23, 24, 25, 27, 29, 31, 32, 36, 3, 8, 11, 14, 19, 22, 26, 28, 30, 37, 2, 7, 10, 13, 18, 21, 38, 1, 17, 39, 33, 34, 40, 35]; |
| 32, 0x1FD | [2, 3, 5, 6, 8, 10, 14, 16, 18, 20, 21, 25, 26, 27, 30, 31, 33, 1, 4, 7, 9, 13, 15, 17, 19, 24, 29, 32, 34, 12, 23, 28, 35, 11, 22, 36, 37, 38, 39, 40]; or [1, 2, 10, 12, 13, 15, 16, 18, 20, 24, 26, 28, 30, 31, 38, 4, 6, 7, 9, 14, 22, 25, 29, 37, 3, 5, 8, 21, 27, 33, 19, 23, 35, 17, 32, 34, 11, 40, 36, 39]; |
| 32, 0x1C1 | [6, 7, 8, 12, 14, 16, 18, 19, 21, 23, 28, 30, 31, 33, 5, 11, 13, 15, 17, 20, 22, 27, 29, 34, 4, 10, 26, 32, 35, 3, 9, 25, 36, 2, 24, 37, 1, 38, 39, 40]; or [6, 7, 8, 12, 14, 16, 18, 19, 21, 23, 28, 30, 31, 33, 5, 11, 13, 15, 17, 20, 22, 27, 29, 34, 4, 10, 26, 32, 35, 1, 9, 24, 40, 3, 25, 36, 2, 37, 38, 39]; |
| 32, 0x1E9 | [3, 5, 7, 8, 9, 10, 11, 12, 15, 21, 22, 23, 24, 25, 27, 30, 31, 32, 33, 2, 4, 6, 14, 20, 26, 29, 34, 1, 13, 19, 28, 35, 18, 36, 17, 37, 16, 38, 39, 40]; or [2, 3, 4, 6, 10, 11, 15, 18, 19, 20, 23, 25, 28, 29, 31, 36, 1, 5, 9, 14, 17, 22, 24, 27, 30, 37, 7, 8, 16, 39, 12, 21, 32, 33, 13, 26, 40, 34, 35, 38]; |
| 32, 0x119 | [3, 4, 6, 9, 10, 11, 14, 15, 18, 21, 23, 24, 25, 31, 32, 33, 2, 5, 8, 13, 17, 20, 22, 30, 34, 1, 7, 12, 16, 19, 29, 35, 28, 36, 27, 37, 26, 38, 39, 40]; or [4, 7, 8, 10, 13, 14, 15, 18, 19, 22, 25, 27, 28, 29, 37, 3, 6, 9, 12, 17, 21, 24, 26, 38, 2, 5, 11, 16, 20, 23, 39, 31, 32, 33, 1, 40, 30, 34, 35, 36]; |
| 32, 0x1B3 | [1, 2, 3, 7, 12, 13, 15, 18, 19, 21, 22, 24, 25, 26, 27, 28, 29, 31, 32, 33, 6, 11, 14, 17, 20, 23, 30, 34, 5, 10, 16, 35, 4, 9, 36, 8, 37, 38, 39, 40]; or [3, 6, 7, 11, 13, 14, 15, 17, 19, 20, 22, 23, 29, 30, 34, 2, 9, 10, 16, 18, 25, 26, 32, 38, 5, 12, 21, 28, 35, 1, 8, 24, 31, 39, 4, 27, 36, 33, 40, 37]; |
| 32, 0x1D9 | [3, 4, 7, 9, 10, 11, 13, 14, 15, 16, 17, 22, 23, 27, 28, 30, 31, 32, 33, 2, 6, 8, 12, 21, 26, 29, 34, 1, 5, 20, 25, 35, 19, 24, 36, 18, 37, 38, 39, 40]; or [2, 3, 4, 5, 8, 9, 10, 13, 17, 18, 19, 21, 24, 27, 29, 37, 1, 7, 12, 16, 20, 23, 26, 28, 38, 6, 14, 25, 30, 31, 39, 11, 15, 22, 32, 33, 34, 35, 40, 36]; |

TABLE 2-continued

| Typical K1, typical CRC polynomial | Typical K1, typical CRC polynomial |
|---|---|
| 32, 0x157 | [1, 3, 6, 7, 8, 13, 14, 15, 16, 17, 18, 20, 24, 26, 27, 29, 30, 31, 33, 2, 5, 12, 19, 23, 25, 28, 32, 34, 4, 11, 22, 35, 10, 21, 36, 9, 37, 38, 39, 40]; or [2, 3, 4, 6, 8, 11, 13, 14, 15, 16, 19, 20, 22, 23, 29, 35, 1, 5, 12, 18, 24, 25, 27, 28, 31, 32, 34, 7, 10, 21, 36, 9, 26, 30, 37, 38, 17, 33, 39, 40]; |
| 32, 0x1B1 | [4, 5, 7, 10, 12, 13, 16, 17, 19, 20, 21, 22, 25, 26, 27, 29, 30, 33, 3, 6, 9, 11, 15, 18, 24, 28, 32, 34, 2, 8, 14, 23, 31, 35, 1, 36, 37, 38, 39, 40]; or [4, 5, 7, 10, 12, 13, 16, 17, 19, 20, 21, 22, 25, 26, 27, 29, 30, 33, 1, 3, 6, 8, 9, 15, 18, 23, 32, 37, 2, 14, 31, 38, 11, 24, 28, 34, 35, 36, 39, 40]; |
| 32, 0x139 | [3, 4, 5, 6, 9, 17, 20, 21, 22, 23, 26, 33, 2, 8, 16, 19, 25, 34, 1, 7, 15, 18, 24, 32, 35, 14, 31, 36, 13, 30, 37, 12, 29, 38, 11, 28, 39, 10, 27, 40]; |
| 32, 0x1D7 | [1, 3, 6, 8, 9, 17, 18, 20, 23, 25, 26, 33, 2, 5, 7, 16, 19, 22, 24, 34, 4, 15, 21, 32, 35, 14, 31, 36, 13, 30, 37, 12, 29, 38, 11, 28, 39, 10, 27, 40]; or [1, 3, 6, 8, 9, 17, 18, 20, 23, 25, 26, 33, 2, 4, 5, 15, 19, 21, 22, 32, 35, 14, 31, 36, 7, 13, 24, 30, 37, 12, 29, 38, 10, 27, 40, 16, 34, 11, 28, 39]; |
| 32, 0x101 | [8, 16, 24, 32, 33, 7, 15, 23, 31, 34, 6, 14, 22, 30, 35, 5, 13, 21, 29, 36, 4, 12, 20, 28, 37, 3, 11, 19, 27, 38, 2, 10, 18, 26, 39, 1, 9, 17, 25, 40]; |
| 40, 0x9 | [3, 6, 9, 12, 15, 18, 21, 24, 27, 30, 33, 36, 39, 41, 2, 5, 8, 11, 14, 17, 20, 23, 26, 29, 32, 35, 38, 42, 1, 4, 7, 10, 13, 16, 19, 22, 25, 28, 31, 34, 37, 40, 43]; |
| 40, 0xD | [2, 3, 4, 7, 9, 10, 11, 14, 16, 17, 18, 21, 23, 24, 25, 28, 30, 31, 32, 35, 37, 38, 39, 41, 1, 6, 8, 13, 15, 20, 22, 27, 29, 34, 36, 42, 5, 12, 19, 26, 33, 40, 43]; |
| 40, 0x19 | [3, 4, 6, 8, 9, 10, 11, 15, 18, 19, 21, 23, 24, 25, 26, 30, 33, 34, 36, 38, 39, 40, 41, 2, 5, 7, 14, 17, 20, 22, 29, 32, 35, 37, 42, 1, 13, 16, 28, 31, 43, 12, 27, 44]; or [3, 4, 6, 8, 9, 10, 11, 15, 18, 19, 21, 23, 24, 25, 26, 30, 33, 34, 36, 38, 39, 40, 41, 1, 5, 7, 12, 16, 20, 22, 27, 31, 35, 37, 44, 2, 14, 17, 29, 32, 42, 13, 28, 43]; |
| 40, 0x1D | [2, 3, 7, 9, 10, 14, 16, 17, 21, 23, 24, 28, 30, 31, 35, 37, 38, 41, 1, 6, 8, 13, 15, 20, 22, 27, 29, 34, 36, 42, 5, 12, 19, 26, 33, 40, 43, 4, 11, 18, 25, 32, 39, 44]; or [2, 3, 7, 9, 10, 14, 16, 17, 21, 23, 24, 28, 30, 31, 35, 37, 38, 41, 1, 6, 8, 13, 15, 20, 22, 27, 29, 34, 36, 42, 4, 11, 18, 25, 32, 39, 44, 5, 12, 19, 26, 33, 40, 43]; |
| 40, 0x17 | [1, 3, 7, 8, 10, 14, 15, 17, 21, 22, 24, 28, 29, 31, 35, 36, 38, 41, 2, 6, 9, 13, 16, 20, 23, 27, 30, 34, 37, 42, 5, 12, 19, 26, 33, 40, 43, 4, 11, 18, 25, 32, 39, 44]; or [1, 3, 7, 8, 10, 14, 15, 17, 21, 22, 24, 28, 29, 31, 35, 36, 38, 41, 2, 5, 9, 12, 16, 19, 23, 26, 30, 33, 37, 40, 43, 4, 11, 18, 25, 32, 39, 44, 6, 13, 20, 27, 34, 42]; |
| 40, 0x1F | [1, 5, 6, 10, 11, 15, 16, 20, 21, 25, 26, 30, 31, 35, 36, 40, 41, 4, 9, 14, 19, 24, 29, 34, 39, 42, 3, 8, 13, 18, 23, 28, 33, 38, 43, 2, 7, 12, 17, 22, 27, 32, 37, 44]; |
| 40, 0x29 | [3, 5, 6, 9, 10, 11, 12, 13, 17, 18, 20, 21, 22, 24, 26, 31, 34, 36, 37, 40, 41, 2, 4, 8, 16, 19, 23, 25, 30, 33, 35, 39, 42, 1, 7, 15, 29, 32, 38, 43, 14, 28, 44, 27, 45]; or [3, 5, 6, 9, 10, 11, 12, 13, 17, 18, 20, 21, 22, 24, 26, 31, 34, 36, 37, 40, 41, 2, 7, 8, 14, 15, 19, 23, 28, 33, 38, 39, 44, 1, 4, 25, 27, 32, 35, 45, 16, 30, 42, 29, 43]; |
| 40, 0x2F | [1, 4, 7, 8, 9, 10, 11, 13, 14, 15, 19, 21, 23, 24, 26, 31, 32, 35, 38, 39, 40, 41, 3, 6, 12, 18, 20, 22, 25, 30, 34, 37, 42, 2, 5, 17, 29, 33, 36, 43, 16, 28, 44, 27, 45]; or [1, 3, 4, 6, 11, 12, 15, 18, 19, 20, 21, 22, 24, 25, 26, 30, 32, 34, 35, 37, 42, 2, 9, 10, 13, 16, 17, 23, 28, 33, 40, 44, 7, 8, 14, 31, 38, 39, 41, 5, 27, 36, 45, 29, 43]; |
| 40, 0x35 | [2, 5, 6, 8, 9, 10, 15, 17, 20, 21, 23, 24, 25, 30, 32, 35, 36, 38, 39, 40, 41, 1, 4, 7, 14, 16, 19, 22, 29, 31, 34, 37, 42, 3, 13, 18, 28, 33, 43, 12, 27, 44, 11, 26, 45]; or [2, 5, 6, 8, 9, 10, 15, 17, 20, 21, 23, 24, 25, 30, 32, 35, 36, 38, 39, 40, 41, 1, 4, 7, 14, 16, 19, 22, 29, 31, 34, 37, 42, 3, 11, 18, 26, 33, 45, 13, 28, 43, 12, 27, 44]; |
| 40, 0x73 | [1, 2, 3, 6, 9, 11, 13, 16, 17, 19, 24, 28, 30, 31, 33, 34, 35, 36, 37, 38, 40, 41, 5, 8, 10, 12, 15, 18, 23, 27, 29, 32, 39, 42, 4, 7, 14, 22, 26, 43, 21, 25, 44, 20, 45, 46]; or [1, 2, 3, 6, 9, 11, 13, 16, 17, 19, 24, 28, 30, 31, 33, 34, 35, 36, 37, 38, 40, 41, 4, 7, 10, 12, 14, 18, 20, 25, 29, 32, 39, 46, 5, 8, 15, 21, 26, 45, 23, 27, 42, 22, 43, 44]; |
| 40, 0x61 | [5, 6, 10, 12, 15, 16, 17, 18, 20, 24, 25, 26, 29, 32, 34, 35, 37, 38, 39, 41, 4, 9, 11, 14, 19, 23, 28, 31, 33, 36, 40, 42, 3, 8, 13, 22, 27, 30, 43, 2, 7, 21, 44, 1, 45, 46]; or [5, 6, 10, 12, 15, 16, 17, 18, 20, 24, 25, 26, 29, 32, 34, 35, 37, 38, 39, 41, 4, 9, 11, 14, 19, 23, 28, 31, 33, 36, 40, 42, 1, 7, 13, 21, 27, 30, 46, 3, 8, 22, 43, 2, 44, 45]; |
| 40, 0x71 | [4, 5, 6, 8, 10, 13, 15, 16, 17, 18, 21, 22, 24, 25, 31, 35, 36, 37, 39, 41, 3, 7, 9, 12, 14, 20, 23, 30, 34, 38, 40, 42, 2, 11, 19, 29, 33, 43, 1, 28, 32, 44, 27, 45, 26, 46]; or [4, 5, 6, 8, 10, 13, 15, 16, 17, 18, 21, 22, 24, 25, 31, 35, 36, 37, 39, 41, 3, 7, 9, 12, 14, 20, 23, 30, 34, 38, 40, 42, 2, 11, 19, 29, 33, 43, 1, 28, 32, 44, 26, 46, 27, 45]; |

TABLE 2-continued

| Typical K1, typical CRC polynomial | Typical K1, typical CRC polynomial |
|---|---|
| 40, 0x4D | [2, 3, 4, 6, 7, 9, 11, 14, 15, 16, 17, 21, 22, 25, 31, 33, 34, 35, 37, 38, 40, 41, 1, 5, 8, 10, 13, 20, 24, 30, 32, 36, 39, 42, 12, 19, 23, 29, 43, 18, 28, 44, 27, 45, 26, 46]; or [1, 3, 5, 6, 11, 12, 13, 16, 17, 19, 20, 21, 22, 23, 25, 29, 32, 34, 36, 37, 43, 7, 9, 10, 14, 18, 24, 28, 38, 40, 44, 2, 4, 15, 31, 33, 35, 41, 8, 30, 39, 42, 27, 45, 26, 46]; |
| 40, 0x7B | [1, 2, 5, 9, 11, 13, 14, 15, 16, 18, 19, 21, 24, 25, 31, 32, 33, 36, 40, 41, 4, 8, 10, 12, 17, 20, 23, 30, 35, 39, 42, 3, 7, 22, 29, 34, 38, 43, 6, 28, 37, 44, 27, 45, 26, 46]; or [1, 2, 5, 9, 11, 13, 14, 15, 16, 18, 19, 21, 24, 25, 31, 32, 33, 36, 40, 41, 3, 6, 10, 12, 17, 20, 22, 26, 34, 37, 46, 4, 7, 23, 27, 35, 38, 45, 8, 30, 39, 42, 28, 44, 29, 43]; |
| 40, 0x5D | [2, 3, 6, 7, 9, 15, 17, 18, 21, 22, 24, 30, 32, 33, 36, 37, 39, 41, 1, 5, 8, 14, 16, 20, 23, 29, 31, 35, 38, 42, 4, 13, 19, 28, 34, 43, 12, 27, 44, 11, 26, 45, 10, 25, 40, 46]; or [2, 3, 6, 7, 9, 15, 17, 18, 21, 22, 24, 30, 32, 33, 36, 37, 39, 41, 1, 5, 8, 14, 16, 20, 23, 29, 31, 35, 38, 42, 4, 11, 19, 26, 34, 45, 10, 25, 40, 46, 13, 28, 43, 12, 27, 44]; |
| 40, 0xD3 | [1, 2, 3, 5, 6, 9, 10, 14, 17, 20, 21, 22, 25, 26, 27, 28, 29, 32, 38, 41, 4, 8, 13, 16, 19, 24, 31, 37, 42, 7, 12, 15, 18, 23, 30, 36, 40, 43, 11, 35, 39, 44, 34, 45, 33, 46, 47]; or [3, 4, 6, 8, 10, 13, 14, 16, 17, 19, 22, 24, 29, 31, 32, 37, 38, 42, 2, 7, 9, 11, 20, 25, 27, 34, 35, 40, 45, 5, 12, 15, 18, 21, 23, 28, 30, 36, 43, 1, 39, 44, 26, 33, 46, 41, 47]; |
| 40, 0xF7 | [1, 3, 5, 6, 7, 9, 12, 14, 16, 18, 19, 21, 22, 23, 26, 31, 35, 38, 41, 2, 4, 8, 11, 13, 15, 17, 20, 25, 30, 34, 37, 40, 42, 10, 24, 29, 33, 36, 39, 43, 28, 32, 44, 27, 45, 46, 47]; or [1, 3, 5, 6, 7, 9, 12, 14, 16, 18, 19, 21, 22, 23, 26, 31, 35, 38, 41, 2, 4, 8, 10, 13, 15, 17, 20, 24, 27, 32, 36, 39, 47, 11, 28, 29, 33, 34, 37, 40, 45, 25, 30, 43, 44, 42, 46]; |
| 40, 0xA7 | [1, 3, 4, 5, 6, 7, 13, 15, 16, 21, 26, 27, 28, 30, 34, 35, 39, 41, 2, 12, 14, 20, 25, 29, 33, 38, 42, 11, 19, 24, 32, 37, 40, 43, 10, 18, 23, 31, 36, 44, 9, 17, 22, 45, 8, 46, 47]; or [1, 3, 4, 5, 6, 7, 13, 15, 16, 21, 26, 27, 28, 30, 34, 35, 39, 41, 2, 12, 14, 20, 25, 29, 33, 38, 42, 8, 9, 17, 18, 23, 32, 36, 37, 46, 22, 31, 40, 47, 11, 19, 24, 43, 10, 44, 45]; |
| 40, 0xC1 | [6, 7, 12, 14, 18, 19, 20, 21, 24, 28, 30, 31, 34, 35, 36, 38, 40, 41, 5, 11, 13, 17, 23, 27, 29, 33, 37, 39, 42, 4, 10, 16, 22, 26, 32, 43, 3, 9, 15, 25, 44, 2, 8, 45, 1, 46, 47]; or [6, 7, 12, 14, 18, 19, 20, 21, 24, 28, 30, 31, 34, 35, 36, 38, 40, 41, 5, 11, 13, 17, 23, 27, 29, 33, 37, 39, 42, 4, 10, 16, 22, 26, 32, 43, 1, 8, 15, 25, 47, 3, 9, 44, 2, 45, 46]; |
| 40, 0x91 | [4, 7, 8, 12, 14, 15, 16, 18, 20, 21, 23, 24, 30, 31, 34, 35, 37, 39, 41, 3, 6, 11, 13, 17, 19, 22, 29, 33, 36, 38, 42, 2, 5, 10, 28, 32, 40, 43, 1, 9, 27, 44, 26, 45, 25, 46, 47]; or [4, 7, 8, 12, 14, 15, 16, 18, 20, 21, 23, 24, 30, 31, 34, 35, 37, 39, 41, 3, 6, 11, 13, 17, 19, 22, 29, 33, 36, 38, 42, 10, 26, 27, 40, 45, 2, 9, 25, 32, 46, 5, 28, 43, 1, 47, 44]; |
| 40, 0xED | [2, 3, 4, 5, 6, 10, 11, 12, 13, 15, 16, 18, 19, 20, 23, 26, 27, 29, 32, 34, 38, 41, 1, 9, 14, 17, 22, 25, 28, 31, 33, 37, 42, 8, 21, 24, 30, 36, 43, 7, 35, 40, 44, 39, 45, 46, 47]; or [2, 3, 4, 5, 6, 10, 11, 12, 13, 15, 16, 18, 19, 20, 23, 26, 27, 29, 32, 34, 38, 41, 1, 9, 14, 17, 22, 25, 28, 31, 33, 37, 42, 8, 21, 24, 30, 36, 43, 7, 35, 40, 44, 39, 46, 47, 45]; |
| 40, 0xA3 | [1, 2, 3, 4, 6, 7, 8, 9, 12, 13, 14, 16, 18, 19, 24, 26, 27, 28, 32, 33, 35, 36, 38, 41, 5, 11, 15, 17, 23, 25, 31, 34, 37, 40, 42, 10, 22, 30, 39, 43, 21, 29, 44, 20, 45, 46, 47]; or [4, 5, 9, 11, 14, 15, 16, 17, 19, 23, 24, 25, 28, 31, 33, 34, 36, 37, 38, 40, 42, 3, 8, 10, 13, 18, 22, 27, 30, 32, 35, 39, 43, 2, 7, 12, 21, 26, 29, 44, 1, 6, 20, 45, 41, 46, 47]; |
| 40, 0xA9 | [3, 5, 6, 7, 9, 10, 11, 12, 14, 17, 18, 20, 22, 24, 25, 27, 28, 33, 34, 35, 36, 37, 40, 41, 2, 4, 8, 13, 16, 19, 21, 23, 26, 32, 39, 42, 1, 15, 31, 38, 43, 30, 44, 29, 45, 46, 47]; or [2, 4, 5, 8, 10, 12, 15, 18, 19, 20, 21, 27, 28, 30, 31, 32, 35, 36, 40, 44, 1, 3, 7, 9, 11, 14, 17, 26, 29, 34, 39, 45, 6, 22, 24, 25, 33, 37, 41, 13, 16, 23, 42, 38, 43, 46, 47]; |
| 40, 0xD9 | [3, 4, 7, 8, 9, 10, 11, 13, 15, 16, 17, 19, 20, 22, 26, 27, 28, 35, 38, 39, 41, 2, 6, 12, 14, 18, 21, 25, 34, 37, 42, 1, 5, 24, 33, 36, 40, 43, 23, 32, 44, 31, 45, 30, 46, 29, 47]; or [2, 3, 5, 7, 9, 14, 15, 16, 17, 20, 21, 23, 24, 25, 28, 31, 37, 38, 40, 45, 1, 4, 6, 8, 13, 19, 22, 27, 30, 36, 39, 46, 10, 11, 26, 35, 41, 12, 18, 34, 42, 33, 43, 32, 44, 29, 47]; |
| 40, 0x8B | [1, 2, 4, 8, 15, 16, 17, 19, 23, 30, 31, 32, 34, 38, 41, 3, 7, 14, 18, 22, 29, 33, 37, 42, 6, 13, 21, 28, 36, 43, 5, 12, 20, 27, 35, 44, 11, 26, 45, 10, 25, 40, 46, 9, 24, 39, 47]; or [1, 2, 4, 8, 15, 16, 17, 19, 23, 30, 31, 32, 34, 38, 41, 5, 6, 12, 20, 21, 27, 35, 36, 44, 3, 7, 11, 18, 22, 26, 33, 37, 45, 10, 25, 40, 46, 9, 24, 39, 47, 14, 29, 42, 13, 28, 43]; |
| 40, 0xF3 | [1, 2, 3, 6, 7, 14, 15, 16, 17, 20, 21, 28, 29, 30, 31, 34, 35, 41, 5, 13, 19, 27, 33, 42, 4, 12, 18, 26, 32, 40, 43, 11, 25, 39, 44, 10, 24, 38, 45, 9, 23, 37, 46, 8, 22, 36, 47]; or [3, 5, 7, 13, 17, 19, 21, 27, 31, 33, 35, 42, 2, 4, 6, 12, 16, 18, 20, 26, 30, 32, 34, 40, 43, 1, 11, 15, 25, 29, 39, 44, 9, 23, 37, 46, 14, 28, 41, 10, 24, 38, 45, 8, 22, 36, 47]; |
| 40, 0x1E7 | [1, 3, 4, 5, 7, 10, 14, 15, 16, 17, 18, 19, 25, 26, 27, 29, 31, 34, 35, 37, 39, 40, 41, 2, 6, 9, 13, 24, 28, 30, 33, 36, 38, 42, 8, 12, 23, 32, 43, 11, 22, 44, 21, 45, 20, 46, 47, 48]; or [3, 6, 7, 8, 9, 10, 12, 14, |

TABLE 2-continued

| Typical K1, typical CRC polynomial | Typical K1, typical CRC polynomial |
|---|---|
| | 15, 16, 17, 19, 23, 25, 28, 30, 31, 32, 36, 40, 43, 2, 5, 11, 13, 18, 22, 24, 27, 29, 35, 39, 44, 1, 4, 21, 26, 34, 38, 45, 20, 33, 46, 37, 42, 47, 41, 48]; |
| 40, 0x165 | [2, 4, 5, 9, 10, 13, 14, 15, 22, 23, 24, 25, 26, 28, 31, 33, 35, 38, 41, 1, 3, 8, 12, 21, 27, 30, 32, 34, 37, 42, 7, 11, 20, 29, 36, 43, 6, 19, 44, 18, 40, 45, 17, 39, 46, 16, 47, 48]; or [2, 4, 5, 9, 10, 13, 14, 15, 22, 23, 24, 25, 26, 28, 31, 33, 35, 38, 41, 1, 3, 8, 12, 21, 27, 30, 32, 34, 37, 42, 7, 11, 20, 29, 36, 43, 6, 19, 44, 17, 18, 39, 46, 16, 40, 47, 48, 45]; |
| 40, 0x171 | [4, 5, 6, 10, 13, 15, 16, 17, 24, 25, 28, 31, 34, 35, 37, 38, 39, 41, 3, 9, 12, 14, 23, 27, 30, 33, 36, 42, 2, 8, 11, 22, 26, 29, 32, 40, 43, 1, 7, 21, 44, 20, 45, 19, 46, 18, 47, 48]; or [4, 5, 6, 10, 13, 15, 16, 17, 24, 25, 28, 31, 34, 35, 37, 38, 39, 41, 3, 9, 12, 14, 23, 27, 30, 33, 36, 42, 2, 7, 8, 18, 19, 26, 40, 47, 11, 22, 29, 32, 43, 1, 21, 44, 48, 20, 45, 46]; |
| 40, 0x18D | [2, 3, 4, 8, 9, 10, 12, 13, 14, 15, 19, 21, 22, 25, 26, 28, 29, 34, 35, 36, 37, 40, 41, 1, 7, 11, 18, 20, 24, 27, 33, 39, 42, 6, 17, 23, 32, 38, 43, 5, 16, 31, 44, 30, 45, 46, 47, 48]; or [4, 5, 6, 9, 12, 15, 16, 20, 23, 24, 25, 27, 29, 31, 32, 34, 38, 44, 3, 8, 11, 14, 19, 22, 26, 28, 30, 33, 37, 45, 2, 7, 10, 13, 18, 21, 36, 40, 46, 1, 17, 35, 39, 47, 41, 48, 42, 43]; |
| 40, 0x1FD | [2, 3, 5, 6, 8, 10, 14, 16, 18, 20, 21, 25, 26, 27, 30, 31, 33, 36, 37, 40, 41, 1, 4, 7, 9, 13, 15, 17, 19, 24, 29, 32, 35, 39, 42, 12, 23, 28, 34, 38, 43, 11, 22, 44, 45, 46, 47, 48]; or [1, 2, 4, 6, 7, 9, 13, 14, 15, 16, 22, 25, 26, 28, 29, 34, 36, 45, 10, 12, 18, 20, 24, 30, 31, 35, 37, 40, 46, 3, 5, 8, 21, 27, 33, 41, 11, 17, 19, 32, 38, 48, 39, 42, 23, 43, 44, 47]; |
| 40, 0x1C1 | [6, 7, 8, 12, 14, 16, 18, 19, 21, 23, 28, 30, 31, 34, 35, 39, 40, 41, 5, 11, 13, 15, 17, 20, 22, 27, 29, 33, 38, 42, 4, 10, 26, 32, 37, 43, 3, 9, 25, 36, 44, 2, 24, 45, 1, 46, 47, 48]; or [6, 7, 8, 12, 14, 16, 18, 19, 21, 23, 28, 30, 31, 34, 35, 39, 40, 41, 5, 11, 13, 15, 17, 20, 22, 27, 29, 33, 38, 42, 4, 10, 26, 32, 37, 43, 1, 9, 24, 36, 48, 3, 25, 44, 2, 45, 46, 47]; |
| 40, 0x1E9 | [3, 5, 7, 8, 9, 10, 11, 12, 15, 21, 22, 23, 24, 25, 27, 30, 31, 32, 33, 35, 36, 37, 38, 41, 2, 4, 6, 14, 20, 26, 29, 34, 42, 1, 13, 19, 28, 40, 43, 18, 39, 44, 17, 45, 16, 46, 47, 48]; or [1, 2, 4, 5, 6, 7, 8, 14, 16, 17, 22, 27, 28, 29, 31, 35, 36, 40, 47, 3, 10, 11, 15, 18, 19, 20, 23, 25, 34, 37, 38, 39, 44, 9, 24, 30, 33, 45, 12, 21, 32, 41, 26, 42, 13, 43, 48, 46]; |
| 40, 0x119 | [3, 4, 6, 9, 10, 11, 14, 15, 18, 21, 23, 24, 25, 31, 32, 33, 34, 38, 39, 40, 41, 2, 5, 8, 13, 17, 20, 22, 30, 37, 42, 1, 7, 12, 16, 19, 29, 36, 43, 28, 35, 44, 27, 45, 26, 46, 47, 48]; or [4, 7, 8, 10, 13, 14, 15, 18, 19, 22, 25, 27, 28, 29, 35, 36, 37, 38, 45, 3, 6, 9, 12, 17, 21, 24, 26, 34, 46, 2, 5, 11, 16, 20, 23, 33, 40, 47, 31, 32, 39, 41, 30, 42, 1, 48, 43, 44]; |
| 40, 0x1B3 | [1, 2, 3, 7, 12, 13, 15, 18, 19, 21, 22, 24, 25, 26, 27, 28, 29, 31, 32, 33, 35, 36, 39, 40, 41, 6, 11, 14, 17, 20, 23, 30, 34, 38, 42, 5, 10, 16, 37, 43, 4, 9, 44, 8, 45, 46, 47, 48]; or [3, 6, 7, 11, 13, 14, 15, 17, 19, 20, 22, 23, 29, 30, 33, 34, 36, 38, 42, 2, 9, 10, 16, 18, 25, 26, 32, 37, 39, 46, 5, 12, 21, 28, 35, 40, 43, 1, 8, 24, 31, 47, 4, 27, 44, 41, 45, 48]; |
| 40, 0x1D9 | [3, 4, 7, 9, 10, 11, 13, 14, 15, 16, 17, 22, 23, 27, 28, 30, 31, 32, 36, 38, 39, 41, 2, 6, 8, 12, 21, 26, 29, 35, 37, 40, 42, 1, 5, 20, 25, 34, 43, 19, 24, 33, 44, 18, 45, 46, 47, 48]; or [2, 3, 4, 5, 8, 9, 10, 13, 17, 18, 19, 21, 24, 27, 29, 34, 36, 38, 39, 45, 1, 7, 12, 16, 20, 23, 26, 28, 33, 35, 37, 46, 6, 14, 25, 30, 31, 47, 11, 15, 22, 32, 41, 44, 40, 42, 48, 43]; |
| 40, 0x157 | [1, 3, 6, 7, 8, 13, 14, 15, 16, 17, 18, 20, 24, 26, 27, 29, 30, 31, 33, 34, 35, 36, 37, 41, 2, 5, 12, 19, 23, 25, 28, 32, 40, 42, 4, 11, 22, 39, 43, 10, 21, 38, 44, 9, 45, 46, 47, 48]; or [1, 2, 3, 5, 8, 12, 18, 19, 20, 23, 24, 25, 27, 28, 31, 32, 37, 40, 42, 4, 7, 9, 11, 15, 16, 21, 26, 29, 30, 34, 36, 45, 6, 13, 14, 22, 33, 35, 39, 43, 10, 38, 44, 46, 17, 41, 47, 48]; |
| 40, 0x1B1 | [4, 5, 7, 10, 12, 13, 16, 17, 19, 20, 21, 22, 25, 26, 27, 29, 30, 33, 36, 37, 41, 3, 6, 9, 11, 15, 18, 24, 28, 32, 35, 40, 42, 2, 8, 14, 23, 31, 34, 39, 43, 1, 38, 44, 45, 46, 47, 48]; or [4, 5, 7, 10, 12, 13, 16, 17, 19, 20, 21, 22, 25, 26, 27, 29, 30, 33, 36, 37, 41, 1, 3, 6, 8, 9, 15, 18, 23, 32, 38, 39, 45, 11, 24, 28, 35, 40, 42, 14, 31, 34, 48, 2, 43, 46, 47, 44]; |
| 40, 0x139 | [3, 4, 5, 6, 9, 17, 20, 21, 22, 23, 26, 34, 37, 38, 39, 40, 41, 2, 8, 16, 19, 25, 33, 36, 42, 1, 7, 15, 18, 24, 32, 35, 43, 14, 31, 44, 13, 30, 45, 12, 29, 46, 11, 28, 47, 10, 27, 48]; or [3, 6, 7, 8, 9, 12, 20, 23, 24, 25, 26, 29, 37, 40, 46, 1, 5, 13, 18, 22, 30, 35, 39, 45, 2, 11, 19, 28, 36, 47, 4, 17, 21, 34, 38, 41, 16, 33, 42, 15, 32, 43, 14, 31, 44, 10, 27, 48]; |

TABLE 2-continued

| Typical K1, typical CRC polynomial | Typical K1, typical CRC polynomial |
|---|---|
| 40, 0x1D7 | [1, 3, 6, 8, 9, 17, 18, 20, 23, 25, 26, 34, 35, 37, 40, 41, 2, 5, 7, 16, 19, 22, 24, 33, 36, 39, 42, 4, 15, 21, 32, 38, 43, 14, 31, 44, 13, 30, 45, 12, 29, 46, 11, 28, 47, 10, 27, 48]; or [2, 6, 7, 8, 9, 13, 19, 23, 24, 25, 26, 30, 36, 40, 45, 1, 3, 17, 18, 20, 34, 35, 37, 41, 5, 12, 22, 29, 39, 46, 4, 10, 21, 27, 38, 48, 15, 32, 43, 14, 31, 44, 11, 28, 47, 16, 33, 42]; |
| 40, 0x101 | [8, 16, 24, 32, 40, 41, 7, 15, 23, 31, 39, 42, 6, 14, 22, 30, 38, 43, 5, 13, 21, 29, 37, 44, 4, 12, 20, 28, 36, 45, 3, 11, 19, 27, 35, 46, 2, 10, 18, 26, 34, 47, 1, 9, 17, 25, 33, 48]; |
| 48, 0x9 | [3, 6, 9, 12, 15, 18, 21, 24, 27, 30, 33, 36, 39, 42, 45, 48, 49, 2, 5, 8, 11, 14, 17, 20, 23, 26, 29, 32, 35, 38, 41, 44, 47, 50, 1, 4, 7, 10, 13, 16, 19, 22, 25, 28, 31, 34, 37, 40, 43, 46, 51]; |
| 48, 0xD | [2, 3, 4, 7, 9, 10, 11, 14, 16, 17, 18, 21, 23, 24, 25, 28, 30, 31, 32, 35, 37, 38, 39, 42, 44, 45, 46, 49, 1, 6, 8, 13, 15, 20, 22, 27, 29, 34, 36, 41, 43, 48, 50, 5, 12, 19, 26, 33, 40, 47, 51]; |
| 48, 0x19 | [3, 4, 6, 8, 9, 10, 11, 15, 18, 19, 21, 23, 24, 25, 26, 30, 33, 34, 36, 38, 39, 40, 41, 45, 48, 49, 2, 5, 7, 14, 17, 20, 22, 29, 32, 35, 37, 44, 47, 50, 1, 13, 16, 28, 31, 43, 46, 51, 12, 27, 42, 52]; or [3, 4, 6, 8, 9, 10, 11, 15, 18, 19, 21, 23, 24, 25, 26, 30, 33, 34, 36, 38, 39, 40, 41, 45, 48, 49, 1, 5, 7, 12, 16, 20, 22, 27, 31, 35, 37, 42, 46, 52, 2, 14, 17, 29, 32, 44, 47, 50, 13, 28, 43, 51]; |
| 48, 0x1D | [2, 3, 7, 9, 10, 14, 16, 17, 21, 23, 24, 28, 30, 31, 35, 37, 38, 42, 44, 45, 49, 1, 6, 8, 13, 15, 20, 22, 27, 29, 34, 36, 41, 43, 48, 50, 5, 12, 19, 26, 33, 40, 47, 51, 4, 11, 18, 25, 32, 39, 46, 52]; or [2, 3, 7, 9, 10, 14, 16, 17, 21, 23, 24, 28, 30, 31, 35, 37, 38, 42, 44, 45, 49, 1, 6, 8, 13, 15, 20, 22, 27, 29, 34, 36, 41, 43, 48, 50, 4, 11, 18, 25, 32, 39, 46, 52, 5, 12, 19, 26, 33, 40, 47, 51]; |
| 48, 0x17 | [1, 3, 7, 8, 10, 14, 15, 17, 21, 22, 24, 28, 29, 31, 35, 36, 38, 42, 43, 45, 49, 2, 6, 9, 13, 16, 20, 23, 27, 30, 34, 37, 41, 44, 48, 50, 5, 12, 19, 26, 33, 40, 47, 51, 4, 11, 18, 25, 32, 39, 46, 52]; or [1, 3, 7, 8, 10, 14, 15, 17, 21, 22, 24, 28, 29, 31, 35, 36, 38, 42, 43, 45, 49, 2, 5, 9, 12, 16, 19, 23, 26, 30, 33, 37, 40, 44, 47, 51, 4, 11, 18, 25, 32, 39, 46, 52, 6, 13, 20, 27, 34, 41, 48, 50]; |
| 48, 0x1F | [1, 5, 6, 10, 11, 15, 16, 20, 21, 25, 26, 30, 31, 35, 36, 40, 41, 45, 46, 49, 4, 9, 14, 19, 24, 29, 34, 39, 44, 50, 3, 8, 13, 18, 23, 28, 33, 38, 43, 48, 51, 2, 7, 12, 17, 22, 27, 32, 37, 42, 47, 52]; |
| 48, 0x29 | [3, 5, 6, 9, 10, 11, 12, 13, 17, 18, 20, 21, 22, 24, 26, 31, 34, 36, 37, 40, 41, 42, 43, 44, 48, 49, 2, 4, 8, 16, 19, 23, 25, 30, 33, 35, 39, 47, 50, 1, 7, 15, 29, 32, 38, 46, 51, 14, 28, 45, 52, 27, 53]; or [3, 5, 6, 9, 10, 11, 12, 13, 17, 18, 20, 21, 22, 24, 26, 31, 34, 36, 37, 40, 41, 42, 43, 44, 48, 49, 2, 7, 8, 14, 15, 19, 23, 28, 33, 38, 39, 45, 46, 52, 1, 4, 25, 27, 32, 35, 53, 16, 30, 47, 50, 29, 51]; |
| 48, 0x2F | [1, 4, 7, 8, 9, 10, 11, 13, 14, 15, 19, 21, 23, 24, 26, 31, 32, 35, 38, 39, 40, 41, 42, 44, 45, 46, 49, 3, 6, 12, 18, 20, 22, 25, 30, 34, 37, 43, 50, 2, 5, 17, 29, 33, 36, 48, 51, 16, 28, 47, 52, 27, 53]; or [1, 3, 4, 6, 11, 12, 15, 18, 19, 20, 21, 22, 24, 25, 26, 30, 32, 34, 35, 37, 42, 43, 46, 50, 7, 8, 9, 10, 13, 14, 23, 31, 38, 39, 40, 41, 44, 45, 49, 2, 5, 17, 29, 33, 36, 48, 51, 16, 28, 47, 52, 27, 53]; |
| 48, 0x35 | [2, 5, 6, 8, 9, 10, 15, 17, 20, 21, 23, 24, 25, 30, 32, 35, 36, 38, 39, 40, 45, 47, 49, 1, 4, 7, 14, 16, 19, 22, 29, 31, 34, 37, 44, 46, 50, 3, 13, 18, 28, 33, 43, 48, 51, 12, 27, 42, 52, 11, 26, 41, 53]; or [2, 5, 6, 8, 9, 10, 15, 17, 20, 21, 23, 24, 25, 30, 32, 35, 36, 38, 39, 40, 45, 47, 49, 1, 4, 7, 14, 16, 19, 22, 29, 31, 34, 37, 44, 46, 50, 3, 11, 18, 26, 33, 41, 48, 53, 13, 28, 43, 51, 12, 27, 42, 52]; |
| 48, 0x73 | [1, 2, 3, 6, 9, 11, 13, 16, 17, 19, 24, 28, 30, 31, 33, 34, 35, 36, 37, 38, 40, 42, 43, 44, 48, 49, 5, 8, 10, 12, 15, 18, 23, 27, 29, 32, 39, 41, 47, 50, 4, 7, 14, 22, 26, 46, 51, 21, 25, 45, 52, 20, 53, 54]; or [1, 2, 3, 6, 9, 11, 13, 16, 17, 19, 24, 28, 30, 31, 33, 34, 35, 36, 37, 38, 40, 42, 43, 44, 48, 49, 4, 7, 10, 12, 14, 18, 20, 25, 29, 32, 39, 41, 45, 54, 5, 8, 15, 23, 27, 47, 50, 21, 26, 46, 53, 22, 51, 52]; |
| 48, 0x61 | [5, 6, 10, 12, 15, 16, 17, 18, 20, 24, 25, 26, 29, 32, 34, 35, 37, 38, 39, 41, 42, 45, 46, 48, 49, 4, 9, 11, 14, 19, 23, 28, 31, 33, 36, 40, 44, 47, 50, 3, 8, 13, 22, 27, 30, 43, 51, 2, 7, 21, 52, 1, 53, 54]; or [5, 6, 10, 12, 15, 16, 17, 18, 20, 24, 25, 26, 29, 32, 34, 35, 37, 38, 39, 41, 42, 45, 46, 48, 49, 4, 9, 11, 14, 19, 23, 28, 31, 33, 36, 40, 44, 47, 50, 1, 7, 13, 21, 27, 30, 43, 54, 3, 8, 22, 51, 2, 52, 53]; |
| 48, 0x71 | [4, 5, 6, 8, 10, 13, 15, 16, 17, 18, 21, 22, 24, 25, 31, 35, 36, 37, 39, 41, 44, 46, 47, 48, 49, 3, 7, 9, 12, 14, 20, 23, 30, 34, 38, 40, 43, 45, 50, 2, 11, 19, 29, 33, 42, 51, 1, 28, 32, 52, 27, 53, 26, 54]; or [4, 5, 6, 8, 10, 13, 15, 16, 17, 18, 21, 22, 24, 25, 31, 35, 36, 37, 39, 41, 44, 46, 47, 48, 49, 1, 7, 9, 11, 14, 19, 23, 26, 32, 38, 40, 42, 45, 54, 3, 12, 20, 30, 34, 43, 50, 2, 29, 33, 51, 28, 52, 27, 53]; |
| 48, 0x4D | [2, 3, 4, 6, 7, 9, 11, 14, 15, 16, 17, 21, 22, 25, 31, 33, 34, 35, 37, 38, 40, 42, 45, 46, 47, 48, 49, 1, 5, 8, 10, 13, 20, 24, 30, 32, 36, 39, 41, 44, 50, 12, 19, 23, 29, 43, 51, 18, 28, 52, 27, 53, 26, 54]; or [3, 5, 6, 7, 9, 10, 12, 14, 17, 18, 19, 20, 24, 25, 28, 34, 36, 37, 38, 40, 41, 43, |

TABLE 2-continued

| Typical K1, typical CRC polynomial | Typical K1, typical CRC polynomial |
|---|---|
| | 45, 48, 52, 1, 11, 13, 16, 21, 22, 23, 29, 32, 42, 44, 47, 51, 2, 4, 8, 27, 33, 35, 39, 53, 15, 31, 46, 49, 30, 50, 26, 54]; |
| 48, 0x7B | [1, 2, 5, 9, 11, 13, 14, 15, 16, 18, 19, 21, 24, 25, 31, 32, 33, 36, 40, 42, 44, 45, 46, 47, 49, 4, 8, 10, 12, 17, 20, 23, 30, 35, 39, 41, 43, 48, 50, 3, 7, 22, 29, 34, 38, 51, 6, 28, 37, 52, 27, 53, 26, 54]; or [1, 2, 5, 9, 11, 13, 14, 15, 16, 18, 19, 21, 24, 25, 31, 32, 33, 36, 40, 42, 44, 45, 46, 47, 49, 4, 6, 7, 10, 12, 22, 23, 27, 35, 37, 38, 41, 43, 53, 3, 17, 20, 26, 34, 48, 54, 8, 30, 39, 50, 29, 51, 28, 52]; |
| 48, 0x5D | [2, 3, 6, 7, 9, 15, 17, 18, 21, 22, 24, 30, 32, 33, 36, 37, 39, 45, 47, 48, 49, 1, 5, 8, 14, 16, 20, 23, 29, 31, 35, 38, 44, 46, 50, 4, 13, 19, 28, 34, 43, 51, 12, 27, 42, 52, 11, 26, 41, 53, 10, 25, 40, 54]; or [2, 4, 5, 8, 9, 11, 17, 19, 20, 23, 24, 26, 32, 34, 35, 38, 39, 41, 47, 53, 3, 6, 7, 15, 18, 21, 22, 30, 33, 36, 37, 45, 48, 49, 1, 14, 16, 29, 31, 44, 46, 50, 10, 25, 40, 54, 12, 27, 42, 52, 13, 28, 43, 51]; |
| 48, 0xD3 | [1, 2, 3, 5, 6, 9, 10, 14, 17, 20, 21, 22, 25, 26, 27, 28, 29, 32, 38, 42, 43, 45, 47, 49, 4, 8, 13, 16, 19, 24, 31, 37, 41, 44, 46, 48, 50, 7, 12, 15, 18, 23, 30, 36, 40, 51, 11, 35, 39, 52, 34, 53, 33, 54, 55]; or [2, 6, 7, 9, 11, 13, 16, 17, 19, 20, 22, 25, 27, 32, 34, 35, 40, 41, 44, 46, 47, 48, 53, 1, 3, 5, 10, 14, 21, 26, 28, 29, 38, 42, 43, 45, 49, 8, 12, 15, 18, 24, 31, 33, 39, 54, 4, 37, 50, 23, 30, 55, 36, 51, 52]; |
| 48, 0xF7 | [1, 3, 5, 6, 7, 9, 12, 14, 16, 18, 19, 21, 22, 23, 26, 31, 35, 38, 41, 42, 43, 44, 46, 48, 49, 2, 4, 8, 11, 13, 15, 17, 20, 25, 30, 34, 37, 40, 45, 47, 50, 10, 24, 29, 33, 36, 39, 51, 28, 32, 52, 27, 53, 54, 55]; or [1, 3, 5, 6, 7, 9, 12, 14, 16, 18, 19, 21, 22, 23, 26, 31, 35, 38, 41, 42, 43, 44, 46, 48, 49, 2, 4, 8, 10, 13, 15, 17, 20, 24, 27, 32, 36, 39, 45, 47, 55, 11, 28, 29, 33, 34, 37, 40, 53, 25, 30, 51, 52, 54, 50]; |
| 48, 0xA7 | [1, 3, 4, 5, 6, 7, 13, 15, 16, 21, 26, 27, 28, 30, 34, 35, 39, 42, 43, 44, 47, 49, 2, 12, 14, 20, 25, 29, 33, 38, 41, 46, 48, 50, 11, 19, 24, 32, 37, 40, 45, 51, 10, 18, 23, 31, 36, 52, 9, 17, 22, 53, 8, 54, 55]; or [1, 3, 4, 5, 6, 7, 13, 15, 16, 21, 26, 27, 28, 30, 34, 35, 39, 42, 43, 44, 47, 49, 2, 8, 9, 17, 18, 23, 29, 32, 36, 37, 41, 45, 46, 54, 12, 14, 20, 25, 33, 38, 48, 50, 22, 31, 40, 55, 11, 19, 24, 51, 10, 52, 53]; |
| 48, 0xC1 | [6, 7, 12, 14, 18, 19, 20, 21, 24, 28, 30, 31, 34, 35, 36, 38, 40, 43, 44, 45, 46, 47, 49, 5, 11, 13, 17, 23, 27, 29, 33, 37, 39, 42, 48, 50, 4, 10, 16, 22, 26, 32, 41, 51, 3, 9, 15, 25, 52, 2, 8, 53, 1, 54, 55]; |
| 48, 0x91 | [4, 7, 8, 12, 14, 15, 16, 18, 20, 21, 23, 24, 30, 31, 34, 35, 37, 39, 42, 43, 44, 47, 48, 49, 3, 6, 11, 13, 17, 19, 22, 29, 33, 36, 38, 41, 46, 50, 2, 5, 10, 28, 32, 40, 45, 51, 1, 9, 27, 52, 26, 53, 25, 54, 55]; or [3, 7, 10, 11, 15, 17, 18, 19, 21, 23, 24, 26, 27, 33, 34, 37, 38, 40, 42, 45, 46, 47, 53, 2, 6, 9, 14, 16, 20, 22, 25, 32, 36, 39, 41, 44, 54, 4, 8, 12, 30, 31, 35, 43, 48, 49, 1, 5, 13, 55, 29, 50, 28, 51, 52]; |
| 48, 0xED | [2, 3, 4, 5, 6, 10, 11, 12, 13, 15, 16, 18, 19, 20, 23, 26, 27, 29, 32, 34, 38, 43, 44, 47, 48, 49, 1, 9, 14, 17, 22, 25, 28, 31, 33, 37, 42, 46, 50, 8, 21, 24, 30, 36, 41, 45, 51, 7, 35, 40, 52, 39, 53, 54, 55]; or [2, 3, 4, 5, 6, 10, 11, 12, 13, 15, 16, 18, 19, 20, 23, 26, 27, 29, 32, 34, 38, 43, 44, 47, 48, 49, 1, 8, 22, 24, 25, 30, 31, 33, 35, 36, 39, 40, 46, 54, 7, 14, 17, 21, 28, 45, 55, 9, 37, 42, 50, 41, 52, 53, 51]; |
| 48, 0xA3 | [1, 2, 3, 4, 6, 7, 8, 9, 12, 13, 14, 16, 18, 19, 24, 26, 27, 28, 32, 33, 35, 36, 38, 41, 45, 48, 49, 5, 11, 15, 17, 23, 25, 31, 34, 37, 40, 44, 47, 50, 10, 22, 30, 39, 43, 46, 51, 21, 29, 42, 52, 20, 53, 54, 55]; or [4, 5, 9, 11, 14, 15, 16, 17, 19, 23, 24, 25, 28, 31, 33, 34, 36, 37, 38, 40, 41, 44, 45, 47, 50, 3, 8, 10, 13, 18, 22, 27, 30, 32, 35, 39, 43, 46, 48, 51, 2, 7, 12, 21, 26, 29, 42, 52, 1, 6, 49, 20, 53, 54, 55]; |
| 48, 0xA9 | [3, 5, 6, 7, 9, 10, 11, 12, 14, 17, 18, 20, 22, 24, 25, 27, 28, 33, 34, 35, 36, 37, 40, 44, 45, 48, 49, 2, 4, 8, 13, 16, 19, 21, 23, 26, 32, 39, 43, 47, 50, 1, 15, 31, 38, 42, 46, 51, 30, 41, 52, 29, 53, 54, 55]; or [2, 4, 5, 8, 10, 12, 15, 18, 19, 20, 21, 27, 28, 30, 31, 32, 35, 36, 40, 41, 42, 44, 46, 47, 48, 52, 3, 6, 7, 9, 11, 14, 17, 22, 24, 25, 33, 34, 37, 45, 49, 1, 26, 29, 39, 43, 53, 13, 16, 38, 54, 23, 55, 50, 51]; |
| 48, 0xD9 | [3, 4, 7, 8, 9, 10, 11, 13, 15, 16, 17, 19, 20, 22, 26, 27, 28, 35, 38, 39, 42, 43, 44, 45, 46, 48, 49, 2, 6, 12, 14, 18, 21, 25, 34, 37, 41, 47, 50, 1, 5, 24, 33, 36, 40, 51, 23, 32, 52, 31, 53, 30, 54, 29, 55]; or [2, 3, 5, 7, 9, 14, 15, 16, 17, 20, 21, 23, 24, 25, 28, 31, 37, 38, 40, 42, 44, 53, 1, 4, 6, 8, 13, 19, 22, 27, 30, 36, 39, 41, 43, 48, 54, 11, 12, 26, 32, 46, 47, 52, 10, 35, 45, 49, 18, 34, 50, 29, 55, 33, 51]; |
| 48, 0x8B | [1, 2, 4, 8, 15, 16, 17, 19, 23, 30, 31, 32, 34, 38, 45, 46, 47, 49, 3, 7, 14, 18, 22, 29, 33, 37, 44, 48, 50, 6, 13, 21, 28, 36, 43, 51, 5, 12, 20, 27, 35, 42, 52, 11, 26, 41, 53, 10, 25, 40, 54, 9, 24, 39, 55]; or [4, 5, 6, 8, 12, 19, 20, 21, 23, 27, 34, 35, 36, 38, 42, 52, 3, 7, 11, 18, 22, 26, 33, 37, 41, 48, 53, 1, 2, 15, 16, 17, 30, 31, 32, 45, 46, 47, 49, 10, 25, 40, 54, 9, 24, 39, 55, 14, 29, 44, 50, 13, 28, 43, 51]; |
| 48, 0xF3 | [1, 2, 3, 6, 7, 14, 15, 16, 17, 20, 21, 28, 29, 30, 31, 34, 35, 42, 43, 44, 45, 48, 49, 5, 13, 19, 27, 33, 41, 47, 50, 4, 12, 18, 26, 32, 40, 46, 51, 11, 25, 39, 52, 10, 24, 38, 53, 9, 23, 37, 54, 8, 22, 36, 55]; or [3, |

TABLE 2-continued

| Typical K1, typical CRC polynomial | Typical K1, typical CRC polynomial |
|---|---|
| | 5, 7, 13, 17, 19, 21, 27, 31, 33, 35, 41, 45, 47, 50, 1, 9, 15, 23, 29, 37, 43, 54, 2, 4, 6, 12, 16, 18, 20, 26, 30, 32, 34, 40, 44, 46, 48, 51, 11, 25, 39, 52, 14, 28, 42, 49, 10, 24, 38, 53, 8, 22, 36, 55]; |
| 48, 0x1E7 | [1, 3, 4, 5, 7, 10, 14, 15, 16, 17, 18, 19, 25, 26, 27, 29, 31, 34, 35, 37, 39, 40, 45, 46, 49, 2, 6, 9, 13, 24, 28, 30, 33, 36, 38, 44, 50, 8, 12, 23, 32, 43, 48, 51, 11, 22, 42, 47, 52, 21, 41, 53, 20, 54, 55, 56]; or [1, 6, 9, 10, 11, 12, 13, 15, 17, 18, 19, 20, 22, 26, 28, 31, 33, 34, 35, 39, 43, 46, 54, 2, 5, 7, 24, 27, 29, 30, 36, 37, 38, 40, 44, 50, 3, 8, 14, 16, 23, 25, 32, 48, 51, 42, 45, 47, 52, 4, 21, 41, 53, 49, 55, 56]; |
| 48, 0x165 | [2, 4, 5, 9, 10, 13, 14, 15, 22, 23, 24, 25, 26, 28, 31, 33, 35, 38, 44, 49, 1, 3, 8, 12, 21, 27, 30, 32, 34, 37, 43, 48, 50, 7, 11, 20, 29, 36, 42, 47, 51, 6, 19, 41, 46, 52, 18, 40, 45, 53, 17, 39, 54, 16, 55, 56]; or [2, 4, 5, 9, 10, 13, 14, 15, 22, 23, 24, 25, 26, 28, 31, 33, 35, 38, 44, 49, 1, 3, 8, 12, 21, 27, 30, 32, 34, 37, 43, 48, 50, 6, 7, 11, 16, 17, 40, 46, 55, 29, 36, 39, 45, 56, 18, 41, 47, 54, 20, 42, 51, 19, 52, 53]; |
| 48, 0x171 | [4, 5, 6, 10, 13, 15, 16, 17, 24, 25, 28, 31, 34, 35, 37, 38, 39, 42, 48, 49, 3, 9, 12, 14, 23, 27, 30, 33, 36, 41, 47, 50, 2, 8, 11, 22, 26, 29, 32, 40, 46, 51, 1, 7, 21, 45, 52, 20, 44, 53, 19, 43, 54, 18, 55, 56]; or [4, 5, 6, 10, 13, 15, 16, 17, 24, 25, 28, 31, 34, 35, 37, 38, 39, 42, 48, 49, 3, 9, 12, 14, 23, 27, 30, 33, 36, 41, 47, 50, 2, 7, 8, 18, 19, 26, 40, 44, 55, 1, 11, 29, 32, 43, 56, 22, 46, 51, 21, 45, 52, 20, 53, 54]; |
| 48, 0x18D | [2, 3, 4, 8, 9, 10, 12, 13, 14, 15, 19, 21, 22, 25, 26, 28, 29, 34, 35, 36, 37, 40, 41, 42, 47, 49, 1, 7, 11, 18, 20, 24, 27, 33, 39, 46, 48, 50, 6, 17, 23, 32, 38, 45, 51, 5, 16, 31, 44, 52, 30, 43, 53, 54, 55, 56]; or [4, 5, 6, 9, 12, 15, 16, 20, 23, 24, 25, 27, 29, 31, 32, 34, 38, 42, 44, 47, 52, 3, 8, 11, 14, 19, 22, 26, 28, 30, 33, 37, 41, 43, 46, 53, 2, 7, 10, 13, 18, 21, 36, 40, 45, 54, 1, 17, 35, 39, 48, 55, 49, 50, 56, 51]; |
| 48, 0x1FD | [2, 3, 5, 6, 8, 10, 14, 16, 18, 20, 21, 25, 26, 27, 30, 31, 33, 36, 37, 40, 41, 42, 44, 49, 1, 4, 7, 9, 13, 15, 17, 19, 24, 29, 32, 35, 39, 43, 48, 50, 12, 23, 28, 34, 38, 47, 51, 11, 22, 46, 52, 45, 53, 54, 55, 56]; or [1, 2, 4, 6, 7, 9, 13, 14, 15, 16, 22, 25, 26, 28, 29, 34, 36, 43, 44, 45, 47, 48, 53, 10, 12, 18, 20, 24, 30, 31, 35, 37, 40, 41, 46, 54, 3, 5, 8, 21, 27, 33, 42, 49, 17, 19, 32, 39, 50, 11, 38, 56, 23, 51, 52, 55]; |
| 48, 0x1C1 | [6, 7, 8, 12, 14, 16, 18, 19, 21, 23, 28, 30, 31, 34, 35, 39, 40, 43, 45, 48, 49, 5, 11, 13, 15, 17, 20, 22, 27, 29, 33, 38, 42, 44, 47, 50, 4, 10, 26, 32, 37, 41, 46, 51, 3, 9, 25, 36, 52, 2, 24, 53, 1, 54, 55, 56]; or [6, 7, 8, 12, 14, 16, 18, 19, 21, 23, 28, 30, 31, 34, 35, 39, 40, 43, 45, 48, 49, 1, 9, 13, 15, 17, 20, 22, 24, 29, 32, 36, 41, 44, 46, 56, 5, 11, 27, 33, 38, 42, 47, 50, 4, 10, 26, 37, 51, 3, 25, 52, 2, 53, 54, 55]; |
| 48, 0x1E9 | [3, 5, 7, 8, 9, 10, 11, 12, 15, 21, 22, 23, 24, 25, 27, 30, 31, 32, 33, 35, 36, 37, 38, 42, 44, 45, 46, 49, 2, 4, 6, 14, 20, 26, 29, 34, 41, 43, 48, 50, 1, 13, 19, 28, 40, 47, 51, 18, 39, 52, 17, 53, 16, 54, 55, 56]; or [1, 2, 4, 5, 6, 7, 8, 14, 16, 17, 22, 27, 28, 29, 31, 35, 36, 40, 43, 44, 45, 48, 55, 3, 10, 11, 15, 18, 19, 20, 23, 25, 34, 37, 38, 39, 41, 47, 52, 9, 12, 21, 24, 30, 32, 33, 42, 46, 49, 53, 26, 50, 13, 56, 51, 54]; |
| 48, 0x119 | [3, 4, 6, 9, 10, 11, 14, 15, 18, 21, 23, 24, 25, 31, 32, 33, 34, 38, 39, 40, 42, 44, 45, 48, 49, 2, 5, 8, 13, 17, 20, 22, 30, 37, 41, 43, 47, 50, 1, 7, 12, 16, 19, 29, 36, 46, 51, 28, 35, 52, 27, 53, 26, 54, 55, 56]; or [4, 7, 8, 10, 13, 14, 15, 18, 19, 22, 25, 27, 28, 29, 35, 36, 37, 38, 42, 43, 44, 46, 48, 53, 3, 6, 9, 11, 21, 23, 24, 31, 32, 33, 34, 39, 40, 45, 49, 12, 17, 26, 41, 47, 54, 2, 5, 16, 20, 55, 1, 56, 30, 50, 51, 52]; |
| 48, 0x1B3 | [1, 2, 3, 7, 12, 13, 15, 18, 19, 21, 22, 24, 25, 26, 27, 28, 29, 31, 32, 33, 35, 36, 39, 40, 41, 43, 47, 49, 6, 11, 14, 17, 20, 23, 30, 34, 38, 42, 46, 48, 50, 5, 10, 16, 37, 45, 51, 4, 9, 44, 52, 8, 53, 54, 55, 56]; or [2, 6, 9, 10, 14, 16, 17, 18, 20, 22, 23, 25, 26, 32, 33, 36, 37, 39, 41, 44, 45, 46, 54, 1, 5, 8, 13, 15, 19, 21, 24, 31, 35, 38, 40, 43, 48, 55, 3, 7, 11, 29, 30, 34, 42, 47, 50, 12, 28, 51, 4, 27, 52, 49, 56, 53]; |
| 48, 0x1D9 | [3, 4, 7, 9, 10, 11, 13, 14, 15, 16, 17, 22, 23, 27, 28, 30, 31, 32, 36, 38, 39, 41, 42, 44, 46, 47, 48, 49, 2, 6, 8, 12, 21, 26, 29, 35, 37, 40, 43, 45, 50, 1, 5, 20, 25, 34, 51, 19, 24, 33, 52, 18, 53, 54, 55, 56]; or [2, 3, 4, 5, 8, 9, 10, 13, 17, 18, 19, 21, 24, 27, 29, 34, 36, 38, 39, 47, 53, 1, 7, 12, 16, 20, 23, 26, 28, 33, 35, 37, 46, 54, 6, 15, 22, 25, 30, 31, 32, 42, 43, 45, 52, 14, 41, 44, 55, 11, 48, 49, 40, 56, 50, 51]; |
| 48, 0x157 | [1, 3, 6, 7, 8, 13, 14, 15, 16, 17, 18, 20, 24, 26, 27, 29, 30, 31, 33, 34, 35, 36, 37, 41, 42, 46, 49, 2, 5, 12, 19, 23, 25, 28, 32, 40, 45, 48, 50, 4, 11, 22, 39, 44, 47, 51, 10, 21, 38, 43, 52, 9, 53, 54, 55, 56]; or [1, 2, 3, 5, 8, 12, 18, 19, 20, 23, 24, 25, 27, 28, 31, 32, 37, 40, 42, 45, 46, 48, 50, 4, 6, 11, 13, 14, 15, 16, 22, 29, 33, 34, 35, 39, 44, 47, 51, 7, 10, 21, 36, 38, 41, 43, 52, 9, 26, 30, 53, 54, 17, 49, 55, 56]; |
| 48, 0x1B1 | [4, 5, 7, 10, 12, 13, 16, 17, 19, 20, 21, 22, 25, 26, 27, 29, 30, 33, 36, 37, 41, 42, 43, 49, 3, 6, 9, 11, 15, 18, 24, 28, 32, 35, 40, 50, 2, 8, 14, 23, 31, 34, 39, 51, 1, 38, 48, 52, 47, 53, 46, 54, 45, 55, 44, 56]; |
| 48, 0x139 | [3, 4, 5, 6, 9, 17, 20, 21, 22, 23, 26, 34, 37, 38, 39, 40, 43, 49, 2, 8, 16, 19, 25, 33, 36, 42, 50, 1, 7, 15, 18, 24, 32, 35, 41, 51, 14, 31, 48, 52, 13, 30, 47, 53, 12, 29, 46, 54, 11, 28, 45, 55, 10, 27, 44, 56]; |

TABLE 2-continued

| Typical K1, typical CRC polynomial | Typical K1, typical CRC polynomial |
|---|---|
| 48, 0x1D7 | [1, 3, 6, 8, 9, 17, 18, 20, 23, 25, 26, 34, 35, 37, 40, 42, 43, 49, 2, 5, 7, 16, 19, 22, 24, 33, 36, 39, 41, 50, 4, 15, 21, 32, 38, 51, 14, 31, 48, 52, 13, 30, 47, 53, 12, 29, 46, 54, 11, 28, 45, 55, 10, 27, 44, 56]; or [1, 3, 6, 8, 9, 17, 18, 20, 23, 25, 26, 34, 35, 37, 40, 42, 43, 49, 2, 4, 5, 15, 19, 21, 22, 32, 36, 38, 39, 51, 14, 31, 48, 52, 7, 13, 24, 30, 41, 47, 53, 12, 29, 46, 54, 10, 27, 44, 56, 16, 33, 50, 11, 28, 45, 55] |
| 48, 0x101 | [8, 16, 24, 32, 40, 48, 49, 7, 15, 23, 31, 39, 47, 50, 6, 14, 22, 30, 38, 46, 51, 5, 13, 21, 29, 37, 45, 52, 4, 12, 20, 28, 36, 44, 53, 3, 11, 19, 27, 35, 43, 54, 2, 10, 18, 26, 34, 42, 55, 1, 9, 17, 25, 33, 41, 56] |
| 50, 0x9 | [3, 6, 9, 12, 15, 18, 21, 24, 27, 30, 33, 36, 39, 42, 45, 48, 51, 2, 5, 8, 11, 14, 17, 20, 23, 26, 29, 32, 35, 38, 41, 44, 47, 50, 52, 1, 4, 7, 10, 13, 16, 19, 22, 25, 28, 31, 34, 37, 40, 43, 46, 49, 53] |
| 50, 0xD | [2, 3, 4, 7, 9, 10, 11, 14, 16, 17, 18, 21, 23, 24, 25, 28, 30, 31, 32, 35, 37, 38, 39, 42, 44, 45, 46, 49, 51, 1, 6, 8, 13, 15, 20, 22, 27, 29, 34, 36, 41, 43, 48, 50, 52, 5, 12, 19, 26, 33, 40, 47, 53] |
| 50, 0x19 | [3, 4, 6, 8, 9, 10, 11, 15, 18, 19, 21, 23, 24, 25, 26, 30, 33, 34, 36, 38, 39, 40, 41, 45, 48, 49, 51, 2, 5, 7, 14, 17, 20, 22, 29, 32, 35, 37, 44, 47, 50, 52, 1, 13, 16, 28, 31, 43, 46, 53, 12, 27, 42, 54] |
| 50, 0x1D | [2, 3, 7, 9, 10, 14, 16, 17, 21, 23, 24, 28, 30, 31, 35, 37, 38, 42, 44, 45, 49, 51, 1, 6, 8, 13, 15, 20, 22, 27, 29, 34, 36, 41, 43, 48, 50, 52, 5, 12, 19, 26, 33, 40, 47, 53, 4, 11, 18, 25, 32, 39, 46, 54]; or [2, 3, 7, 9, 10, 14, 16, 17, 21, 23, 24, 28, 30, 31, 35, 37, 38, 42, 44, 45, 49, 51, 1, 6, 8, 13, 15, 20, 22, 27, 29, 34, 36, 41, 43, 48, 50, 52, 4, 11, 18, 25, 32, 39, 46, 54, 5, 12, 19, 26, 33, 40, 47, 53] |
| 50, 0x17 | [1, 3, 7, 8, 10, 14, 15, 17, 21, 22, 24, 28, 29, 31, 35, 36, 38, 42, 43, 45, 49, 50, 51, 2, 6, 9, 13, 16, 20, 23, 27, 30, 34, 37, 41, 44, 48, 52, 5, 12, 19, 26, 33, 40, 47, 53, 4, 11, 18, 25, 32, 39, 46, 54]; or [2, 3, 5, 9, 10, 12, 16, 17, 19, 23, 24, 26, 30, 31, 33, 37, 38, 40, 44, 45, 47, 53, 1, 7, 8, 14, 15, 21, 22, 28, 29, 35, 36, 42, 43, 49, 50, 51, 4, 11, 18, 25, 32, 39, 46, 54, 6, 13, 20, 27, 34, 41, 48, 52] |
| 50, 0x1F | [1, 5, 6, 10, 11, 15, 16, 20, 21, 25, 26, 30, 31, 35, 36, 40, 41, 45, 46, 50, 51, 4, 9, 14, 19, 24, 29, 34, 39, 44, 49, 52, 3, 8, 13, 18, 23, 28, 33, 38, 43, 48, 53, 2, 7, 12, 17, 22, 27, 32, 37, 42, 47, 54] |
| 50, 0x29 | [3, 5, 6, 9, 10, 11, 12, 13, 17, 18, 20, 21, 22, 24, 26, 31, 34, 36, 37, 40, 41, 42, 43, 44, 48, 49, 51, 2, 4, 8, 16, 19, 23, 25, 30, 33, 35, 39, 47, 50, 52, 1, 7, 15, 29, 32, 38, 46, 53, 14, 28, 45, 54, 27, 55]; or [3, 5, 6, 9, 10, 11, 12, 13, 17, 18, 20, 21, 22, 24, 26, 31, 34, 36, 37, 40, 41, 42, 43, 44, 48, 49, 51, 2, 7, 8, 14, 15, 19, 23, 28, 33, 38, 39, 45, 46, 50, 54, 4, 16, 25, 30, 35, 47, 52, 1, 27, 32, 55, 29, 53] |
| 50, 0x2F | [1, 4, 7, 8, 9, 10, 11, 13, 14, 15, 19, 21, 23, 24, 26, 31, 32, 35, 38, 39, 40, 41, 42, 44, 45, 46, 50, 51, 3, 6, 12, 18, 20, 22, 25, 30, 34, 37, 43, 49, 52, 2, 5, 17, 29, 33, 36, 48, 53, 16, 28, 47, 54, 27, 55]; or [1, 3, 4, 6, 11, 12, 15, 18, 19, 20, 21, 22, 24, 25, 26, 30, 32, 34, 35, 37, 42, 43, 46, 49, 50, 52, 7, 8, 9, 10, 13, 14, 23, 31, 38, 39, 40, 41, 44, 45, 51, 2, 16, 17, 28, 33, 47, 48, 54, 5, 27, 36, 55, 29, 53] |
| 50, 0x35 | [2, 5, 6, 8, 9, 10, 15, 17, 20, 21, 23, 24, 25, 30, 32, 35, 36, 38, 39, 40, 45, 47, 50, 51, 1, 4, 7, 14, 16, 19, 22, 29, 31, 34, 37, 44, 46, 49, 52, 3, 13, 18, 28, 33, 43, 48, 53, 12, 27, 42, 54, 11, 26, 41, 55]; or [2, 5, 6, 8, 9, 10, 15, 17, 20, 21, 23, 24, 25, 30, 32, 35, 36, 38, 39, 40, 45, 47, 50, 51, 1, 3, 7, 11, 16, 18, 22, 26, 31, 33, 37, 41, 46, 48, 55, 4, 14, 19, 29, 34, 44, 49, 52, 13, 28, 43, 53, 12, 27, 42, 54] |
| 50, 0x73 | [1, 2, 3, 6, 9, 11, 13, 16, 17, 19, 24, 28, 30, 31, 33, 34, 35, 36, 37, 38, 40, 42, 43, 44, 48, 49, 51, 5, 8, 10, 12, 15, 18, 23, 27, 29, 32, 39, 41, 47, 52, 4, 7, 14, 22, 26, 46, 50, 53, 21, 25, 45, 54, 20, 55, 56]; or [1, 2, 3, 6, 9, 11, 13, 16, 17, 19, 24, 28, 30, 31, 33, 34, 35, 36, 37, 38, 40, 42, 43, 44, 48, 49, 51, 5, 8, 10, 12, 15, 18, 23, 27, 29, 32, 39, 41, 47, 52, 7, 14, 20, 21, 25, 26, 46, 55, 4, 45, 50, 56, 22, 53, 54] |
| 50, 0x61 | [5, 6, 10, 12, 15, 16, 17, 18, 20, 24, 25, 26, 29, 32, 34, 35, 37, 38, 39, 41, 42, 45, 46, 48, 50, 51, 4, 9, 11, 14, 19, 23, 28, 31, 33, 36, 40, 44, 47, 49, 52, 3, 8, 13, 22, 27, 30, 43, 53, 2, 7, 21, 54, 1, 55, 56]; or [5, 6, 10, 12, 15, 16, 17, 18, 20, 24, 25, 26, 29, 32, 34, 35, 37, 38, 39, 41, 42, 45, 46, 48, 50, 51, 4, 9, 11, 14, 19, 23, 28, 31, 33, 36, 40, 44, 47, 49, 52, 1, 7, 13, 21, 27, 30, 43, 56, 3, 8, 22, 53, 2, 54, 55] |
| 50, 0x71 | [4, 5, 6, 8, 10, 13, 15, 16, 17, 18, 21, 22, 24, 25, 31, 35, 36, 37, 39, 41, 44, 46, 47, 48, 49, 51, 3, 7, 9, 12, 14, 20, 23, 30, 34, 38, 40, 43, 45, 52, 2, 11, 19, 29, 33, 42, 50, 53, 1, 28, 32, 54, 27, 55, 26, 56]; or [4, 5, 6, 8, 10, 13, 15, 16, 17, 18, 21, 22, 24, 25, 31, 35, 36, 37, 39, 41, 44, 46, 47, 48, 49, 51, 3, 7, 9, 12, 14, 20, 23, 30, 34, 38, 40, 43, 45, 52, 2, 11, 19, 29, 33, 42, 50, 53, 1, 26, 32, 56, 28, 54, 27, 55] |
| 50, 0x4D | [2, 3, 4, 6, 7, 9, 11, 14, 15, 16, 17, 21, 22, 25, 31, 33, 34, 35, 37, 38, 40, 42, 45, 46, 47, 48, 51, 1, 5, 8, 10, 13, 20, 24, 30, 32, 36, 39, 41, 44, 52, 12, 19, 23, 29, 43, 50, 53, 18, 28, 49, 54, 27, 55, 26, 56] |
| 50, 0x7B | [1, 2, 5, 9, 11, 13, 14, 15, 16, 18, 19, 21, 24, 25, 31, 32, 33, 36, 40, 42, 44, 45, 46, 47, 49, 50, 51, 4, 8, 10, 12, 17, 20, 23, 30, 35, 39, 41, 43, 48, 52, 3, 7, 22, 29, 34, 38, 53, 6, 28, 37, 54, 27, 55, 26, 56]; or [1, 2, 5, 9, 11, 13, 14, 15, 16, 18, 19, 21, 24, 25, 31, 32, 33, 36, 40, |

TABLE 2-continued

| Typical K1, typical CRC polynomial | Typical K1, typical CRC polynomial |
|---|---|
| | 42, 44, 45, 46, 47, 49, 50, 51, 3, 6, 7, 8, 10, 17, 23, 28, 34, 37, 38, 39, 41, 48, 54, 12, 20, 22, 26, 43, 56, 4, 30, 35, 52, 27, 55, 29, 53]; |
| 50, 0x5D | [2, 3, 6, 7, 9, 15, 17, 18, 21, 22, 24, 30, 32, 33, 36, 37, 39, 45, 47, 48, 51, 1, 5, 8, 14, 16, 20, 23, 29, 31, 35, 38, 44, 46, 50, 52, 4, 13, 19, 28, 34, 43, 49, 53, 12, 27, 42, 54, 11, 26, 41, 55, 10, 25, 40, 56]; or [2, 3, 6, 7, 9, 15, 17, 18, 21, 22, 24, 30, 32, 33, 36, 37, 39, 45, 47, 48, 51, 1, 5, 8, 14, 16, 20, 23, 29, 31, 35, 38, 44, 46, 50, 52, 4, 11, 19, 26, 34, 41, 49, 55, 10, 25, 40, 56, 12, 27, 42, 54, 13, 28, 43, 53]; |
| 50, 0xD3 | [1, 2, 3, 5, 6, 9, 10, 14, 17, 20, 21, 22, 25, 26, 27, 28, 29, 32, 38, 42, 43, 45, 47, 49, 51, 4, 8, 13, 16, 19, 24, 31, 37, 41, 44, 46, 48, 52, 7, 12, 15, 18, 23, 30, 36, 40, 50, 53, 11, 35, 39, 54, 34, 55, 33, 56, 57]; or [1, 2, 3, 5, 6, 9, 10, 14, 17, 20, 21, 22, 25, 26, 27, 28, 29, 32, 38, 42, 43, 45, 47, 49, 51, 7, 11, 13, 16, 19, 34, 35, 40, 41, 44, 46, 48, 50, 55, 4, 8, 24, 31, 37, 52, 12, 15, 18, 33, 39, 56, 23, 30, 57, 36, 53, 54]; |
| 50, 0xF7 | [1, 3, 5, 6, 7, 9, 12, 14, 16, 18, 19, 21, 22, 23, 26, 31, 35, 38, 41, 42, 43, 44, 46, 48, 51, 2, 4, 8, 11, 13, 15, 17, 20, 25, 30, 34, 37, 40, 45, 47, 52, 10, 24, 29, 33, 36, 39, 53, 28, 32, 54, 27, 50, 55, 49, 56, 57]; or [1, 3, 5, 6, 7, 9, 12, 14, 16, 18, 19, 21, 22, 23, 26, 31, 35, 38, 41, 42, 43, 44, 46, 48, 51, 2, 4, 8, 10, 13, 15, 17, 20, 24, 27, 32, 36, 39, 45, 47, 49, 57, 11, 25, 29, 30, 33, 34, 37, 53, 28, 40, 54, 50, 55, 52, 56]; |
| 50, 0xA7 | [1, 3, 4, 5, 6, 7, 13, 15, 16, 21, 26, 27, 28, 30, 34, 35, 39, 42, 43, 44, 47, 49, 51, 2, 12, 14, 20, 25, 29, 33, 38, 41, 46, 48, 52, 11, 19, 24, 32, 37, 40, 45, 50, 53, 10, 18, 23, 31, 36, 54, 9, 17, 22, 55, 8, 56, 57]; or [1, 3, 4, 5, 6, 7, 13, 15, 16, 21, 26, 27, 28, 30, 34, 35, 39, 42, 43, 44, 47, 49, 51, 2, 8, 9, 17, 18, 23, 29, 32, 36, 37, 41, 45, 46, 56, 12, 14, 20, 25, 33, 38, 48, 52, 22, 31, 40, 50, 57, 11, 19, 24, 53, 10, 54, 55]; |
| 50, 0xC1 | [6, 7, 12, 14, 18, 19, 20, 21, 24, 28, 30, 31, 34, 35, 36, 38, 40, 43, 44, 45, 46, 47, 49, 51, 5, 11, 13, 17, 23, 27, 29, 33, 37, 39, 42, 48, 52, 4, 10, 16, 22, 26, 32, 41, 53, 3, 9, 15, 25, 54, 2, 8, 50, 55, 1, 56, 57]; or [6, 7, 12, 14, 18, 19, 20, 21, 24, 28, 30, 31, 34, 35, 36, 38, 40, 43, 44, 45, 46, 47, 49, 51, 5, 11, 13, 17, 23, 27, 29, 33, 37, 39, 42, 48, 52, 4, 10, 16, 22, 26, 32, 41, 53, 3, 9, 15, 25, 54, 2, 8, 50, 55, 1, 57, 56]; |
| 50, 0x91 | [4, 7, 8, 12, 14, 15, 16, 18, 20, 21, 23, 24, 30, 31, 34, 35, 37, 39, 42, 43, 44, 47, 48, 49, 50, 51, 3, 6, 11, 13, 17, 19, 22, 29, 33, 36, 38, 41, 46, 52, 2, 5, 10, 28, 32, 40, 45, 53, 1, 9, 27, 54, 26, 55, 25, 56, 57]; or [3, 7, 10, 11, 15, 17, 18, 19, 21, 23, 24, 26, 27, 33, 34, 37, 38, 40, 42, 45, 46, 47, 50, 55, 2, 6, 9, 14, 16, 20, 22, 25, 32, 36, 39, 41, 44, 49, 56, 4, 8, 12, 30, 31, 35, 43, 48, 51, 13, 29, 52, 1, 5, 57, 28, 53, 54]; |
| 50, 0xED | [2, 3, 4, 5, 6, 10, 11, 12, 13, 15, 16, 18, 19, 20, 23, 26, 27, 29, 32, 34, 38, 43, 44, 47, 48, 49, 51, 1, 9, 14, 17, 22, 25, 28, 31, 33, 37, 42, 46, 50, 52, 8, 21, 24, 30, 36, 41, 45, 53, 7, 35, 40, 54, 39, 55, 56, 57]; or [1, 2, 3, 8, 11, 15, 16, 18, 19, 22, 24, 25, 27, 29, 30, 31, 33, 34, 35, 36, 39, 40, 44, 46, 48, 56, 4, 5, 6, 10, 12, 13, 20, 23, 26, 32, 38, 43, 47, 49, 51, 9, 14, 17, 28, 37, 42, 50, 52, 7, 41, 45, 54, 21, 57, 53, 55]; |
| 50, 0xA3 | [1, 2, 3, 4, 6, 7, 8, 9, 12, 13, 14, 16, 18, 19, 24, 26, 27, 28, 32, 33, 35, 36, 38, 41, 45, 48, 49, 51, 5, 11, 15, 17, 23, 25, 31, 34, 37, 40, 44, 47, 52, 10, 22, 30, 39, 43, 46, 50, 53, 21, 29, 42, 54, 20, 55, 56, 57]; or [4, 5, 9, 11, 14, 15, 16, 17, 19, 23, 24, 25, 28, 31, 33, 34, 36, 37, 38, 40, 41, 44, 45, 47, 49, 52, 3, 8, 10, 13, 18, 22, 27, 30, 32, 35, 39, 43, 46, 48, 50, 53, 1, 2, 6, 7, 12, 26, 51, 21, 29, 42, 54, 20, 56, 55, 57]; |
| 50, 0xA9 | [3, 5, 6, 7, 9, 10, 11, 12, 14, 17, 18, 20, 22, 24, 25, 27, 28, 33, 34, 35, 36, 37, 40, 44, 45, 48, 49, 50, 51, 2, 4, 8, 13, 16, 19, 21, 23, 26, 32, 39, 43, 47, 52, 1, 15, 31, 38, 42, 46, 53, 30, 41, 54, 29, 55, 56, 57]; or [2, 4, 5, 8, 10, 12, 15, 18, 19, 20, 21, 27, 28, 30, 31, 32, 35, 36, 40, 41, 42, 44, 46, 47, 48, 49, 50, 54, 7, 9, 11, 13, 14, 16, 22, 24, 26, 29, 37, 38, 39, 56, 3, 6, 17, 25, 33, 34, 45, 51, 23, 43, 52, 1, 53, 55, 57]; |
| 50, 0xD9 | [3, 4, 7, 8, 9, 10, 11, 13, 15, 16, 17, 19, 20, 22, 26, 27, 28, 35, 38, 39, 42, 43, 44, 45, 46, 48, 50, 51, 2, 6, 12, 14, 18, 21, 25, 34, 37, 41, 47, 49, 52, 1, 5, 24, 33, 36, 40, 53, 23, 32, 54, 31, 55, 30, 56, 29, 57]; or [2, 3, 5, 7, 9, 14, 15, 16, 17, 20, 21, 23, 24, 25, 28, 31, 37, 38, 40, 42, 44, 49, 50, 55, 1, 4, 6, 8, 13, 19, 22, 27, 30, 36, 39, 41, 43, 48, 56, 10, 11, 26, 35, 45, 46, 51, 12, 32, 47, 54, 18, 29, 57, 34, 52, 33, 53]; |
| 50, 0x8B | [1, 2, 4, 8, 15, 16, 17, 19, 23, 30, 31, 32, 34, 38, 45, 46, 47, 49, 51, 3, 7, 14, 18, 22, 29, 33, 37, 44, 48, 52, 6, 13, 21, 28, 36, 43, 53, 5, 12, 20, 27, 35, 42, 50, 54, 11, 26, 41, 55, 10, 25, 40, 56, 9, 24, 39, 57]; or [4, 5, 6, 8, 12, 19, 20, 21, 23, 27, 34, 35, 36, 38, 42, 49, 50, 54, 1, 2, 15, 16, 17, 30, 31, 32, 45, 46, 47, 51, 3, 7, 11, 18, 22, 26, |

TABLE 2-continued

| Typical K1, typical CRC polynomial | Typical K1, typical CRC polynomial |
|---|---|
| | 33, 37, 41, 48, 55, 10, 25, 40, 56, 9, 24, 39, 57, 14, 29, 44, 52, 13, 28, 43, 53]; |
| 50, 0xF3 | [1, 2, 3, 6, 7, 14, 15, 16, 17, 20, 21, 28, 29, 30, 31, 34, 35, 42, 43, 44, 45, 48, 49, 51, 5, 13, 19, 27, 33, 41, 47, 52, 4, 12, 18, 26, 32, 40, 46, 53, 11, 25, 39, 54, 10, 24, 38, 55, 9, 23, 37, 56, 8, 22, 36, 50, 57]; or [3, 5, 7, 13, 17, 19, 21, 27, 31, 33, 35, 41, 45, 47, 49, 52, 2, 4, 6, 12, 16, 18, 20, 26, 30, 32, 34, 40, 44, 46, 48, 53, 1, 11, 15, 25, 29, 39, 43, 54, 9, 23, 37, 56, 14, 28, 42, 51, 10, 24, 38, 55, 8, 22, 36, 50, 57]; |
| 50, 0x1E7 | [1, 3, 4, 5, 7, 10, 14, 15, 16, 17, 18, 19, 25, 26, 27, 29, 31, 34, 35, 37, 39, 40, 45, 46, 50, 51, 2, 6, 9, 13, 24, 28, 30, 33, 36, 38, 44, 49, 52, 8, 12, 23, 32, 43, 48, 53, 11, 22, 42, 47, 54, 21, 41, 55, 20, 56, 57, 58]; or [3, 6, 7, 8, 9, 10, 12, 14, 15, 16, 17, 19, 23, 25, 28, 30, 31, 32, 36, 40, 43, 46, 48, 53, 2, 5, 11, 13, 18, 22, 24, 27, 29, 35, 39, 42, 45, 47, 54, 1, 20, 26, 33, 34, 49, 56, 37, 38, 44, 52, 4, 21, 41, 50, 55, 57, 51, 58]; |
| 50, 0x165 | [2, 4, 5, 9, 10, 13, 14, 15, 22, 23, 24, 25, 26, 28, 31, 33, 35, 38, 44, 49, 50, 51, 1, 3, 8, 12, 21, 27, 30, 32, 34, 37, 43, 48, 52, 7, 11, 20, 29, 36, 42, 47, 53, 6, 19, 41, 46, 54, 18, 40, 45, 55, 17, 39, 56, 16, 57, 58]; or [2, 4, 6, 7, 11, 12, 15, 16, 17, 24, 25, 26, 27, 28, 30, 33, 35, 37, 40, 46, 57, 5, 9, 10, 13, 14, 22, 23, 31, 38, 44, 49, 50, 51, 1, 3, 29, 32, 34, 36, 39, 45, 58, 8, 21, 43, 48, 52, 18, 41, 47, 56, 20, 42, 53, 19, 54, 55]; |
| 50, 0x171 | [4, 5, 6, 10, 13, 15, 16, 17, 24, 25, 28, 31, 34, 35, 37, 38, 39, 42, 48, 50, 51, 3, 9, 12, 14, 23, 27, 30, 33, 36, 41, 47, 49, 52, 2, 8, 11, 22, 26, 29, 32, 40, 46, 53, 1, 7, 21, 45, 54, 20, 44, 55, 19, 43, 56, 18, 57, 58]; or [4, 5, 6, 10, 13, 15, 16, 17, 24, 25, 28, 31, 34, 35, 37, 38, 39, 42, 48, 50, 51, 3, 9, 12, 14, 23, 27, 30, 33, 36, 41, 47, 49, 52, 2, 7, 8, 18, 19, 26, 40, 44, 57, 1, 11, 29, 32, 43, 58, 22, 46, 53, 21, 45, 54, 20, 55, 56]; |
| 50, 0x18D | [2, 3, 4, 8, 9, 10, 12, 13, 14, 15, 19, 21, 22, 25, 26, 28, 29, 34, 35, 36, 37, 40, 41, 42, 47, 49, 51, 1, 7, 11, 18, 20, 24, 27, 33, 39, 46, 48, 50, 52, 6, 17, 23, 32, 38, 45, 53, 5, 16, 31, 44, 54, 30, 43, 55, 56, 57, 58]; or [4, 5, 6, 9, 12, 15, 16, 20, 23, 24, 25, 27, 29, 31, 32, 34, 38, 42, 44, 47, 54, 3, 8, 11, 14, 19, 22, 26, 28, 30, 33, 37, 41, 43, 46, 50, 55, 2, 7, 10, 13, 18, 21, 36, 40, 45, 49, 56, 1, 17, 35, 39, 48, 57, 51, 52, 58, 53]; |
| 50, 0x1FD | [2, 3, 5, 6, 8, 10, 14, 16, 18, 20, 21, 25, 26, 27, 30, 31, 33, 36, 37, 40, 41, 42, 44, 49, 51, 1, 4, 7, 9, 13, 15, 17, 19, 24, 29, 32, 35, 39, 43, 48, 52, 12, 23, 28, 34, 38, 47, 53, 11, 22, 46, 50, 54, 45, 55, 56, 57, 58]; or [1, 2, 4, 6, 7, 9, 13, 14, 15, 16, 22, 25, 26, 28, 29, 34, 36, 43, 44, 45, 47, 48, 50, 55, 10, 12, 18, 20, 24, 30, 31, 35, 37, 40, 41, 46, 56, 3, 5, 8, 21, 27, 33, 42, 49, 51, 17, 19, 32, 39, 52, 11, 38, 58, 23, 53, 54, 57]; |
| 50, 0x1C1 | [6, 7, 8, 12, 14, 16, 18, 19, 21, 23, 28, 30, 31, 34, 35, 39, 40, 43, 45, 48, 49, 50, 51, 5, 11, 13, 15, 17, 20, 22, 27, 29, 33, 38, 42, 44, 47, 52, 4, 10, 26, 32, 37, 41, 46, 53, 3, 9, 25, 36, 54, 2, 24, 55, 1, 56, 57, 58]; or [6, 7, 8, 12, 14, 16, 18, 19, 21, 23, 28, 30, 31, 34, 35, 39, 40, 43, 45, 48, 49, 50, 51, 5, 11, 13, 15, 17, 20, 22, 27, 29, 33, 38, 42, 44, 47, 52, 1, 9, 24, 32, 36, 41, 46, 58, 4, 10, 26, 37, 53, 3, 25, 54, 2, 55, 56, 57]; |
| 50, 0x1E9 | [3, 5, 7, 8, 9, 10, 11, 12, 15, 21, 22, 23, 24, 25, 27, 30, 31, 32, 33, 35, 36, 37, 38, 42, 44, 45, 46, 49, 50, 51, 2, 4, 6, 14, 20, 26, 29, 34, 41, 43, 48, 52, 1, 13, 19, 28, 40, 47, 53, 18, 39, 54, 17, 55, 16, 56, 57, 58]; or [1, 2, 4, 5, 6, 7, 8, 14, 16, 17, 22, 27, 28, 29, 31, 35, 36, 40, 43, 44, 45, 48, 50, 57, 3, 10, 11, 15, 18, 19, 20, 23, 25, 34, 37, 38, 39, 41, 47, 49, 54, 9, 24, 30, 33, 42, 46, 55, 12, 21, 32, 51, 13, 26, 58, 52, 53, 56]; |
| 50, 0x119 | [3, 4, 6, 9, 10, 11, 14, 15, 18, 21, 23, 24, 25, 31, 32, 33, 34, 38, 39, 40, 42, 44, 45, 48, 49, 50, 51, 2, 5, 8, 13, 17, 20, 22, 30, 37, 41, 43, 47, 52, 1, 7, 12, 16, 19, 29, 36, 46, 53, 28, 35, 54, 27, 55, 26, 56, 57, 58]; or [4, 7, 8, 10, 13, 14, 15, 18, 19, 22, 25, 27, 28, 29, 35, 36, 37, 38, 42, 43, 44, 46, 48, 49, 55, 3, 6, 9, 12, 17, 21, 24, 26, 34, 41, 45, 47, 56, 2, 5, 11, 16, 20, 23, 33, 40, 50, 57, 31, 32, 39, 51, 1, 58, 30, 52, 53, 54]; |
| 50, 0x1B3 | [1, 2, 3, 7, 12, 13, 15, 18, 19, 21, 22, 24, 25, 26, 27, 28, 29, 31, 32, 33, 35, 36, 39, 40, 41, 43, 47, 49, 51, 6, 11, 14, 17, 20, 23, 30, 34, 38, 42, 46, 48, 52, 5, 10, 16, 37, 45, 50, 53, 4, 9, 44, 54, 8, 55, 56, 57, 58]; or [2, 6, 9, 10, 14, 16, 17, 18, 20, 22, 23, 25, 26, 32, 33, 36, 37, 39, 41, 44, 45, 46, 49, 50, 56, 3, 7, 11, 13, 15, 19, 29, 30, 34, 38, 42, 43, 47, 48, 52, 1, 5, 8, 21, 24, 31, 35, 40, 57, 12, 28, 53, 4, 27, 54, 51, 58, 55]; |
| 50, 0x1D9 | [3, 4, 7, 9, 10, 11, 13, 14, 15, 16, 17, 22, 23, 27, 28, 30, 31, 32, 36, 38, 39, 41, 42, 44, 46, 47, 48, 49, 51, 2, 6, 8, 12, 21, 26, 29, 35, 37, 40, 43, 45, 50, 52, 1, 5, 20, 25, 34, 53, 19, 24, 33, 54, 18, 55, 56, 57, 58]; or [2, 3, 4, 5, 8, 9, 10, 13, 17, 18, 19, 21, 24, 27, 29, 34, 36, 38, |

TABLE 2-continued

| Typical K1, typical CRC polynomial | Typical K1, typical CRC polynomial |
|---|---|
| | 39, 47, 50, 55, 1, 7, 12, 16, 20, 23, 26, 28, 33, 35, 37, 46, 49, 56, 6, 14, 25, 30, 31, 41, 42, 44, 45, 57, 15, 22, 32, 43, 54, 11, 48, 51, 40, 52, 53, 58]; |
| 50, 0x157 | [1, 3, 6, 7, 8, 13, 14, 15, 16, 17, 18, 20, 24, 26, 27, 29, 30, 31, 33, 34, 35, 36, 37, 41, 42, 46, 49, 50, 51, 2, 5, 12, 19, 23, 25, 28, 32, 40, 45, 48, 52, 4, 11, 22, 39, 44, 47, 53, 10, 21, 38, 43, 54, 9, 55, 56, 57, 58]; or [1, 2, 3, 5, 8, 12, 18, 19, 20, 23, 24, 25, 27, 28, 31, 32, 37, 40, 42, 45, 46, 48, 50, 52, 4, 6, 11, 13, 14, 15, 16, 22, 29, 33, 34, 35, 39, 44. 47, 53, 7, 9, 21, 26, 30, 36, 41, 43, 55, 10, 38, 49, 54, 56, 17, 57, 51, 58]; |
| 50, 0x1B1 | [4, 5, 7, 10, 12, 13, 16, 17, 19, 20, 21, 22, 25, 26, 27, 29, 30, 33, 36, 37, 41, 42, 43, 51, 3, 6, 9, 11, 15, 18, 24, 28, 32, 35, 40, 50, 52, 2, 8, 14, 23, 31, 34, 39, 49, 53, 1, 38, 48, 54, 47, 55, 46, 56, 45, 57, 44, 58]; |
| 50, 0x139 | [3, 4, 5, 6, 9, 17, 20, 21, 22, 23, 26, 34, 37, 38, 39, 40, 43, 51, 2, 8, 16, 19, 25, 33, 36, 42, 50, 52, 1, 7, 15, 18, 24, 32, 35, 41, 49, 53, 14, 31, 48, 54, 13, 30, 47, 55, 12, 29, 46, 56, 11, 28, 45, 57, 10, 27, 44, 58]; |
| 50, 0x1D7 | [1, 3, 6, 8, 9, 17, 18, 20, 23, 25, 26, 34, 35, 37, 40, 42, 43, 51, 2, 5, 7, 16, 19, 22, 24, 33, 36, 39, 41, 50, 52, 4, 15, 21, 32, 38, 49, 53, 14, 31, 48, 54, 13, 30, 47, 55, 12, 29, 46, 56, 11, 28, 45, 57, 10, 27, 44, 58]; or [1, 3, 6, 8, 9, 17, 18, 20, 23, 25, 26, 34, 35, 37, 40, 42, 43, 51, 2, 4, 5, 15, 19, 21, 22, 32, 36, 38, 39, 49, 53, 14, 31, 48, 54, 7, 13, 24, 30, 41, 47, 55, 12, 29, 46, 56, 10, 27, 44, 58, 16, 33, 50, 52, 11, 28, 45, 57]; |
| 50, 0x101 | [8, 16, 24, 32, 40, 48, 51, 7, 15, 23, 31, 39, 47, 52, 6, 14, 22, 30, 38, 46, 53, 5, 13, 21, 29, 37, 45, 54, 4, 12, 20, 28, 36, 44, 55, 3, 11, 19, 27, 35, 43, 56, 2, 10, 18, 26, 34, 42, 50, 57, 1, 9, 17, 25, 33, 41, 49, 58]; |
| 60, 0x9 | [3, 6, 9, 12, 15, 18, 21, 24, 27, 30, 33, 36, 39, 42, 45, 48, 51, 54, 57, 60, 61, 2, 5, 8, 11, 14, 17, 20, 23, 26, 29, 32, 35, 38, 41, 44, 47, 50, 53, 56, 59, 62, 1, 4, 7, 10, 13, 16, 19, 22, 25, 28, 31, 34, 37, 40, 43, 46, 49, 52, 55, 58, 63]; |
| 60, 0xD | [2, 3, 4, 7, 9, 10, 11, 14, 16, 17, 18, 21, 23, 24, 25, 28, 30, 31, 32, 35, 37, 38, 39, 42, 44, 45, 46, 49, 51, 52, 53, 56, 58, 59, 60, 61, 1, 6, 8, 13, 15, 20, 22, 27, 29, 34, 36, 41, 43, 48, 50, 55, 57, 62, 5, 12, 19, 26, 33, 40, 47, 54, 63]; |
| 60, 0x19 | [3, 4, 6, 8, 9, 10, 11, 15, 18, 19, 21, 23, 24, 25, 26, 30, 33, 34, 36, 38, 39, 40, 41, 45, 48, 49, 51, 53, 54, 55, 56, 60, 61, 2, 5, 7, 14, 17, 20, 22, 29, 32, 35, 37, 44, 47, 50, 52, 59, 62, 1, 13, 16, 28, 31, 43, 46, 58, 63, 12, 27, 42, 57, 64]; |
| 60, 0x1D | [2, 3, 7, 9, 10, 14, 16, 17, 21, 23, 24, 28, 30, 31, 35, 37, 38, 42, 44, 45, 49, 51, 52, 56, 58, 59, 61, 1, 6, 8, 13, 15, 20, 22, 27, 29, 34, 36, 41, 43, 48, 50, 55, 57, 62, 5, 12, 19, 26, 33, 40, 47, 54, 63, 4, 11, 18, 25, 32, 39, 46, 53, 60, 64]; or [2, 3, 7, 9, 10, 14, 16, 17, 21, 23, 24, 28, 30, 31, 35, 37, 38, 42, 44, 45, 49, 51, 52, 56, 58, 59, 61, 1, 6, 8, 13, 15, 20, 22, 27, 29, 34, 36, 41, 43, 48, 50, 55, 57, 62, 4, 11, 18, 25, 32, 39, 46, 53, 60, 64, 5, 12, 19, 26, 33, 40, 47, 54, 63]; |
| 60, 0x17 | [1, 3, 7, 8, 10, 14, 15, 17, 21, 22, 24, 28, 29, 31, 35, 36, 38, 42, 43, 45, 49, 50, 52, 56, 57, 59, 61, 2, 6, 9, 13, 16, 20, 23, 27, 30, 34, 37, 41, 44, 48, 51, 55, 58, 62, 5, 12, 19, 26, 33, 40, 47, 54, 63, 4, 11, 18, 25, 32, 39, 46, 53, 60, 64]; or [1, 3, 7, 8, 10, 14, 15, 17, 21, 22, 24, 28, 29, 31, 35, 36, 38, 42, 43, 45, 49, 50, 52, 56, 57, 59, 61, 2, 5, 9, 12, 16, 19, 23, 26, 30, 33, 37, 40, 44, 47, 51, 54, 58, 63, 4, 11, 18, 25, 32, 39, 46, 53, 60, 64, 6, 13, 20, 27, 34, 41, 48, 55, 62]; |
| 60, 0x1F | [1, 5, 6, 10, 11, 15, 16, 20, 21, 25, 26, 30, 31, 35, 36, 40, 41, 45, 46, 50, 51, 55, 56, 60, 61, 4, 9, 14, 19, 24, 29, 34, 39, 44, 49, 54, 59, 62, 3, 8, 13, 18, 23, 28, 33, 38, 43, 48, 53, 58, 63, 2, 7, 12, 17, 22, 27, 32, 37, 42, 47, 52, 57, 64]; |
| 60, 0x29 | [3, 5, 6, 9, 10, 11, 12, 13, 17, 18, 20, 21, 22, 24, 26, 31, 34, 36, 37, 40, 41, 42, 43, 44, 48, 49, 51, 52, 53, 55, 57, 61, 2, 4, 8, 16, 19, 23, 25, 30, 33, 35, 39, 47, 50, 54, 56, 62, 1, 7, 15, 29, 32, 38, 46, 60, 63, 14, 28, 45, 59, 64, 27, 58, 65]; |
| 60, 0x2F | [1, 4, 7, 8, 9, 10, 11, 13, 14, 15, 19, 21, 23, 24, 26, 31, 32, 35, 38, 39, 40, 41, 42, 44, 45, 46, 50, 52, 54, 55, 57, 61, 3, 6, 12, 18, 20, 22, 25, 30, 34, 37, 43, 49, 51, 53, 56, 62, 2, 5, 17, 29, 33, 36, 48, 60, 63, 16, 28, 47, 59, 64, 27, 58, 65]; |
| 60, 0x35 | [2, 5, 6, 8, 9, 10, 15, 17, 20, 21, 23, 24, 25, 30, 32, 35, 36, 38, 39, 40, 45, 47, 50, 51, 53, 54, 55, 60, 61, 1, 4, 7, 14, 16, 19, 22, 29, 31, 34, 37, 44, 46, 49, 52, 59, 62, 3, 13, 18, 28, 33, 43, 48, 58, 63, 12, 27, 42, 57, 64, 11, 26, 41, 56, 65]; or [2, 5, 6, 8, 9, 10, 15, 17, 20, 21, 23, 24, 25, 30, 32, 35, 36, 38, 39, 40, 45, 47, 50, 51, 53, 54, 55, 60, 61, 1, 4, 7, 14, 16, 19, 22, 29, 31, 34, 37, 44, 46, 49, 52, 59, 62, 3, 11, 18, 26, 33, 41, 48, 56, 65, 13, 28, 43, 58, 63, 12, 27, 42, 57, 64]; |

TABLE 2-continued

| Typical K1, typical CRC polynomial | Typical K1, typical CRC polynomial |
|---|---|
| 60, 0x73 | [1, 2, 3, 6, 9, 11, 13, 16, 17, 19, 24, 28, 30, 31, 33, 34, 35, 36, 37, 38, 40, 42, 43, 44, 48, 49, 52, 53, 54, 56, 57, 61, 5, 8, 10, 12, 15, 18, 23, 27, 29, 32, 39, 41, 47, 51, 55, 62, 4, 7, 14, 22, 26, 46, 50, 63, 21, 25, 45, 60, 64, 20, 59, 65, 58, 66]; |
| 60, 0x61 | [5, 6, 10, 12, 15, 16, 17, 18, 20, 24, 25, 26, 29, 32, 34, 35, 37, 38, 39, 41, 42, 45, 46, 48, 50, 52, 53, 54, 55, 56, 57, 61, 4, 9, 11, 14, 19, 23, 28, 31, 33, 36, 40, 44, 47, 49, 51, 62, 3, 8, 13, 22, 27, 30, 43, 63, 2, 7, 21, 60, 64, 1, 59, 65, 58, 66]; |
| 60, 0x71 | [4, 5, 6, 8, 10, 13, 15, 16, 17, 18, 21, 22, 24, 25, 31, 35, 36, 37, 39, 41, 44, 46, 47, 48, 49, 52, 53, 55, 56, 61, 3, 7, 9, 12, 14, 20, 23, 30, 34, 38, 40, 43, 45, 51, 54, 62, 2, 11, 19, 29, 33, 42, 50, 60, 63, 1, 28, 32, 59, 64, 27, 58, 65, 26, 57, 66]; or [4, 5, 6, 8, 10, 13, 15, 16, 17, 18, 21, 22, 24, 25, 31, 35, 36, 37, 39, 41, 44, 46, 47, 48, 49, 52, 53, 55, 56, 61, 3, 7, 9, 12, 14, 20, 23, 30, 34, 38, 40, 43, 45, 51, 54, 62, 2, 11, 19, 29, 33, 42, 50, 60, 63, 1, 28, 32, 59, 64, 26, 57, 66, 27, 58, 65]; |
| 60, 0x4D | [2, 3, 4, 6, 7, 9, 11, 14, 15, 16, 17, 21, 22, 25, 31, 33, 34, 35, 37, 38, 40, 42, 45, 46, 47, 48, 52, 53, 56, 61, 1, 5, 8, 10, 13, 20, 24, 30, 32, 36, 39, 41, 44, 51, 55, 62, 12, 19, 23, 29, 43, 50, 54, 60, 63, 18, 28, 49, 59, 64, 27, 58, 65, 26, 57, 66]; or [2, 3, 4, 6, 7, 9, 11, 14, 15, 16, 17, 21, 22, 25, 31, 33, 34, 35, 37, 38, 40, 42, 45, 46, 47, 48, 52, 53, 56, 61, 1, 5, 8, 10, 13, 20, 24, 30, 32, 36, 39, 41, 44, 51, 55, 62, 12, 18, 19, 28, 43, 49, 50, 59, 64, 23, 27, 54, 58, 65, 26, 57, 66, 29, 60, 63]; |
| 60, 0x7B | [1, 2, 5, 9, 11, 13, 14, 15, 16, 18, 19, 21, 24, 25, 31, 32, 33, 36, 40, 42, 44, 45, 46, 47, 49, 50, 52, 55, 56, 61, 4, 8, 10, 12, 17, 20, 23, 30, 35, 39, 41, 43, 48, 51, 54, 62, 3, 7, 22, 29, 34, 38, 53, 60, 63, 6, 28, 37, 59, 64, 27, 58, 65, 26, 57, 66]; or [1, 2, 5, 9, 11, 13, 14, 15, 16, 18, 19, 21, 24, 25, 31, 32, 33, 36, 40, 42, 44, 45, 46, 47, 49, 50, 52, 55, 56, 61, 3, 6, 7, 8, 10, 17, 23, 28, 34, 37, 38, 39, 41, 48, 54, 59, 64, 12, 20, 22, 26, 43, 51, 53, 57, 66, 4, 30, 35, 62, 29, 60, 63, 27, 58, 65]; |
| 60, 0x5D | [2, 3, 6, 7, 9, 15, 17, 18, 21, 22, 24, 30, 32, 33, 36, 37, 39, 45, 47, 48, 51, 52, 54, 60, 61, 1, 5, 8, 14, 16, 20, 23, 29, 31, 35, 38, 44, 46, 50, 53, 59, 62, 4, 13, 19, 28, 34, 43, 49, 58, 63, 12, 27, 42, 57, 64, 11, 26, 41, 56, 65, 10, 25, 40, 55, 66]; or [2, 3, 6, 7, 9, 15, 17, 18, 21, 22, 24, 30, 32, 33, 36, 37, 39, 45, 47, 48, 51, 52, 54, 60, 61, 1, 5, 8, 14, 16, 20, 23, 29, 31, 35, 38, 44, 46, 50, 53, 59, 62, 4, 11, 19, 26, 34, 41, 49, 56, 65, 10, 25, 40, 55, 66, 13, 28, 43, 58, 63, 12, 27, 42, 57, 64]; |
| 60, 0xD3 | [1, 2, 3, 5, 6, 9, 10, 14, 17, 20, 21, 22, 25, 26, 27, 28, 29, 32, 38, 42, 43, 45, 47, 49, 52, 53, 55, 56, 58, 61, 4, 8, 13, 16, 19, 24, 31, 37, 41, 44, 46, 48, 51, 54, 57, 60, 62, 7, 12, 15, 18, 23, 30, 36, 40, 50, 59, 63, 11, 35, 39, 64, 34, 65, 33, 66, 67]; or [1, 2, 3, 5, 6, 9, 10, 14, 17, 20, 21, 22, 25, 26, 27, 28, 29, 32, 38, 42, 43, 45, 47, 49, 52, 53, 55, 56, 58, 61, 4, 7, 11, 15, 18, 23, 30, 33, 39, 44, 46, 48, 50, 54, 57, 59, 67, 13, 16, 19, 34, 35, 40, 41, 51, 60, 65, 8, 24, 31, 37, 62, 12, 66, 36, 63, 64]; |
| 60, 0xF7 | [1, 3, 5, 6, 7, 9, 12, 14, 16, 18, 19, 21, 22, 23, 26, 31, 35, 38, 41, 42, 43, 44, 46, 48, 54, 56, 57, 58, 59, 61, 2, 4, 8, 11, 13, 15, 17, 20, 25, 30, 34, 37, 40, 45, 47, 53, 55, 62, 10, 24, 29, 33, 36, 39, 52, 60, 63, 28, 32, 51, 64, 27, 50, 65, 49, 66, 67]; or [1, 3, 5, 6, 7, 9, 12, 14, 16, 18, 19, 21, 22, 23, 26, 31, 35, 38, 41, 42, 43, 44, 46, 48, 54, 56, 57, 58, 59, 61, 2, 4, 8, 10, 13, 15, 17, 20, 24, 27, 32, 36, 39, 45, 47, 49, 55, 60, 67, 11, 28, 29, 33, 34, 37, 40, 50, 51, 65, 25, 30, 52, 53, 63, 64, 62, 66]; |
| 60, 0xA7 | [1, 3, 4, 5, 6, 7, 13, 15, 16, 21, 26, 27, 28, 30, 34, 35, 39, 42, 43, 44, 47, 49, 52, 53, 55, 58, 60, 61, 2, 12, 14, 20, 25, 29, 33, 38, 41, 46, 48, 51, 54, 57, 59, 62, 11, 19, 24, 32, 37, 40, 45, 50, 56, 63, 10, 18, 23, 31, 36, 64, 9, 17, 22, 65, 8, 66, 67]; or [1, 3, 4, 5, 6, 7, 13, 15, 16, 21, 26, 27, 28, 30, 34, 35, 39, 42, 43, 44, 47, 49, 52, 53, 55, 58, 60, 61, 2, 8, 9, 17, 18, 23, 29, 32, 36, 37, 41, 45, 46, 51, 54, 57, 66, 14, 22, 31, 40, 48, 50, 56, 59, 67, 12, 20, 25, 33, 38, 62, 11, 19, 24, 63, 10, 64, 65]; |
| 60, 0xC1 | [6, 7, 12, 14, 18, 19, 20, 21, 24, 28, 30, 31, 34, 35, 36, 38, 40, 43, 44, 45, 46, 47, 49, 54, 55, 56, 60, 61, 5, 11, 13, 17, 23, 27, 29, 33, 37, 39, 42, 48, 53, 59, 62, 4, 10, 16, 22, 26, 32, 41, 52, 58, 63, 3, 9, 15, 25, 51, 57, 64, 2, 8, 50, 65, 1, 66, 67]; or [6, 7, 12, 14, 18, 19, 20, 21, 24, 28, 30, 31, 34, 35, 36, 38, 40, 43, 44, 45, 46, 47, 49, 54, 55, 56, 60, 61, 5, 11, 13, 17, 23, 27, 29, 33, 37, 39, 42, 48, 53, 59, 62, 4, 10, 16, 22, 26, 32, 41, 52, 58, 63, 1, 8, 15, 25, 50, 57, 67, 3, 9, 51, 64, 2, 65, 66]; |
| 60, 0x91 | [4, 7, 8, 12, 14, 15, 16, 18, 20, 21, 23, 24, 30, 31, 34, 35, 37, 39, 42, 43, 44, 47, 48, 49, 50, 52, 53, 55, 60, 61, 3, 6, 11, 13, 17, 19, 22, 29, 33, 36, 38, 41, 46, 51, 54, 59, 62, 2, 5, 10, 28, 32, 40, 45, 58, 63, 1, 9, 27, 57, 64, 26, 56, 65, 25, 66, 67]; or [4, 7, 8, 12, 14, 15, 16, 18, |

TABLE 2-continued

| Typical K1, typical CRC polynomial | Typical K1, typical CRC polynomial |
|---|---|
| | 20, 21, 23, 24, 30, 31, 34, 35, 37, 39, 42, 43, 44, 47, 48, 49, 50, 52, 53, 55, 60, 61, 3, 6, 11, 13, 17, 19, 22, 29, 33, 36, 38, 41, 46, 51, 54, 59, 62, 10, 26, 27, 40, 45, 56, 58, 65, 2, 9, 25, 32, 57, 66, 1, 5, 67, 28, 63, 64]; |
| 60, 0xED | [2, 3, 4, 5, 6, 10, 11, 12, 13, 15, 16, 18, 19, 20, 23, 26, 27, 29, 32, 34, 38, 43, 44, 47, 48, 49, 51, 53, 55, 56, 61, 1, 9, 14, 17, 22, 25, 28, 31, 33, 37, 42, 46, 50, 52, 54, 62, 8, 21, 24, 30, 36, 41, 45, 63, 7, 35, 40, 60, 64, 39, 59, 65, 58, 66, 57, 67]; or [2, 3, 4, 5, 6, 10, 11, 12, 13, 15, 16, 18, 19, 20, 23, 26, 27, 29, 32, 34, 38, 43, 44, 47, 48, 49, 51, 53, 55, 56, 61, 1, 9, 14, 17, 22, 25, 28, 31, 33, 37, 42, 46, 50, 52, 54, 62, 8, 21, 24, 30, 36, 41, 45, 63, 7, 35, 40, 60, 64, 39, 59, 65, 57, 67, 58, 66]; |
| 60, 0xA3 | [1, 2, 3, 4, 6, 7, 8, 9, 12, 13, 14, 16, 18, 19, 24, 26, 27, 28, 32, 33, 35, 36, 38, 41, 45, 48, 49, 52, 54, 56, 61, 5, 11, 15, 17, 23, 25, 31, 34, 37, 40, 44, 47, 51, 53, 55, 62, 10, 22, 30, 39, 43, 46, 50, 63, 21, 29, 42, 60, 64, 20, 59, 65, 58, 66, 57, 67]; or [1, 2, 3, 4, 6, 7, 8, 9, 12, 13, 14, 16, 18, 19, 24, 26, 27, 28, 32, 33, 35, 36, 38, 41, 45, 48, 49, 52, 54, 56, 61, 5, 11, 15, 17, 23, 25, 31, 34, 37, 40, 44, 47, 51, 53, 55, 62, 10, 22, 30, 39, 43, 46, 50, 63, 20, 21, 29, 58, 66, 42, 57, 67, 60, 64, 59, 65]; |
| 60, 0xA9 | [3, 5, 6, 7, 9, 10, 11, 12, 14, 17, 18, 20, 22, 24, 25, 27, 28, 33, 34, 35, 36, 37, 40, 44, 45, 48, 49, 50, 54, 56, 61, 2, 4, 8, 13, 16, 19, 21, 23, 26, 32, 39, 43, 47, 53, 55, 62, 1, 15, 31, 38, 42, 46, 52, 63, 30, 41, 51, 60, 64, 29, 59, 65, 58, 66, 57, 67]; or [3, 5, 6, 7, 9, 10, 11, 12, 14, 17, 18, 20, 22, 24, 25, 27, 28, 33, 34, 35, 36, 37, 40, 44, 45, 48, 49, 50, 54, 56, 61, 2, 4, 8, 13, 16, 19, 21, 23, 26, 32, 39, 43, 47, 53, 55, 62, 1, 15, 31, 38, 42, 46, 52, 63, 29, 30, 51, 58, 66, 41, 57, 67, 60, 64, 59, 65]; |
| 60, 0xD9 | [3, 4, 7, 8, 9, 10, 11, 13, 15, 16, 17, 19, 20, 22, 26, 27, 28, 35, 38, 39, 42, 43, 44, 45, 46, 48, 50, 51, 52, 54, 55, 57, 61, 2, 6, 12, 14, 18, 21, 25, 34, 37, 41, 47, 49, 53, 56, 60, 62, 1, 5, 24, 33, 36, 40, 59, 63, 23, 32, 58, 64, 31, 65, 30, 66, 29, 67]; or [2, 3, 5, 7, 9, 14, 15, 16, 17, 20, 21, 23, 24, 25, 28, 31, 37, 38, 40, 42, 44, 49, 50, 51, 52, 55, 56, 58, 59, 60, 65, 1, 4, 6, 8, 13, 19, 22, 27, 30, 36, 39, 41, 43, 48, 54, 57, 66, 10, 11, 26, 35, 45, 46, 61, 12, 32, 47, 64, 18, 34, 53, 62, 29, 67, 33, 63]; |
| 60, 0x8B | [1, 2, 4, 8, 15, 16, 17, 19, 23, 30, 31, 32, 34, 38, 45, 46, 47, 49, 53, 60, 61, 3, 7, 14, 18, 22, 29, 33, 37, 44, 48, 52, 59, 62, 6, 13, 21, 28, 36, 43, 51, 58, 63, 5, 12, 20, 27, 35, 42, 50, 57, 64, 11, 26, 41, 56, 65, 10, 25, 40, 55, 66, 9, 24, 39, 54, 67]; or [1, 2, 4, 8, 15, 16, 17, 19, 23, 30, 31, 32, 34, 38, 45, 46, 47, 49, 53, 60, 61, 5, 6, 12, 20, 21, 27, 35, 36, 42, 50, 51, 57, 64, 3, 7, 11, 18, 22, 26, 33, 37, 41, 48, 52, 56, 65, 10, 25, 40, 55, 66, 9, 24, 39, 54, 67, 14, 29, 44, 59, 62, 13, 28, 43, 58, 63]; |
| 60, 0xF3 | [1, 2, 3, 6, 7, 14, 15, 16, 17, 20, 21, 28, 29, 30, 31, 34, 35, 42, 43, 44, 45, 48, 49, 56, 57, 58, 59, 61, 5, 13, 19, 27, 33, 41, 47, 55, 62, 4, 12, 18, 26, 32, 40, 46, 54, 60, 63, 11, 25, 39, 53, 64, 10, 24, 38, 52, 65, 9, 23, 37, 51, 66, 8, 22, 36, 50, 67]; or [3, 5, 7, 13, 17, 19, 21, 27, 31, 33, 35, 41, 45, 47, 49, 55, 59, 62, 1, 9, 15, 23, 29, 37, 43, 51, 57, 66, 2, 4, 6, 12, 16, 18, 20, 26, 30, 32, 34, 40, 44, 46, 48, 54, 58, 60, 63, 11, 25, 39, 53, 64, 14, 28, 42, 56, 61, 10, 24, 38, 52, 65, 8, 22, 36, 50, 67]; |
| 60, 0x1E7 | [1, 3, 4, 5, 7, 10, 14, 15, 16, 17, 18, 19, 25, 26, 27, 29, 31, 34, 35, 37, 39, 40, 45, 46, 50, 51, 53, 58, 59, 60, 61, 2, 6, 9, 13, 24, 28, 30, 33, 36, 38, 44, 49, 52, 57, 62, 8, 12, 23, 32, 43, 48, 56, 63, 11, 22, 42, 47, 55, 64, 21, 41, 54, 65, 20, 66, 67, 68]; or [1, 6, 9, 10, 11, 12, 13, 15, 17, 18, 19, 20, 22, 26, 28, 31, 33, 34, 35, 39, 43, 46, 49, 51, 55, 56, 59, 66, 2, 5, 7, 24, 27, 29, 30, 36, 37, 38, 40, 44, 52, 53, 57, 62, 3, 8, 14, 16, 23, 25, 32, 48, 58, 63, 42, 45, 47, 60, 64, 4, 21, 41, 50, 54, 65, 67, 61, 68]; |
| 60, 0x165 | [2, 4, 5, 9, 10, 13, 14, 15, 22, 23, 24, 25, 26, 28, 31, 33, 35, 38, 44, 49, 50, 51, 53, 54, 55, 56, 57, 58, 60, 61, 1, 3, 8, 12, 21, 27, 30, 32, 34, 37, 43, 48, 52, 59, 62, 7, 11, 20, 29, 36, 42, 47, 63, 6, 19, 41, 46, 64, 18, 40, 45, 65, 17, 39, 66, 16, 67, 68]; or [1, 6, 7, 8, 10, 11, 12, 13, 14, 15, 17, 18, 23, 24, 28, 31, 32, 38, 39, 41, 45, 47, 50, 51, 53, 55, 60, 66, 3, 4, 5, 9, 20, 21, 25, 29, 35, 36, 42, 44, 48, 52, 57, 59, 63, 2, 22, 26, 33, 49, 54, 56, 58, 61, 19, 27, 34, 37, 43, 46, 64, 40, 65, 16, 30, 67, 68, 62]; |
| 60, 0x171 | [4, 5, 6, 10, 13, 15, 16, 17, 24, 25, 28, 31, 34, 35, 37, 38, 39, 42, 48, 50, 52, 53, 55, 56, 58, 60, 61, 3, 9, 12, 14, 23, 27, 30, 33, 36, 41, 47, 49, 51, 54, 57, 59, 62, 2, 8, 11, 22, 26, 29, 32, 40, 46, 63, 1, 7, 21, 45, 64, 20, 44, 65, 19, 43, 66, 18, 67, 68]; or [4, 5, 6, 10, 13, 15, 16, 17, 24, 25, 28, 31, 34, 35, 37, 38, 39, 42, 48, 50, 52, 53, 55, 56, 58, 60, 61, 2, 7, 8, 12, 18, 19, 26, 27, 30, 33, 36, 40, 41, 44, 54, 57, 67, 1, 11, 14, 29, 32, 43, 49, 51, 59, 68, 3, 9, 23, 47, 62, 22, 46, 63, 21, 45, 64, 20, 65, 66]; |

TABLE 2-continued

| Typical K1, typical CRC polynomial | Typical K1, typical CRC polynomial |
|---|---|
| 60, 0x18D | [2, 3, 4, 8, 9, 10, 12, 13, 14, 15, 19, 21, 22, 25, 26, 28, 29, 34, 35, 36, 37, 40, 41, 42, 47, 49, 51, 52, 53, 54, 55, 56, 57, 58, 61, 1, 7, 11, 18, 20, 24, 27, 33, 39, 46, 48, 50, 60, 62, 6, 17, 23, 32, 38, 45, 59, 63, 5, 16, 31, 44, 64, 30, 43, 65, 66, 67, 68]; or [4, 5, 6, 9, 12, 15, 16, 20, 23, 24, 25, 27, 29, 31, 32, 34, 38, 42, 44, 47, 51, 52, 53, 54, 55, 64, 3, 8, 11, 14, 19, 22, 26, 28, 30, 33, 37, 41, 43, 46, 50, 65, 2, 7, 10, 13, 18, 21, 36, 40, 45, 49, 66, 1, 17, 35, 39, 48, 60, 67, 57, 58, 59, 63, 56, 61, 62, 68]; |
| 60, 0x1FD | [2, 3, 5, 6, 8, 10, 14, 16, 18, 20, 21, 25, 26, 27, 30, 31, 33, 36, 37, 40, 41, 42, 44, 49, 53, 54, 56, 57, 58, 60, 61, 1, 4, 7, 9, 13, 15, 17, 19, 24, 29, 32, 35, 39, 43, 48, 52, 55, 59, 62, 12, 23, 28, 34, 38, 47, 51, 63, 11, 22, 46, 50, 64, 45, 65, 66, 67, 68]; or [1, 2, 10, 12, 13, 15, 16, 18, 20, 24, 26, 28, 30, 31, 35, 36, 37, 40, 41, 43, 46, 47, 50, 51, 52, 54, 59, 66, 3, 5, 6, 8, 14, 21, 25, 27, 33, 42, 44, 49, 53, 56, 57, 58, 60, 61, 4, 7, 9, 11, 17, 19, 22, 32, 34, 38, 45, 55, 68, 29, 39, 48, 62, 65, 23, 63, 64, 67]; |
| 60, 0x1C1 | [6, 7, 8, 12, 14, 16, 18, 19, 21, 23, 28, 30, 31, 34, 35, 39, 40, 43, 45, 48, 49, 50, 52, 53, 54, 56, 60, 61, 5, 11, 13, 15, 17, 20, 22, 27, 29, 33, 38, 42, 44, 47, 51, 55, 59, 62, 4, 10, 26, 32, 37, 41, 46, 58, 63, 3, 9, 25, 36, 57, 64, 2, 24, 65, 1, 66, 67, 68]; or [6, 7, 8, 12, 14, 16, 18, 19, 21, 23, 28, 30, 31, 34, 35, 39, 40, 43, 45, 48, 49, 50, 52, 53, 54, 56, 60, 61, 5, 11, 13, 15, 17, 20, 22, 27, 29, 33, 38, 42, 44, 47, 51, 55, 59, 62, 4, 10, 26, 32, 37, 41, 46, 58, 63, 1, 9, 24, 36, 57, 68, 3, 25, 64, 2, 65, 66, 67]; |
| 60, 0x1E9 | [3, 5, 7, 8, 9, 10, 11, 12, 15, 21, 22, 23, 24, 25, 27, 30, 31, 32, 33, 35, 36, 37, 38, 42, 44, 45, 46, 49, 50, 51, 53, 54, 58, 59, 61, 2, 4, 6, 14, 20, 26, 29, 34, 41, 43, 48, 52, 57, 60, 62, 1, 13, 19, 28, 40, 47, 56, 63, 18, 39, 55, 64, 17, 65, 16, 66, 67, 68]; or [1, 2, 4, 5, 6, 7, 8, 14, 16, 17, 22, 27, 28, 29, 31, 35, 36, 40, 43, 44, 45, 48, 50, 53, 54, 56, 59, 67, 3, 10, 11, 15, 18, 19, 20, 23, 25, 34, 37, 38, 39, 41, 47, 49, 55, 60, 64, 9, 24, 30, 33, 42, 46, 52, 58, 65, 12, 21, 32, 51, 61, 13, 26, 57, 66, 62, 63, 68]; |
| 60, 0x119 | [3, 4, 6, 9, 10, 11, 14, 15, 18, 21, 23, 24, 25, 31, 32, 33, 34, 38, 39, 40, 42, 44, 45, 48, 49, 50, 51, 52, 53, 56, 58, 61, 2, 5, 8, 13, 17, 20, 22, 30, 37, 41, 43, 47, 55, 57, 62, 1, 7, 12, 16, 19, 29, 36, 46, 54, 60, 63, 28, 35, 59, 64, 27, 65, 26, 66, 67, 68]; or [3, 4, 6, 9, 10, 11, 14, 15, 18, 21, 23, 24, 25, 31, 32, 33, 34, 38, 39, 40, 42, 44, 45, 48, 49, 50, 51, 52, 53, 56, 58, 61, 2, 5, 8, 13, 17, 20, 22, 30, 37, 41, 43, 47, 55, 57, 62, 7, 19, 27, 28, 29, 35, 36, 46, 54, 60, 65, 12, 26, 59, 66, 1, 16, 63, 67, 68, 64]; |
| 60, 0x1B3 | [1, 2, 3, 7, 12, 13, 15, 18, 19, 21, 22, 24, 25, 26, 27, 28, 29, 31, 32, 33, 35, 36, 39, 40, 41, 43, 47, 49, 52, 55, 56, 57, 58, 59, 61, 6, 11, 14, 17, 20, 23, 30, 34, 38, 42, 46, 48, 51, 54, 62, 5, 10, 16, 37, 45, 50, 53, 60, 63, 4, 9, 44, 64, 8, 65, 66, 67, 68]; or [3, 6, 7, 11, 13, 14, 15, 17, 19, 20, 22, 23, 29, 30, 33, 34, 36, 38, 41, 42, 43, 46, 47, 48, 49, 51, 52, 54, 59, 62, 2, 9, 10, 16, 18, 25, 26, 32, 37, 39, 44, 45, 50, 55, 57, 66, 1, 5, 8, 21, 24, 31, 35, 40, 53, 56, 67, 12, 28, 58, 60, 63, 4, 27, 64, 61, 68, 65]; |
| 60, 0x1D9 | [3, 4, 7, 9, 10, 11, 13, 14, 15, 16, 17, 22, 23, 27, 28, 30, 31, 32, 36, 38, 39, 41, 42, 44, 46, 47, 48, 49, 51, 53, 56, 57, 58, 59, 60, 61, 2, 6, 8, 12, 21, 26, 29, 35, 37, 40, 43, 45, 50, 52, 55, 62, 1, 5, 20, 25, 34, 54, 63, 19, 24, 33, 64, 18, 65, 66, 67, 68]; or [2, 3, 4, 5, 8, 9, 10, 13, 17, 18, 19, 21, 24, 27, 29, 34, 36, 38, 39, 47, 50, 51, 54, 56, 57, 58, 60, 65, 1, 7, 12, 16, 20, 23, 26, 28, 33, 35, 37, 46, 49, 53, 55, 59, 66, 6, 15, 22, 25, 30, 31, 32, 42, 43, 45, 64, 14, 41, 44, 52, 67, 11, 48, 61, 40, 68, 62, 63]; |
| 60, 0x157 | [1, 3, 6, 7, 8, 13, 14, 15, 16, 17, 18, 20, 24, 26, 27, 29, 30, 31, 33, 34, 35, 36, 37, 41, 42, 46, 49, 50, 53, 54, 55, 56, 58, 59, 61, 2, 5, 12, 19, 23, 25, 28, 32, 40, 45, 48, 52, 57, 60, 62, 4, 11, 22, 39, 44, 47, 51, 63, 10, 21, 38, 43, 64, 9, 65, 66, 67, 68]; or [1, 2, 3, 5, 8, 12, 18, 19, 20, 23, 24, 25, 27, 28, 31, 32, 37, 40, 42, 45, 46, 48, 50, 52, 56, 57, 59, 60, 62, 4, 6, 11, 13, 14, 15, 16, 22, 29, 33, 34, 35, 39, 44, 47, 51, 53, 54, 63, 7, 10, 21, 36, 38, 41, 43, 49, 64, 9, 26, 30, 55, 65, 17, 58, 61, 66, 67, 68]; |
| 60, 0x1B1 | [4, 5, 7, 10, 12, 13, 16, 17, 19, 20, 21, 22, 25, 26, 27, 29, 30, 33, 36, 37, 41, 42, 43, 51, 55, 56, 58, 61, 3, 6, 9, 11, 15, 18, 24, 28, 32, 35, 40, 50, 54, 57, 60, 62, 2, 8, 14, 23, 31, 34, 39, 49, 53, 59, 63, 1, 38, 48, 52, 64, 47, 65, 46, 66, 45, 67, 44, 68]; or [4, 5, 7, 10, 12, 13, 16, 17, 19, 20, 21, 22, 25, 26, 27, 29, 30, 33, 36, 37, 41, 42, 43, 51, 55, 56, 58, 61, 3, 6, 9, 11, 15, 18, 24, 28, 32, 35, 40, 50, 54, 57, 60, 62, 2, 8, 14, 23, 31, 34, 39, 49, 53, 59, 63, 1, 38, 44, 52, 68, 48, 64, 46, 66, 45, 67, 47, 65]; |
| 60, 0x139 | [3, 4, 5, 6, 9, 17, 20, 21, 22, 23, 26, 34, 37, 38, 39, 40, 43, 51, 54, 55, 56, 57, 60, 61, 2, 8, 16, 19, 25, 33, 36, 42, 50, 53, 59, 62, 1, 7, 15, 18, 24, 32, 35, 41, 49, 52, 58, 63, 14, 31, 48, 64, 13, 30, 47, 65, 12, 29, 46, 66, 11, 28, 45, 67, 10, 27, 44, 68]; |

TABLE 2-continued

| Typical K1, typical CRC polynomial | Typical K1, typical CRC polynomial |
|---|---|
| 60, 0x1D7 | [1, 3, 6, 8, 9, 17, 18, 20, 23, 25, 26, 34, 35, 37, 40, 42, 43, 51, 52, 54, 57, 59, 60, 61, 2, 5, 7, 16, 19, 22, 24, 33, 36, 39, 41, 50, 53, 56, 58, 62, 4, 15, 21, 32, 38, 49, 55, 63, 14, 31, 48, 64, 13, 30, 47, 65, 12, 29, 46, 66, 11, 28, 45, 67, 10, 27, 44, 68]; or [1, 3, 6, 8, 9, 17, 18, 20, 23, 25, 26, 34, 35, 37, 40, 42, 43, 51, 52, 54, 57, 59, 60, 61, 2, 4, 5, 15, 19, 21, 22, 32, 36, 38, 39, 49, 53, 55, 56, 63, 14, 31, 48, 64, 7, 13, 24, 30, 41, 47, 58, 65, 12, 29, 46, 66, 10, 27, 44, 68, 16, 33, 50, 62, 11, 28, 45, 67]; |
| 60, 0x101 | [8, 16, 24, 32, 40, 48, 56, 61, 7, 15, 23, 31, 39, 47, 55, 62, 6, 14, 22, 30, 38, 46, 54, 63, 5, 13, 21, 29, 37, 45, 53, 64, 4, 12, 20, 28, 36, 44, 52, 60, 65, 3, 11, 19, 27, 35, 43, 51, 59, 66, 2, 10, 18, 26, 34, 42, 50, 58, 67, 1, 9, 17, 25, 33, 41, 49, 57, 68]; |
| 64, 0x9 | [3, 6, 9, 12, 15, 18, 21, 24, 27, 30, 33, 36, 39, 42, 45, 48, 51, 54, 57, 60, 63, 65, 2, 5, 8, 11, 14, 17, 20, 23, 26, 29, 32, 35, 38, 41, 44, 47, 50, 53, 56, 59, 62, 66, 1, 4, 7, 10, 13, 16, 19, 22, 25, 28, 31, 34, 37, 40, 43, 46, 49, 52, 55, 58, 61, 64, 67]; |
| 64, 0xD | [2, 3, 4, 7, 9, 10, 11, 14, 16, 17, 18, 21, 23, 24, 25, 28, 30, 31, 32, 35, 37, 38, 39, 42, 44, 45, 46, 49, 51, 52, 53, 56, 58, 59, 60, 63, 65, 1, 6, 8, 13, 15, 20, 22, 27, 29, 34, 36, 41, 43, 48, 50, 55, 57, 62, 64, 66, 5, 12, 19, 26, 33, 40, 47, 54, 61, 67]; |
| 64, 0x19 | [3, 4, 6, 8, 9, 10, 11, 15, 18, 19, 21, 23, 24, 25, 26, 30, 33, 34, 36, 38, 39, 40, 41, 45, 48, 49, 51, 53, 54, 55, 56, 60, 63, 64, 65, 2, 5, 7, 14, 17, 20, 22, 29, 32, 35, 37, 44, 47, 50, 52, 59, 62, 66, 1, 13, 16, 28, 31, 43, 46, 58, 61, 67, 12, 27, 42, 57, 68]; or [3, 4, 6, 8, 9, 10, 11, 15, 18, 19, 21, 23, 24, 25, 26, 30, 33, 34, 36, 38, 39, 40, 41, 45, 48, 49, 51, 53, 54, 55, 56, 60, 63, 64, 65, 2, 5, 7, 14, 17, 20, 22, 29, 32, 35, 37, 44, 47, 50, 52, 59, 62, 66, 1, 12, 16, 27, 31, 42, 46, 57, 61, 68, 13, 28, 43, 58, 67]; |
| 64, 0x1D | [2, 3, 7, 9, 10, 14, 16, 17, 21, 23, 24, 28, 30, 31, 35, 37, 38, 42, 44, 45, 49, 51, 52, 56, 58, 59, 63, 65, 1, 6, 8, 13, 15, 20, 22, 27, 29, 34, 36, 41, 43, 48, 50, 55, 57, 62, 64, 66, 5, 12, 19, 26, 33, 40, 47, 54, 61, 67, 4, 11, 18, 25, 32, 39, 46, 53, 60, 68]; or [2, 3, 7, 9, 10, 14, 16, 17, 21, 23, 24, 28, 30, 31, 35, 37, 38, 42, 44, 45, 49, 51, 52, 56, 58, 59, 63, 65, 1, 6, 8, 13, 15, 20, 22, 27, 29, 34, 36, 41, 43, 48, 50, 55, 57, 62, 64, 66, 4, 11, 18, 25, 32, 39, 46, 53, 60, 68, 5, 12, 19, 26, 33, 40, 47, 54, 61, 67]; |
| 64, 0x17 | [1, 3, 7, 8, 10, 14, 15, 17, 21, 22, 24, 28, 29, 31, 35, 36, 38, 42, 43, 45, 49, 50, 52, 56, 57, 59, 63, 64, 65, 2, 6, 9, 13, 16, 20, 23, 27, 30, 34, 37, 41, 44, 48, 51, 55, 58, 62, 66, 5, 12, 19, 26, 33, 40, 47, 54, 61, 67, 4, 11, 18, 25, 32, 39, 46, 53, 60, 68]; or [2, 3, 5, 9, 10, 12, 16, 17, 19, 23, 24, 26, 30, 31, 33, 37, 38, 40, 44, 45, 47, 51, 52, 54, 58, 59, 61, 67, 1, 7, 8, 14, 15, 21, 22, 28, 29, 35, 36, 42, 43, 49, 50, 56, 57, 63, 64, 65, 4, 11, 18, 25, 32, 39, 46, 53, 60, 68, 6, 13, 20, 27, 34, 41, 48, 55, 62, 66]; |
| 64, 0x1F | [1, 5, 6, 10, 11, 15, 16, 20, 21, 25, 26, 30, 31, 35, 36, 40, 41, 45, 46, 50, 51, 55, 56, 60, 61, 65, 4, 9, 14, 19, 24, 29, 34, 39, 44, 49, 54, 59, 64, 66, 3, 8, 13, 18, 23, 28, 33, 38, 43, 48, 53, 58, 63, 67, 2, 7, 12, 17, 22, 27, 32, 37, 42, 47, 52, 57, 62, 68]; |
| 64, 0x29 | [3, 5, 6, 9, 10, 11, 12, 13, 17, 18, 20, 21, 22, 24, 26, 31, 34, 36, 37, 40, 41, 42, 43, 44, 48, 49, 51, 52, 53, 55, 57, 62, 65, 2, 4, 8, 16, 19, 23, 25, 30, 33, 35, 39, 47, 50, 54, 56, 61, 64, 66, 1, 7, 15, 29, 32, 38, 46, 60, 63, 67, 14, 28, 45, 59, 68, 27, 58, 69]; |
| 64, 0x2F | [1, 4, 7, 8, 9, 10, 11, 13, 14, 15, 19, 21, 23, 24, 26, 31, 32, 35, 38, 39, 40, 41, 42, 44, 45, 46, 50, 52, 54, 55, 57, 62, 63, 65, 3, 6, 12, 18, 20, 22, 25, 30, 34, 37, 43, 49, 51, 53, 56, 61, 66, 2, 5, 17, 29, 33, 36, 48, 60, 64, 67, 16, 28, 47, 59, 68, 27, 58, 69]; or [1, 4, 7, 8, 9, 10, 11, 13, 14, 15, 19, 21, 23, 24, 26, 31, 32, 35, 38, 39, 40, 41, 42, 44, 45, 46, 50, 52, 54, 55, 57, 62, 63, 65, 3, 6, 12, 18, 20, 22, 25, 30, 34, 37, 43, 49, 51, 53, 56, 61, 66, 2, 16, 17, 28, 33, 47, 48, 59, 64, 68, 5, 29, 36, 60, 67, 27, 58, 69]; |
| 64, 0x35 | [2, 5, 6, 8, 9, 10, 15, 17, 20, 21, 23, 24, 25, 30, 32, 35, 36, 38, 39, 40, 45, 47, 50, 51, 53, 54, 55, 60, 62, 65, 1, 4, 7, 14, 16, 19, 22, 29, 31, 34, 37, 44, 46, 49, 52, 59, 61, 64, 66, 3, 13, 18, 28, 33, 43, 48, 58, 63, 67, 12, 27, 42, 57, 68, 11, 26, 41, 56, 69]; or [2, 5, 6, 8, 9, 10, 15, 17, 20, 21, 23, 24, 25, 30, 32, 35, 36, 38, 39, 40, 45, 47, 50, 51, 53, 54, 55, 60, 62, 65, 1, 4, 7, 14, 16, 19, 22, 29, 31, 34, 37, 44, 46, 49, 52, 59, 61, 64, 66, 3, 11, 18, 26, 33, 41, 48, 56, 63, 69, 13, 28, 43, 58, 67, 12, 27, 42, 57, 68]; |
| 64, 0x73 | [1, 2, 3, 6, 9, 11, 13, 16, 17, 19, 24, 28, 30, 31, 33, 34, 35, 36, 37, 38, 40, 42, 43, 44, 48, 49, 52, 53, 54, 56, 57, 63, 64, 65, 5, 8, 10, 12, 15, 18, 23, 27, 29, 32, 39, 41, 47, 51, 55, 62, 66, 4, 7, 14, 22, 26, 46, 50, 61, 67, 21, 25, 45, 60, 68, 20, 59, 69, 58, 70]; or [3, 5, 6, 8, 9, 10, 11, 12, 13, 15, 17, 18, 19, 23, 24, 27, 28, 29, 31, 32, 38, 39, 40, 41, 44, 47, 49, 51, 54, 55, 57, 62, 66, 2, 4, 7, 14, 16, 22, 26, 30, 37, 43, 46, 48, 50, 53, 56, 61, 67, 1, 33, 34, 35, 36, 42, 52, 63, 64, 65, 21, 25, 45, 60, 68, 20, 59, 69, 58, 70]; |

TABLE 2-continued

| Typical K1, typical CRC polynomial | Typical K1, typical CRC polynomial |
|---|---|
| 64, 0x61 | [5, 6, 10, 12, 15, 16, 17, 18, 20, 24, 25, 26, 29, 32, 34, 35, 37, 38, 39, 41, 42, 45, 46, 48, 50, 52, 53, 54, 55, 56, 57, 63, 65, 4, 9, 11, 14, 19, 23, 28, 31, 33, 36, 40, 44, 47, 49, 51, 62, 66, 3, 8, 13, 22, 27, 30, 43, 61, 67, 2, 7, 21, 60, 68, 1, 59, 64, 69, 58, 70]; |
| 64, 0x71 | [4, 5, 6, 8, 10, 13, 15, 16, 17, 18, 21, 22, 24, 25, 31, 35, 36, 37, 39, 41, 44, 46, 47, 48, 49, 52, 53, 55, 56, 62, 65, 3, 7, 9, 12, 14, 20, 23, 30, 34, 38, 40, 43, 45, 51, 54, 61, 66, 2, 11, 19, 29, 33, 42, 50, 60, 64, 67, 1, 28, 32, 59, 63, 68, 27, 58, 69, 26, 57, 70]; or [4, 5, 6, 8, 10, 13, 15, 16, 17, 18, 21, 22, 24, 25, 31, 35, 36, 37, 39, 41, 44, 46, 47, 48, 49, 52, 53, 55, 56, 62, 65, 3, 7, 9, 12, 14, 20, 23, 30, 34, 38, 40, 43, 45, 51, 54, 61, 66, 2, 11, 19, 29, 33, 42, 50, 60, 64, 67, 1, 26, 32, 57, 63, 70, 28, 59, 68, 27, 58, 69]; |
| 64, 0x4D | [2, 3, 4, 6, 7, 9, 11, 14, 15, 16, 17, 21, 22, 25, 31, 33, 34, 35, 37, 38, 40, 42, 45, 46, 47, 48, 52, 53, 56, 62, 64, 65, 1, 5, 8, 10, 13, 20, 24, 30, 32, 36, 39, 41, 44, 51, 55, 61, 63, 66, 12, 19, 23, 29, 43, 50, 54, 60, 67, 18, 28, 49, 59, 68, 27, 58, 69, 26, 57, 70]; or [3, 5, 6, 7, 9, 10, 12, 14, 17, 18, 19, 20, 24, 25, 28, 34, 36, 37, 38, 40, 41, 43, 45, 48, 49, 50, 51, 55, 56, 59, 68, 2, 4, 11, 15, 16, 21, 22, 31, 33, 35, 42, 46, 47, 52, 53, 62, 64, 65, 8, 13, 23, 27, 39, 44, 54, 58, 69, 1, 26, 32, 57, 63, 70, 30, 61, 66, 29, 60, 67]; |
| 64, 0x7B | [1, 2, 5, 9, 11, 13, 14, 15, 16, 18, 19, 21, 24, 25, 31, 32, 33, 36, 40, 42, 44, 45, 46, 47, 49, 50, 52, 55, 56, 62, 63, 64, 65, 4, 8, 10, 12, 17, 20, 23, 30, 35, 39, 41, 43, 48, 51, 54, 61, 66, 3, 7, 22, 29, 34, 38, 53, 60, 67, 6, 28, 37, 59, 68, 27, 58, 69, 26, 57, 70]; or [1, 3, 5, 6, 7, 8, 10, 11, 13, 16, 17, 23, 24, 25, 28, 32, 34, 36, 37, 38, 39, 41, 42, 44, 47, 48, 54, 55, 56, 59, 63, 68, 2, 9, 14, 15, 18, 19, 21, 31, 33, 40, 45, 46, 49, 50, 52, 62, 64, 65, 12, 20, 22, 26, 43, 51, 53, 57, 70, 4, 30, 35, 61, 66, 29, 60, 67, 27, 58, 69]; |
| 64, 0x5D | [2, 3, 6, 7, 9, 15, 17, 18, 21, 22, 24, 30, 32, 33, 36, 37, 39, 45, 47, 48, 51, 52, 54, 60, 62, 63, 65, 1, 5, 8, 14, 16, 20, 23, 29, 31, 35, 38, 44, 46, 50, 53, 59, 61, 66, 4, 13, 19, 28, 34, 43, 49, 58, 64, 67, 12, 27, 42, 57, 68, 11, 26, 41, 56, 69, 10, 25, 40, 55, 70]; or [2, 3, 6, 7, 9, 15, 17, 18, 21, 22, 24, 30, 32, 33, 36, 37, 39, 45, 47, 48, 51, 52, 54, 60, 62, 63, 65, 1, 5, 8, 14, 16, 20, 23, 29, 31, 35, 38, 44, 46, 50, 53, 59, 61, 66, 4, 11, 19, 26, 34, 41, 49, 56, 64, 69, 10, 25, 40, 55, 70, 12, 27, 42, 57, 68, 13, 28, 43, 58, 67]; |
| 64, 0xD3 | [1, 2, 3, 5, 6, 9, 10, 14, 17, 20, 21, 22, 25, 26, 27, 28, 29, 32, 38, 42, 43, 45, 47, 49, 52, 53, 55, 56, 58, 61, 63, 65, 4, 8, 13, 16, 19, 24, 31, 37, 41, 44, 46, 48, 51, 54, 57, 60, 62, 66, 7, 12, 15, 18, 23, 30, 36, 40, 50, 59, 67, 11, 35, 39, 68, 34, 64, 69, 33, 70, 71]; or [1, 2, 3, 5, 6, 9, 10, 14, 17, 20, 21, 22, 25, 26, 27, 28, 29, 32, 38, 42, 43, 45, 47, 49, 52, 53, 55, 56, 58, 61, 63, 65, 4, 7, 11, 15, 18, 23, 30, 33, 39, 44, 46, 48, 50, 54, 57, 59, 62, 64, 71, 13, 16, 19, 34, 35, 40, 41, 51, 60, 69, 8, 24, 31, 37, 66, 12, 36, 67, 68, 70]; |
| 64, 0xF7 | [1, 3, 5, 6, 7, 9, 12, 14, 16, 18, 19, 21, 22, 23, 26, 31, 35, 38, 41, 42, 43, 44, 46, 48, 54, 56, 57, 58, 59, 62, 63, 64, 65, 2, 4, 8, 11, 13, 15, 17, 20, 25, 30, 34, 37, 40, 45, 47, 53, 55, 61, 66, 10, 24, 29, 33, 36, 39, 52, 60, 67, 28, 32, 51, 68, 27, 50, 69, 49, 70, 71]; or [1, 3, 5, 6, 7, 9, 12, 14, 16, 18, 19, 21, 22, 23, 26, 31, 35, 38, 41, 42, 43, 44, 46, 48, 54, 56, 57, 58, 59, 62, 63, 64, 65, 2, 4, 8, 10, 13, 15, 17, 20, 24, 27, 32, 36, 39, 45, 47, 49, 55, 60, 71, 11, 25, 29, 30, 33, 34, 37, 52, 53, 67, 28, 40, 51, 61, 68, 50, 69, 66, 70]; |
| 64, 0xA7 | [1, 3, 4, 5, 6, 7, 13, 15, 16, 21, 26, 27, 28, 30, 34, 35, 39, 42, 43, 44, 47, 49, 52, 53, 55, 58, 60, 61, 62, 63, 65, 2, 12, 14, 20, 25, 29, 33, 38, 41, 46, 48, 51, 54, 57, 59, 64, 66, 11, 19, 24, 32, 37, 40, 45, 50, 56, 67, 10, 18, 23, 31, 36, 68, 9, 17, 22, 69, 8, 70, 71]; or [1, 3, 4, 5, 6, 7, 13, 15, 16, 21, 26, 27, 28, 30, 34, 35, 39, 42, 43, 44, 47, 49, 52, 53, 55, 58, 60, 61, 62, 63, 65, 2, 8, 9, 17, 18, 23, 29, 32, 36, 37, 41, 45, 46, 51, 54, 57, 64, 70, 14, 22, 31, 40, 48, 50, 56, 59, 71, 12, 20, 25, 33, 38, 66, 11, 19, 24, 67, 10, 68, 69]; |
| 64, 0xC1 | [6, 7, 12, 14, 18, 19, 20, 21, 24, 28, 30, 31, 34, 35, 36, 38, 40, 43, 44, 45, 46, 47, 49, 54, 55, 56, 60, 63, 65, 5, 11, 13, 17, 23, 27, 29, 33, 37, 39, 42, 48, 53, 59, 62, 66, 4, 10, 16, 22, 26, 32, 41, 52, 58, 61, 64, 67, 3, 9, 15, 25, 51, 57, 68, 2, 8, 50, 69, 1, 70, 71]; or [6, 7, 12, 14, 18, 19, 20, 21, 24, 28, 30, 31, 34, 35, 36, 38, 40, 43, 44, 45, 46, 47, 49, 54, 55, 56, 60, 63, 65, 5, 11, 13, 17, 23, 27, 29, 33, 37, 39, 42, 48, 53, 59, 62, 66, 4, 10, 16, 22, 26, 32, 41, 52, 58, 61, 64, 67, 1, 8, 15, 25, 50, 57, 71, 3, 9, 51, 68, 2, 69, 70]; |
| 64, 0x91 | [4, 7, 8, 12, 14, 15, 16, 18, 20, 21, 23, 24, 30, 31, 34, 35, 37, 39, 42, 43, 44, 47, 48, 49, 50, 52, 53, 55, 60, 62, 64, 65, 3, 6, 11, 13, 17, 19, 22, 29, 33, 36, 38, 41, 46, 51, 54, 59, 61, 63, 66, 2, 5, 10, 28, 32, 40, 45, 58, 67, 1, 9, 27, 57, 68, 26, 56, 69, 25, 70, 71]; or [3, 7, 10, 11, 15, 17, 18, 19, 21, 23, 24, 26, 27, 33, 34, 37, 38, 40, 42, 45, 46, 47, 50, 51, 52, 53, 55, 56, 58, 63, 69, 4, 8, 12, 14, 16, 20, 30, 31, 35, 39, 43, 44, 48, 49, 60, 62, 64, 65, 6, 13, 22, 29, 36, 41, 54, 59, 61, 66, 2, 9, 25, 32, 57, 70, 1, 5, 71, 28, 67, 68]; |

TABLE 2-continued

| Typical K1, typical CRC polynomial | Typical K1, typical CRC polynomial |
|---|---|
| 64, 0xED | [2, 3, 4, 5, 6, 10, 11, 12, 13, 15, 16, 18, 19, 20, 23, 26, 27, 29, 32, 34, 38, 43, 44, 47, 48, 49, 51, 53, 55, 56, 63, 65, 1, 9, 14, 17, 22, 25, 28, 31, 33, 37, 42, 46, 50, 52, 54, 62, 64, 66, 8, 21, 24, 30, 36, 41, 45, 61, 67, 7, 35, 40, 60, 68, 39, 59, 69, 58, 70, 57, 71]; or [2, 3, 4, 5, 6, 10, 11, 12, 13, 15, 16, 18, 19, 20, 23, 26, 27, 29, 32, 34, 38, 43, 44, 47, 48, 49, 51, 53, 55, 56, 63, 65, 7, 8, 14, 22, 24, 25, 28, 33, 35, 37, 40, 41, 42, 45, 54, 60, 68, 1, 9, 17, 31, 46, 50, 52, 62, 64, 66, 21, 36, 39, 59, 69, 30, 57, 71, 61, 67, 58, 70]; |
| 64, 0xA3 | [1, 2, 3, 4, 6, 7, 8, 9, 12, 13, 14, 16, 18, 19, 24, 26, 27, 28, 32, 33, 35, 36, 38, 41, 45, 48, 49, 52, 54, 56, 63, 64, 65, 5, 11, 15, 17, 23, 25, 31, 34, 37, 40, 44, 47, 51, 53, 55, 62, 66, 10, 22, 30, 39, 43, 46, 50, 61, 67, 21, 29, 42, 60, 68, 20, 59, 69, 58, 70, 57, 71]; or [2, 3, 4, 5, 6, 8, 9, 10, 11, 14, 15, 16, 18, 20, 21, 26, 28, 29, 30, 34, 35, 37, 38, 40, 43, 47, 50, 51, 54, 56, 58, 70, 1, 7, 12, 13, 19, 24, 27, 32, 33, 36, 41, 45, 48, 49, 52, 63, 64, 65, 17, 23, 25, 31, 44, 53, 55, 62, 66, 22, 39, 46, 61, 67, 42, 60, 68, 57, 71, 59, 69]; |
| 64, 0xA9 | [3, 5, 6, 7, 9, 10, 11, 12, 14, 17, 18, 20, 22, 24, 25, 27, 28, 33, 34, 35, 36, 37, 40, 44, 45, 48, 49, 50, 54, 56, 63, 65, 2, 4, 8, 13, 16, 19, 21, 23, 26, 32, 39, 43, 47, 53, 55, 62, 66, 1, 15, 31, 38, 42, 46, 52, 61, 64, 67, 30, 41, 51, 60, 68, 29, 59, 69, 58, 70, 57, 71]; or [3, 5, 6, 7, 9, 10, 11, 12, 14, 17, 18, 20, 22, 24, 25, 27, 28, 33, 34, 35, 36, 37, 40, 44, 45, 48, 49, 50, 54, 56, 63, 65, 2, 4, 8, 13, 16, 19, 21, 23, 26, 32, 39, 43, 47, 53, 55, 62, 66, 29, 30, 38, 42, 46, 51, 52, 58, 70, 1, 15, 31, 61, 64, 67, 41, 60, 68, 57, 71, 59, 69]; |
| 64, 0xD9 | [3, 4, 7, 8, 9, 10, 11, 13, 15, 16, 17, 19, 20, 22, 26, 27, 28, 35, 38, 39, 42, 43, 44, 45, 46, 48, 50, 51, 52, 54, 55, 57, 61, 62, 63, 65, 2, 6, 12, 14, 18, 21, 25, 34, 37, 41, 47, 49, 53, 56, 60, 66, 1, 5, 24, 33, 36, 40, 59, 67, 23, 32, 58, 68, 31, 69, 30, 70, 29, 64, 71]; or [2, 3, 5, 7, 9, 14, 15, 16, 17, 20, 21, 23, 24, 25, 28, 31, 37, 38, 40, 42, 44, 49, 50, 51, 52, 55, 56, 58, 59, 60, 63, 69, 1, 4, 6, 8, 13, 19, 22, 27, 30, 36, 39, 41, 43, 48, 54, 57, 62, 70, 10, 11, 26, 35, 45, 46, 61, 65, 12, 18, 34, 47, 53, 66, 33, 67, 32, 68, 29, 64, 71]; |
| 64, 0x8B | [1, 2, 4, 8, 15, 16, 17, 19, 23, 30, 31, 32, 34, 38, 45, 46, 47, 49, 53, 60, 61, 62, 64, 65, 3, 7, 14, 18, 22, 29, 33, 37, 44, 48, 52, 59, 63, 66, 6, 13, 21, 28, 36, 43, 51, 58, 67, 5, 12, 20, 27, 35, 42, 50, 57, 68, 11, 26, 41, 56, 69, 10, 25, 40, 55, 70, 9, 24, 39, 54, 71]; or [4, 5, 6, 8, 12, 19, 20, 21, 23, 27, 34, 35, 36, 38, 42, 49, 50, 51, 53, 57, 64, 68, 3, 7, 11, 18, 22, 26, 33, 37, 41, 48, 52, 56, 63, 69, 1, 2, 15, 16, 17, 30, 31, 32, 45, 46, 47, 60, 61, 62, 65, 10, 25, 40, 55, 70, 9, 24, 39, 54, 71, 14, 29, 44, 59, 66, 13, 28, 43, 58, 67]; |
| 64, 0xF3 | [1, 2, 3, 6, 7, 14, 15, 16, 17, 20, 21, 28, 29, 30, 31, 34, 35, 42, 43, 44, 45, 48, 49, 56, 57, 58, 59, 62, 63, 65, 5, 13, 19, 27, 33, 41, 47, 55, 61, 66, 4, 12, 18, 26, 32, 40, 46, 54, 60, 67, 11, 25, 39, 53, 68, 10, 24, 38, 52, 69, 9, 23, 37, 51, 70, 8, 22, 36, 50, 64, 71]; or [3, 5, 7, 13, 17, 19, 21, 27, 31, 33, 35, 41, 45, 47, 49, 55, 59, 61, 63, 66, 2, 4, 6, 12, 16, 18, 20, 26, 30, 32, 34, 40, 44, 46, 48, 54, 58, 60, 62, 67, 1, 11, 15, 25, 29, 39, 43, 53, 57, 68, 9, 23, 37, 51, 70, 14, 28, 42, 56, 65, 10, 24, 38, 52, 69, 8, 22, 36, 50, 64, 71]; |
| 64, 0x1E7 | [1, 3, 4, 5, 7, 10, 14, 15, 16, 17, 18, 19, 25, 26, 27, 29, 31, 34, 35, 37, 39, 40, 45, 46, 50, 51, 53, 58, 59, 60, 61, 65, 2, 6, 9, 13, 24, 28, 30, 33, 36, 38, 44, 49, 52, 57, 64, 66, 8, 12, 23, 32, 43, 48, 56, 63, 67, 11, 22, 42, 47, 55, 62, 68, 21, 41, 54, 69, 20, 70, 71, 72]; or [1, 2, 5, 6, 7, 9, 10, 13, 19, 24, 27, 28, 29, 30, 31, 33, 35, 36, 37, 38, 40, 44, 46, 49, 51, 52, 53, 57, 61, 64, 66, 3, 8, 12, 14, 15, 16, 17, 23, 25, 32, 43, 48, 56, 58, 59, 63, 67, 11, 18, 20, 22, 26, 34, 39, 55, 62, 70, 4, 21, 42, 54, 71, 45, 50, 60, 65, 47, 68, 41, 69, 72]; |
| 64, 0x165 | [2, 4, 5, 9, 10, 13, 14, 15, 22, 23, 24, 25, 26, 28, 31, 33, 35, 38, 44, 49, 50, 51, 53, 54, 55, 56, 57, 58, 60, 61, 65, 1, 3, 8, 12, 21, 27, 30, 32, 34, 37, 43, 48, 52, 59, 66, 7, 11, 20, 29, 36, 42, 47, 64, 67, 6, 19, 41, 46, 63, 68, 18, 40, 45, 62, 69, 17, 39, 70, 16, 71, 72]; or [2, 4, 5, 9, 10, 13, 14, 15, 22, 23, 24, 25, 26, 28, 31, 33, 35, 38, 44, 49, 50, 51, 53, 54, 55, 56, 57, 58, 60, 61, 65, 1, 3, 8, 12, 21, 27, 30, 32, 34, 37, 43, 48, 52, 59, 66, 7, 11, 20, 29, 36, 42, 47, 64, 67, 6, 17, 18, 39, 41, 45, 62, 63, 70, 19, 46, 68, 16, 40, 71, 72, 69]; |
| 64, 0x171 | [4, 5, 6, 10, 13, 15, 16, 17, 24, 25, 28, 31, 34, 35, 37, 38, 39, 42, 48, 50, 52, 53, 55, 56, 58, 60, 61, 64, 65, 3, 9, 12, 14, 23, 27, 30, 33, 36, 41, 47, 49, 51, 54, 57, 59, 63, 66, 2, 8, 11, 22, 26, 29, 32, 40, 46, 62, 67, 1, 7, 21, 45, 68, 20, 44, 69, 19, 43, 70, 18, 71, 72]; or [4, 5, 6, 10, 13, 15, 16, 17, 24, 25, 28, 31, 34, 35, 37, 38, 39, 42, 48, 50, 52, 53, 55, 56, 58, 60, 61, 64, 65, 3, 9, 12, 14, 23, 27, 30, 33, 36, 41, 47, 49, 51, 54, 57, 59, 63, 66, 2, 7, 8, 18, 19, 26, 40, 44, 62, 71, 1, 11, 29, 32, 43, 72, 22, 46, 67, 21, 45, 68, 20, 69, 70]; |
| 64, 0x18D | [2, 3, 4, 8, 9, 10, 12, 13, 14, 15, 19, 21, 22, 25, 26, 28, 29, 34, 35, 36, 37, 40, 41, 42, 47, 49, 51, 52, 53, 54, 55, 56, 57, 58, 61, 63, 64, 65, 1, 7, 11, 18, 20, 24, 27, 33, 39, 46, 48, 50, 60, 62, 66, 6, 17, 23, 32, 38, 45, 59, 67, 5, 16, 31, 44, 68, 30, 43, 69, 70, 71, 72]; or [4, 5, |

TABLE 2-continued

| Typical K1, typical CRC polynomial | Typical K1, typical CRC polynomial |
|---|---|
| | 6, 9, 12, 15, 16, 20, 23, 24, 25, 27, 29, 31, 32, 34, 38, 42, 44, 47, 51, 52, 53, 54, 55, 63, 68, 3, 8, 11, 14, 19, 22, 26, 28, 30, 33, 37, 41, 43, 46, 50, 62, 64, 69, 2, 7, 10, 13, 18, 21, 36, 40, 45, 49, 61, 70, 1, 17, 35, 39, 48, 60, 71, 57, 58, 59, 67, 56, 65, 72, 66]; |
| 64, 0x1FD | [2, 3, 5, 6, 8, 10, 14, 16, 18, 20, 21, 25, 26, 27, 30, 31, 33, 36, 37, 40, 41, 42, 44, 49, 53, 54, 56, 57, 58, 60, 61, 62, 63, 65, 1, 4, 7, 9, 13, 15, 17, 19, 24, 29, 32, 35, 39, 43, 48, 52, 55, 59, 66, 12, 23, 28, 34, 38, 47, 51, 64, 67, 11, 22, 46, 50, 68, 45, 69, 70, 71, 72]; or [1, 2, 10, 12, 13, 15, 16, 18, 20, 24, 26, 28, 30, 31, 35, 36, 37, 40, 41, 43, 46, 47, 50, 51, 52, 54, 59, 63, 64, 70, 3, 5, 6, 8, 14, 21, 25, 27, 33, 42, 44, 49, 53, 56, 57, 58, 60, 61, 62, 65, 4, 7, 9, 17, 19, 29, 32, 39, 48, 55, 66, 22, 34, 45, 69, 11, 38, 72, 23, 67, 68, 71]; |
| 64, 0x1C1 | [6, 7, 8, 12, 14, 16, 18, 19, 21, 23, 28, 30, 31, 34, 35, 39, 40, 43, 45, 48, 49, 50, 52, 53, 54, 56, 60, 63, 64, 65, 5, 11, 13, 15, 17, 20, 22, 27, 29, 33, 38, 42, 44, 47, 51, 55, 59, 62, 66, 4, 10, 26, 32, 37, 41, 46, 58, 61, 67, 3, 9, 25, 36, 57, 68, 2, 24, 69, 1, 70, 71, 72]; or [6, 7, 8, 12, 14, 16, 18, 19, 21, 23, 28, 30, 31, 34, 35, 39, 40, 43, 45, 48, 49, 50, 52, 53, 54, 56, 60, 63, 64, 65, 5, 11, 13, 15, 17, 20, 22, 27, 29, 33, 38, 42, 44, 47, 51, 55, 59, 62, 66, 1, 9, 24, 32, 36, 41, 46, 57, 61, 72, 4, 10, 26, 37, 58, 67, 3, 25, 68, 2, 69, 70, 71]; |
| 64, 0x1E9 | [3, 5, 7, 8, 9, 10, 11, 12, 15, 21, 22, 23, 24, 25, 27, 30, 31, 32, 33, 35, 36, 37, 38, 42, 44, 45, 46, 49, 50, 51, 53, 54, 58, 59, 61, 63, 64, 65, 2, 4, 6, 14, 20, 26, 29, 34, 41, 43, 48, 52, 57, 60, 62, 66, 1, 13, 19, 28, 40, 47, 56, 67, 18, 39, 55, 68, 17, 69, 16, 70, 71, 72]; or [1, 2, 4, 5, 6, 7, 8, 14, 16, 17, 22, 27, 28, 29, 31, 35, 36, 40, 43, 44, 45, 48, 50, 53, 54, 56, 59, 61, 62, 63, 64, 71, 3, 10, 11, 15, 18, 19, 20, 23, 25, 34, 37, 38, 39, 41, 47, 49, 55, 60, 68, 9, 24, 30, 33, 42, 46, 52, 58, 69, 12, 13, 26, 57, 70, 21, 32, 51, 65, 66, 67, 72]; |
| 64, 0x119 | [3, 4, 6, 9, 10, 11, 14, 15, 18, 21, 23, 24, 25, 31, 32, 33, 34, 38, 39, 40, 42, 44, 45, 48, 49, 50, 51, 52, 53, 56, 58, 62, 64, 65, 2, 5, 8, 13, 17, 20, 22, 30, 37, 41, 43, 47, 55, 57, 61, 63, 66, 1, 7, 12, 16, 19, 29, 36, 46, 54, 60, 67, 28, 35, 59, 68, 27, 69, 26, 70, 71, 72]; or [4, 7, 8, 10, 13, 14, 15, 18, 19, 22, 25, 27, 28, 29, 35, 36, 37, 38, 42, 43, 44, 46, 48, 49, 52, 53, 54, 55, 56, 57, 60, 62, 69, 3, 6, 9, 12, 17, 21, 24, 26, 34, 41, 45, 47, 51, 59, 61, 70, 11, 23, 31, 32, 33, 39, 40, 50, 58, 64, 65, 2, 5, 16, 20, 71, 1, 63, 72, 30, 66, 67, 68]; |
| 64, 0x1B3 | [1, 2, 3, 7, 12, 13, 15, 18, 19, 21, 22, 24, 25, 26, 27, 28, 29, 31, 32, 33, 35, 36, 39, 40, 41, 43, 47, 49, 52, 55, 56, 57, 58, 59, 62, 63, 65, 6, 11, 14, 17, 20, 23, 30, 34, 38, 42, 46, 48, 51, 54, 61, 66, 5, 10, 16, 37, 45, 50, 53, 60, 64, 67, 4, 9, 44, 68, 8, 69, 70, 71, 72]; or [3, 6, 7, 11, 13, 14, 15, 17, 19, 20, 22, 23, 29, 30, 33, 34, 36, 38, 41, 42, 43, 46, 47, 48, 49, 51, 52, 54, 59, 61, 63, 66, 2, 9, 10, 16, 18, 25, 26, 32, 37, 39, 44, 45, 50, 55, 57, 62, 64, 70, 1, 5, 8, 21, 24, 31, 35, 40, 53, 56, 71, 12, 28, 58, 60, 67, 4, 27, 68, 65, 69, 72]; |
| 64, 0x1D9 | [3, 4, 7, 9, 10, 11, 13, 14, 15, 16, 17, 22, 23, 27, 28, 30, 31, 32, 36, 38, 39, 41, 42, 44, 46, 47, 48, 49, 51, 53, 56, 57, 58, 59, 60, 61, 62, 64, 65, 2, 6, 8, 12, 21, 26, 29, 35, 37, 40, 43, 45, 50, 52, 55, 63, 66, 1, 5, 20, 25, 34, 54, 67, 19, 24, 33, 68, 18, 69, 70, 71, 72]; or [2, 3, 4, 5, 8, 9, 10, 13, 17, 18, 19, 21, 24, 27, 29, 34, 36, 38, 39, 47, 50, 51, 54, 56, 57, 58, 60, 61, 62, 63, 64, 69, 1, 7, 12, 16, 20, 23, 26, 28, 33, 35, 37, 46, 49, 53, 55, 59, 70, 6, 15, 22, 25, 30, 31, 32, 42, 43, 45, 68, 14, 41, 44, 52, 71, 11, 48, 65, 40, 72, 66, 67]; |
| 64, 0x157 | [1, 3, 6, 7, 8, 13, 14, 15, 16, 17, 18, 20, 24, 26, 27, 29, 30, 31, 33, 34, 35, 36, 37, 41, 42, 46, 49, 50, 53, 54, 55, 56, 58, 59, 61, 63, 64, 65, 2, 5, 12, 19, 23, 25, 28, 32, 40, 45, 48, 52, 57, 60, 62, 66, 4, 11, 22, 39, 44, 47, 51, 67, 10, 21, 38, 43, 68, 9, 69, 70, 71, 72]; or [1, 2, 3, 5, 8, 12, 18, 19, 20, 23, 24, 25, 27, 28, 31, 32, 37, 40, 42, 45, 46, 48, 50, 52, 56, 57, 59, 60, 61, 62, 64, 66, 4, 6, 11, 13, 14, 15, 16, 22, 29, 33, 34, 35, 39, 44, 47, 51, 53, 54, 67, 7, 10, 21, 36, 38, 41, 43, 49, 63, 68, 9, 26, 30, 55, 69, 58, 70, 17, 71, 65, 72]; |
| 64, 0x1B1 | [4, 5, 7, 10, 12, 13, 16, 17, 19, 20, 21, 22, 25, 26, 27, 29, 30, 33, 36, 37, 41, 42, 43, 51, 55, 56, 58, 61, 63, 64, 65, 3, 6, 9, 11, 15, 18, 24, 28, 32, 35, 40, 50, 54, 57, 60, 62, 66, 2, 8, 14, 23, 31, 34, 39, 49, 53, 59, 67, 1, 38, 48, 52, 68, 47, 69, 46, 70, 45, 71, 44, 72]; or [4, 5, 7, 10, 12, 13, 16, 17, 19, 20, 21, 22, 25, 26, 27, 29, 30, 33, 36, 37, 41, 42, 43, 51, 55, 56, 58, 61, 63, 64, 65, 3, 6, 9, 11, 15, 18, 24, 28, 32, 35, 40, 50, 54, 57, 60, 62, 66, 2, 8, 14, 23, 31, 34, 39, 49, 53, 59, 67, 1, 38, 44, 52, 72, 48, 68, 46, 70, 47, 69, 45, 71]; |
| 64, 0x139 | [3, 4, 5, 6, 9, 17, 20, 21, 22, 23, 26, 34, 37, 38, 39, 40, 43, 51, 54, 55, 56, 57, 60, 65, 2, 8, 16, 19, 25, 33, 36, 42, 50, 53, 59, 66, 1, 7, 15, 18, 24, 32, 35, 41, 49, 52, 58, 67, 14, 31, 48, 68, 13, 30, 47, 64, 69, 12, 29, 46, 63, 70, 11, 28, 45, 62, 71, 10, 27, 44, 61, 72]; |
| 64, 0x1D7 | [1, 3, 6, 8, 9, 17, 18, 20, 23, 25, 26, 34, 35, 37, 40, 42, 43, 51, 52, 54, 57, 59, 60, 65, 2, 5, 7, 16, 19, 22, 24, 33, 36, 39, 41, 50, 53, 56, 58, 66, 4, 15, 21, 32, 38, 49, 55, 67, 14, 31, 48, 68, 13, 30, 47, 64, 69, 12, 29, 46, 63, 70, 11, 28, 45, 62, 71, 10, 27, 44, 61, 72]; or [1, |

TABLE 2-continued

| Typical K1, typical CRC polynomial | Typical K1, typical CRC polynomial |
|---|---|
| 64, 0×101 | 3, 6, 8, 9, 17, 18, 20, 23, 25, 26, 34, 35, 37, 40, 42, 43, 51, 52, 54, 57, 59, 60, 65, 2, 4, 5, 15, 19, 21, 22, 32, 36, 38, 39, 49, 53, 55, 56, 67, 14, 31, 48, 68, 7, 13, 24, 30, 41, 47, 58, 64, 69, 12, 29, 46, 63, 70, 10, 27, 44, 61, 72, 16, 33, 50, 66, 11, 28, 45, 62, 71]; [8, 16, 24, 32, 40, 48, 56, 64, 65, 7, 15, 23, 31, 39, 47, 55, 63, 66, 6, 14, 22, 30, 38, 46, 54, 62, 67, 5, 13, 21, 29, 37, 45, 53, 61, 68, 4, 12, 20, 28, 36, 44, 52, 60, 69, 3, 11, 19, 27, 35, 43, 51, 59, 70, 2, 10, 18, 26, 34, 42, 50, 58, 71, 1, 9, 17, 25, 33, 41, 49, 57, 72]; |

Table 2 lists interleaved sequences when a CRC length is 3, 4, 5, 6, 7, or 8, and $K_1$ is equal to 32, 48, 64, 30, 40, 50, or 60. A value whose sequence number in the interleaved sequence is less than or equal to $K_1$ is corresponding to a reverse number of $K_1$ information bits. For example, a sequence number 1 is corresponding to a $K_1^{th}$ information bit, and a sequence number 2 is corresponding to a $(K_1-1)^{th}$ information bit. If there are J1 values whose sequence numbers in the interleaved sequence are greater than $K_1$, the J1 values are corresponding to J1 check bits. For example, a sequence number $(K_1+1)$ is corresponding to a first check bit, and a sequence number $(K_1+J1)$ is corresponding to a $J1^{th}$ check bit.

Figure 7:
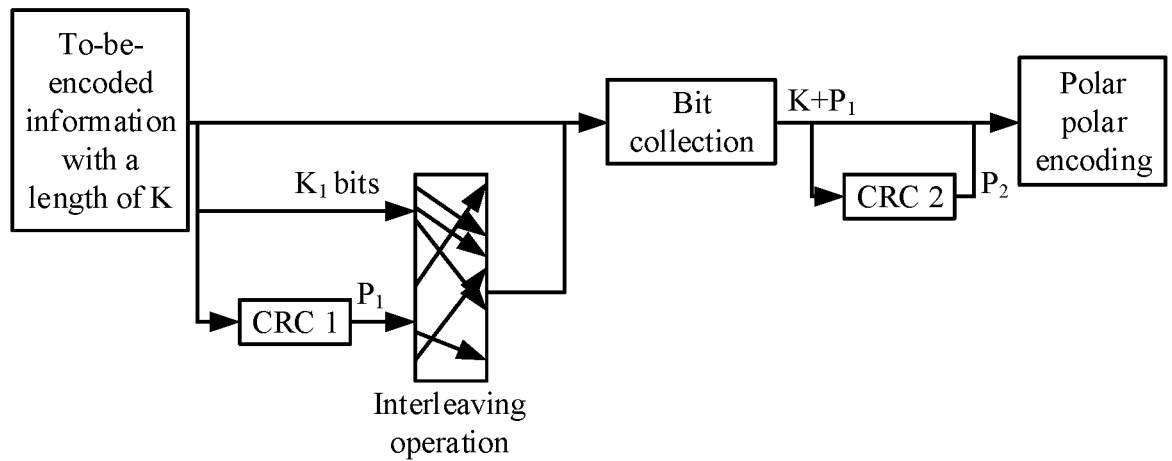
FIG. 7 is a schematic diagram 4 of a polar code encoding method according to an embodiment of this application.

Optionally, as shown in FIG. 7, based on the polar code encoding method in the partial interleaving mode shown in FIG. 6, the transmit end may further perform interleaving after check encoding is performed on the first part of information bit sequence, to obtain a first check encoding codeword, perform bit collection on the first check encoding codeword and the second part of information bit sequence in the K information bits except the first part of information bit. A bit collection process may be understood as: combining the first check encoding codeword and the second part of information bit in a specific order; performing check encoding on a collected sequence to obtain a second check encoding codeword; and performing polar encoding on the second check encoding codeword. Specifically, the transmit end performs check encoding on the first part of information bit sequence with a length of $K_1$ and the sequence of all information bits with a length of K respectively by using the two CRC codes (CRC 1 and CRC 2). Obtained check bit sequences are respectively P1 and P2. Lengths of P1 and P2 are respectively J1 and J2. $K_1=Int[K \times R]+C$, where Int[ ] represents a rounding operation, K represents a quantity of all information bits, and an optional combination of R and C includes {R, C}={0.5, 0}, {0, 40}, and the like. J1 and J2 may meet a specific relationship. For example, J1+J2=C and J1=3, 4, 5, 6, 7, 8, or the like. C is a constant, and is determined based on a system false alarm probability requirement. For example, C=19, 20, or the like. Generator polynomials of the CRC 1 and the CRC 2 are shown in Table 1. The $K_1$ information bits checked by using the CRC 1 and the J1 check bits generated by using the CRC 1 are interleaved to obtain CW 1. The interleaving operation is defined by the interleaved sequence. The typical interleaved sequence is shown in Table 2. The (K−K1) information bits not checked by using the CRC 1 and CW 1 are collected to obtain CW 2. CRC 2 check is performed on CW 2. Obtained check bits and CW 2 are sorted to obtain CW 3. The codeword CW 3 is sent to a polar encoder for encoding.

The foregoing possible implementation is merely an example of this embodiment of this application. It may be understood that the transmit end may further select the first part of information bit sequence with a length of $K_1$ and a second part of information bit sequence with a length of $K_2$ from the K information bits, where $K=K_1+K_2$. The first part of information bit sequence and the second part of information bit sequence complement each other, and a union set of the first part of information bit sequence and the second part of information bit sequence is a sequence of all of the K information bits. Manners of check, interleaving, and encoding are similar to those in the foregoing possible implementation. Optionally, the first part of information bit sequence may further have an intersection with the second part of information bit sequence. In conclusion, the polar code encoding method described in the foregoing possible implementation is applicable to two to-be-encoded first bit sequences in any case.

In another possible implementation, the transmit end performs check encoding on an empty set bit sequence with a length of 0 to obtain a first check bit sequence (or to be distinguished from the foregoing description, herein denoted as a third check bit sequence), and performs check encoding on the K information bits to obtain the second check bit sequence, where K is a positive integer. The third check bit sequence is an all-zero vector, and a length of the third check bit sequence is related to a check code. The transmit end interleaves the sequence of all information bits, the second check bit sequence, and the third check bit sequence, and performs polar encoding on a sequence obtained after the interleaving operation.

Figure 8:
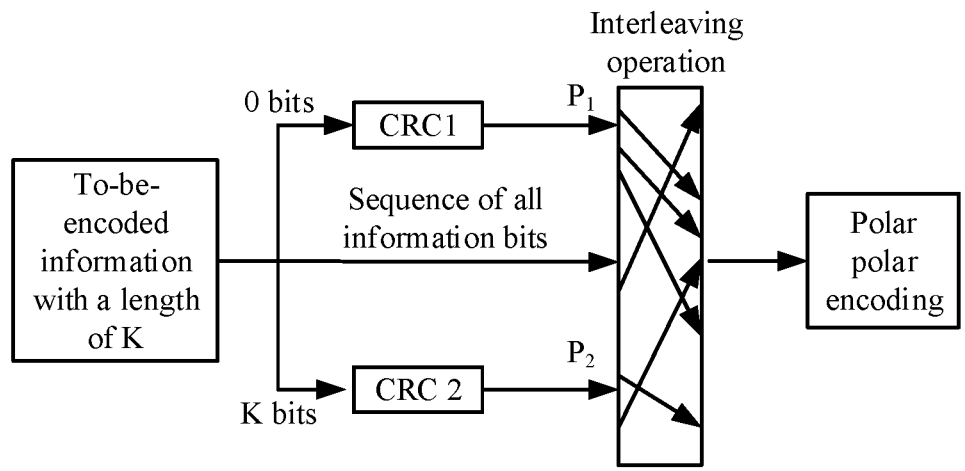
FIG. 8 is a schematic diagram 5 of a polar code encoding method according to an embodiment of this application.

For example, FIG. 8 is a schematic diagram of encoding in another possible implementation.

(I). Check

Before the polar code encoding is performed, the transmit end performs check encoding on the empty set bit sequence with a length of 0 and the sequence of all information bits with a length of K respectively by using the two CRC codes (CRC 1 and CRC 2). Obtained check bit sequences are respectively P1 and P2. Lengths of P1 and P2 are respectively J1 and J2. P1 is an all-zero vector. J1 and J2 meet a specific relationship. For example, J1+J2=C and J2=16, 17, 18, 19, or the like. C is a constant, and is determined based on a system false alarm probability requirement. For example, C=19, 20, 21, 22, or the like. Generator polynomials of the CRC 1 and the CRC 2 are shown in Table 1.

(II). Interleaving

The K information bits, the check bit sequence P1 obtained by using the CRC 1, and the check bit sequence P2 obtained by using the CRC 2 are sorted and interleaved.

The K information bits and the check bit sequence P2 are sorted to obtain the codeword sequence CW 1. One arrangement manner is that the first K bits of CW 1 are K information bits, and the last J2 bits are check bits P2.

The codeword CW 1 is interleaved. The interleaving operation is defined by an interleaved sequence. The interleaved sequence is shown in Table 3. A length of the interleaved sequence is (K+J2), and CW 1' is obtained after interleaving.

The check bit sequence P1 obtained by using the CRC 1 is inserted into CW 1' to obtain the codeword CW 2, that is, a check bit of P1 is alternately arranged in CW 1'. An insertion location may be before, after, or in CW 1'. If the check bit is inserted in CW 1', one method is that the insertion location is corresponding to a location with lowest reliability in (K+J1+J2) locations during subsequent polar encoding.

(III). Encoding

The codeword CW 2 is input into a polar encoder for encoding.

TABLE 3

| Typical K, typical CRC polynomial | Interleaved sequence |
|---|---|
| 80, 0 × 1A9B1 | [4, 5, 7, 10, 11, 12, 15, 17, 20, 21, 24, 25, 27, 29, 30, 32, 36, 37, 38, 43, 44, 45, 47, 50, 51, 52, 53, 60, 61, 63, 64, 69, 70, 71, 76, 78, 79, 80, 81, 3, 6, 9, 14, 16, 19, 23, 26, 28, 31, 35, 42, 46, 49, 59, 62, 68, 75, 77, 82, 2, 8, 13, 18, 22, 34, 41, 48, 58, 67, 74, 83, 1, 33, 40, 57, 66, 73, 84, 39, 56, 65, 72, 85, 55, 86, 54, 87, 88, 89, 90, 91, 92, 93, 94, 95, 96]; or [3, 5, 9, 11, 12, 15, 16, 18, 20, 26, 28, 31, 35, 36, 37, 38, 42, 47, 49, 50, 52, 55, 58, 61, 63, 64, 65, 68, 70, 73, 75, 89, 2, 4, 8, 10, 14, 17, 19, 25, 27, 30, 34, 41, 46, 48, 51, 54, 57, 60, 62, 67, 69, 72, 74, 90, 1, 7, 13, 24, 29, 33, 40, 45, 53, 56, 59, 66, 71, 80, 91, 21, 22, 23, 39, 76, 79, 86, 32, 78, 87, 43, 44, 81, 6, 77, 82, 96, 83, 84, 88, 94, 95, 92, 93, 85]; |
| 80, 0 × 1FDBF | [1, 6, 8, 9, 11, 12, 13, 14, 15, 17, 18, 19, 20, 22, 27, 33, 35, 40, 41, 43, 45, 46, 48, 55, 56, 60, 61, 62, 64, 65, 70, 72, 75, 76, 79, 80, 81, 5, 7, 10, 16, 21, 26, 32, 34, 39, 42, 44, 47, 54, 59, 63, 69, 71, 74, 78, 82, 4, 25, 31, 38, 53, 58, 68, 73, 77, 83, 3, 24, 30, 37, 52, 57, 67, 84, 2, 23, 29, 36, 51, 66, 85, 28, 50, 86, 49, 87, 88, 89, 90, 91, 92, 93, 94, 95, 96]; or [1, 2, 3, 7, 10, 14, 18, 20, 21, 23, 24, 25, 26, 32, 33, 35, 36, 37, 41, 42, 53, 54, 58, 61, 62, 65, 68, 69, 76, 77, 78, 88, 4, 5, 11, 12, 13, 17, 22, 27, 31, 34, 38, 47, 48, 56, 60, 71, 72, 73, 79, 83, 8, 15, 43, 45, 46, 52, 55, 57, 67, 70, 80, 89, 16, 28, 29, 30, 50, 51, 59, 63, 74, 75, 94, 44, 64, 66, 90, 6, 9, 19, 40, 81, 49, 96, 39, 82, 92, 95, 85, 93, 91, 84, 86, 87]; |
| 80, 0 × 16801 | [11, 13, 14, 16, 22, 26, 28, 32, 33, 35, 36, 37, 38, 40, 41, 43, 45, 46, 48, 52, 55, 56, 57, 58, 60, 63, 64, 65, 67, 68, 69, 74, 75, 76, 78, 79, 80, 81, 10, 12, 15, 21, 25, 27, 31, 34, 39, 42, 44, 47, 51, 54, 59, 62, 66, 73, 77, 82, 9, 20, 24, 30, 50, 53, 61, 72, 83, 8, 19, 23, 29, 49, 71, 84, 7, 18, 70, 85, 6, 17, 86, 5, 87, 4, 88, 3, 89, 2, 90, 1, 91, 92, 93, 94, 95, 96]; or [2, 3, 5, 13, 14, 15, 16, 17, 21, 24, 25, 27, 28, 29, 30, 33, 34, 36, 38, 40, 43, 44, 47, 48, 49, 53, 54, 55, 60, 70, 73, 74, 76, 92, 1, 4, 12, 20, 23, 26, 32, 35, 37, 39, 42, 46, 52, 59, 69, 72, 75, 80, 93, 19, 31, 51, 56, 57, 63, 64, 65, 67, 71, 78, 94, 18, 45, 50, 58, 62, 66, 77, 95, 11, 22, 41, 68, 79, 81, 61, 96, 10, 82, 9, 83, 8, 84, 7, 85, 6, 86, 87, 88, 89, 90, 91]; |
| 80, 0 × 1D5E3 | [1, 2, 3, 4, 7, 8, 9, 10, 15, 18, 19, 20, 23, 27, 29, 30, 32, 33, 36, 39, 44, 45, 46, 48, 50, 60, 61, 63, 64, 65, 68, 72, 73, 75, 76, 77, 79, 80, 81, 6, 14, 17, 22, 26, 28, 31, 35, 38, 43, 47, 49, 59, 62, 67, 71, 74, 78, 82, 5, 13, 16, 21, 25, 34, 37, 42, 58, 66, 70, 83, 12, 24, 41, 57, 69, 84, 11, 40, 56, 85, 55, 86, 54, 87, 53, 88, 52, 89, 51, 90, 91, 92, 93, 94, 95, 96]; or [4, 6, 10, 14, 15, 17, 20, 22, 23, 26, 27, 28, 30, 31, 33, 35, 36, 38, 39, 43, 46, 47, 48, 49, 50, 59, 61, 62, 65, 67, 68, 71, 73, 74, 77, 78, 82, 3, 5, 9, 13, 16, 19, 21, 25, 29, 32, 34, 37, 42, 45, 58, 60, 64, 66, 70, 72, 76, 80, 83, 1, 8, 12, 24, 40, 41, 51, 52, 63, 69, 75, 79, 95, 2, 7, 18, 44, 81, 57, 84, 11, 96, 56, 85, 55, 86, 53, 54, 93, 94, 87, 88, 89, 90, 91, 92]; |
| 80, 0 × 179E9 | [3, 5, 7, 8, 9, 10, 13, 14, 15, 16, 17, 18, 19, 20, 24, 25, 26, 27, 29, 32, 34, 35, 39, 40, 41, 42, 43, 44, 46, 47, 48, 51, 53, 55, 56, 57, 58, 59, 60, 62, 63, 64, 65, 68, 71, 75, 76, 78, 79, 80, 81, 2, 4, 6, 12, 23, 28, 31, 33, 38, 45, 50, 52, 54, 61, 67, 70, 74, 77, 82, 1, 11, 22, 30, 37, 49, 66, 69, 73, 83, 21, 36, 72, 84, 85, 86, 87, 88, 89, 90, 91, 92, 93, 94, 95, 96]; or [2, 3, 4, 6, 8, 9, 11, 12, 18, 19, 20, 21, 22, 23, 25, 27, 31, 34, 35, 36, 37, 38, 42, 45, 46, 47, 50, 51, 52, 54, 58, 61, 63, 64, 71, 72, 73, 77, 84, 1, 7, 15, 16, 17, 24, 28, 29, 30, 33, 39, 43, 48, 55, 56, 59, 62, 66, 67, 74, 80, 92, 13, 14, 26, 32, 40, 41, 57, 68, 69, 76, 78, 94, 5, 10, 44, 49, 53, 60, 70, 85, 65, 87, 88, 75, 79, 89, 86, 90, 91, 93, 95, 81, 96, 82, 83]; |
| 80, 0 × 1E469 | [3, 5, 9, 11, 12, 14, 16, 18, 19, 24, 26, 28, 29, 30, 32, 34, 37, 38, 40, 41, 42, 45, 47, 48, 49, 50, 51, 52, 55, 56, 57, 58, 59, 60, 61, 62, 63, 64, 66, 68, 70, 71, 73, 74, 75, 79, 80, 81, 2, 4, 8, 10, 13, 15, 17, 23, 25, 27, 31, 33, 36, 39, 44, 46, 54, 65, 67, 69, 72, 78, 82, 1, 7, 22, 35, 43, 53, 77, 83, 6, 21, 76, 84, 20, 85, 86, 87, 88, 89, 90, 91, 92, 93, 94, 95, 96]; or [3, 4, 5, 7, 10, 11, 12, 13, 15, 17, 22, 25, 27, 28, 32, 33, 34, 35, 39, 43, 44, 45, 46, 49, 51, 52, 56, 60, 68, 69, 74, 76, 77, 78, 79, 91, 1, 6, 9, 14, 18, 21, 23, 24, 40, 41, 47, 50, 55, 57, 58, 59, 61, 65, 66, 72, 86, 2, 16, 26, 31, 38, 42, 48, 67, 73, 75, 80, 92, 8, 20, 30, 37, 54, 93, 19, 53, 62, 64, 84, 29, 63, 71, 85, 36, 70, 94, 95, 81, 82, 96, 83, 87, 88, 89, 90]; |

TABLE 3-continued

| Typical K, typical CRC polynomial | Interleaved sequence |
|---|---|
| 80, 0 × 1CC27 | [1, 3, 4, 5, 6, 9, 10, 11, 12, 13, 16, 17, 18, 21, 22, 25, 27, 28, 30, 32, 33, 34, 35, 36, 38, 42, 44, 46, 47, 50, 52, 53, 55, 56, 58, 60, 61, 62, 64, 68, 69, 70, 72, 74, 75, 76, 77, 78, 80, 81, 2, 8, 15, 20, 24, 26, 29, 31, 37, 41, 43, 45, 49, 51, 54, 57, 59, 63, 67, 71, 73, 79, 82, 7, 14, 19, 23, 40, 48, 66, 83, 39, 65, 84, 85, 86, 87, 88, 89, 90, 91, 92, 93, 94, 95, 96]; or [3, 8, 9, 11, 12, 14, 15, 16, 18, 19, 21, 23, 24, 27, 28, 29, 34, 37, 38, 39, 42, 43, 45, 46, 48, 52, 53, 54, 62, 65, 68, 69, 71, 73, 76, 79, 80, 92, 4, 6, 7, 10, 13, 22, 32, 33, 40, 41, 47, 49, 57, 60, 63, 64, 66, 74, 75, 83, 2, 5, 17, 31, 36, 56, 59, 67, 70, 84, 1, 20, 30, 35, 55, 58, 61, 72, 78, 85, 26, 44, 51, 93, 25, 50, 77, 94, 82, 95, 86, 87, 88, 89, 90, 91, 81, 96]; |
| 80, 0 × 1DBA3 | [1, 2, 3, 4, 6, 7, 10, 12, 13, 15, 18, 20, 22, 23, 24, 25, 26, 27, 28, 29, 36, 37, 38, 40, 43, 44, 47, 48, 49, 51, 54, 57, 61, 63, 67, 68, 70, 71, 72, 75, 76, 81, 5, 9, 11, 14, 17, 19, 21, 35, 39, 42, 46, 50, 53, 56, 60, 62, 66, 69, 74, 82, 8, 16, 34, 41, 45, 52, 55, 59, 65, 73, 80, 83, 33, 58, 64, 79, 84, 32, 78, 85, 31, 77, 86, 30, 87, 88, 89, 90, 91, 92, 93, 94, 95, 96]; or [2, 5, 9, 10, 12, 13, 15, 17, 18, 20, 26, 29, 30, 31, 33, 34, 36, 38, 42, 45, 46, 48, 49, 51, 53, 56, 58, 61, 62, 65, 67, 70, 71, 75, 80, 90, 1, 4, 8, 11, 14, 16, 19, 25, 28, 32, 35, 37, 41, 44, 47, 50, 52, 55, 57, 60, 64, 66, 69, 74, 79, 91, 6, 22, 23, 59, 72, 73, 76, 78, 92, 21, 68, 77, 88, 7, 24, 43, 54, 63, 89, 39, 40, 82, 3, 83, 27, 84, 95, 81, 85, 96, 93, 94, 86, 87]; |
| 80, 0 × 1F635 | [2, 5, 6, 8, 12, 20, 23, 24, 25, 27, 28, 30, 31, 32, 33, 34, 36, 37, 38, 39, 42, 44, 45, 46, 49, 51, 52, 54, 55, 57, 59, 60, 61, 62, 63, 65, 68, 70, 71, 72, 73, 74, 75, 76, 78, 79, 80, 81, 1, 4, 7, 11, 19, 22, 26, 29, 35, 41, 43, 48, 50, 53, 56, 58, 64, 67, 69, 77, 82, 3, 10, 18, 21, 40, 47, 66, 83, 9, 17, 84, 16, 85, 15, 86, 14, 87, 13, 88, 89, 90, 91, 92, 93, 94, 95, 96]; or [2, 3, 4, 5, 8, 10, 12, 18, 20, 21, 22, 24, 26, 27, 29, 33, 35, 38, 39, 40, 43, 45, 46, 47, 50, 51, 53, 54, 58, 62, 65, 66, 69, 75, 77, 79, 80, 83, 1, 7, 9, 11, 17, 19, 23, 25, 28, 32, 34, 37, 42, 44, 49, 52, 57, 61, 64, 68, 74, 76, 78, 84, 16, 30, 41, 48, 55, 56, 59, 67, 70, 71, 72, 85, 13, 15, 31, 36, 60, 73, 91, 14, 92, 6, 90, 63, 94, 95, 93, 81, 82, 86, 87, 88, 96, 89]; |
| 80, 0 × 1B41D | [2, 3, 7, 9, 12, 13, 15, 18, 26, 28, 31, 32, 34, 36, 37, 39, 40, 41, 43, 45, 48, 49, 51, 54, 55, 58, 59, 60, 64, 66, 69, 70, 76, 77, 79, 81, 1, 6, 8, 11, 14, 17, 25, 27, 30, 33, 35, 38, 42, 44, 47, 50, 53, 57, 63, 65, 68, 75, 78, 82, 5, 10, 16, 24, 29, 46, 52, 56, 62, 67, 74, 83, 4, 23, 61, 73, 84, 22, 72, 80, 85, 21, 71, 86, 20, 87, 19, 88, 89, 90, 91, 92, 93, 94, 95, 96]; or [6, 10, 11, 15, 16, 17, 18, 22, 25, 29, 30, 32, 35, 36, 37, 41, 42, 46, 47, 52, 54, 58, 63, 67, 70, 72, 73, 74, 75, 78, 79, 80, 85, 5, 9, 14, 21, 24, 28, 31, 34, 40, 45, 51, 53, 57, 62, 66, 69, 71, 77, 86, 4, 8, 13, 20, 23, 27, 33, 39, 44, 50, 56, 61, 65, 68, 76, 87, 3, 7, 12, 19, 26, 38, 43, 49, 55, 60, 64, 88, 2, 48, 59, 89, 81, 1, 82, 90, 96, 83, 91, 92, 93, 94, 84, 95]; |
| 80, 0 × 19F11 | [4, 9, 10, 11, 15, 17, 19, 23, 27, 35, 36, 37, 39, 40, 41, 42, 43, 44, 47, 48, 50, 53, 54, 55, 56, 57, 61, 63, 64, 65, 66, 69, 72, 76, 78, 79, 80, 81, 3, 8, 14, 16, 18, 22, 26, 34, 38, 46, 49, 52, 60, 62, 68, 71, 75, 77, 82, 2, 7, 13, 21, 25, 33, 45, 51, 59, 67, 70, 74, 83, 1, 6, 12, 20, 24, 32, 58, 73, 84, 5, 31, 85, 30, 86, 29, 87, 28, 88, 89, 90, 91, 92, 93, 94, 95, 96]; or [1, 2, 9, 13, 14, 16, 18, 19, 22, 23, 32, 33, 36, 39, 43, 44, 46, 48, 51, 55, 56, 58, 59, 62, 64, 66, 67, 70, 71, 72, 73, 75, 79, 91, 4, 8, 10, 11, 12, 21, 27, 31, 37, 38, 40, 41, 45, 53, 74, 76, 92, 5, 6, 7, 17, 42, 47, 49, 52, 54, 60, 63, 68, 69, 80, 85, 3, 26, 30, 50, 61, 65, 78, 86, 15, 25, 29, 57, 77, 87, 24, 28, 35, 88, 20, 93, 81, 34, 82, 94, 95, 96, 83, 84, 89, 90]; |
| 80, 0 × 14F61 | [5, 6, 8, 9, 11, 12, 14, 15, 16, 17, 18, 19, 21, 22, 25, 27, 31, 32, 33, 39, 41, 42, 43, 47, 50, 51, 54, 58, 60, 61, 63, 64, 65, 67, 69, 70, 72, 77, 78, 81, 4, 7, 10, 13, 20, 24, 26, 30, 38, 40, 46, 49, 53, 57, 59, 62, 66, 68, 71, 76, 82, 3, 23, 29, 37, 45, 48, 52, 56, 75, 83, 2, 28, 36, 44, 55, 74, 80, 84, 1, 35, 73, 79, 85, 34, 86, 87, 88, 89, 90, 91, 92, 93, 94, 95, 96]; or [5, 6, 8, 9, 11, 12, 14, 15, 16, 17, 18, 19, 21, 22, 25, 27, 31, 32, 33, 39, 41, 42, 43, 47, 50, 51, 54, 58, 60, 61, 63, 64, 65, 67, 69, 70, 72, 77, 78, 81, 4, 7, 10, 13, 20, 24, 26, 30, 38, 40, 46, 49, 53, 57, 59, 62, 66, 68, 71, 76, 82, 3, 23, 29, 37, 45, 48, 52, 56, 75, 83, 2, 28, 36, 44, 55, 74, 80, 84, 1, 35, 73, 79, 85, 34, 91, 95, 96, 92, 87, 88, 93, 89, 94, 86, 90]; |
| 80, 0 × 151E9 | [3, 5, 7, 8, 9, 10, 11, 14, 15, 16, 18, 20, 21, 22, 23, 24, 25, 28, 29, 30, 31, 35, 36, 38, 40, 41, 44, 47, 48, 49, 51, 53, 57, 58, 59, 62, 63, 65, 66, 68, 69, 73, 74, 78, 81, 2, 4, 6, 13, 17, 19, 27, 34, 37, 39, 43, 46, 50, 52, 56, 61, 64, 67, 72, 77, 80, 82, 1, 12, 26, 33, 42, 45, 55, 60, 71, 76, 79, 83, 32, 54, 70, 75, 84, 85, 86, 87, 88, 89, 90, 91, 92, 93, 94, 95, 96]; or [1, 2, 3, 4, 5, 9, 12, 16, 17, 18, 20, 23, 27, 34, 36, 40, 41, 43, 45, 52, 54, 55, 56, 57, 59, 62, 63, 65, 67, 71, 72, 74, 77, 78, 80, 86, 6, 7, 10, 11, 13, 14, 15, 19, 21, 31, 32, 37, 44, 46, 49, 51, |

TABLE 3-continued

| Typical K, typical CRC polynomial | Interleaved sequence |
|---|---|
| | 60, 64, 66, 70, 75, 76, 88, 8, 22, 24, 25, 26, 28, 29, 38, 47, 50, 68, 79, 89, 39, 42, 48, 53, 61, 90, 73, 91, 35, 92, 30, 58, 69, 81, 82, 33, 84, 85, 93, 94, 95, 96, 83, 87]; |
| 80, 0 × 1AE8B | [1, 2, 4, 8, 9, 10, 12, 13, 14, 18, 21, 23, 25, 27, 29, 30, 31, 32, 36, 38, 40, 43, 44, 49, 50, 51, 53, 54, 55, 56, 59, 61, 65, 66, 68, 73, 77, 78, 79, 81, 3, 7, 11, 17, 20, 22, 24, 26, 28, 35, 37, 39, 42, 48, 52, 58, 60, 64, 67, 72, 76, 82, 6, 16, 19, 34, 41, 47, 57, 63, 71, 75, 80, 83, 5, 15, 33, 46, 62, 70, 74, 84, 45, 69, 85, 86, 87, 88, 89, 90, 91, 92, 93, 94, 95, 96]; or [2, 4, 6, 8, 11, 13, 14, 15, 16, 20, 21, 22, 28, 32, 33, 36, 39, 42, 43, 44, 47, 50, 55, 56, 57, 58, 59, 60, 61, 64, 65, 67, 68, 69, 70, 73, 74, 88, 1, 3, 5, 7, 10, 12, 19, 27, 31, 35, 38, 41, 46, 49, 54, 63, 66, 72, 89, 24, 26, 29, 34, 37, 51, 53, 62, 71, 78, 84, 9, 18, 23, 25, 30, 40, 77, 79, 81, 45, 52, 80, 85, 17, 76, 86, 48, 90, 96, 75, 87, 82, 92, 93, 94, 95, 83, 91]; |
| 80, 0 × 1DBF1 | [4, 5, 6, 7, 9, 10, 11, 12, 13, 15, 17, 21, 22, 26, 28, 29, 37, 38, 39, 40, 41, 43, 46, 47, 48, 49, 50, 54, 55, 60, 63, 64, 67, 69, 71, 73, 76, 79, 80, 81, 3, 8, 14, 16, 20, 25, 27, 36, 42, 45, 53, 59, 62, 66, 68, 70, 72, 75, 78, 82, 2, 19, 24, 35, 44, 52, 58, 61, 65, 74, 77, 83, 1, 18, 23, 34, 51, 57, 84, 33, 56, 85, 32, 86, 31, 87, 30, 88, 89, 90, 91, 92, 93, 94, 95, 96]; or [1, 3, 4, 6, 8, 9, 11, 12, 13, 15, 18, 19, 21, 23, 24, 34, 38, 39, 41, 43, 50, 52, 53, 56, 57, 60, 61, 63, 66, 68, 69, 71, 72, 73, 74, 75, 78, 79, 92, 5, 7, 10, 17, 22, 26, 28, 29, 37, 40, 46, 47, 48, 49, 54, 55, 64, 67, 76, 80, 81, 14, 16, 20, 25, 27, 36, 42, 45, 59, 62, 70, 82, 2, 35, 44, 58, 65, 77, 83, 33, 51, 85, 32, 86, 30, 31, 90, 91, 95, 96, 84, 87, 89, 93, 88, 94]; |
| 80, 0 × 1F4B7 | [1, 3, 5, 7, 8, 9, 10, 12, 16, 17, 18, 19, 20, 23, 29, 31, 33, 34, 36, 37, 41, 42, 44, 45, 48, 50, 51, 52, 53, 55, 61, 62, 64, 65, 68, 70, 75, 79, 81, 2, 4, 6, 11, 15, 22, 28, 30, 32, 35, 40, 43, 47, 49, 54, 60, 63, 67, 69, 74, 78, 80, 82, 14, 21, 27, 39, 46, 59, 66, 73, 77, 83, 13, 26, 38, 58, 72, 76, 84, 25, 57, 71, 85, 24, 56, 86, 87, 88, 89, 90, 91, 92, 93, 94, 95, 96]; or [1, 5, 7, 10, 11, 14, 15, 17, 19, 20, 21, 23, 24, 25, 26, 30, 31, 33, 40, 42, 48, 49, 50, 53, 54, 57, 58, 62, 68, 69, 70, 72, 73, 76, 77, 78, 80, 94, 3, 8, 9, 12, 16, 18, 29, 34, 36, 37, 41, 44, 45, 51, 52, 55, 61, 64, 65, 75, 79, 81, 2, 4, 22, 27, 28, 39, 46, 47, 59, 66, 67, 74, 83, 6, 13, 38, 84, 35, 43, 63, 71, 85, 32, 60, 91, 92, 56, 96, 88, 89, 90, 93, 95, 82, 86, 87]; |
| 80, 0 × 1BD23 | [1, 2, 3, 4, 6, 14, 15, 18, 19, 20, 25, 27, 29, 30, 31, 33, 35, 37, 38, 40, 42, 43, 46, 47, 48, 50, 55, 56, 62, 63, 64, 65, 67, 70, 73, 76, 77, 78, 81, 5, 13, 17, 24, 26, 28, 32, 34, 36, 39, 41, 45, 49, 54, 61, 66, 69, 72, 75, 82, 12, 16, 23, 44, 53, 60, 68, 71, 74, 80, 83, 11, 22, 52, 59, 79, 84, 10, 21, 51, 58, 85, 9, 57, 86, 8, 87, 7, 88, 89, 90, 91, 92, 93, 94, 95, 96]; or [2, 4, 8, 10, 11, 12, 13, 14, 16, 21, 22, 27, 36, 39, 41, 43, 44, 45, 46, 47, 48, 49, 50, 52, 53, 54, 55, 56, 58, 61, 62, 66, 68, 71, 75, 76, 78, 89, 1, 3, 7, 9, 15, 20, 26, 35, 38, 40, 42, 51, 57, 60, 65, 67, 70, 74, 77, 90, 6, 18, 19, 25, 29, 30, 31, 33, 37, 63, 64, 73, 81, 5, 17, 24, 28, 32, 34, 69, 72, 82, 23, 59, 94, 79, 96, 80, 83, 84, 85, 91, 93, 95, 92, 86, 87, 88]; |
| 80, 0 × 1BEAD | [2, 3, 4, 5, 9, 10, 13, 14, 15, 16, 18, 20, 22, 24, 25, 28, 29, 32, 33, 35, 36, 38, 39, 40, 41, 43, 44, 46, 48, 49, 50, 52, 54, 56, 57, 58, 62, 65, 67, 68, 72, 74, 76, 78, 79, 81, 1, 8, 12, 17, 19, 21, 23, 27, 31, 34, 37, 42, 45, 47, 51, 53, 55, 61, 64, 66, 71, 73, 75, 77, 80, 82, 7, 11, 26, 30, 60, 63, 70, 83, 6, 59, 69, 84, 85, 86, 87, 88, 89, 90, 91, 92, 93, 94, 95, 96]; or [2, 6, 10, 11, 15, 20, 21, 22, 30, 35, 39, 42, 43, 44, 46, 47, 49, 52, 54, 58, 59, 62, 64, 65, 66, 68, 70, 74, 75, 78, 79, 86, 1, 5, 9, 14, 19, 29, 34, 38, 41, 45, 48, 51, 53, 57, 61, 63, 67, 69, 73, 77, 80, 87, 12, 17, 24, 27, 31, 36, 56, 72, 76, 93, 7, 8, 13, 16, 18, 23, 26, 32, 40, 50, 84, 4, 25, 33, 37, 60, 71, 85, 3, 88, 28, 89, 55, 83, 91, 90, 92, 81, 82, 96, 94, 95]; |
| 80, 0 × 1FFF7 | [1, 3, 5, 6, 7, 8, 12, 15, 16, 17, 20, 21, 22, 24, 25, 26, 27, 29, 31, 35, 37, 40, 42, 45, 49, 53, 54, 56, 57, 58, 66, 69, 71, 72, 75, 76, 78, 80, 81, 2, 4, 11, 14, 19, 23, 28, 30, 34, 36, 39, 41, 44, 48, 52, 55, 65, 68, 70, 74, 77, 79, 82, 10, 13, 18, 33, 38, 43, 47, 51, 64, 67, 73, 83, 9, 32, 46, 50, 63, 84, 62, 85, 61, 86, 60, 87, 59, 88, 89, 90, 91, 92, 93, 94, 95, 96]; or [1, 4, 5, 7, 9, 10, 11, 15, 19, 21, 23, 25, 29, 33, 37, 38, 46, 49, 52, 53, 54, 58, 61, 62, 63, 64, 66, 68, 72, 76, 78, 86, 12, 13, 17, 18, 20, 24, 27, 28, 32, 34, 36, 39, 41, 43, 47, 57, 65, 69, 70, 85, 3, 6, 8, 16, 22, 26, 31, 35, 40, 42, 45, 56, 71, 75, 80, 81, 14, 48, 51, 60, 67, 73, 74, 77, 79, 92, 2, 30, 50, 55, 59, 96, 91, 44, 90, 83, 84, 88, 94, 82, 87, 93, 95, 89]; |
| 80, 0 × 18005 | [2, 4, 6, 8, 10, 12, 14, 15, 18, 19, 22, 23, 26, 27, 31, 35, 39, 43, 45, 46, 48, 51, 53, 54, 56, 59, 60, 61, 64, 67, 68, 69, 72, 77, 80, 81, 1, 3, 5, 7, 9, 11, 13, 17, 21, 25, 30, 34, 38, 42, 44, 47, 50, 52, 55, 58, 63, 66, 71, 76, 79, 82, 16, 20, 24, 29, 33, 37, 41, 49, 57, 62, 65, 70, 75, 78, 83, 28, 32, 36, 40, 74, 84, 73, 85, 86, 87, 88, 89, 90, 91, 92, 93, 94, 95, 96]; or [2, 4, 6, 8, 10, 12, 14, 15, 18, 19, 22, 23, 26, 27, 31, 35, 39, 43, 45, 46, 48, 51, 53, 54, 56, 59, 60, 61, 64, 67, 68, 69, 72, |

TABLE 3-continued

| Typical K, typical CRC polynomial | Interleaved sequence |
|---|---|
| | 77, 80, 81, 1, 3, 5, 7, 9, 11, 13, 17, 21, 25, 30, 34, 38, 42, 44, 47, 50, 52, 55, 58, 63, 66, 71, 76, 79, 82, 16, 20, 24, 28, 32, 36, 40, 49, 57, 62, 65, 70, 73, 78, 96, 29, 33, 37, 41, 75, 83, 74, 84, 85, 86, 87, 88, 89, 90, 91, 92, 93, 94, 95]; |
| 80, 0 × 1C001 | [14, 15, 16, 28, 30, 32, 42, 43, 45, 47, 48, 56, 60, 64, 70, 71, 72, 74, 75, 76, 78, 79, 80, 81, 13, 27, 29, 31, 41, 44, 46, 55, 59, 63, 69, 73, 77, 82, 12, 26, 40, 54, 58, 62, 68, 83, 11, 25, 39, 53, 57, 61, 67, 84, 10, 24, 38, 52, 66, 85, 9, 23, 37, 51, 65, 86, 8, 22, 36, 50, 87, 7, 21, 35, 49, 88, 6, 20, 34, 89, 5, 19, 33, 90, 4, 18, 91, 3, 17, 92, 2, 93, 1, 94, 95, 96]; or [14, 15, 16, 28, 30, 32, 42, 43, 45, 47, 48, 56, 60, 64, 70, 71, 72, 74, 75, 76, 78, 79, 80, 81, 13, 27, 29, 31, 41, 44, 46, 55, 59, 63, 69, 73, 77, 82, 12, 26, 40, 54, 58, 62, 68, 83, 11, 25, 39, 53, 57, 61, 67, 84, 1, 17, 33, 49, 65, 96, 10, 24, 38, 52, 66, 85, 9, 23, 37, 51, 86, 8, 22, 36, 50, 87, 7, 21, 35, 88, 6, 20, 34, 89, 5, 19, 90, 4, 18, 91, 3, 92, 2, 93, 94, 95]; |
| 80, 0 × 10811 | [4, 8, 11, 12, 19, 20, 22, 26, 27, 28, 32, 33, 35, 42, 48, 49, 51, 52, 55, 56, 58, 63, 64, 65, 66, 67, 70, 72, 74, 75, 77, 80, 81, 3, 7, 10, 18, 21, 25, 31, 34, 41, 47, 50, 54, 57, 62, 69, 71, 73, 76, 79, 82, 2, 6, 9, 17, 24, 30, 40, 46, 53, 61, 68, 78, 83, 1, 5, 16, 23, 29, 39, 45, 60, 84, 15, 38, 44, 59, 85, 14, 37, 43, 86, 13, 36, 87, 88, 89, 90, 91, 92, 93, 94, 95, 96]; or [5, 9, 13, 16, 17, 24, 25, 27, 31, 32, 33, 37, 38, 40, 47, 53, 54, 56, 57, 60, 61, 63, 68, 69, 70, 71, 72, 75, 77, 79, 80, 92, 4, 8, 12, 15, 23, 26, 30, 36, 39, 46, 52, 55, 59, 62, 67, 74, 76, 78, 93, 11, 19, 20, 22, 28, 35, 42, 48, 49, 51, 58, 64, 65, 66, 81, 3, 7, 14, 29, 45, 73, 94, 2, 6, 10, 21, 34, 44, 50, 95, 1, 43, 96, 18, 41, 82, 83, 84, 85, 86, 87, 88, 89, 90, 91]; |
| 80, 0 × 1E2E9 | [3, 5, 7, 10, 11, 12, 13, 15, 19, 20, 23, 25, 26, 29, 30, 31, 32, 34, 36, 37, 38, 39, 40, 42, 43, 45, 46, 50, 52, 59, 61, 63, 64, 65, 66, 67, 68, 69, 70, 76, 77, 80, 81, 2, 4, 6, 9, 14, 18, 22, 24, 28, 33, 35, 41, 44, 49, 51, 58, 60, 62, 75, 79, 82, 1, 8, 17, 21, 27, 48, 57, 74, 78, 83, 16, 47, 56, 73, 84, 55, 72, 85, 54, 71, 86, 53, 87, 88, 89, 90, 91, 92, 93, 94, 95, 96]; or [4, 5, 6, 8, 13, 16, 18, 19, 21, 22, 23, 28, 30, 35, 37, 38, 41, 42, 45, 46, 47, 49, 50, 53, 54, 55, 58, 59, 63, 64, 68, 69, 75, 77, 80, 90, 3, 7, 12, 15, 17, 20, 27, 29, 34, 36, 40, 44, 48, 52, 57, 62, 67, 74, 76, 79, 91, 2, 11, 14, 26, 33, 39, 43, 51, 56, 61, 66, 73, 78, 92, 1, 10, 25, 32, 60, 65, 72, 93, 9, 70, 84, 24, 31, 85, 95, 81, 71, 86, 88, 89, 94, 96, 82, 83, 87]; |
| 80, 0 × 1D20B | [1, 2, 4, 7, 8, 12, 13, 14, 22, 28, 29, 32, 33, 35, 36, 37, 39, 40, 41, 43, 45, 47, 53, 57, 59, 60, 61, 64, 66, 67, 68, 69, 70, 72, 75, 76, 77, 78, 79, 80, 81, 3, 6, 11, 21, 27, 31, 34, 38, 42, 44, 46, 52, 56, 58, 63, 65, 71, 74, 82, 5, 10, 20, 26, 30, 51, 55, 62, 73, 83, 9, 19, 25, 50, 54, 84, 18, 24, 49, 85, 17, 23, 48, 86, 16, 87, 15, 88, 89, 90, 91, 92, 93, 94, 95, 96]; or [6, 7, 8, 9, 13, 14, 19, 20, 22, 25, 27, 28, 31, 33, 37, 42, 44, 47, 50, 51, 53, 54, 55, 56, 57, 60, 62, 63, 64, 66, 67, 75, 76, 77, 80, 84, 5, 12, 18, 21, 24, 26, 30, 32, 36, 41, 43, 46, 49, 52, 59, 61, 65, 74, 79, 85, 3, 4, 16, 29, 35, 38, 39, 40, 48, 58, 68, 71, 72, 90, 2, 11, 34, 45, 70, 82, 17, 23, 73, 78, 86, 15, 91, 1, 10, 69, 92, 95, 83, 87, 93, 88, 94, 81, 89, 96]; |
| 80, 0 × 1B101 | [8, 12, 13, 15, 26, 28, 29, 30, 31, 34, 36, 37, 40, 41, 43, 45, 46, 52, 56, 58, 62, 65, 66, 67, 69, 72, 74, 77, 78, 80, 81, 7, 11, 14, 25, 27, 33, 35, 39, 42, 44, 51, 55, 57, 61, 64, 68, 71, 73, 76, 79, 82, 6, 10, 24, 32, 38, 50, 54, 60, 63, 70, 75, 83, 5, 9, 23, 49, 53, 59, 84, 4, 22, 48, 85, 3, 21, 47, 86, 2, 20, 87, 1, 19, 88, 18, 89, 17, 90, 16, 91, 92, 93, 94, 95, 96]; or [8, 12, 13, 15, 26, 28, 29, 30, 31, 34, 36, 37, 40, 41, 43, 45, 46, 52, 56, 58, 62, 65, 66, 67, 69, 72, 74, 77, 78, 80, 81, 1, 9, 14, 16, 27, 32, 35, 38, 42, 44, 47, 53, 57, 59, 63, 68, 70, 73, 75, 79, 96, 7, 11, 25, 33, 39, 51, 55, 61, 64, 71, 76, 82, 6, 10, 24, 50, 54, 60, 83, 5, 23, 49, 84, 4, 22, 48, 85, 3, 21, 86, 2, 20, 87, 19, 88, 17, 18, 93, 94, 95, 89, 90, 91, 92]; |
| 80, 0 × 15AC9 | [3, 7, 11, 13, 15, 16, 18, 21, 23, 31, 33, 34, 36, 38, 39, 40, 46, 47, 48, 50, 51, 54, 55, 56, 57, 60, 65, 66, 75, 79, 80, 81, 2, 6, 10, 12, 14, 17, 20, 22, 30, 32, 35, 37, 45, 49, 53, 59, 64, 74, 78, 82, 1, 5, 9, 19, 29, 44, 52, 58, 63, 73, 77, 83, 4, 8, 28, 43, 62, 72, 76, 84, 27, 42, 61, 71, 85, 26, 41, 70, 86, 25, 69, 87, 24, 68, 88, 67, 89, 90, 91, 92, 93, 94, 95, 96]; or [2, 5, 9, 13, 15, 17, 18, 20, 23, 25, 33, 35, 36, 38, 40, 41, 42, 48, 49, 50, 52, 53, 56, 57, 58, 59, 62, 67, 68, 77, 95, 3, 7, 11, 16, 21, 31, 34, 39, 46, 47, 51, 54, 55, 60, 65, 66, 75, 79, 80, 81, 6, 10, 12, 14, 22, 30, 32, 37, 45, 64, 74, 78, 82, 1, 4, 8, 19, 24, 61, 76, 96, 29, 44, 63, 73, 83, 27, 43, 69, 70, 93, 28, 72, 84, 71, 92, 26, 94, 85, 86, 90, 88, 91, 89, 87]; |
| 80, 0 × 17085 | [2, 4, 6, 7, 8, 10, 11, 13, 14, 15, 17, 19, 20, 22, 23, 24, 25, 26, 28, 32, 34, 36, 37, 38, 39, 43, 44, 45, 48, 54, 55, 56, 58, 60, 61, 62, 65, 66, 68, 69, 71, 75, 76, 77, 78, 79, 80, 81, 1, 3, 5, 9, 12, 16, 18, 21, 27, 31, 33, 35, 42, 47, 53, 57, 59, 64, 67, 70, 74, 82, 30, 41, 46, 52, 63, 73, 83, 29, 40, 51, 72, 84, 50, 85, 49, 86, 87, 88, 89, 90, 91, 92, 93, 94, 95, 96]; or [5, 6, 8, 9, 10, 11, 15, 16, 17, 19, 22, 24, 26, 28, |

TABLE 3-continued

| Typical K, typical CRC polynomial | Interleaved sequence |
|---|---|
| | 30, 32, 33, 38, 40, 41, 44, 45, 47, 50, 55, 57, 59, 61, 63, 65, 71, 74, 75, 88, 4, 7, 14, 18, 21, 23, 25, 27, 29, 31, 37, 39, 43, 46, 49, 54, 56, 58, 60, 62, 64, 70, 73, 89, 3, 13, 20, 36, 42, 48, 53, 69, 72, 80, 90, 2, 12, 35, 52, 68, 79, 91, 1, 34, 51, 67, 78, 92, 83, 66, 76, 77, 94, 84, 85, 86, 93, 87, 95, 81, 82, 96]; |
| 80, 0 × 1D169 | [3, 5, 8, 9, 10, 11, 13, 16, 18, 19, 21, 24, 25, 27, 28, 29, 30, 32, 33, 36, 39, 41, 42, 43, 44, 45, 53, 55, 58, 60, 63, 64, 66, 67, 68, 69, 73, 74, 77, 79, 80, 81, 2, 4, 7, 12, 15, 17, 20, 23, 26, 31, 35, 38, 40, 52, 54, 57, 59, 62, 65, 72, 76, 78, 82, 1, 6, 14, 22, 34, 37, 51, 56, 61, 71, 75, 83, 50, 70, 84, 49, 85, 48, 86, 47, 87, 46, 88, 89, 90, 91, 92, 93, 94, 95, 96]; or [2, 3, 6, 7, 9, 11, 15, 19, 22, 26, 28, 32, 38, 40, 43, 44, 45, 50, 52, 53, 57, 58, 61, 65, 67, 68, 69, 70, 71, 73, 76, 79, 84, 1, 5, 8, 10, 14, 18, 21, 25, 27, 31, 37, 39, 42, 49, 51, 56, 60, 64, 66, 72, 75, 78, 80, 85, 4, 16, 17, 20, 29, 33, 48, 59, 86, 30, 34, 35, 41, 47, 63, 74, 89, 24, 36, 46, 62, 77, 90, 13, 23, 55, 91, 12, 54, 92, 81, 82, 83, 96, 87, 88, 93, 94, 95]; |
| 80, 0 × 1B55D | [2, 3, 6, 7, 8, 9, 10, 13, 18, 19, 23, 24, 25, 26, 28, 29, 32, 35, 36, 38, 42, 46, 51, 52, 54, 55, 56, 60, 61, 62, 64, 69, 70, 75, 77, 78, 81, 1, 5, 12, 17, 22, 27, 31, 34, 37, 41, 45, 50, 53, 59, 63, 68, 74, 76, 82, 4, 11, 16, 21, 30, 33, 40, 44, 49, 58, 67, 73, 80, 83, 15, 20, 39, 43, 48, 57, 66, 72, 79, 84, 14, 47, 65, 71, 85, 86, 87, 88, 89, 90, 91, 92, 93, 94, 95, 96]; or [2, 5, 11, 12, 14, 19, 20, 21, 24, 25, 27, 29, 31, 36, 39, 43, 44, 45, 47, 48, 49, 50, 51, 54, 56, 60, 63, 65, 68, 70, 75, 78, 87, 1, 4, 10, 13, 18, 23, 26, 28, 30, 35, 38, 42, 46, 53, 55, 59, 62, 64, 67, 69, 74, 77, 88, 3, 6, 7, 8, 9, 32, 52, 61, 81, 17, 22, 34, 37, 41, 76, 82, 15, 16, 40, 66, 71, 73, 79, 94, 33, 57, 96, 58, 72, 80, 95, 89, 90, 85, 86, 91, 92, 93, 83, 84]; |
| 80, 0 × 197CB | [1, 2, 4, 6, 8, 9, 10, 11, 14, 15, 17, 21, 22, 25, 26, 27, 29, 32, 35, 36, 38, 39, 40, 41, 42, 43, 44, 45, 47, 48, 51, 52, 53, 54, 57, 61, 62, 63, 65, 66, 67, 69, 75, 76, 78, 79, 81, 3, 5, 7, 13, 16, 20, 24, 28, 31, 34, 37, 46, 50, 56, 60, 64, 68, 74, 77, 80, 82, 12, 19, 23, 30, 33, 49, 55, 59, 73, 83, 18, 58, 72, 84, 71, 85, 70, 86, 87, 88, 89, 90, 91, 92, 93, 94, 95, 96]; or [3, 5, 6, 8, 10, 13, 17, 18, 20, 21, 30, 34, 36, 38, 39, 40, 41, 42, 45, 46, 47, 51, 53, 55, 57, 58, 63, 69, 72, 74, 76, 77, 80, 84, 2, 4, 7, 9, 12, 16, 19, 29, 33, 35, 37, 44, 50, 52, 54, 56, 62, 68, 71, 73, 75, 79, 85, 1, 11, 15, 28, 32, 43, 49, 61, 67, 70, 78, 86, 24, 26, 31, 60, 64, 93, 14, 23, 25, 27, 48, 59, 66, 94, 22, 65, 95, 82, 83, 87, 89, 91, 90, 92, 81, 88, 96]; |
| 80, 0 × 1A80B | [1, 2, 4, 7, 8, 9, 14, 20, 23, 24, 25, 28, 30, 31, 32, 33, 34, 39, 40, 44, 46, 47, 48, 50, 51, 55, 59, 60, 65, 67, 68, 69, 71, 72, 75, 76, 77, 81, 3, 6, 13, 19, 22, 27, 29, 38, 43, 45, 49, 54, 58, 64, 66, 70, 74, 82, 5, 12, 18, 21, 26, 37, 42, 53, 57, 63, 73, 80, 83, 11, 17, 36, 41, 52, 56, 62, 79, 84, 10, 16, 35, 61, 78, 85, 15, 86, 87, 88, 89, 90, 91, 92, 93, 94, 95, 96]; or [2, 3, 4, 6, 9, 13, 14, 19, 20, 22, 25, 27, 28, 29, 34, 38, 40, 43, 44, 45, 48, 49, 51, 54, 55, 58, 60, 64, 65, 66, 69, 70, 72, 74, 77, 82, 7, 8, 10, 16, 18, 24, 26, 35, 36, 39, 41, 42, 46, 52, 56, 57, 59, 61, 62, 63, 67, 73, 75, 78, 92, 1, 5, 15, 17, 21, 23, 53, 93, 12, 33, 37, 47, 50, 68, 71, 76, 80, 83, 30, 31, 32, 94, 11, 79, 95, 81, 96, 84, 85, 86, 87, 88, 89, 90, 91]; |
| 80, 0 × 1E771 | [4, 5, 6, 9, 14, 19, 22, 23, 24, 26, 28, 31, 36, 37, 41, 44, 47, 48, 49, 52, 53, 55, 57, 58, 62, 63, 66, 69, 72, 74, 75, 78, 79, 81, 3, 8, 13, 18, 21, 25, 27, 30, 35, 40, 43, 46, 51, 54, 56, 61, 65, 68, 71, 73, 77, 80, 82, 2, 7, 12, 17, 20, 29, 34, 39, 42, 45, 50, 60, 64, 67, 70, 76, 83, 1, 11, 16, 33, 38, 59, 84, 10, 15, 32, 85, 86, 87, 88, 89, 90, 91, 92, 93, 94, 95, 96]; or [4, 5, 6, 9, 14, 19, 22, 23, 24, 26, 28, 31, 36, 37, 41, 44, 47, 48, 49, 52, 53, 55, 57, 58, 62, 63, 66, 69, 72, 74, 75, 78, 79, 81, 3, 8, 13, 18, 21, 25, 27, 30, 35, 40, 43, 46, 51, 54, 56, 61, 65, 68, 71, 73, 77, 80, 82, 1, 7, 10, 15, 20, 29, 32, 38, 42, 45, 50, 59, 64, 67, 70, 76, 96, 2, 12, 17, 34, 39, 60, 83, 11, 16, 33, 84, 90, 85, 87, 88, 89, 91, 92, 93, 95, 86, 94]; |
| 80, 0 × 1D5D3 | [1, 2, 3, 5, 6, 8, 9, 10, 12, 14, 15, 16, 17, 19, 22, 23, 25, 26, 29, 30, 31, 35, 36, 37, 39, 40, 41, 42, 43, 45, 46, 49, 50, 53, 57, 58, 59, 60, 62, 63, 66, 69, 71, 74, 78, 81, 4, 7, 11, 13, 18, 21, 24, 28, 34, 38, 44, 48, 52, 56, 61, 65, 68, 70, 73, 77, 82, 20, 27, 33, 47, 51, 55, 64, 67, 72, 76, 80, 83, 32, 54, 75, 79, 84, 85, 86, 87, 88, 89, 90, 91, 92, 93, 94, 95, 96]; or [2, 4, 5, 6, 7, 12, 17, 18, 19, 20, 21, 22, 26, 28, 29, 30, 34, 36, 37, 39, 42, 46, 47, 59, 65, 67, 68, 69, 70, 75, 80, 85, 1, 3, 11, 16, 25, 27, 33, 35, 38, 41, 45, 58, 64, 66, 74, 79, 86, 13, 24, 31, 32, 40, 43, 50, 51, 52, 53, 57, 61, 72, 73, 89, 10, 15, 23, 49, 56, 60, 71, 78, 90, 44, 54, 55, 62, 76, 77, 93, 48, 63, 82, 8, 91, 9, 92, 14, 94, 83, 84, 88, 95, 87, 81, 96]; |
| 80, 0 × 1F29F | [1, 5, 6, 7, 10, 12, 13, 14, 17, 20, 21, 23, 25, 26, 27, 28, 30, 33, 36, 37, 38, 44, 45, 46, 47, 50, 52, 54, 55, 56, 60, 62, 64, 65, 70, 71, 72, 73, 74, 78, 79, 81, 4, 9, 11, 16, 19, 22, 24, 29, 32, 35, 43, 49, 51, 53, 59, 61, 63, 69, 77, 80, 82, 3, 8, 15, 18, 31, 34, 42, 48, 58, 68, 76, 83, 2, 41, 57, 67, 75, 84, 40, 66, 85, 39, 86, 87, 88, 89, 90, 91, 92, 93, |

TABLE 3-continued

| Typical K, typical CRC polynomial | Interleaved sequence |
|---|---|
| | 94, 95, 96]; or [3, 10, 11, 12, 13, 16, 18, 19, 20, 22, 24, 26, 27, 28, 29, 34, 38, 40, 41, 42, 43, 45, 47, 49, 52, 53, 57, 58, 60, 61, 64, 67, 68, 69, 72, 73, 75, 77, 79, 90, 2, 9, 15, 17, 21, 23, 25, 33, 37, 39, 44, 46, 48, 51, 56, 59, 63, 66, 71, 74, 76, 78, 91, 1, 8, 14, 32, 36, 50, 55, 62, 65, 70, 92, 5, 6, 30, 31, 35, 93, 54, 95, 4, 7, 80, 82, 84, 81, 85, 83, 86, 87, 96, 94, 88, 89]; |
| 80, 0 × 15935 | [2, 5, 6, 9, 10, 11, 14, 16, 17, 18, 21, 25, 27, 28, 29, 30, 31, 34, 37, 38, 40, 41, 42, 43, 45, 46, 48, 53, 54, 55, 56, 58, 59, 60, 62, 63, 69, 70, 71, 76, 78, 80, 81, 1, 4, 8, 13, 15, 20, 24, 26, 33, 36, 39, 44, 47, 52, 57, 61, 68, 75, 77, 79, 82, 3, 7, 12, 19, 23, 32, 35, 51, 67, 74, 83, 22, 50, 66, 73, 84, 49, 65, 72, 85, 64, 86, 87, 88, 89, 90, 91, 92, 93, 94, 95, 96]; or [3, 5, 6, 7, 9, 11, 12, 13, 16, 21, 23, 24, 25, 26, 27, 28, 29, 32, 38, 41, 42, 43, 44, 45, 46, 47, 49, 54, 57, 58, 59, 61, 63, 64, 65, 67, 75, 86, 2, 4, 8, 10, 15, 20, 22, 31, 37, 40, 48, 53, 56, 60, 62, 66, 74, 87, 1, 14, 19, 30, 36, 39, 52, 55, 73, 88, 18, 50, 68, 70, 71, 76, 77, 92, 17, 34, 35, 51, 69, 72, 78, 80, 89, 33, 79, 85, 90, 91, 81, 95, 96, 82, 93, 94, 83, 84]; |
| 80, 0 × 18DED | [2, 3, 4, 5, 6, 8, 13, 15, 16, 17, 20, 21, 22, 23, 25, 26, 29, 30, 34, 36, 41, 42, 44, 50, 51, 52, 53, 54, 56, 60, 61, 62, 63, 64, 65, 66, 69, 72, 74, 75, 77, 80, 81, 1, 7, 12, 14, 19, 24, 28, 33, 35, 40, 43, 49, 55, 59, 68, 71, 73, 76, 79, 82, 11, 18, 27, 32, 39, 48, 58, 67, 70, 78, 83, 10, 31, 38, 47, 57, 84, 9, 37, 46, 85, 45, 86, 87, 88, 89, 90, 91, 92, 93, 94, 95, 96]; or [1, 2, 13, 15, 17, 18, 21, 23, 28, 30, 32, 33, 37, 38, 39, 40, 44, 45, 46, 48, 49, 50, 55, 58, 59, 62, 63, 64, 65, 69, 71, 73, 75, 78, 79, 86, 4, 5, 6, 11, 12, 19, 22, 24, 29, 31, 35, 41, 47, 54, 60, 61, 74, 76, 77, 80, 92, 3, 10, 16, 27, 34, 53, 70, 72, 93, 7, 8, 14, 57, 66, 67, 68, 88, 25, 26, 42, 51, 89, 9, 20, 36, 43, 52, 94, 56, 95, 83, 90, 81, 82, 96, 84, 87, 85, 91]; |
| 80, 0 × 1AAE5 | [2, 4, 5, 7, 8, 10, 12, 13, 17, 18, 20, 27, 28, 33, 34, 35, 36, 38, 39, 40, 41, 42, 45, 46, 47, 49, 50, 52, 53, 54, 55, 56, 58, 59, 60, 62, 66, 70, 75, 78, 81, 1, 3, 6, 9, 11, 16, 19, 26, 32, 37, 44, 48, 51, 57, 61, 65, 69, 74, 77, 80, 82, 15, 25, 31, 43, 64, 68, 73, 76, 79, 83, 14, 24, 30, 63, 67, 72, 84, 23, 29, 71, 85, 22, 86, 21, 87, 88, 89, 90, 91, 92, 93, 94, 95, 96]; or [1, 5, 6, 7, 10, 12, 18, 19, 20, 21, 22, 23, 24, 26, 27, 31, 32, 33, 36, 38, 39, 40, 45, 48, 50, 53, 55, 56, 57, 58, 61, 64, 65, 70, 71, 72, 77, 78, 87, 2, 3, 9, 14, 25, 29, 35, 42, 43, 47, 49, 60, 62, 63, 66, 67, 73, 76, 86, 4, 8, 11, 13, 16, 51, 54, 59, 68, 69, 80, 94, 17, 28, 34, 41, 46, 52, 75, 81, 15, 37, 44, 79, 83, 30, 74, 84, 85, 95, 82, 96, 92, 93, 88, 89, 90, 91]; |
| 80, 0 × 193B5 | [2, 5, 6, 7, 10, 11, 13, 14, 20, 23, 24, 27, 29, 35, 41, 43, 45, 46, 47, 48, 49, 51, 55, 56, 57, 58, 59, 62, 63, 64, 65, 67, 69, 70, 72, 73, 75, 77, 78, 79, 81, 1, 4, 9, 12, 19, 22, 26, 28, 34, 40, 42, 44, 50, 54, 61, 66, 68, 71, 74, 76, 82, 3, 8, 18, 21, 25, 33, 39, 53, 60, 83, 17, 32, 38, 52, 84, 16, 31, 37, 80, 85, 15, 30, 36, 86, 87, 88, 89, 90, 91, 92, 93, 94, 95, 96]; or [1, 4, 8, 12, 13, 14, 16, 18, 19, 21, 22, 24, 29, 31, 33, 35, 37, 41, 42, 43, 45, 47, 48, 52, 55, 63, 64, 65, 66, 72, 73, 74, 75, 76, 78, 79, 80, 85, 2, 3, 6, 7, 9, 10, 20, 23, 25, 39, 44, 51, 53, 54, 58, 59, 60, 61, 68, 69, 71, 83, 5, 11, 17, 28, 32, 34, 38, 50, 57, 67, 70, 77, 84, 15, 27, 30, 36, 40, 49, 56, 86, 26, 87, 46, 62, 90, 91, 92, 81, 82, 89, 93, 94, 95, 96, 88]; |
| 80, 0 × 12341 | [6, 8, 9, 12, 13, 20, 21, 22, 24, 27, 28, 29, 30, 31, 32, 33, 35, 37, 39, 44, 46, 48, 49, 51, 52, 55, 56, 60, 61, 62, 63, 65, 66, 72, 74, 77, 78, 81, 5, 7, 11, 19, 23, 26, 34, 36, 38, 43, 45, 47, 50, 54, 59, 64, 71, 73, 76, 82, 4, 10, 18, 25, 42, 53, 58, 70, 75, 83, 3, 17, 41, 57, 69, 84, 2, 16, 40, 68, 80, 85, 1, 15, 67, 79, 86, 14, 87, 88, 89, 90, 91, 92, 93, 94, 95, 96]; or [6, 8, 9, 12, 13, 20, 21, 22, 24, 27, 28, 29, 30, 31, 32, 33, 35, 37, 39, 44, 46, 48, 49, 51, 52, 55, 56, 60, 61, 62, 63, 65, 66, 72, 74, 77, 78, 81, 5, 7, 11, 19, 23, 26, 34, 36, 38, 43, 45, 47, 50, 54, 59, 64, 71, 73, 76, 82, 4, 10, 18, 25, 42, 53, 58, 70, 75, 83, 3, 17, 41, 57, 69, 84, 15, 16, 40, 68, 80, 94, 2, 85, 1, 67, 79, 86, 14, 95, 96, 89, 90, 91, 92, 93, 87, 88]; |
| 80, 0 × 14D79 | [3, 4, 5, 9, 10, 11, 15, 17, 18, 19, 20, 27, 28, 29, 30, 31, 35, 37, 41, 42, 44, 47, 48, 49, 50, 51, 54, 57, 60, 65, 69, 70, 71, 72, 75, 76, 77, 78, 79, 81, 2, 8, 14, 16, 26, 34, 36, 40, 43, 46, 53, 56, 59, 64, 68, 74, 80, 82, 1, 7, 13, 25, 33, 39, 45, 52, 55, 58, 63, 67, 73, 83, 6, 12, 24, 32, 38, 62, 66, 84, 23, 61, 85, 22, 86, 21, 87, 88, 89, 90, 91, 92, 93, 94, 95, 96]; or [1, 2, 6, 7, 8, 13, 20, 23, 24, 25, 27, 33, 34, 35, 36, 38, 42, 45, 47, 50, 51, 54, 57, 59, 60, 61, 64, 66, 67, 71, 73, 75, 77, 79, 85, 5, 12, 14, 17, 18, 21, 22, 26, 28, 29, 30, 37, 39, 46, 48, 49, 55, 56, 63, 69, 70, 72, 74, 76, 91, 3, 4, 9, 10, 11, 15, 19, 31, 41, 44, 65, 78, 81, 16, 40, 43, 52, 53, 58, 80, 89, 32, 62, 95, 68, 82, 83, 90, 96, 87, 88, 92, 93, 94, 86, 84]; |
| 80, 0 × 13613 | [1, 2, 3, 5, 7, 8, 9, 10, 15, 19, 21, 22, 25, 26, 33, 36, 38, 40, 42, 44, 45, 47, 51, 55, 57, 58, 59, 61, 63, 64, 65, 67, 68, 70, 72, 73, 75, 76, 77, 78, 79, 81, 4, 6, 14, 18, 20, 24, 32, 35, 37, 39, 41, 43, 46, 50, 54, 56, 60, 62, 66, 69, 71, 74, 82, 13, 17, 23, 31, 34, 49, 53, 83, 12, 16, |

TABLE 3-continued

| Typical K, typical CRC polynomial | Interleaved sequence |
|---|---|
| | 30, 48, 52, 84, 11, 29, 80, 85, 28, 86, 27, 87, 88, 89, 90, 91, 92, 93, 94, 95, 96]; or [2, 11, 14, 15, 16, 17, 18, 22, 23, 28, 29, 31, 32, 35, 36, 38, 40, 41, 43, 45, 49, 51, 54, 58, 59, 61, 62, 67, 68, 70, 72, 77, 78, 79, 91, 1, 10, 13, 21, 27, 30, 34, 37, 39, 42, 44, 48, 50, 53, 57, 60, 66, 69, 71, 76, 80, 92, 5, 8, 9, 12, 25, 26, 52, 55, 56, 64, 73, 75, 85, 4, 7, 24, 33, 47, 63, 65, 74, 86, 3, 6, 20, 46, 87, 19, 88, 89, 90, 94, 81, 93, 95, 96, 82, 83, 84]; |
| 80, 0 × 1F497 | [1, 3, 8, 9, 20, 21, 23, 25, 26, 29, 33, 34, 40, 41, 43, 48, 49, 50, 51, 53, 58, 59, 60, 61, 63, 65, 66, 69, 70, 71, 74, 75, 76, 79, 80, 81, 2, 7, 19, 22, 24, 28, 32, 39, 42, 47, 52, 57, 62, 64, 68, 73, 78, 82, 6, 18, 27, 31, 38, 46, 56, 67, 72, 77, 83, 5, 17, 30, 37, 45, 55, 84, 4, 16, 36, 44, 54, 85, 15, 35, 86, 14, 87, 13, 88, 12, 89, 11, 90, 10, 91, 92, 93, 94, 95, 96]; or [2, 3, 6, 9, 18, 22, 26, 27, 28, 29, 31, 34, 38, 42, 43, 46, 48, 49, 52, 53, 56, 58, 59, 62, 66, 67, 69, 71, 72, 74, 76, 77, 79, 83, 1, 4, 7, 13, 21, 24, 32, 33, 41, 44, 47, 51, 54, 57, 61, 63, 64, 73, 78, 93, 5, 12, 25, 30, 37, 45, 55, 65, 70, 75, 80, 94, 19, 23, 39, 68, 82, 8, 17, 84, 88, 20, 40, 50, 60, 81, 16, 36, 85, 15, 35, 86, 89, 11, 90, 95, 10, 96, 14, 87, 91, 92]; |
| 80, 0 × 3CBED | [2, 3, 4, 5, 6, 8, 9, 10, 17, 18, 19, 20, 25, 27, 29, 30, 34, 36, 40, 41, 42, 47, 49, 50, 51, 52, 53, 54, 55, 56, 57, 60, 61, 63, 66, 67, 68, 69, 71, 77, 78, 81, 1, 7, 16, 24, 26, 28, 33, 35, 39, 46, 48, 59, 62, 65, 70, 76, 80, 82, 15, 23, 32, 38, 45, 58, 64, 75, 79, 83, 14, 22, 31, 37, 44, 74, 84, 13, 21, 43, 73, 85, 12, 72, 86, 11, 87, 88, 89, 90, 91, 92, 93, 94, 95, 96, 97]; or [1, 2, 3, 4, 6, 8, 11, 13, 15, 16, 17, 20, 21, 23, 27, 31, 34, 35, 36, 42, 47, 48, 51, 52, 53, 56, 60, 63, 65, 72, 77, 88, 9, 12, 18, 22, 26, 28, 29, 30, 32, 37, 38, 41, 44, 49, 50, 59, 61, 64, 67, 71, 73, 78, 80, 96, 10, 14, 19, 24, 55, 58, 62, 66, 68, 69, 70, 79, 87, 5, 7, 39, 45, 57, 75, 76, 83, 25, 33, 54, 74, 86, 43, 46, 92, 40, 93, 94, 81, 84, 89, 95, 82, 85, 97, 90, 91]; |
| 80, 0 × 3D173 | [1, 2, 3, 6, 8, 9, 10, 11, 13, 14, 15, 16, 18, 19, 20, 23, 25, 26, 27, 28, 30, 31, 35, 38, 40, 41, 42, 43, 45, 46, 47, 48, 49, 51, 52, 53, 54, 57, 59, 60, 61, 62, 66, 67, 68, 71, 73, 74, 77, 79, 81, 5, 7, 12, 17, 22, 24, 29, 34, 37, 39, 44, 50, 56, 58, 65, 70, 72, 76, 78, 82, 4, 21, 33, 36, 55, 64, 69, 75, 80, 83, 32, 63, 84, 85, 86, 87, 88, 89, 90, 91, 92, 93, 94, 95, 96, 97]; or [1, 4, 6, 10, 11, 15, 16, 17, 18, 21, 23, 27, 30, 32, 34, 36, 38, 42, 43, 45, 48, 49, 52, 55, 57, 60, 61, 65, 66, 69, 75, 76, 77, 78, 79, 80, 85, 5, 7, 8, 12, 14, 22, 25, 26, 29, 31, 33, 37, 39, 40, 41, 44, 46, 59, 63, 67, 70, 74, 89, 3, 13, 20, 24, 28, 35, 47, 54, 58, 62, 64, 68, 73, 90, 2, 19, 53, 72, 91, 9, 56, 71, 92, 50, 82, 51, 96, 83, 84, 86, 95, 93, 94, 81, 97, 87, 88]; |
| 80, 0 × 38355 | [2, 9, 10, 12, 13, 15, 16, 17, 18, 19, 20, 21, 24, 27, 28, 29, 30, 34, 35, 36, 37, 38, 41, 47, 49, 50, 51, 54, 57, 59, 67, 70, 74, 79, 80, 81, 1, 8, 11, 14, 23, 26, 33, 40, 46, 48, 53, 56, 58, 66, 69, 73, 78, 82, 7, 22, 25, 32, 39, 45, 52, 55, 65, 68, 72, 77, 83, 6, 31, 44, 64, 71, 76, 84, 5, 43, 63, 75, 85, 4, 42, 62, 86, 3, 61, 87, 60, 88, 89, 90, 91, 92, 93, 94, 95, 96, 97]; or [2, 9, 10, 12, 13, 15, 16, 17, 18, 19, 20, 21, 24, 27, 28, 29, 30, 34, 35, 36, 37, 38, 41, 47, 49, 50, 51, 54, 57, 59, 67, 70, 74, 79, 80, 81, 1, 3, 4, 23, 25, 26, 32, 40, 42, 43, 48, 53, 55, 56, 58, 60, 61, 68, 69, 71, 72, 75, 76, 96, 11, 14, 22, 31, 39, 52, 97, 8, 33, 46, 66, 73, 78, 82, 5, 6, 7, 63, 65, 85, 45, 62, 64, 86, 77, 83, 44, 84, 87, 88, 89, 90, 91, 92, 93, 94, 95]; |
| 80, 0 × 3B43B | [1, 2, 5, 6, 8, 9, 11, 12, 13, 14, 17, 20, 21, 23, 27, 28, 29, 32, 33, 35, 37, 40, 44, 45, 46, 47, 50, 53, 55, 56, 59, 60, 61, 65, 66, 67, 68, 71, 72, 73, 75, 79, 80, 81, 4, 7, 10, 16, 19, 22, 26, 31, 34, 36, 39, 43, 49, 52, 54, 58, 64, 70, 74, 78, 82, 3, 15, 18, 25, 30, 38, 42, 48, 51, 57, 63, 69, 77, 83, 24, 41, 62, 76, 84, 85, 86, 87, 88, 89, 90, 91, 92, 93, 94, 95, 96, 97]; or [1, 4, 6, 7, 9, 11, 13, 15, 19, 23, 24, 28, 31, 34, 38, 40, 41, 44, 46, 48, 51, 52, 53, 54, 55, 60, 61, 62, 65, 67, 75, 76, 84, 2, 12, 17, 18, 20, 21, 26, 30, 39, 42, 45, 47, 49, 50, 58, 63, 66, 68, 70, 71, 72, 77, 91, 16, 22, 25, 29, 37, 43, 57, 69, 74, 92, 5, 10, 14, 32, 33, 35, 56, 59, 64, 78, 86, 36, 87, 3, 73, 79, 80, 85, 8, 88, 89, 27, 90, 82, 83, 96, 81, 97, 94, 93, 95]; |
| 80, 0 × 3D5F3 | [1, 2, 3, 6, 7, 8, 12, 14, 18, 20, 25, 26, 27, 28, 30, 31, 32, 35, 36, 37, 39, 41, 44, 47, 50, 52, 54, 55, 58, 60, 61, 62, 65, 72, 74, 75, 76, 79, 81, 5, 11, 13, 17, 19, 24, 29, 34, 38, 40, 43, 46, 49, 51, 53, 57, 59, 64, 71, 73, 78, 82, 4, 10, 16, 23, 33, 42, 45, 48, 56, 63, 70, 77, 80, 83, 9, 15, 22, 69, 84, 21, 68, 85, 67, 86, 66, 87, 88, 89, 90, 91, 92, 93, 94, 95, 96, 97]; or [2, 3, 7, 9, 10, 11, 12, 15, 17, 19, 20, 22, 23, 25, 27, 29, 39, 40, 43, 44, 46, 48, 54, 55, 58, 59, 60, 61, 63, 66, 68, 72, 73, 77, 78, 80, 89, 1, 6, 8, 14, 16, 18, 21, 24, 26, 28, 38, 42, 45, 47, 53, 57, 62, 65, 67, 71, 76, 79, 90, 30, 31, 32, 35, 36, 37, 41, 50, 52, 74, 75, 81, 4, 13, 33, 51, 56, 97, 5, 34, 49, 69, 70, 85, 64, 87, 82, 93, 94, 96, 83, 88, 91, 92, 84, 86, 95]; |
| 80, 0 × 32861 | [5, 6, 10, 11, 12, 13, 15, 18, 20, 21, 22, 24, 26, 32, 35, 36, 37, 38, 41, 42, 44, 45, 47, 50, 51, 54, 56, 57, 60, 63, 68, 72, 74, 78, 79, 81, 4, 9, 14, 17, 19, 23, 25, 31, 34, 40, 43, 46, 49, 53, 55, 59, 62, 67, 71, |

TABLE 3-continued

| Typical K, typical CRC polynomial | Interleaved sequence |
|---|---|
| | 73, 77, 80, 82, 3, 8, 16, 30, 33, 39, 48, 52, 58, 61, 66, 70, 76, 83, 2, 7, 29, 65, 69, 75, 84, 1, 28, 64, 85, 27, 86, 87, 88, 89, 90, 91, 92, 93, 94, 95, 96, 97]; or [5, 6, 10, 11, 12, 13, 15, 18, 20, 21, 22, 24, 26, 32, 35, 36, 37, 38, 41, 42, 44, 45, 47, 50, 51, 54, 56, 57, 60, 63, 68, 72, 74, 78, 79, 81, 4, 9, 14, 17, 19, 23, 25, 31, 34, 40, 43, 46, 49, 53, 55, 59, 62, 67, 71, 73, 77, 80, 82, 3, 8, 16, 30, 33, 39, 48, 52, 58, 61, 66, 70, 76, 83, 2, 7, 29, 65, 69, 75, 84, 1, 27, 64, 97, 28, 85, 86, 87, 92, 88, 93, 94, 89, 90, 91, 95, 96]; |
| 80, 0 × 37B89 | [3, 6, 7, 8, 11, 14, 17, 18, 19, 22, 29, 30, 31, 32, 36, 39, 40, 41, 44, 50, 51, 52, 54, 56, 57, 62, 63, 64, 66, 67, 68, 69, 73, 74, 76, 78, 80, 81, 2, 5, 10, 13, 16, 21, 28, 35, 38, 43, 49, 53, 55, 61, 65, 72, 75, 77, 79, 82, 1, 4, 9, 12, 15, 20, 27, 34, 37, 42, 48, 60, 71, 83, 26, 33, 47, 59, 70, 84, 25, 46, 58, 85, 24, 45, 86, 23, 87, 88, 89, 90, 91, 92, 93, 94, 95, 96, 97]; or [1, 2, 8, 12, 19, 23, 26, 27, 30, 33, 34, 38, 41, 45, 48, 49, 51, 55, 56, 58, 60, 62, 63, 67, 69, 70, 71, 76, 78, 93, 3, 6, 14, 17, 25, 31, 36, 37, 39, 47, 52, 59, 61, 64, 73, 74, 75, 77, 80, 94, 7, 11, 18, 22, 29, 32, 40, 44, 50, 54, 57, 66, 68, 81, 5, 16, 42, 53, 89, 13, 24, 35, 46, 72, 79, 95, 4, 9, 15, 20, 65, 97, 10, 21, 28, 43, 82, 96, 83, 92, 88, 84, 85, 86, 87, 90, 91]; |
| 80, 0 × 24001 | [14, 17, 28, 34, 42, 45, 48, 51, 56, 68, 70, 73, 81, 13, 16, 27, 33, 41, 44, 47, 50, 55, 67, 69, 72, 82, 12, 15, 26, 32, 40, 43, 46, 49, 54, 66, 71, 80, 83, 11, 25, 31, 39, 53, 65, 79, 84, 10, 24, 30, 38, 52, 64, 78, 85, 9, 23, 29, 37, 63, 77, 86, 8, 22, 36, 62, 76, 87, 7, 21, 35, 61, 75, 88, 6, 20, 60, 74, 89, 5, 19, 59, 90, 4, 18, 58, 91, 3, 57, 92, 2, 93, 1, 94, 95, 96, 97]; or [14, 17, 28, 34, 42, 45, 48, 51, 56, 68, 70, 73, 81, 13, 16, 27, 33, 41, 44, 47, 50, 55, 67, 69, 72, 82, 12, 15, 26, 32, 40, 43, 46, 49, 54, 66, 71, 80, 83, 11, 25, 31, 39, 53, 65, 79, 84, 3, 20, 37, 59, 76, 95, 2, 19, 30, 36, 58, 75, 96, 1, 18, 29, 35, 52, 57, 74, 97, 10, 24, 38, 64, 78, 85, 9, 23, 63, 77, 86, 8, 22, 62, 87, 7, 21, 61, 88, 6, 60, 89, 5, 90, 4, 91, 92, 93, 94]; |
| 80, 0 × 374D1 | [4, 6, 7, 8, 10, 12, 13, 14, 15, 16, 17, 18, 19, 22, 23, 24, 26, 28, 32, 33, 34, 35, 37, 41, 43, 45, 46, 50, 51, 52, 54, 57, 64, 66, 71, 72, 75, 76, 79, 80, 81, 3, 5, 9, 11, 21, 25, 27, 31, 36, 40, 42, 44, 49, 53, 56, 63, 65, 70, 74, 78, 82, 2, 20, 30, 39, 48, 55, 62, 69, 73, 77, 83, 1, 29, 38, 47, 61, 68, 84, 60, 67, 85, 59, 86, 58, 87, 88, 89, 90, 91, 92, 93, 94, 95, 96, 97]; or [2, 3, 7, 9, 11, 16, 17, 20, 23, 26, 29, 30, 31, 32, 34, 35, 39, 42, 43, 45, 47, 48, 51, 52, 53, 54, 57, 60, 62, 64, 66, 67, 68, 77, 79, 85, 1, 6, 8, 10, 15, 19, 22, 25, 28, 33, 38, 41, 44, 46, 50, 56, 59, 61, 63, 65, 76, 78, 86, 4, 5, 12, 13, 21, 27, 40, 49, 55, 58, 71, 72, 80, 87, 14, 24, 37, 70, 88, 18, 36, 69, 89, 90, 75, 81, 73, 95, 97, 74, 82, 83, 84, 96, 91, 92, 94, 93]; |
| 80, 0 × 3B001 | [12, 13, 15, 16, 17, 24, 26, 30, 32, 34, 36, 37, 38, 40, 44, 47, 50, 51, 52, 61, 63, 64, 67, 69, 73, 74, 75, 76, 79, 80, 81, 11, 14, 23, 25, 29, 31, 33, 35, 39, 43, 46, 49, 60, 62, 66, 68, 72, 78, 82, 10, 22, 28, 42, 45, 48, 59, 65, 71, 77, 83, 9, 21, 27, 41, 58, 70, 84, 8, 20, 57, 85, 7, 19, 56, 86, 6, 18, 55, 87, 5, 54, 88, 4, 53, 89, 3, 90, 2, 91, 1, 92, 93, 94, 95, 96, 97]; or [12, 13, 15, 16, 17, 24, 26, 30, 32, 34, 36, 37, 38, 40, 44, 47, 50, 51, 52, 61, 63, 64, 67, 69, 73, 74, 75, 76, 79, 80, 81, 11, 14, 23, 25, 29, 31, 33, 35, 39, 43, 46, 49, 60, 62, 66, 68, 72, 78, 82, 10, 22, 28, 42, 45, 48, 59, 65, 71, 77, 83, 1, 18, 27, 41, 53, 70, 97, 9, 21, 58, 84, 8, 20, 57, 85, 7, 19, 56, 86, 6, 55, 87, 5, 54, 88, 4, 89, 3, 90, 2, 91, 92, 93, 94, 96, 95]; |
| 80, 0 × 3CADD | [2, 3, 6, 21, 22, 26, 27, 28, 29, 42, 45, 47, 49, 50, 52, 63, 64, 65, 66, 67, 69, 74, 75, 81, 1, 5, 20, 25, 41, 44, 46, 48, 51, 62, 68, 73, 82, 4, 19, 24, 40, 43, 61, 72, 83, 18, 23, 39, 60, 71, 84, 17, 38, 59, 70, 80, 85, 16, 37, 58, 79, 86, 15, 36, 57, 78, 87, 14, 35, 56, 77, 88, 13, 34, 55, 76, 89, 12, 33, 54, 90, 11, 32, 53, 91, 10, 31, 92, 9, 30, 93, 8, 94, 7, 95, 96, 97]; or [2, 3, 6, 21, 22, 26, 27, 28, 29, 42, 45, 47, 49, 50, 52, 63, 64, 65, 66, 67, 69, 74, 75, 81, 1, 5, 20, 25, 41, 44, 46, 48, 51, 62, 68, 73, 82, 4, 7, 23, 30, 43, 53, 70, 76, 97, 8, 24, 31, 54, 71, 77, 96, 19, 40, 61, 72, 83, 10, 11, 12, 33, 35, 55, 57, 58, 92, 9, 32, 34, 56, 80, 93, 79, 94, 78, 95, 18, 39, 60, 84, 13, 14, 37, 59, 90, 36, 91, 17, 38, 85, 16, 86, 15, 88, 89, 87]; |
| 80, 0 × 2E49D | [2, 3, 9, 11, 15, 16, 21, 23, 24, 26, 28, 29, 30, 31, 35, 40, 43, 45, 46, 49, 51, 52, 53, 54, 55, 57, 58, 61, 62, 66, 68, 69, 70, 72, 75, 76, 77, 79, 81, 1, 8, 10, 14, 20, 22, 25, 27, 34, 39, 42, 44, 48, 50, 56, 60, 65, 67, 71, 74, 78, 82, 7, 13, 19, 33, 38, 41, 47, 59, 64, 73, 80, 83, 6, 12, 18, 32, 37, 63, 84, 5, 17, 36, 85, 4, 86, 87, 88, 89, 90, 91, 92, 93, 94, 95, 96, 97]; or [3, 5, 8, 10, 12, 13, 16, 17, 22, 24, 26, 27, 28, 29, 33, 34, 35, 36, 38, 40, 45, 46, 49, 50, 52, 54, 57, 59, 66, 79, 80, 85, 2, 4, 7, 9, 11, 15, 21, 23, 25, 32, 37, 39, 44, 48, 51, 53, 56, 58, 65, 78, 86, 1, 6, 14, 20, 31, 43, 47, 55, 64, 77, 87, 18, 60, 62, 63, 69, 70, 71, 73, 76, 84, 19, 42, 61, 68, 72, 75, 88, 30, 81, 67, 74, 82, 41, 89, 90, 96, 97, 95, 83, 91, 92, 93, 94]; |

TABLE 3-continued

| Typical K, typical CRC polynomial | Interleaved sequence |
|---|---|
| 80, 0 × 3685B | [1, 2, 7, 10, 11, 15, 17, 18, 19, 20, 22, 24, 27, 31, 33, 34, 37, 38, 39, 40, 41, 48, 49, 50, 52, 55, 56, 57, 59, 63, 64, 65, 68, 73, 77, 78, 79, 81, 6, 9, 14, 16, 21, 23, 26, 30, 32, 36, 47, 51, 54, 58, 62, 67, 72, 76, 80, 82, 5, 8, 13, 25, 29, 35, 46, 53, 61, 66, 71, 75, 83, 4, 12, 28, 45, 60, 70, 74, 84, 3, 44, 69, 85, 43, 86, 42, 87, 88, 89, 90, 91, 92, 93, 94, 95, 96, 97]; or [1, 2, 4, 5, 9, 10, 11, 12, 13, 14, 15, 17, 21, 25, 27, 28, 29, 30, 31, 32, 33, 37, 38, 40, 41, 45, 59, 60, 64, 66, 68, 70, 71, 73, 74, 79, 84, 7, 18, 19, 20, 22, 24, 34, 39, 48, 49, 50, 52, 55, 56, 57, 63, 65, 77, 78, 81, 23, 26, 35, 44, 53, 54, 61, 62, 75, 76, 95, 8, 16, 36, 43, 67, 69, 96, 6, 47, 51, 58, 72, 80, 82, 46, 83, 42, 87, 3, 97, 88, 89, 90, 91, 92, 93, 94, 85, 86]; |
| 80, 0 × 35FB1 | [4, 5, 7, 9, 11, 13, 14, 17, 19, 22, 24, 25, 26, 27, 28, 31, 32, 33, 35, 36, 38, 39, 41, 43, 44, 45, 47, 50, 57, 60, 61, 62, 63, 65, 67, 69, 70, 75, 76, 77, 78, 79, 80, 81, 3, 6, 8, 10, 12, 16, 18, 21, 23, 30, 34, 37, 40, 42, 46, 49, 56, 59, 64, 66, 68, 74, 82, 2, 15, 20, 29, 48, 55, 58, 73, 83, 1, 54, 72, 84, 53, 71, 85, 52, 86, 51, 87, 88, 89, 90, 91, 92, 93, 94, 95, 96, 97]; or [1, 2, 4, 5, 6, 13, 18, 20, 21, 23, 30, 31, 35, 38, 43, 45, 46, 47, 48, 49, 53, 56, 57, 58, 59, 63, 66, 68, 75, 76, 77, 79, 80, 91, 3, 7, 8, 11, 16, 17, 19, 22, 26, 27, 28, 29, 32, 33, 41, 62, 64, 67, 71, 73, 88, 10, 37, 50, 52, 55, 60, 72, 86, 9, 15, 25, 36, 40, 51, 54, 61, 65, 70, 74, 78, 87, 12, 14, 34, 39, 42, 44, 93, 69, 94, 24, 81, 82, 85, 92, 97, 83, 84, 89, 90, 95, 96]; |
| 80, 0 × 3B15D | [2, 3, 6, 7, 8, 9, 13, 14, 16, 17, 18, 19, 20, 21, 23, 24, 25, 26, 34, 37, 38, 41, 43, 45, 46, 63, 65, 66, 69, 70, 71, 72, 76, 77, 79, 80, 81, 1, 5, 12, 15, 22, 33, 36, 40, 42, 44, 62, 64, 68, 75, 78, 82, 4, 11, 32, 35, 39, 61, 67, 74, 83, 10, 31, 60, 73, 84, 30, 59, 85, 29, 58, 86, 28, 57, 87, 27, 56, 88, 55, 89, 54, 90, 53, 91, 52, 92, 51, 93, 50, 94, 49, 95, 48, 96, 47, 97]; or [1, 2, 3, 5, 7, 11, 14, 16, 17, 23, 24, 28, 35, 36, 38, 40, 42, 43, 44, 45, 46, 48, 64, 65, 66, 68, 70, 74, 77, 79, 80, 96, 4, 6, 9, 10, 12, 13, 18, 20, 26, 31, 33, 41, 60, 67, 69, 72, 73, 75, 76, 84, 8, 15, 21, 22, 27, 30, 37, 39, 50, 71, 78, 94, 19, 29, 49, 95, 25, 51, 93, 34, 63, 81, 32, 59, 85, 47, 97, 62, 82, 61, 83, 58, 86, 55, 89, 57, 87, 56, 88, 54, 90, 53, 91, 52, 92]; |
| 80, 0 × 67A71 | [4, 5, 6, 8, 9, 10, 11, 12, 14, 15, 16, 17, 18, 20, 22, 23, 24, 28, 29, 30, 31, 33, 40, 41, 43, 45, 46, 47, 48, 51, 54, 61, 62, 64, 65, 67, 69, 70, 72, 73, 74, 75, 80, 81, 3, 7, 13, 19, 21, 27, 32, 39, 42, 44, 50, 53, 60, 63, 66, 68, 71, 79, 82, 2, 26, 38, 49, 52, 59, 78, 83, 1, 25, 37, 58, 77, 84, 36, 57, 76, 85, 35, 56, 86, 34, 55, 87, 88, 89, 90, 91, 92, 93, 94, 95, 96, 97, 98]; or [1, 4, 6, 7, 8, 9, 10, 13, 15, 16, 19, 21, 26, 30, 31, 34, 36, 37, 38, 41, 42, 52, 53, 56, 58, 59, 62, 63, 66, 67, 72, 74, 80, 94, 3, 11, 17, 22, 23, 24, 25, 28, 35, 43, 45, 46, 47, 48, 54, 55, 57, 64, 69, 70, 71, 75, 79, 95, 2, 27, 44, 51, 65, 68, 73, 78, 96, 5, 14, 20, 29, 33, 50, 77, 97, 18, 32, 40, 49, 60, 90, 39, 61, 76, 91, 86, 12, 92, 81, 82, 98, 83, 84, 85, 93, 87, 88, 89]; |
| 80, 0 × 72001 | [13, 16, 17, 18, 26, 32, 34, 36, 39, 42, 43, 44, 45, 47, 48, 51, 52, 53, 54, 64, 65, 69, 70, 72, 77, 78, 80, 81, 12, 15, 25, 31, 33, 35, 38, 41, 46, 50, 63, 68, 71, 76, 79, 82, 11, 14, 24, 30, 37, 40, 49, 62, 67, 75, 83, 10, 23, 29, 61, 66, 74, 84, 9, 22, 28, 60, 73, 85, 8, 21, 27, 59, 86, 7, 20, 58, 87, 6, 19, 57, 88, 5, 56, 89, 4, 55, 90, 3, 91, 2, 92, 1, 93, 94, 95, 96, 97, 98]; or [13, 16, 17, 18, 26, 32, 34, 36, 39, 42, 43, 44, 45, 47, 48, 51, 52, 53, 54, 64, 65, 69, 70, 72, 77, 78, 80, 81, 12, 15, 25, 31, 33, 35, 38, 41, 46, 50, 63, 68, 71, 76, 79, 82, 1, 14, 19, 27, 37, 40, 49, 55, 66, 73, 98, 11, 24, 30, 62, 67, 75, 83, 10, 23, 29, 61, 74, 84, 9, 22, 28, 60, 85, 8, 21, 59, 86, 7, 20, 58, 87, 6, 57, 88, 5, 56, 89, 4, 90, 3, 91, 2, 92, 93, 97, 94, 95, 96]; |
| 80, 0 × 5F471 | [4, 5, 6, 8, 12, 14, 17, 18, 20, 27, 28, 30, 31, 33, 37, 38, 40, 42, 43, 44, 45, 47, 50, 51, 52, 53, 54, 55, 59, 60, 61, 65, 66, 68, 72, 73, 77, 80, 81, 3, 7, 11, 13, 16, 19, 26, 29, 32, 36, 39, 41, 46, 49, 58, 64, 67, 71, 76, 79, 82, 2, 10, 15, 25, 35, 48, 57, 63, 70, 75, 78, 83, 1, 9, 24, 34, 56, 62, 69, 74, 84, 23, 85, 22, 86, 21, 87, 88, 89, 90, 91, 92, 93, 94, 95, 96, 97, 98]; or [1, 2, 3, 7, 9, 14, 16, 18, 19, 25, 28, 32, 33, 43, 46, 47, 48, 51, 52, 53, 54, 57, 59, 62, 65, 76, 77, 79, 80, 94, 6, 8, 11, 15, 20, 22, 23, 29, 31, 35, 36, 37, 41, 42, 50, 56, 58, 60, 63, 64, 66, 71, 72, 73, 75, 86, 4, 5, 12, 13, 24, 30, 38, 40, 44, 55, 68, 78, 95, 17, 27, 45, 61, 81, 26, 39, 49, 67, 82, 10, 70, 83, 34, 69, 74, 84, 97, 21, 98, 93, 91, 92, 96, 85, 87, 88, 89, 90]; |
| 80, 0 × 7E42D | [2, 3, 4, 5, 7, 10, 12, 13, 14, 16, 17, 18, 19, 21, 24, 25, 27, 29, 30, 31, 38, 40, 41, 42, 43, 45, 46, 47, 49, 50, 52, 54, 55, 56, 58, 62, 67, 68, 69, 72, 75, 78, 81, 1, 6, 9, 11, 15, 20, 23, 26, 28, 37, 39, 44, 48, 51, 53, 57, 61, 66, 71, 74, 77, 80, 82, 8, 22, 36, 60, 65, 70, 73, 76, 79, 83, 35, 59, 64, 84, 34, 63, 85, 33, 86, 32, 87, 88, 89, 90, 91, 92, 93, 94, 95, 96, 97, 98]; or [2, 4, 5, 6, 13, 16, 18, 19, 20, 22, 23, 24, 25, 31, 35, 40, 42, 46, 48, 49, 50, 55, 56, 57, 58, 59, 61, 62, 64, 65, 71, 74, 77, 84, 1, 3, 12, 15, 17, 21, 30, 34, 39, 41, 45, 47, 54, 60, 63, |

TABLE 3-continued

| Typical K, typical CRC polynomial | Interleaved sequence |
|---|---|
| | 70, 73, 76, 80, 85, 7, 10, 11, 27, 33, 43, 44, 52, 53, 67, 68, 78, 79, 86, 9, 26, 29, 32, 51, 66, 87, 8, 28, 88, 36, 69, 72, 75, 83, 38, 89, 37, 90, 14, 94, 91, 92, 93, 96, 81, 82, 98, 97, 95]; |
| 80, 0 × 75761 | [5, 6, 8, 9, 14, 15, 16, 19, 22, 23, 25, 28, 29, 32, 34, 36, 39, 40, 41, 42, 43, 44, 45, 46, 48, 51, 52, 53, 54, 55, 56, 59, 60, 64, 65, 66, 69, 70, 73, 75, 76, 81, 4, 7, 13, 18, 21, 24, 27, 31, 33, 35, 38, 47, 50, 58, 63, 68, 72, 74, 82, 3, 12, 17, 20, 26, 30, 37, 49, 57, 62, 67, 71, 83, 2, 11, 61, 80, 84, 1, 10, 79, 85, 78, 86, 77, 87, 88, 89, 90, 91, 92, 93, 94, 95, 96, 97, 98]; or [1, 3, 5, 6, 9, 13, 14, 15, 16, 22, 26, 28, 31, 32, 33, 35, 37, 38, 39, 42, 47, 48, 51, 53, 58, 60, 61, 64, 65, 68, 69, 71, 72, 76, 77, 90, 2, 4, 7, 8, 10, 11, 17, 20, 21, 23, 27, 34, 44, 49, 56, 59, 63, 67, 70, 73, 75, 93, 19, 25, 36, 43, 55, 62, 66, 74, 94, 18, 29, 40, 50, 52, 78, 97, 24, 30, 41, 45, 46, 57, 89, 54, 81, 82, 12, 83, 80, 87, 79, 88, 91, 92, 84, 85, 86, 98, 95, 96]; |
| 80, 0 × 5ADF5 | [2, 5, 7, 9, 10, 13, 14, 15, 16, 20, 24, 28, 30, 31, 32, 34, 35, 37, 39, 40, 41, 42, 43, 44, 45, 46, 50, 51, 52, 54, 56, 58, 59, 62, 64, 65, 66, 67, 69, 70, 71, 72, 73, 74, 75, 77, 79, 81, 1, 4, 6, 8, 12, 19, 23, 27, 29, 33, 36, 38, 49, 53, 55, 57, 61, 63, 68, 76, 78, 80, 82, 3, 11, 18, 22, 26, 48, 60, 83, 17, 21, 25, 47, 84, 85, 86, 87, 88, 89, 90, 91, 92, 93, 94, 95, 96, 97, 98]; or [2, 3, 8, 9, 10, 11, 12, 15, 16, 18, 20, 22, 24, 26, 29, 31, 33, 34, 38, 45, 46, 48, 49, 51, 57, 58, 59, 60, 63, 66, 68, 74, 80, 83, 1, 7, 14, 17, 19, 21, 23, 25, 28, 30, 32, 37, 44, 47, 50, 56, 62, 65, 67, 73, 79, 84, 5, 6, 13, 27, 36, 41, 52, 54, 61, 69, 71, 77, 96, 35, 40, 53, 55, 64, 70, 72, 75, 78, 91, 39, 43, 87, 4, 42, 76, 86, 89, 90, 92, 93, 85, 81, 97, 82, 94, 98, 88, 95]; |
| 80, 0 × 649DD | [2, 3, 6, 8, 9, 12, 13, 14, 18, 22, 23, 25, 28, 29, 30, 34, 35, 36, 37, 41, 42, 44, 45, 46, 49, 51, 52, 53, 54, 55, 59, 61, 63, 64, 65, 67, 68, 69, 70, 75, 76, 77, 81, 1, 5, 7, 11, 17, 21, 24, 27, 33, 40, 43, 48, 50, 58, 60, 62, 66, 74, 82, 4, 10, 16, 20, 26, 32, 39, 47, 57, 73, 80, 83, 15, 19, 31, 38, 56, 72, 79, 84, 71, 78, 85, 86, 87, 88, 89, 90, 91, 92, 93, 94, 95, 96, 97, 98]; or [3, 5, 7, 8, 9, 10, 11, 13, 14, 15, 17, 18, 24, 26, 30, 33, 34, 38, 39, 45, 48, 50, 52, 53, 54, 58, 64, 65, 69, 70, 71, 77, 78, 79, 80, 92, 1, 19, 20, 21, 22, 23, 31, 32, 37, 40, 41, 51, 55, 56, 59, 67, 72, 73, 84, 2, 4, 6, 12, 16, 25, 29, 44, 47, 49, 57, 63, 68, 76, 93, 28, 36, 43, 46, 62, 75, 94, 27, 66, 74, 95, 61, 96, 35, 42, 60, 97, 88, 85, 89, 81, 82, 86, 90, 91, 98, 83, 87]; |
| 80, 0 × 6F159 | [3, 4, 9, 10, 11, 12, 13, 14, 15, 16, 17, 18, 19, 20, 21, 22, 23, 26, 27, 29, 30, 33, 36, 38, 40, 42, 44, 46, 51, 53, 54, 59, 60, 61, 62, 65, 66, 69, 70, 72, 75, 76, 77, 78, 81, 2, 8, 25, 28, 32, 35, 37, 39, 41, 43, 45, 50, 52, 58, 64, 68, 71, 74, 80, 82, 1, 7, 24, 31, 34, 49, 57, 63, 67, 73, 79, 83, 6, 48, 56, 84, 5, 47, 55, 85, 86, 87, 88, 89, 90, 91, 92, 93, 94, 95, 96, 97, 98]; or [2, 3, 5, 7, 11, 26, 28, 30, 31, 33, 35, 36, 38, 39, 40, 41, 42, 43, 44, 45, 46, 47, 48, 49, 53, 54, 55, 57, 61, 65, 67, 69, 71, 73, 74, 75, 77, 96, 1, 4, 6, 10, 25, 27, 29, 32, 34, 37, 52, 56, 60, 64, 66, 68, 70, 72, 76, 80, 97, 8, 21, 22, 24, 50, 58, 63, 79, 84, 9, 12, 13, 14, 15, 18, 51, 62, 89, 17, 59, 90, 94, 16, 78, 91, 92, 19, 20, 23, 81, 82, 98, 83, 85, 95, 86, 87, 88, 93]; |
| 80, 0 × 67785 | [2, 4, 6, 7, 9, 11, 12, 15, 16, 17, 19, 20, 22, 23, 25, 26, 33, 38, 39, 40, 41, 42, 46, 48, 51, 53, 56, 57, 59, 60, 62, 64, 65, 67, 69, 70, 73, 74, 75, 78, 79, 80, 81, 1, 3, 5, 8, 10, 14, 18, 21, 24, 32, 37, 45, 47, 50, 52, 55, 58, 61, 63, 66, 68, 72, 77, 82, 13, 31, 36, 44, 49, 54, 71, 76, 83, 30, 35, 43, 84, 29, 34, 85, 28, 86, 27, 87, 88, 89, 90, 91, 92, 93, 94, 95, 96, 97, 98]; or [1, 2, 4, 5, 8, 12, 13, 14, 15, 21, 22, 23, 25, 28, 31, 32, 33, 36, 37, 38, 40, 41, 42, 43, 44, 46, 49, 50, 54, 56, 57, 58, 60, 62, 63, 66, 71, 72, 73, 78, 80, 88, 6, 7, 9, 11, 16, 17, 19, 20, 26, 39, 48, 51, 53, 59, 64, 65, 67, 69, 70, 74, 75, 79, 81, 3, 10, 18, 24, 45, 47, 52, 55, 61, 68, 77, 82, 27, 29, 30, 34, 35, 76, 93, 94, 98, 83, 84, 85, 86, 87, 89, 95, 96, 97, 90, 91, 92]; |
| 80, 0 × 46001 | [13, 14, 18, 26, 28, 36, 39, 40, 41, 42, 44, 46, 49, 50, 52, 54, 56, 65, 66, 69, 72, 74, 78, 80, 81, 12, 17, 25, 27, 35, 38, 43, 45, 48, 51, 53, 55, 64, 68, 71, 73, 77, 79, 82, 11, 16, 24, 34, 37, 47, 63, 67, 70, 76, 83, 10, 15, 23, 33, 62, 75, 84, 9, 22, 32, 61, 85, 8, 21, 31, 60, 86, 7, 20, 30, 59, 87, 6, 19, 29, 58, 88, 5, 57, 89, 4, 90, 3, 91, 2, 92, 1, 93, 94, 95, 96, 97, 98]; or [4, 17, 18, 22, 30, 32, 40, 43, 44, 45, 46, 48, 50, 53, 54, 56, 58, 60, 69, 70, 73, 76, 78, 95, 3, 16, 21, 29, 31, 39, 42, 47, 49, 52, 55, 57, 59, 68, 72, 75, 77, 96, 13, 14, 26, 28, 36, 41, 65, 66, 74, 80, 81, 12, 25, 27, 35, 38, 51, 64, 71, 79, 82, 2, 15, 20, 67, 97, 1, 19, 37, 98, 11, 24, 34, 63, 83, 10, 23, 33, 62, 84, 9, 61, 85, 8, 86, 7, 87, 6, 88, 5, 89, 90, 94, 91, 92, 93]; |
| 80, 0 × 72BE9 | [3, 5, 7, 8, 10, 12, 13, 16, 21, 22, 23, 24, 25, 26, 27, 32, 35, 36, 42, 46, 48, 52, 53, 54, 58, 61, 62, 64, 65, 67, 72, 75, 76, 77, 81, 2, 4, 6, 9, 11, 15, 20, 31, 34, 41, 45, 47, 51, 57, 60, 63, 66, 71, 74, 80, 82, 1, 14, 19, 30, 33, 40, 44, 50, 56, 59, 70, 73, 79, 83, 18, 29, 39, 43, 49, 55, 69, 78, 84, 17, 28, 38, 68, 85, 37, 86, 87, 88, 89, 90, 91, 92, 93, 94, 95, 96, 97, 98]; or [3, 5, 7, 8, 10, 12, 13, 16, 21, 22, 23, 24, 25, 26, 27, 32, 35, 36, 42, 46, 48, 52, 53, 54, 58, 61, 62, 64, 65, 67, 72, |

TABLE 3-continued

| Typical K, typical CRC polynomial | Interleaved sequence |
|---|---|
| | 75, 76, 77, 81, 2, 4, 6, 9, 11, 15, 20, 31, 34, 41, 45, 47, 51, 57, 60, 63, 66, 71, 74, 80, 82, 1, 14, 17, 28, 33, 37, 43, 49, 55, 59, 68, 73, 78, 98, 19, 30, 40, 44, 50, 56, 70, 79, 83, 29, 38, 39, 69, 88, 18, 92, 93, 87, 86, 97, 84, 85, 89, 90, 91, 94, 95, 96]; |
| 80, 0 × 5EF9D | [2, 3, 8, 12, 13, 14, 15, 16, 18, 19, 20, 21, 23, 24, 25, 26, 28, 31, 32, 33, 34, 38, 40, 41, 42, 43, 45, 46, 49, 50, 51, 53, 55, 56, 58, 59, 60, 66, 67, 68, 69, 70, 73, 74, 80, 81, 1, 7, 11, 17, 22, 27, 30, 37, 39, 44, 48, 52, 54, 57, 65, 72, 79, 82, 6, 10, 29, 36, 47, 64, 71, 78, 83, 5, 9, 35, 63, 77, 84, 4, 62, 76, 85, 61, 75, 86, 87, 88, 89, 90, 91, 92, 93, 94, 95, 96, 97, 98]; or [1, 6, 8, 10, 12, 19, 20, 21, 22, 26, 27, 30, 33, 35, 38, 41, 42, 43, 45, 52, 53, 54, 55, 58, 59, 60, 61, 62, 70, 74, 76, 77, 78, 80, 91, 3, 5, 7, 9, 13, 15, 18, 23, 25, 29, 31, 34, 40, 44, 47, 50, 51, 63, 64, 66, 67, 71, 72, 84, 2, 14, 36, 37, 39, 46, 48, 57, 79, 89, 4, 11, 16, 17, 32, 56, 65, 68, 69, 85, 73, 75, 86, 28, 49, 87, 83, 24, 90, 96, 95, 92, 93, 81, 82, 88, 97, 98, 94]; |
| 80, 0 × 4F779 | [3, 4, 5, 10, 12, 13, 15, 16, 17, 23, 26, 27, 28, 29, 31, 33, 34, 37, 46, 51, 52, 56, 59, 62, 64, 65, 68, 69, 70, 71, 72, 74, 77, 78, 81, 2, 9, 11, 14, 22, 25, 30, 32, 36, 45, 50, 55, 58, 61, 63, 67, 73, 76, 82, 1, 8, 21, 24, 35, 44, 49, 54, 57, 60, 66, 75, 83, 7, 20, 43, 48, 53, 84, 6, 19, 42, 47, 85, 18, 41, 86, 40, 87, 39, 80, 88, 38, 79, 89, 90, 91, 92, 93, 94, 95, 96, 97, 98]; or [3, 4, 5, 10, 12, 13, 15, 16, 17, 23, 26, 27, 28, 29, 31, 33, 34, 37, 46, 51, 52, 56, 59, 62, 64, 65, 68, 69, 70, 71, 72, 74, 77, 78, 81, 2, 9, 11, 14, 22, 25, 30, 32, 36, 45, 50, 55, 58, 61, 63, 67, 73, 76, 82, 1, 8, 21, 24, 35, 44, 49, 54, 57, 60, 66, 75, 83, 6, 7, 18, 19, 20, 41, 47, 53, 79, 95, 40, 80, 96, 43, 48, 84, 39, 97, 38, 98, 42, 85, 87, 86, 88, 94, 90, 93, 89, 91, 92]; |
| 80, 0 × 658D3 | [1, 2, 3, 5, 6, 9, 10, 11, 12, 13, 14, 15, 17, 18, 19, 20, 21, 23, 27, 30, 31, 34, 36, 38, 39, 43, 45, 46, 50, 53, 58, 59, 62, 65, 66, 67, 68, 74, 75, 76, 78, 80, 81, 4, 8, 16, 22, 26, 29, 33, 35, 37, 42, 44, 49, 52, 57, 61, 64, 73, 77, 79, 82, 7, 25, 28, 32, 41, 48, 51, 56, 60, 63, 72, 83, 24, 40, 47, 55, 71, 84, 54, 70, 85, 69, 86, 87, 88, 89, 90, 91, 92, 93, 94, 95, 96, 97, 98]; or [2, 6, 9, 10, 11, 14, 15, 17, 21, 24, 26, 27, 28, 32, 33, 38, 40, 41, 45, 47, 49, 53, 54, 56, 61, 62, 66, 67, 68, 70, 73, 77, 79, 80, 85, 1, 5, 8, 13, 16, 20, 23, 25, 31, 37, 39, 44, 46, 48, 52, 55, 60, 65, 69, 72, 76, 78, 86, 3, 7, 12, 19, 30, 35, 43, 50, 57, 63, 95, 4, 18, 22, 34, 36, 51, 58, 74, 88, 29, 42, 64, 89, 59, 71, 90, 75, 91, 96, 92, 97, 82, 87, 83, 84, 81, 98, 93, 94]; |
| 80, 0 × 72AA7 | [1, 3, 4, 5, 6, 7, 9, 13, 15, 17, 18, 19, 22, 23, 26, 28, 30, 33, 36, 37, 40, 41, 42, 43, 46, 47, 49, 50, 52, 54, 55, 58, 62, 63, 64, 65, 66, 67, 69, 70, 74, 77, 78, 79, 80, 81, 2, 8, 12, 14, 16, 21, 25, 27, 29, 32, 35, 39, 45, 48, 51, 53, 57, 61, 68, 73, 76, 82, 11, 20, 24, 31, 34, 38, 44, 56, 60, 72, 75, 83, 10, 59, 71, 84, 85, 86, 87, 88, 89, 90, 91, 92, 93, 94, 95, 96, 97, 98]; or [2, 3, 4, 6, 7, 10, 12, 14, 15, 17, 18, 21, 22, 24, 25, 27, 29, 32, 33, 35, 36, 37, 48, 57, 58, 59, 62, 66, 67, 69, 70, 71, 76, 78, 80, 90, 1, 5, 9, 11, 13, 16, 20, 23, 26, 28, 31, 34, 47, 56, 61, 65, 68, 75, 77, 79, 91, 8, 40, 41, 42, 43, 49, 50, 52, 54, 60, 63, 92, 19, 30, 39, 46, 51, 53, 55, 93, 45, 73, 74, 82, 44, 88, 64, 72, 89, 38, 94, 95, 97, 96, 81, 98, 83, 84, 85, 86, 87]; |
| 80, 0 × 55BE9 | [3, 5, 7, 8, 10, 14, 16, 17, 18, 19, 20, 21, 23, 24, 25, 26, 28, 29, 33, 36, 37, 38, 43, 45, 63, 66, 68, 70, 71, 73, 77, 79, 80, 81, 2, 4, 6, 9, 13, 15, 22, 27, 32, 35, 42, 44, 62, 65, 67, 69, 72, 76, 78, 82, 1, 12, 31, 34, 41, 61, 64, 75, 83, 11, 30, 40, 60, 74, 84, 39, 59, 85, 58, 86, 57, 87, 56, 88, 55, 89, 54, 90, 53, 91, 52, 92, 51, 93, 50, 94, 49, 95, 48, 96, 47, 97, 46, 98]; or [2, 3, 6, 11, 17, 18, 22, 23, 24, 26, 28, 29, 32, 33, 35, 37, 38, 40, 44, 45, 54, 65, 66, 69, 74, 80, 90, 1, 5, 10, 16, 21, 25, 27, 31, 34, 36, 39, 43, 53, 64, 68, 73, 79, 91, 4, 14, 19, 41, 42, 49, 67, 77, 95, 9, 13, 15, 30, 48, 72, 76, 78, 96, 20, 51, 93, 8, 12, 50, 71, 75, 94, 60, 84, 7, 59, 70, 85, 55, 89, 47, 97, 63, 81, 46, 98, 62, 82, 56, 88, 61, 83, 52, 92, 57, 87, 58, 86]; |
| 80, 0 × F56FB | [1, 2, 5, 7, 9, 10, 11, 14, 17, 18, 19, 20, 21, 23, 25, 28, 30, 31, 32, 34, 35, 37, 38, 39, 40, 41, 43, 45, 47, 49, 54, 58, 60, 61, 65, 68, 69, 74, 76, 77, 80, 81, 4, 6, 8, 13, 16, 22, 24, 27, 29, 33, 36, 42, 44, 46, 48, 53, 57, 59, 64, 67, 73, 75, 79, 82, 3, 12, 15, 26, 52, 56, 63, 66, 72, 78, 83, 51, 55, 62, 71, 84, 50, 70, 85, 86, 87, 88, 89, 90, 91, 92, 93, 94, 95, 96, 97, 98, 99]; or [2, 3, 5, 7, 8, 9, 14, 15, 17, 19, 20, 21, 22, 24, 25, 28, 30, 39, 41, 43, 45, 48, 49, 53, 56, 57, 61, 62, 69, 76, 78, 79, 91, 1, 4, 6, 13, 16, 18, 23, 27, 29, 38, 40, 42, 44, 47, 52, 55, 60, 68, 75, 77, 92, 11, 12, 32, 33, 35, 36, 54, 58, 59, 63, 66, 80, 90, 10, 26, 31, 34, 46, 51, 65, 67, 93, 37, 50, 64, 94, 70, 71, 87, 88, 89, 72, 86, 74, 81, 95, 73, 96, 99, 85, 97, 84, 98, 82, 83]; |
| 80, 0 × FC809 | [3, 6, 9, 11, 12, 14, 16, 19, 20, 26, 30, 34, 35, 38, 39, 40, 41, 44, 45, 48, 50, 53, 55, 58, 59, 60, 66, 67, 69, 71, 73, 74, 75, 77, 79, 80, 81, 2, 5, 8, 10, 13, 15, 18, 25, 29, 33, 37, 43, 47, 49, 52, 54, 57, 65, 68, 70, 72, 76, 78, 82, 1, 4, 7, 17, 24, 28, 32, 36, 42, 46, 51, 56, 64, 83, 23, 27, 31, 63, 84, 22, 62, 85, 21, 61, 86, 87, 88, 89, 90, 91, 92, 93, 94, 95, 96, 97, 98, 99]; or [3, 6, 9, 11, 12, 14, 16, 19, 20, 26, 30, 34, |

TABLE 3-continued

| Typical K, typical CRC polynomial | Interleaved sequence |
|---|---|
| | 35, 38, 39, 40, 41, 44, 45, 48, 50, 53, 55, 58, 59, 60, 66, 67, 69, 71, 73, 74, 75, 77, 79, 80, 81, 2, 5, 8, 10, 13, 15, 18, 25, 29, 33, 37, 43, 47, 49, 52, 54, 57, 65, 68, 70, 72, 76, 78, 82, 1, 4, 7, 17, 24, 28, 32, 36, 42, 46, 51, 56, 64, 83, 27, 31, 61, 62, 96, 21, 99, 22, 23, 92, 63, 93, 94, 95, 84, 85, 86, 87, 88, 89, 90, 91, 97, 98]; |
| 80, 0 × AEC81 | [7, 10, 11, 13, 15, 17, 19, 20, 21, 22, 24, 25, 26, 28, 32, 38, 39, 40, 42, 44, 47, 48, 52, 55, 57, 59, 60, 63, 65, 69, 70, 71, 73, 74, 76, 77, 79, 80, 81, 6, 9, 12, 14, 16, 18, 23, 27, 31, 37, 41, 43, 46, 51, 54, 56, 58, 62, 64, 68, 72, 75, 78, 82, 5, 8, 30, 36, 45, 50, 53, 61, 67, 83, 4, 29, 35, 49, 66, 84, 3, 34, 85, 2, 33, 86, 1, 87, 88, 89, 90, 91, 92, 93, 94, 95, 96, 97, 98, 99]; or [1, 2, 4, 6, 8, 9, 17, 18, 19, 20, 25, 27, 28, 30, 31, 33, 36, 38, 39, 44, 46, 48, 51, 52, 57, 60, 62, 70, 71, 77, 78, 80, 94, 11, 12, 13, 14, 22, 29, 32, 34, 40, 41, 43, 49, 50, 54, 56, 63, 64, 65, 69, 72, 74, 76, 79, 96, 3, 10, 21, 24, 26, 35, 42, 47, 53, 55, 61, 68, 73, 75, 97, 15, 23, 59, 67, 98, 7, 81, 92, 16, 45, 58, 66, 99, 37, 82, 5, 83, 84, 91, 93, 85, 95, 86, 87, 88, 89, 90]; |
| 80, 0 × E645B | [1, 2, 7, 12, 13, 14, 16, 17, 18, 22, 23, 25, 26, 27, 28, 34, 36, 37, 40, 44, 49, 50, 51, 52, 55, 57, 58, 61, 62, 63, 64, 68, 71, 72, 73, 74, 75, 76, 77, 78, 81, 6, 11, 15, 21, 24, 33, 35, 39, 43, 48, 54, 56, 60, 67, 70, 82, 5, 10, 20, 32, 38, 42, 47, 53, 59, 66, 69, 83, 4, 9, 19, 31, 41, 46, 65, 80, 84, 3, 8, 30, 45, 79, 85, 29, 86, 87, 88, 89, 90, 91, 92, 93, 94, 95, 96, 97, 98, 99]; or [2, 6, 7, 11, 14, 15, 18, 21, 23, 24, 28, 33, 34, 35, 37, 39, 40, 43, 44, 48, 52, 54, 55, 56, 58, 60, 64, 67, 68, 70, 78, 82, 1, 5, 10, 13, 17, 20, 22, 27, 32, 36, 38, 42, 47, 51, 53, 57, 59, 63, 66, 69, 77, 83, 4, 8, 9, 16, 25, 26, 30, 41, 45, 46, 50, 62, 72, 80, 98, 29, 31, 61, 71, 74, 75, 87, 3, 12, 49, 65, 73, 88, 19, 89, 90, 76, 91, 79, 92, 93, 81, 85, 86, 94, 99, 95, 96, 97, 84]; |
| 80, 0 × 9C7D1 | [4, 6, 7, 9, 10, 14, 16, 17, 20, 25, 26, 28, 31, 32, 36, 38, 40, 42, 44, 47, 48, 50, 51, 52, 53, 55, 57, 59, 60, 61, 62, 63, 64, 67, 68, 70, 73, 74, 75, 76, 77, 78, 81, 3, 5, 8, 13, 15, 19, 24, 27, 30, 35, 37, 39, 41, 43, 46, 49, 54, 56, 58, 66, 69, 72, 82, 2, 12, 18, 23, 29, 34, 45, 65, 71, 83, 1, 11, 22, 33, 84, 21, 80, 85, 79, 86, 87, 88, 89, 90, 91, 92, 93, 94, 95, 96, 97, 98, 99]; or [4, 5, 6, 8, 13, 15, 24, 33, 37, 38, 43, 50, 53, 59, 61, 64, 65, 67, 69, 72, 73, 75, 80, 91, 3, 7, 12, 14, 23, 32, 36, 42, 49, 52, 58, 60, 63, 66, 68, 71, 74, 79, 92, 2, 11, 22, 31, 35, 41, 48, 51, 57, 62, 70, 78, 93, 1, 10, 21, 30, 34, 40, 47, 56, 77, 94, 9, 17, 20, 25, 26, 27, 46, 76, 85, 39, 44, 45, 55, 96, 16, 19, 86, 28, 81, 54, 82, 18, 29, 83, 84, 88, 89, 97, 87, 90, 98, 99, 95]; |
| 80, 0 × FE757 | [1, 3, 6, 7, 8, 9, 10, 11, 12, 17, 20, 22, 23, 24, 27, 31, 32, 33, 34, 35, 39, 41, 42, 44, 45, 46, 48, 49, 50, 51, 53, 54, 55, 57, 59, 60, 61, 62, 63, 64, 65, 67, 68, 71, 77, 78, 79, 80, 81, 2, 5, 16, 19, 21, 26, 30, 38, 40, 43, 47, 52, 56, 58, 66, 70, 76, 82, 4, 15, 18, 25, 29, 37, 69, 75, 83, 14, 28, 36, 74, 84, 13, 73, 85, 72, 86, 87, 88, 89, 90, 91, 92, 93, 94, 95, 96, 97, 98, 99]; or [1, 2, 10, 11, 12, 14, 16, 20, 24, 25, 26, 28, 32, 34, 35, 39, 41, 42, 43, 44, 53, 54, 55, 57, 58, 62, 68, 72, 73, 76, 77, 78, 90, 6, 8, 13, 17, 22, 30, 31, 33, 37, 47, 49, 50, 56, 59, 65, 69, 74, 75, 80, 87, 3, 5, 19, 21, 27, 38, 40, 46, 51, 52, 66, 70, 71, 82, 7, 23, 29, 36, 48, 64, 67, 79, 88, 4, 18, 45, 60, 98, 9, 15, 61, 89, 63, 91, 92, 93, 95, 85, 83, 84, 86, 97, 94, 96, 81, 99]; |
| 80, 0 × A2B79 | [3, 4, 5, 11, 13, 14, 17, 18, 22, 25, 27, 31, 34, 37, 38, 39, 41, 48, 51, 52, 55, 56, 60, 63, 66, 67, 69, 70, 71, 72, 73, 75, 81, 2, 10, 12, 16, 21, 24, 26, 30, 33, 36, 40, 47, 50, 54, 59, 62, 65, 68, 74, 82, 1, 9, 15, 20, 23, 29, 32, 35, 46, 49, 53, 58, 61, 64, 83, 8, 19, 28, 45, 57, 84, 7, 44, 85, 6, 43, 86, 42, 87, 80, 88, 79, 89, 78, 90, 77, 91, 76, 92, 93, 94, 95, 96, 97, 98, 99]; or [3, 4, 5, 11, 13, 14, 17, 18, 22, 25, 27, 31, 34, 37, 38, 39, 41, 48, 51, 52, 55, 56, 60, 63, 66, 67, 69, 70, 71, 72, 73, 75, 81, 2, 10, 12, 16, 21, 24, 26, 30, 33, 36, 40, 47, 50, 54, 59, 62, 65, 68, 74, 82, 1, 9, 15, 20, 23, 29, 32, 35, 46, 49, 53, 58, 61, 64, 83, 7, 44, 85, 8, 19, 28, 45, 57, 84, 6, 43, 77, 98, 42, 76, 99, 79, 80, 89, 87, 88, 86, 92, 93, 78, 94, 95, 96, 97, 90, 91]; |
| 80, 0 × E4001 | [14, 17, 18, 19, 28, 34, 36, 38, 42, 45, 46, 47, 48, 50, 51, 54, 57, 68, 70, 72, 73, 74, 75, 76, 81, 13, 16, 27, 33, 35, 37, 41, 44, 49, 53, 56, 67, 69, 71, 82, 12, 15, 26, 32, 40, 43, 52, 55, 66, 80, 83, 11, 25, 31, 39, 65, 79, 84, 10, 24, 30, 64, 78, 85, 9, 23, 29, 63, 77, 86, 8, 22, 62, 87, 7, 21, 61, 88, 6, 20, 60, 89, 5, 59, 90, 4, 58, 91, 3, 92, 2, 93, 1, 94, 95, 96, 97, 98, 99]; or [14, 17, 18, 19, 28, 34, 36, 38, 42, 45, 46, 47, 48, 50, 51, 54, 57, 68, 70, 72, 73, 74, 75, 76, 81, 13, 16, 27, 33, 35, 37, 41, 44, 49, 53, 56, 67, 69, 71, 82, 12, 15, 26, 32, 40, 43, 52, 55, 66, 80, 83, 11, 25, 31, 39, 65, 79, 84, 1, 20, 29, 58, 77, 99, 10, 24, 30, 64, 78, 85, 9, 23, 63, 86, 8, 22, 62, 87, 7, 21, 61, 88, 6, 60, 89, 5, 59, 90, 4, 91, 2, 98, 3, 92, 93, 94, 95, 96, 97]; |
| 80 0 × 99AE9 | [3, 5, 7, 10, 14, 15, 17, 18, 19, 21, 26, 27, 28, 29, 32, 33, 35, 36, 37, 38, 39, 42, 45, 53, 54, 56, 58, 59, 60, 61, 62, 64, 65, 72, 73, 75, 76, 77, 78, 79, 81, 2, 4, 6, 9, 13, 16, 20, 25, 31, 34, 41, 44, 52, 55, 57, 63, 71, 74, 82, 1, 8, 12, 24, 30, 40, 43, 51, 70, 80, 83, 11, 23, 50, 69, 84, 22, 49, 68, 85, 48, 67, 86, 47, 66, 87, 46, 88, 89, 90, 91, 92, 93, |

TABLE 3-continued

| Typical K, typical CRC polynomial | Interleaved sequence |
|---|---|
| | 94, 95, 96, 97, 98, 99]; or [1, 6, 7, 8, 9, 14, 15, 16, 20, 21, 23, 25, 27, 28, 29, 31, 32, 34, 38, 41, 42, 49, 54, 55, 58, 59, 61, 64, 68, 69, 73, 74, 78, 96, 2, 4, 10, 13, 19, 33, 35, 36, 37, 39, 40, 43, 44, 45, 46, 47, 50, 53, 56, 66, 75, 88, 3, 5, 11, 12, 17, 24, 30, 51, 57, 60, 65, 70, 77, 80, 84, 18, 22, 48, 52, 63, 67, 86, 26, 72, 89, 76, 79, 85, 87, 62, 71, 90, 91, 92, 93, 94, 97, 81, 82, 95, 98, 83, 99]; |
| 80, 0 × F86F7 | [1, 3, 5, 6, 7, 10, 11, 14, 16, 19, 21, 23, 25, 26, 31, 33, 38, 42, 43, 44, 46, 47, 50, 53, 54, 55, 59, 61, 62, 66, 69, 71, 73, 75, 79, 81, 2, 4, 9, 13, 15, 18, 20, 22, 24, 30, 32, 37, 41, 45, 49, 52, 58, 60, 65, 68, 70, 72, 74, 78, 80, 82, 8, 12, 17, 29, 36, 40, 48, 51, 57, 64, 67, 77, 83, 28, 35, 39, 56, 63, 76, 84, 27, 34, 85, 86, 87, 88, 89, 90, 91, 92, 93, 94, 95, 96, 97, 98, 99]; or [1, 3, 5, 6, 7, 10, 11, 14, 16, 19, 21, 23, 25, 26, 31, 33, 38, 42, 43, 44, 46, 47, 50, 53, 54, 55, 59, 61, 62, 66, 69, 71, 73, 75, 79, 81, 2, 4, 8, 12, 15, 17, 20, 22, 24, 27, 32, 34, 39, 45, 48, 51, 56, 60, 63, 67, 70, 72, 74, 76, 80, 99, 13, 29, 36, 41, 49, 64, 77, 78, 88, 9, 28, 30, 35, 37, 40, 68, 89, 58, 90, 57, 65, 87, 91, 18, 52, 92, 93, 96, 86, 94, 95, 85, 97, 83, 84, 98, 82]; |
| 80, 0 × 94001 | [14, 16, 19, 28, 32, 38, 42, 44, 46, 47, 48, 51, 52, 54, 56, 57, 64, 70, 72, 75, 76, 78, 80, 81, 13, 15, 18, 27, 31, 37, 41, 43, 45, 50, 53, 55, 63, 69, 71, 74, 77, 79, 82, 12, 17, 26, 30, 36, 40, 49, 62, 68, 73, 83, 11, 25, 29, 35, 39, 61, 67, 84, 10, 24, 34, 60, 66, 85, 9, 23, 33, 59, 65, 86, 8, 22, 58, 87, 7, 21, 88, 6, 20, 89, 5, 90, 4, 91, 3, 92, 2, 93, 1, 94, 95, 96, 97, 98, 99]; or [3, 17, 19, 22, 31, 35, 41, 45, 47, 49, 50, 51, 54, 55, 57, 59, 60, 67, 73, 75, 78, 79, 97, 14, 16, 28, 32, 38, 42, 44, 46, 48, 52, 56, 64, 70, 72, 76, 80, 81, 13, 15, 18, 27, 37, 43, 53, 63, 69, 71, 74, 77, 82, 12, 26, 30, 36, 40, 62, 68, 83, 2, 21, 34, 58, 66, 98, 1, 20, 29, 33, 39, 65, 99, 11, 25, 61, 84, 10, 24, 85, 9, 23, 86, 8, 87, 7, 88, 6, 89, 5, 90, 4, 91, 92, 93, 94, 95, 96]; |
| 80, 0 × CF5C5 | [2, 4, 7, 10, 11, 13, 16, 17, 18, 20, 22, 27, 32, 33, 34, 37, 39, 40, 41, 43, 44, 46, 47, 48, 51, 52, 57, 60, 61, 63, 66, 67, 68, 69, 71, 72, 75, 77, 80, 81, 1, 3, 6, 9, 12, 15, 19, 21, 26, 31, 36, 38, 42, 45, 50, 56, 59, 62, 65, 70, 74, 76, 79, 82, 5, 8, 14, 25, 30, 35, 49, 55, 58, 64, 73, 78, 83, 24, 29, 54, 84, 23, 28, 53, 85, 86, 87, 88, 89, 90, 91, 92, 93, 94, 95, 96, 97, 98, 99]; or [2, 3, 9, 12, 13, 16, 17, 18, 24, 26, 28, 32, 34, 35, 37, 42, 44, 47, 48, 49, 53, 54, 60, 66, 67, 68, 71, 73, 79, 91, 1, 8, 11, 15, 23, 25, 27, 31, 33, 36, 41, 43, 46, 52, 59, 65, 70, 72, 78, 92, 5, 6, 14, 22, 29, 30, 45, 51, 55, 56, 63, 74, 75, 77, 89, 4, 20, 39, 57, 58, 61, 64, 80, 93, 10, 21, 40, 50, 62, 76, 90, 7, 38, 87, 69, 81, 19, 99, 82, 94, 83, 95, 96, 84, 88, 97, 98, 85, 86]; |
| 80, 0 × D7791 | [4, 7, 9, 10, 13, 15, 17, 19, 22, 23, 24, 25, 28, 29, 30, 31, 32, 33, 34, 35, 36, 38, 39, 41, 48, 49, 53, 56, 58, 61, 63, 65, 67, 71, 72, 73, 74, 78, 80, 81, 3, 6, 8, 12, 14, 16, 18, 21, 27, 37, 40, 47, 52, 55, 57, 60, 62, 64, 66, 70, 77, 79, 82, 2, 5, 11, 20, 26, 46, 51, 54, 59, 69, 76, 83, 1, 45, 50, 68, 75, 84, 44, 85, 43, 86, 42, 87, 88, 89, 90, 91, 92, 93, 94, 95, 96, 97, 98, 99]; or [1, 3, 4, 10, 11, 13, 14, 15, 17, 19, 20, 21, 23, 25, 26, 29, 30, 36, 39, 41, 43, 46, 47, 48, 55, 57, 58, 59, 62, 63, 65, 68, 69, 78, 79, 90, 2, 8, 9, 18, 22, 28, 31, 32, 42, 45, 50, 51, 54, 61, 66, 70, 71, 72, 76, 88, 12, 27, 33, 34, 35, 44, 56, 60, 73, 74, 75, 80, 89, 7, 24, 38, 49, 53, 67, 81, 5, 16, 37, 40, 64, 99, 6, 52, 77, 82, 91, 83, 85, 92, 84, 86, 87, 95, 96, 97, 98, 93, 94]; |
| 80, 0 × AD0B5 | [2, 5, 6, 7, 8, 9, 10, 11, 12, 17, 20, 21, 23, 24, 25, 28, 29, 33, 34, 35, 36, 37, 40, 41, 43, 45, 46, 48, 50, 52, 53, 54, 55, 57, 58, 61, 62, 64, 66, 68, 69, 70, 74, 77, 80, 81, 1, 4, 16, 19, 22, 27, 32, 39, 42, 44, 47, 49, 51, 56, 60, 63, 65, 67, 73, 76, 79, 82, 3, 15, 18, 26, 31, 38, 59, 72, 75, 78, 83, 14, 30, 71, 84, 13, 85, 86, 87, 88, 89, 90, 91, 92, 93, 94, 95, 96, 97, 98, 99]; or [2, 3, 4, 7, 9, 10, 11, 15, 18, 20, 26, 27, 28, 29, 30, 31, 33, 34, 36, 38, 39, 40, 42, 43, 49, 50, 53, 54, 59, 64, 69, 70, 73, 74, 80, 93, 1, 6, 8, 14, 17, 19, 25, 32, 35, 37, 41, 48, 52, 58, 63, 68, 72, 79, 94, 5, 13, 22, 23, 44, 46, 47, 51, 57, 60, 62, 66, 67, 71, 78, 88, 12, 16, 21, 45, 56, 61, 65, 77, 89, 24, 75, 76, 86, 87, 55, 90, 91, 92, 96, 95, 97, 83, 84, 81, 82, 85, 98, 99]; |
| 80, 0 × C9685 | [2, 4, 6, 7, 8, 9, 11, 13, 14, 16, 17, 19, 22, 24, 27, 30, 31, 32, 33, 35, 36, 37, 38, 39, 40, 42, 46, 47, 49, 50, 52, 53, 55, 56, 58, 59, 61, 62, 63, 64, 68, 69, 72, 73, 81, 1, 3, 5, 10, 12, 15, 18, 21, 23, 26, 29, 34, 41, 45, 48, 51, 54, 57, 60, 67, 71, 82, 20, 25, 28, 44, 66, 70, 83, 43, 65, 80, 84, 79, 85, 78, 86, 77, 87, 76, 88, 75, 89, 74, 90, 91, 92, 93, 94, 95, 96, 97, 98, 99]; or [2, 3, 4, 6, 9, 10, 13, 15, 16, 17, 20, 23, 29, 30, 31, 32, 33, 34, 35, 36, 38, 41, 42, 43, 44, 56, 65, 66, 67, 69, 72, 73, 76, 78, 79, 80, 88, 1, 5, 8, 12, 14, 19, 22, 28, 37, 40, 55, 64, 68, 71, 75, 77, 89, 18, 21, 24, 26, 27, 39, 45, 47, 48, 50, 53, 54, 57, 59, 60, 62, 63, 74, 93, 7, 25, 46, 49, 52, 58, 61, 94, 51, 70, 95, 83, 11, 84, 85, 86, 87, 90, 81, 82, 96, 97, 98, 91, 92, 99]; |
| 80, 0 × F1CF7 | [1, 3, 5, 6, 7, 9, 10, 11, 12, 13, 16, 19, 20, 24, 25, 29, 31, 32, 36, 38, 41, 42, 45, 46, 47, 48, 49, 50, 51, 52, 53, 54, 55, 56, 57, 58, 59, 60, 61, 62, 65, 67, 71, 77, 78, 80, 81, 2, 4, 8, 15, 18, 23, 28, 30, 35, 37, 40, 44, 64, 66, 70, 76, 79, 82, 14, 17, 22, 27, 34, 39, 43, 63, 69, 75, |

TABLE 3-continued

| Typical K, typical CRC polynomial | Interleaved sequence |
|---|---|
| | 83, 21, 26, 33, 68, 74, 84, 73, 85, 72, 86, 87, 88, 89, 90, 91, 92, 93, 94, 95, 96, 97, 98, 99]; or [4, 7, 10, 11, 12, 13, 14, 15, 18, 21, 22, 27, 28, 32, 33, 34, 36, 39, 40, 41, 44, 51, 67, 70, 73, 74, 75, 76, 77, 78, 93, 3, 6, 9, 17, 20, 26, 31, 35, 38, 43, 50, 66, 69, 72, 80, 94, 2, 5, 8, 16, 19, 25, 30, 37, 42, 49, 65, 68, 71, 79, 95, 1, 24, 29, 48, 64, 96, 23, 57, 87, 59, 85, 62, 82, 46, 98, 53, 91, 45, 47, 52, 54, 55, 56, 58, 60, 61, 81, 63, 88, 99, 89, 83, 90, 84, 86, 97, 92]; |
| 80, 0 × BBBCF | [1, 4, 5, 6, 7, 8, 9, 10, 12, 15, 16, 18, 19, 20, 21, 24, 25, 26, 28, 31, 32, 33, 35, 37, 41, 45, 46, 47, 48, 49, 51, 62, 63, 64, 66, 69, 70, 71, 73, 74, 75, 76, 77, 78, 81, 3, 11, 14, 17, 23, 27, 30, 34, 36, 40, 44, 50, 61, 65, 68, 72, 80, 82, 2, 13, 22, 29, 39, 43, 60, 67, 79, 83, 38, 42, 59, 84, 58, 85, 57, 86, 56, 87, 55, 88, 54, 89, 53, 90, 52, 91, 92, 93, 94, 95, 96, 97, 98, 99]; or [1, 3, 4, 8, 9, 10, 11, 18, 20, 22, 24, 38, 41, 42, 43, 45, 46, 49, 50, 55, 63, 75, 77, 78, 79, 96, 5, 7, 12, 13, 14, 15, 26, 28, 47, 53, 54, 59, 67, 92, 16, 17, 19, 30, 32, 51, 57, 58, 71, 88, 21, 23, 27, 33, 34, 35, 36, 37, 40, 44, 61, 64, 65, 66, 68, 72, 80, 82, 2, 25, 29, 56, 62, 69, 73, 89, 39, 52, 76, 94, 6, 31, 70, 97, 48, 90, 60, 74, 91, 95, 84, 87, 85, 86, 93, 81, 83, 98, 99]; |
| 80, 0 × 90CBF | [1, 6, 9, 10, 11, 14, 15, 17, 19, 21, 25, 26, 28, 29, 30, 32, 33, 34, 35, 37, 44, 45, 48, 49, 51, 52, 54, 58, 59, 61, 62, 65, 68, 69, 72, 73, 75, 76, 79, 81, 5, 8, 13, 16, 18, 20, 24, 27, 31, 36, 43, 47, 50, 53, 57, 60, 64, 67, 71, 74, 78, 82, 4, 7, 12, 23, 42, 46, 56, 63, 66, 70, 77, 80, 83, 3, 22, 41, 55, 84, 2, 40, 85, 39, 86, 38, 87, 88, 89, 90, 91, 92, 93, 94, 95, 96, 97, 98, 99]; or [3, 5, 13, 17, 23, 25, 27, 29, 33, 41, 43, 45, 51, 57, 61, 63, 67, 69, 71, 75, 77, 88, 2, 4, 12, 16, 22, 24, 26, 28, 32, 40, 42, 44, 50, 56, 60, 62, 66, 68, 70, 74, 76, 89, 1, 11, 15, 21, 31, 39, 49, 55, 59, 65, 73, 90, 6, 7, 9, 18, 20, 36, 37, 46, 53, 54, 64, 78, 79, 80, 83, 8, 14, 30, 34, 48, 58, 72, 84, 35, 52, 92, 10, 19, 38, 93, 47, 94, 95, 96, 81, 97, 98, 85, 99, 86, 91, 82, 87]; |
| 100, 0 × 1A9B1 | [4, 5, 7, 10, 11, 12, 15, 17, 20, 21, 24, 25, 27, 29, 30, 32, 36, 37, 38, 43, 44, 45, 47, 50, 51, 52, 53, 60, 61, 63, 64, 69, 70, 71, 76, 78, 79, 80, 82, 84, 86, 87, 90, 94, 96, 99, 100, 101, 3, 6, 9, 14, 16, 19, 23, 26, 28, 31, 35, 42, 46, 49, 59, 62, 68, 75, 77, 81, 83, 85, 89, 93, 95, 98, 102, 2, 8, 13, 18, 22, 34, 41, 48, 58, 67, 74, 88, 92, 97, 103, 1, 33, 40, 57, 66, 73, 91, 104, 39, 56, 65, 72, 105, 55, 106, 54, 107, 108, 109, 110, 111, 112, 113, 114, 115, 116]; or [3, 5, 9, 11, 12, 15, 16, 18, 20, 26, 28, 31, 35, 36, 37, 38, 42, 47, 49, 50, 52, 55, 58, 61, 63, 64, 65, 68, 70, 73, 75, 82, 83, 85, 88, 89, 98, 109, 2, 4, 8, 10, 14, 17, 19, 25, 27, 30, 34, 41, 46, 48, 51, 54, 57, 60, 62, 67, 69, 72, 74, 81, 84, 87, 97, 110, 1, 7, 13, 24, 29, 33, 40, 45, 53, 56, 59, 66, 71, 80, 86, 96, 111, 21, 22, 23, 39, 76, 79, 90, 91, 93, 99, 106, 32, 78, 92, 95, 107, 43, 44, 94, 100, 101, 6, 77, 102, 116, 103, 104, 108, 114, 112, 113, 115, 105]; |
| 100, 0 × 1FDBF | [1, 6, 8, 9, 11, 12, 13, 14, 15, 17, 18, 19, 20, 22, 27, 33, 35, 40, 41, 43, 45, 46, 48, 55, 56, 60, 61, 62, 64, 65, 70, 72, 75, 76, 79, 80, 81, 83, 84, 85, 86, 87, 91, 93, 94, 96, 97, 99, 101, 5, 7, 10, 16, 21, 26, 32, 34, 39, 42, 44, 47, 54, 59, 63, 69, 71, 74, 78, 82, 90, 92, 95, 98, 100, 102, 4, 25, 31, 38, 53, 58, 68, 73, 77, 89, 103, 3, 24, 30, 37, 52, 57, 67, 88, 104, 2, 23, 29, 36, 51, 66, 105, 28, 50, 106, 49, 107, 108, 109, 110, 111, 112, 113, 114, 115, 116]; or [1, 2, 3, 7, 10, 14, 18, 20, 21, 23, 24, 25, 26, 32, 33, 35, 36, 37, 41, 42, 53, 54, 58, 61, 62, 65, 68, 69, 76, 77, 78, 85, 86, 88, 91, 94, 96, 108, 4, 5, 11, 12, 13, 17, 22, 27, 31, 34, 38, 47, 48, 56, 60, 71, 72, 73, 79, 83, 84, 87, 89, 90, 98, 103, 8, 15, 16, 28, 29, 30, 45, 50, 51, 59, 63, 74, 75, 80, 82, 92, 93, 114, 43, 46, 52, 55, 57, 67, 70, 81, 95, 97, 99, 109, 44, 64, 66, 100, 110, 6, 9, 19, 40, 101, 49, 115, 116, 39, 102, 112, 105, 111, 106, 107, 113, 104]; |
| 100, 0 × 16801 | [11, 13, 14, 16, 22, 26, 28, 32, 33, 35, 36, 37, 38, 40, 41, 43, 45, 46, 48, 52, 55, 56, 57, 58, 60, 63, 64, 65, 67, 68, 69, 74, 75, 76, 78, 79, 80, 81, 84, 86, 89, 90, 91, 94, 95, 96, 97, 98, 99, 100, 101, 10, 12, 15, 21, 25, 27, 31, 34, 39, 42, 44, 47, 51, 54, 59, 62, 66, 73, 77, 83, 85, 88, 93, 102, 9, 20, 24, 30, 50, 53, 61, 72, 82, 87, 92, 103, 8, 19, 23, 29, 49, 71, 104, 7, 18, 70, 105, 6, 17, 106, 5, 107, 4, 108, 3, 109, 2, 110, 1, 111, 112, 113, 114, 115, 116]; or [2, 3, 5, 13, 14, 15, 16, 17, 21, 24, 25, 27, 28, 29, 30, 33, 34, 36, 38, 40, 43, 44, 47, 48, 49, 53, 54, 55, 60, 70, 73, 74, 76, 81, 83, 85, 87, 88, 95, 99, 100, 112, 1, 4, 12, 20, 23, 26, 32, 35, 37, 39, 42, 46, 52, 59, 69, 72, 75, 80, 82, 84, 86, 94, 98, 113, 19, 31, 51, 56, 57, 63, 64, 65, 67, 71, 78, 89, 90, 91, 93, 96, 114, 18, 45, 50, 58, 62, 66, 77, 92, 97, 115, 11, 22, 41, 68, 79, 101, 61, 116, 10, 102, 9, 103, 8, 104, 7, 105, 6, 106, 107, 108, 109, 110, 111]; |
| 100, 0 × 1D5E3 | [1, 2, 3, 4, 7, 8, 9, 10, 15, 18, 19, 20, 23, 27, 29, 30, 32, 33, 36, 39, 44, 45, 46, 48, 50, 60, 61, 63, 64, 65, 68, 72, 73, 75, 76, 77, 79, 80, 81, 83, 85, 87, 88, 89, 91, 93, 96, 97, 98, 99, 101, 6, 14, 17, 22, 26, 28, 31, 35, 38, 43, 47, 49, 59, 62, 67, 71, 74, 78, 82, 84, 86, 90, 92, 95, 102, 5, 13, 16, 21, 25, 34, 37, 42, 58, 66, 70, 94, 103, 12, 24, 41, |

TABLE 3-continued

| Typical K, typical CRC polynomial | Interleaved sequence |
|---|---|
| | 57, 69, 104, 11, 40, 56, 105, 55, 106, 54, 107, 53, 108, 52, 100, 109, 51, 110, 111, 112, 113, 114, 115, 116]; or [1, 3, 4, 6, 7, 8, 9, 11, 13, 15, 16, 20, 22, 24, 26, 30, 31, 33, 34, 35, 36, 42, 43, 48, 50, 55, 57, 58, 60, 65, 67, 68, 69, 70, 72, 74, 75, 76, 78, 82, 83, 86, 93, 95, 96, 97, 98, 99, 106, 10, 14, 17, 23, 27, 28, 38, 39, 46, 47, 49, 59, 61, 62, 71, 73, 77, 81, 84, 85, 89, 90, 91, 92, 102, 5, 19, 21, 25, 29, 32, 37, 45, 64, 66, 80, 88, 94, 103, 2, 12, 18, 41, 44, 63, 79, 87, 104, 40, 56, 105, 51, 53, 54, 100, 113, 52, 115, 101, 114, 116, 107, 109, 110, 108, 111, 112]; |
| 100, 0 × 179E9 | [3, 5, 7, 8, 9, 10, 13, 14, 15, 16, 17, 18, 19, 20, 24, 25, 26, 27, 29, 32, 34, 35, 39, 40, 41, 42, 43, 44, 46, 47, 48, 51, 53, 55, 56, 57, 58, 59, 60, 62, 63, 64, 65, 68, 71, 75, 76, 78, 79, 80, 81, 82, 83, 85, 87, 88, 90, 91, 92, 96, 99, 100, 101, 2, 4, 6, 12, 23, 28, 31, 33, 38, 45, 50, 52, 54, 61, 67, 70, 74, 77, 84, 86, 89, 95, 98, 102, 1, 11, 22, 30, 37, 49, 66, 69, 73, 94, 97, 103, 21, 36, 72, 93, 104, 105, 106, 107, 108, 109, 110, 111, 112, 113, 114, 115, 116]; or [1, 3, 4, 9, 12, 13, 14, 15, 22, 23, 25, 26, 29, 32, 33, 36, 37, 38, 40, 41, 46, 48, 50, 51, 52, 57, 62, 64, 67, 68, 69, 71, 72, 74, 76, 77, 78, 80, 85, 89, 90, 92, 94, 95, 97, 99, 100, 114, 5, 7, 8, 16, 17, 21, 28, 31, 35, 43, 44, 47, 54, 56, 60, 61, 63, 70, 75, 79, 81, 82, 84, 86, 109, 2, 11, 24, 27, 30, 39, 42, 55, 59, 66, 88, 96, 98, 112, 6, 18, 19, 20, 34, 45, 58, 73, 83, 91, 93, 104, 10, 49, 53, 105, 110, 87, 111, 65, 106, 107, 108, 113, 115, 101, 116, 102, 103]; |
| 100, 0 × 1E469 | [3, 5, 9, 11, 12, 14, 16, 18, 19, 24, 26, 28, 29, 30, 32, 34, 37, 38, 40, 41, 42, 45, 47, 48, 49, 50, 51, 52, 55, 56, 57, 58, 59, 60, 61, 62, 63, 64, 66, 68, 70, 71, 73, 74, 75, 79, 80, 82, 84, 87, 89, 90, 91, 94, 95, 97, 98, 99, 101, 2, 4, 8, 10, 13, 15, 17, 23, 25, 27, 31, 33, 36, 39, 44, 46, 54, 65, 67, 69, 72, 78, 81, 83, 86, 88, 93, 96, 102, 1, 7, 22, 35, 43, 53, 77, 85, 92, 103, 6, 21, 76, 100, 104, 20, 105, 106, 107, 108, 109, 110, 111, 112, 113, 114, 115, 116]; or [1, 4, 5, 6, 9, 10, 13, 14, 17, 18, 21, 22, 23, 24, 25, 32, 33, 34, 39, 40, 41, 44, 45, 47, 50, 55, 56, 57, 58, 59, 61, 65, 66, 68, 72, 78, 82, 86, 88, 89, 91, 96, 99, 100, 106, 3, 7, 11, 12, 15, 27, 28, 35, 43, 46, 49, 51, 52, 60, 69, 74, 76, 77, 79, 81, 85, 93, 94, 95, 111, 2, 16, 26, 31, 38, 42, 48, 67, 73, 75, 80, 84, 90, 92, 112, 8, 20, 30, 37, 54, 83, 87, 98, 113, 36, 53, 62, 63, 64, 70, 114, 19, 97, 104, 29, 71, 105, 107, 115, 101, 102, 103, 108, 109, 116, 110]; |
| 100, 0 × 1CC27 | [1, 3, 4, 5, 6, 9, 10, 11, 12, 13, 16, 17, 18, 21, 22, 25, 27, 28, 30, 32, 33, 34, 35, 36, 38, 42, 44, 46, 47, 50, 52, 53, 55, 56, 58, 60, 61, 62, 64, 68, 69, 70, 72, 74, 75, 76, 77, 78, 80, 81, 82, 84, 91, 94, 96, 97, 99, 101, 2, 8, 15, 20, 24, 26, 29, 31, 37, 41, 43, 45, 49, 51, 54, 57, 59, 63, 67, 71, 73, 79, 83, 90, 93, 95, 98, 100, 102, 7, 14, 19, 23, 40, 48, 66, 89, 92, 103, 39, 65, 88, 104, 87, 105, 86, 106, 85, 107, 108, 109, 110, 111, 112, 113, 114, 115, 116]; or [3, 4, 6, 7, 9, 10, 11, 13, 14, 16, 18, 19, 22, 23, 24, 29, 32, 33, 34, 37, 38, 40, 41, 43, 47, 48, 49, 57, 60, 63, 64, 66, 68, 71, 74, 75, 76, 80, 83, 84, 89, 90, 91, 92, 93, 98, 103, 2, 5, 8, 12, 15, 17, 21, 28, 31, 36, 39, 42, 46, 56, 59, 62, 65, 67, 70, 73, 79, 82, 88, 97, 104, 1, 20, 27, 30, 35, 45, 55, 58, 61, 69, 72, 78, 81, 87, 96, 105, 52, 53, 54, 85, 94, 95, 112, 26, 44, 51, 113, 25, 50, 77, 86, 114, 99, 100, 115, 102, 111, 101, 106, 107, 116, 108, 109, 110]; |
| 100, 0 × 1DBA3 | [1, 2, 3, 4, 6, 7, 10, 12, 13, 15, 18, 20, 22, 23, 24, 25, 26, 27, 28, 29, 36, 37, 38, 40, 43, 44, 47, 48, 49, 51, 54, 57, 61, 63, 67, 68, 70, 71, 72, 75, 76, 82, 83, 85, 86, 88, 89, 91, 94, 96, 97, 99, 101, 5, 9, 11, 14, 17, 19, 21, 35, 39, 42, 46, 50, 53, 56, 60, 62, 66, 69, 74, 81, 84, 87, 90, 93, 95, 98, 100, 102, 8, 16, 34, 41, 45, 52, 55, 59, 65, 73, 80, 92, 103, 33, 58, 64, 79, 104, 32, 78, 105, 31, 77, 106, 30, 107, 108, 109, 110, 111, 112, 113, 114, 115, 116]; or [2, 5, 9, 10, 12, 13, 15, 17, 18, 20, 26, 29, 30, 31, 33, 34, 36, 38, 42, 45, 46, 48, 49, 51, 53, 56, 58, 61, 62, 65, 67, 70, 71, 75, 80, 83, 84, 86, 89, 90, 92, 93, 94, 96, 99, 110, 1, 4, 8, 11, 14, 16, 19, 25, 28, 32, 35, 37, 41, 44, 47, 50, 52, 55, 57, 60, 64, 66, 69, 74, 79, 82, 85, 88, 91, 95, 98, 100, 111, 6, 22, 23, 59, 72, 73, 76, 78, 81, 87, 112, 21, 68, 77, 97, 108, 7, 24, 43, 54, 63, 109, 27, 40, 113, 3, 39, 114, 101, 115, 116, 102, 103, 106, 107, 104, 105]; |
| 100, 0 × 1F635 | [2, 5, 6, 8, 12, 20, 23, 24, 25, 27, 28, 30, 31, 32, 33, 34, 36, 37, 38, 39, 42, 44, 45, 46, 49, 51, 52, 54, 55, 57, 59, 60, 61, 62, 63, 65, 68, 70, 71, 72, 73, 74, 75, 76, 78, 79, 80, 83, 87, 89, 90, 92, 93, 95, 97, 98, 101, 1, 4, 7, 11, 19, 22, 26, 29, 35, 41, 43, 48, 50, 53, 56, 58, 64, 67, 69, 77, 82, 86, 88, 91, 94, 96, 102, 3, 10, 18, 21, 40, 47, 66, 81, 85, 100, 103, 9, 17, 84, 99, 104, 16, 105, 15, 106, 14, 107, 13, 108, 109, 110, 111, 112, 113, 114, 115, 116]; or [1, 3, 5, 10, 12, 16, 18, 19, 22, 23, 28, 30, 32, 34, 39, 41, 42, 43, 46, 48, 54, 55, 56, 57, 59, 61, 62, 64, 65, 67, 68, 70, 71, 72, 74, 76, 77, 80, 81, 86, 92, 93, 94, 96, 97, 99, 105, 2, 4, 8, 20, 21, 24, 26, 27, 29, 33, 35, 38, 40, 45, 47, 50, 51, 53, 58, 66, 69, 75, 79, 83, 85, 88, 89, 91, 98, 100, 103, 6, 11, |

TABLE 3-continued

| Typical K, typical CRC polynomial | Interleaved sequence |
|---|---|
| | 13, 14, 15, 44, 49, 63, 73, 84, 114, 7, 9, 17, 25, 37, 52, 78, 82, 87, 90, 95, 104, 31, 110, 36, 60, 111, 112, 115, 101, 102, 106, 107, 108, 109, 113, 116]; |
| 100, 0 × 1B41D | [2, 3, 7, 9, 12, 13, 15, 18, 26, 28, 31, 32, 34, 36, 37, 39, 40, 41, 43, 45, 48, 49, 51, 54, 55, 58, 59, 60, 64, 66, 69, 70, 76, 77, 79, 84, 86, 88, 90, 91, 92, 93, 94, 96, 97, 100, 101, 1, 6, 8, 11, 14, 17, 25, 27, 30, 33, 35, 38, 42, 44, 47, 50, 53, 57, 63, 65, 68, 75, 78, 83, 85, 87, 89, 95, 99, 102, 5, 10, 16, 24, 29, 46, 52, 56, 62, 67, 74, 82, 98, 103, 4, 23, 61, 73, 81, 104, 22, 72, 80, 105, 21, 71, 106, 20, 107, 19, 108, 109, 110, 111, 112, 113, 114, 115, 116]; or [6, 10, 11, 15, 16, 17, 18, 22, 25, 29, 30, 32, 35, 36, 37, 41, 42, 46, 47, 52, 54, 58, 63, 67, 70, 72, 73, 74, 75, 78, 79, 80, 83, 84, 85, 86, 88, 89, 91, 93, 96, 97, 98, 105, 5, 9, 14, 21, 24, 28, 31, 34, 40, 45, 51, 53, 57, 62, 66, 69, 71, 77, 82, 87, 90, 92, 95, 100, 106, 4, 8, 13, 20, 23, 27, 33, 39, 44, 50, 56, 61, 65, 68, 76, 81, 94, 99, 107, 3, 7, 12, 19, 26, 38, 43, 49, 55, 60, 64, 108, 2, 48, 59, 101, 1, 102, 109, 110, 116, 103, 104, 113, 111, 112, 114, 115]; |
| 100, 0 × 19F11 | [4, 9, 10, 11, 15, 17, 19, 23, 27, 35, 36, 37, 39, 40, 41, 42, 43, 44, 47, 48, 50, 53, 54, 55, 56, 57, 61, 63, 64, 65, 66, 69, 72, 76, 78, 79, 80, 82, 86, 88, 89, 90, 93, 94, 95, 96, 97, 101, 3, 8, 14, 16, 18, 22, 26, 34, 38, 46, 49, 52, 60, 62, 68, 71, 75, 77, 81, 85, 87, 92, 100, 102, 2, 7, 13, 21, 25, 33, 45, 51, 59, 67, 70, 74, 84, 91, 99, 103, 1, 6, 12, 20, 24, 32, 58, 73, 83, 98, 104, 5, 31, 105, 30, 106, 29, 107, 28, 108, 109, 110, 111, 112, 113, 114, 115, 116]; or [1, 2, 9, 13, 14, 16, 18, 19, 22, 23, 32, 33, 36, 39, 43, 44, 46, 48, 51, 55, 56, 58, 59, 62, 64, 66, 67, 70, 71, 72, 73, 75, 79, 81, 84, 86, 89, 91, 93, 94, 96, 98, 99, 111, 4, 8, 10, 11, 12, 21, 27, 31, 37, 38, 40, 41, 45, 53, 74, 76, 82, 83, 85, 92, 112, 5, 6, 7, 17, 42, 47, 49, 52, 54, 60, 63, 68, 69, 80, 88, 95, 105, 3, 26, 30, 50, 61, 65, 78, 87, 90, 100, 106, 15, 20, 113, 25, 29, 57, 77, 107, 114, 24, 28, 115, 35, 97, 101, 108, 34, 102, 103, 104, 116, 110, 109]; |
| 100, 0 × 14F61 | [5, 6, 8, 9, 11, 12, 14, 15, 16, 17, 18, 19, 21, 22, 25, 27, 31, 32, 33, 39, 41, 42, 43, 47, 50, 51, 54, 58, 60, 61, 63, 64, 65, 67, 69, 70, 72, 77, 78, 83, 97, 99, 101, 4, 7, 10, 13, 20, 24, 26, 30, 38, 40, 46, 49, 53, 57, 59, 62, 66, 68, 71, 76, 82, 96, 98, 102, 3, 23, 29, 37, 45, 48, 52, 56, 75, 81, 95, 100, 103, 2, 28, 36, 44, 55, 74, 80, 94, 104, 1, 35, 73, 79, 93, 105, 34, 92, 106, 91, 107, 90, 108, 89, 109, 88, 110, 87, 111, 86, 112, 85, 113, 84, 114, 115, 116]; or [5, 6, 8, 9, 11, 12, 14, 15, 16, 17, 18, 19, 21, 22, 25, 27, 31, 32, 33, 39, 41, 42, 43, 47, 50, 51, 54, 58, 60, 61, 63, 64, 65, 67, 69, 70, 72, 77, 78, 83, 97, 99, 101, 4, 7, 10, 13, 20, 24, 26, 30, 38, 40, 46, 49, 53, 57, 59, 62, 66, 68, 71, 76, 82, 96, 98, 102, 2, 23, 29, 34, 35, 44, 45, 52, 56, 74, 79, 80, 85, 115, 3, 37, 48, 75, 81, 95, 100, 103, 1, 28, 55, 73, 84, 116, 36, 94, 104, 93, 105, 87, 89, 111, 86, 88, 112, 113, 114, 92, 106, 91, 107, 90, 108, 109, 110]; |
| 100, 0 × 151E9 | [3, 5, 7, 8, 9, 10, 11, 14, 15, 16, 18, 20, 21, 22, 23, 24, 25, 28, 29, 30, 31, 35, 36, 38, 40, 41, 44, 47, 48, 49, 51, 53, 57, 58, 59, 62, 63, 65, 66, 68, 69, 73, 74, 78, 81, 82, 84, 86, 88, 89, 91, 93, 95, 97, 101, 2, 4, 6, 13, 17, 19, 27, 34, 37, 39, 43, 46, 50, 52, 56, 61, 64, 67, 72, 77, 80, 83, 85, 87, 90, 92, 94, 96, 100, 102, 1, 12, 26, 33, 42, 45, 55, 60, 71, 76, 79, 99, 103, 32, 54, 70, 75, 98, 104, 105, 106, 107, 108, 109, 110, 111, 112, 113, 114, 115, 116]; or [1, 2, 3, 4, 5, 9, 12, 16, 17, 18, 20, 23, 27, 34, 36, 40, 41, 43, 45, 52, 54, 55, 56, 57, 59, 62, 63, 65, 67, 71, 72, 74, 77, 78, 80, 83, 84, 86, 87, 90, 92, 96, 97, 106, 6, 7, 8, 11, 13, 15, 21, 22, 24, 25, 26, 28, 29, 38, 44, 47, 49, 50, 51, 64, 68, 75, 76, 79, 81, 85, 89, 93, 99, 109, 10, 14, 19, 31, 32, 37, 46, 60, 66, 70, 88, 91, 100, 108, 39, 42, 48, 53, 61, 95, 98, 110, 73, 82, 94, 111, 35, 112, 30, 69, 113, 33, 58, 114, 101, 102, 103, 115, 116, 107, 104, 105]; |
| 100, 0 × 1AE8B | [1, 2, 4, 8, 9, 10, 12, 13, 14, 18, 21, 23, 25, 27, 29, 30, 31, 32, 36, 38, 40, 43, 44, 49, 50, 51, 53, 54, 55, 56, 59, 61, 65, 66, 68, 73, 77, 78, 79, 82, 83, 90, 91, 92, 95, 99, 100, 101, 3, 7, 11, 17, 20, 22, 24, 26, 28, 35, 37, 39, 42, 48, 52, 58, 60, 64, 67, 72, 76, 81, 89, 94, 98, 102, 6, 16, 19, 34, 41, 47, 57, 63, 71, 75, 80, 88, 93, 97, 103, 5, 15, 33, 46, 62, 70, 74, 87, 96, 104, 45, 69, 86, 105, 85, 106, 84, 107, 108, 109, 110, 111, 112, 113, 114, 115, 116]; or [2, 4, 6, 8, 11, 13, 14, 15, 16, 20, 21, 22, 28, 32, 33, 36, 39, 42, 43, 44, 47, 50, 55, 56, 57, 58, 59, 60, 61, 64, 65, 67, 68, 69, 70, 73, 74, 82, 87, 89, 90, 94, 98, 99, 108, 1, 3, 5, 7, 10, 12, 19, 27, 31, 35, 38, 41, 46, 49, 54, 63, 66, 72, 81, 86, 88, 93, 97, 100, 109, 9, 18, 23, 25, 29, 30, 40, 51, 53, 77, 78, 79, 83, 91, 92, 95, 101, 24, 26, 37, 45, 52, 62, 80, 84, 96, 116, 34, 71, 104, 105, 17, 76, 85, 106, 48, 75, 107, 112, 114, 102, 103, 110, 113, 115, 111]; |
| 100, 0 × 1DBF1 | [4, 5, 6, 7, 9, 10, 11, 12, 13, 15, 17, 21, 22, 26, 28, 29, 37, 38, 39, 40, 41, 43, 46, 47, 48, 49, 50, 54, 55, 60, 63, 64, 67, 69, 71, 73, 76, 79, 80, 83, 84, 86, 90, 92, 93, 94, 97, 98, 100, 101, 3, 8, 14, 16, 20, |

TABLE 3-continued

| Typical K, typical CRC polynomial | Interleaved sequence |
|---|---|
| | 25, 27, 36, 42, 45, 53, 59, 62, 66, 68, 70, 72, 75, 78, 82, 85, 89, 91, 96, 99, 102, 2, 19, 24, 35, 44, 52, 58, 61, 65, 74, 77, 81, 88, 95, 103, 1, 18, 23, 34, 51, 57, 87, 104, 33, 56, 105, 32, 106, 31, 107, 30, 108, 109, 110, 111, 112, 113, 114, 115, 116]; or [2, 3, 5, 7, 9, 10, 12, 19, 20, 21, 24, 25, 26, 28, 30, 31, 36, 39, 42, 48, 49, 50, 51, 54, 55, 56, 57, 58, 59, 63, 66, 68, 69, 70, 74, 76, 77, 78, 80, 82, 84, 85, 89, 94, 95, 96, 97, 110, 1, 4, 6, 8, 11, 18, 23, 27, 29, 35, 38, 41, 47, 53, 62, 65, 67, 73, 75, 79, 81, 83, 88, 93, 111, 13, 15, 34, 43, 52, 60, 61, 71, 72, 86, 87, 90, 98, 100, 112, 17, 22, 37, 40, 46, 64, 92, 101, 14, 16, 45, 91, 99, 102, 44, 103, 104, 33, 105, 116, 115, 32, 107, 108, 109, 113, 114, 106]; |
| 100, 0 × 1F4B7 | [1, 3, 5, 7, 8, 9, 10, 12, 16, 17, 18, 19, 20, 23, 29, 31, 33, 34, 36, 37, 41, 42, 44, 45, 48, 50, 51, 52, 53, 55, 61, 62, 64, 65, 68, 70, 75, 79, 81, 84, 87, 90, 92, 93, 94, 95, 96, 99, 100, 101, 2, 4, 6, 11, 15, 22, 28, 30, 32, 35, 40, 43, 47, 49, 54, 60, 63, 67, 69, 74, 78, 80, 83, 86, 89, 91, 98, 102, 14, 21, 27, 39, 46, 59, 66, 73, 77, 82, 85, 88, 97, 103, 13, 26, 38, 58, 72, 76, 104, 25, 57, 71, 105, 24, 56, 106, 107, 108, 109, 110, 111, 112, 113, 114, 115, 116]; or [2, 5, 6, 7, 9, 10, 15, 17, 20, 22, 24, 25, 27, 28, 29, 31, 32, 35, 36, 37, 38, 40, 46, 48, 50, 53, 58, 60, 61, 63, 66, 68, 70, 75, 76, 77, 78, 79, 80, 82, 88, 91, 95, 98, 100, 111, 1, 4, 8, 14, 16, 19, 21, 23, 26, 30, 34, 39, 45, 47, 49, 52, 57, 59, 62, 65, 67, 69, 74, 81, 87, 90, 94, 97, 99, 112, 3, 33, 41, 42, 43, 51, 55, 71, 72, 73, 83, 85, 86, 93, 96, 105, 12, 18, 44, 64, 84, 92, 101, 11, 13, 54, 56, 116, 106, 107, 89, 113, 103, 108, 114, 102, 104, 109, 110, 115]; |
| 100, 0 × 1BD23 | [1, 2, 3, 4, 6, 14, 15, 18, 19, 20, 25, 27, 29, 30, 31, 33, 35, 37, 38, 40, 42, 43, 46, 47, 48, 50, 55, 56, 62, 63, 64, 65, 67, 70, 73, 76, 77, 78, 82, 83, 84, 87, 89, 91, 94, 95, 98, 99, 100, 101, 5, 13, 17, 24, 26, 28, 32, 34, 36, 39, 41, 45, 49, 54, 61, 66, 69, 72, 75, 81, 86, 88, 90, 93, 97, 102, 12, 16, 23, 44, 53, 60, 68, 71, 74, 80, 85, 92, 96, 103, 11, 22, 52, 59, 79, 104, 10, 21, 51, 58, 105, 9, 57, 106, 8, 107, 7, 108, 109, 110, 111, 112, 113, 114, 115, 116]; or [2, 4, 8, 10, 11, 12, 13, 14, 16, 21, 22, 27, 36, 39, 41, 43, 44, 45, 46, 47, 48, 49, 50, 52, 53, 54, 55, 56, 58, 61, 62, 66, 68, 71, 75, 76, 78, 84, 87, 89, 90, 92, 94, 96, 97, 98, 99, 109, 1, 3, 7, 9, 15, 20, 26, 35, 38, 40, 42, 51, 57, 60, 65, 67, 70, 74, 77, 83, 86, 88, 91, 93, 95, 100, 110, 6, 18, 19, 25, 29, 30, 31, 33, 37, 63, 64, 73, 82, 101, 5, 17, 24, 34, 69, 113, 28, 32, 79, 85, 116, 72, 81, 102, 23, 80, 103, 59, 104, 105, 111, 112, 114, 115, 106, 107, 108]; |
| 100, 0 × 1BEAD | [2, 3, 4, 5, 9, 10, 13, 14, 15, 16, 18, 20, 22, 24, 25, 28, 29, 32, 33, 35, 36, 38, 39, 40, 41, 43, 44, 46, 48, 49, 50, 52, 54, 56, 57, 58, 62, 65, 67, 68, 72, 74, 76, 78, 79, 81, 82, 83, 86, 87, 88, 89, 90, 93, 94, 95, 96, 98, 100, 101, 1, 8, 12, 17, 19, 21, 23, 27, 31, 34, 37, 42, 45, 47, 51, 53, 55, 61, 64, 66, 71, 73, 75, 77, 80, 85, 92, 97, 99, 102, 7, 11, 26, 30, 60, 63, 70, 84, 91, 103, 6, 59, 69, 104, 105, 106, 107, 108, 109, 110, 111, 112, 113, 114, 115, 116]; or [2, 6, 10, 11, 15, 20, 21, 22, 30, 35, 39, 42, 43, 44, 46, 47, 49, 52, 54, 58, 59, 62, 64, 65, 66, 68, 70, 74, 75, 78, 79, 81, 83, 84, 85, 86, 87, 88, 90, 91, 95, 96, 99, 100, 106, 5, 7, 8, 13, 16, 18, 23, 26, 27, 31, 32, 34, 38, 40, 50, 61, 69, 72, 77, 93, 104, 1, 9, 14, 19, 29, 41, 45, 48, 51, 53, 57, 63, 67, 73, 80, 82, 89, 94, 98, 107, 12, 17, 24, 36, 56, 76, 97, 113, 4, 25, 33, 37, 60, 71, 92, 105, 3, 108, 28, 109, 55, 103, 110, 111, 112, 114, 115, 101, 116, 102]; |
| 100, 0 × 1FFF7 | [1, 3, 5, 6, 7, 8, 12, 15, 16, 17, 20, 21, 22, 24, 25, 26, 27, 29, 31, 35, 37, 40, 42, 45, 49, 53, 54, 56, 57, 58, 66, 69, 71, 72, 75, 76, 78, 80, 81, 82, 88, 89, 91, 92, 94, 95, 96, 98, 99, 100, 101, 2, 4, 11, 14, 19, 23, 28, 30, 34, 36, 39, 41, 44, 48, 52, 55, 65, 68, 70, 74, 77, 79, 87, 90, 93, 97, 102, 10, 13, 18, 33, 38, 43, 47, 51, 64, 67, 73, 86, 103, 9, 32, 46, 50, 63, 85, 104, 62, 84, 105, 61, 83, 106, 60, 107, 59, 108, 109, 110, 111, 112, 113, 114, 115, 116]; or [1, 4, 5, 7, 9, 10, 11, 15, 19, 21, 23, 25, 29, 33, 37, 38, 46, 49, 52, 53, 54, 58, 61, 62, 63, 64, 66, 68, 72, 76, 78, 82, 83, 87, 89, 90, 91, 92, 93, 95, 97, 98, 106, 12, 13, 17, 20, 24, 26, 27, 28, 30, 41, 43, 55, 57, 59, 67, 69, 73, 74, 75, 79, 80, 85, 86, 88, 100, 111, 8, 14, 16, 18, 31, 34, 36, 39, 40, 42, 44, 45, 47, 48, 50, 51, 70, 71, 114, 2, 6, 56, 65, 77, 94, 99, 103, 32, 81, 84, 105, 22, 35, 60, 112, 104, 3, 96, 101, 116, 107, 102, 108, 110, 115, 109, 113]; |
| 100, 0 × 18005 | [2, 4, 6, 8, 10, 12, 14, 15, 18, 19, 22, 23, 26, 27, 31, 35, 39, 43, 45, 46, 48, 51, 53, 54, 56, 59, 60, 61, 64, 67, 68, 69, 72, 77, 80, 85, 88, 90, 93, 96, 98, 101, 1, 3, 5, 7, 9, 11, 13, 17, 21, 25, 30, 34, 38, 42, 44, 47, 50, 52, 55, 58, 63, 66, 71, 76, 79, 84, 87, 89, 92, 95, 97, 100, 102, 16, 20, 24, 29, 33, 37, 41, 49, 57, 62, 65, 70, 75, 78, 83, 86, 91, 94, 99, 103, 28, 32, 36, 40, 74, 82, 104, 73, 81, 105, 106, 107, 108, 109, 110, 111, 112, 113, 114, 115, 116]; or [2, 4, 6, 8, 10, 12, 14, 15, 18, 19, 22, 23, 26, 27, 31, 35, 39, 43, 45, 46, 48, 51, 53, 54, 56, 59, 60, 61, 64, 67, 68, 69, 72, 77, 80, 85, 88, 90, 93, 96, 98, 101, 1, 3, 5, |

TABLE 3-continued

| Typical K, typical CRC polynomial | Interleaved sequence |
|---|---|
| | 7, 9, 11, 13, 17, 21, 25, 30, 34, 38, 42, 44, 47, 50, 52, 55, 58, 63, 66, 71, 76, 79, 84, 87, 89, 92, 95, 97, 100, 102, 16, 20, 24, 28, 32, 36, 40, 49, 57, 62, 65, 70, 73, 78, 81, 86, 91, 94, 99, 116, 29, 33, 37, 41, 75, 83, 103, 74, 82, 104, 105, 106, 107, 108, 109, 110, 111, 112, 113, 114, 115]; |
| 100, 0 × 1C001 | [14, 15, 16, 28, 30, 32, 42, 43, 45, 47, 48, 56, 60, 64, 70, 71, 72, 74, 75, 76, 78, 79, 80, 84, 86, 90, 94, 96, 98, 99, 101, 13, 27, 29, 31, 41, 44, 46, 55, 59, 63, 69, 73, 77, 83, 85, 89, 93, 95, 97, 100, 102, 12, 26, 40, 54, 58, 62, 68, 82, 88, 92, 103, 11, 25, 39, 53, 57, 61, 67, 81, 87, 91, 104, 10, 24, 38, 52, 66, 105, 9, 23, 37, 51, 65, 106, 8, 22, 36, 50, 107, 7, 21, 35, 49, 108, 6, 20, 34, 109, 5, 19, 33, 110, 4, 18, 111, 3, 17, 112, 2, 113, 1, 114, 115, 116]; or [14, 15, 16, 28, 30, 32, 42, 43, 45, 47, 48, 56, 60, 64, 70, 71, 72, 74, 75, 76, 78, 79, 80, 84, 86, 90, 94, 96, 98, 99, 101, 13, 27, 29, 31, 41, 44, 46, 55, 59, 63, 69, 73, 77, 83, 85, 89, 93, 95, 97, 100, 102, 1, 17, 33, 49, 57, 61, 65, 81, 87, 91, 116, 12, 26, 40, 54, 58, 62, 68, 82, 88, 92, 103, 11, 25, 39, 53, 67, 104, 10, 24, 38, 52, 66, 105, 9, 23, 37, 51, 106, 8, 22, 36, 50, 107, 7, 21, 35, 108, 6, 20, 34, 109, 5, 19, 110, 4, 18, 111, 3, 112, 2, 113, 114, 115]; |
| 100, 0 × 10811 | [4, 8, 11, 12, 19, 20, 22, 26, 27, 28, 32, 33, 35, 42, 48, 49, 51, 52, 55, 56, 58, 63, 64, 65, 66, 67, 70, 72, 74, 75, 77, 80, 81, 82, 84, 86, 88, 95, 96, 98, 101, 3, 7, 10, 18, 21, 25, 31, 34, 41, 47, 50, 54, 57, 62, 69, 71, 73, 76, 79, 83, 85, 87, 94, 97, 102, 2, 6, 9, 17, 24, 30, 40, 46, 53, 61, 68, 78, 93, 103, 1, 5, 16, 23, 29, 39, 45, 60, 92, 104, 15, 38, 44, 59, 91, 100, 105, 14, 37, 43, 90, 99, 106, 13, 36, 89, 107, 108, 109, 110, 111, 112, 113, 114, 115, 116]; or [5, 9, 13, 16, 17, 24, 25, 27, 31, 32, 33, 37, 38, 40, 47, 53, 54, 56, 57, 60, 61, 63, 68, 69, 70, 71, 72, 75, 77, 79, 80, 82, 85, 86, 87, 89, 91, 93, 100, 112, 4, 8, 11, 12, 19, 20, 22, 26, 28, 35, 42, 48, 49, 51, 52, 55, 58, 64, 65, 66, 67, 74, 81, 84, 88, 95, 96, 98, 101, 3, 7, 10, 18, 21, 34, 41, 50, 62, 73, 76, 83, 94, 97, 102, 2, 6, 30, 46, 78, 103, 1, 23, 29, 39, 45, 92, 104, 15, 36, 59, 90, 99, 113, 14, 114, 44, 115, 43, 116, 105, 106, 107, 108, 109, 110, 111]; |
| 100, 0 × 1E2E9 | [3, 5, 7, 10, 11, 12, 13, 15, 19, 20, 23, 25, 26, 29, 30, 31, 32, 34, 36, 37, 38, 39, 40, 42, 43, 45, 46, 50, 52, 59, 61, 63, 64, 65, 66, 67, 68, 69, 70, 76, 77, 80, 81, 83, 84, 86, 87, 89, 93, 97, 100, 101, 2, 4, 6, 9, 14, 18, 22, 24, 28, 33, 35, 41, 44, 49, 51, 58, 60, 62, 75, 79, 82, 85, 88, 92, 96, 99, 102, 1, 8, 17, 21, 27, 48, 57, 74, 78, 91, 95, 98, 103, 16, 47, 56, 73, 90, 94, 104, 55, 72, 105, 54, 71, 106, 53, 107, 108, 109, 110, 111, 112, 113, 114, 115, 116]; or [2, 3, 4, 5, 8, 9, 11, 13, 15, 16, 17, 19, 22, 25, 27, 28, 30, 32, 33, 35, 38, 45, 46, 47, 49, 50, 52, 56, 58, 59, 60, 62, 68, 69, 70, 73, 74, 76, 78, 87, 89, 90, 93, 94, 99, 100, 104, 1, 7, 10, 12, 14, 18, 21, 24, 26, 29, 31, 34, 37, 44, 48, 51, 55, 57, 61, 67, 72, 75, 77, 86, 88, 92, 98, 105, 6, 23, 41, 42, 53, 54, 63, 64, 80, 91, 95, 96, 97, 110, 20, 36, 40, 79, 111, 39, 43, 66, 85, 112, 65, 84, 113, 81, 83, 101, 82, 102, 71, 114, 116, 103, 115, 108, 106, 109, 107]; |
| 100, 0 × 1D20B | [1, 2, 4, 7, 8, 12, 13, 14, 22, 28, 29, 32, 33, 35, 36, 37, 39, 40, 41, 43, 45, 47, 53, 57, 59, 60, 61, 64, 66, 67, 68, 69, 70, 72, 75, 76, 77, 78, 79, 80, 82, 83, 87, 89, 90, 95, 99, 100, 101, 3, 6, 11, 21, 27, 31, 34, 38, 42, 44, 46, 52, 56, 58, 63, 65, 71, 74, 81, 86, 88, 94, 98, 102, 5, 10, 20, 26, 30, 51, 55, 62, 73, 85, 93, 97, 103, 9, 19, 25, 50, 54, 84, 92, 96, 104, 18, 24, 49, 91, 105, 17, 23, 48, 106, 16, 107, 15, 108, 109, 110, 111, 112, 113, 114, 115, 116]; or [3, 4, 12, 16, 19, 21, 25, 27, 28, 29, 31, 32, 33, 35, 37, 38, 39, 40, 43, 44, 48, 49, 50, 51, 53, 54, 56, 58, 59, 64, 66, 67, 68, 71, 72, 74, 81, 84, 86, 97, 98, 100, 110, 2, 11, 15, 18, 20, 24, 26, 30, 34, 36, 42, 47, 52, 55, 57, 63, 65, 70, 73, 80, 83, 85, 96, 99, 111, 1, 10, 14, 17, 23, 41, 46, 62, 69, 79, 82, 95, 112, 6, 8, 22, 45, 61, 87, 88, 90, 94, 102, 5, 7, 13, 60, 89, 93, 103, 9, 75, 76, 77, 113, 92, 115, 78, 101, 114, 91, 116, 104, 105, 106, 107, 108, 109]; |
| 100, 0 × 1B101 | [8, 12, 13, 15, 26, 28, 29, 30, 31, 34, 36, 37, 40, 41, 43, 45, 46, 52, 56, 58, 62, 65, 66, 67, 69, 72, 74, 77, 78, 80, 81, 83, 85, 89, 90, 93, 96, 97, 98, 99, 100, 101, 7, 11, 14, 25, 27, 33, 35, 39, 42, 44, 51, 55, 57, 61, 64, 68, 71, 73, 76, 79, 82, 84, 88, 92, 95, 102, 6, 10, 24, 32, 38, 50, 54, 60, 63, 70, 75, 87, 91, 94, 103, 5, 9, 23, 49, 53, 59, 86, 104, 4, 22, 48, 105, 3, 21, 47, 106, 2, 20, 107, 1, 19, 108, 18, 109, 17, 110, 16, 111, 112, 113, 114, 115, 116]; or [8, 12, 13, 15, 26, 28, 29, 30, 31, 34, 36, 37, 40, 41, 43, 45, 46, 52, 56, 58, 62, 65, 66, 67, 69, 72, 74, 77, 78, 80, 81, 83, 85, 89, 90, 93, 96, 97, 98, 99, 100, 101, 1, 9, 14, 16, 27, 32, 35, 38, 42, 44, 47, 53, 57, 59, 63, 68, 70, 73, 75, 79, 82, 84, 86, 91, 94, 116, 7, 11, 25, 33, 39, 51, 55, 61, 64, 71, 76, 88, 92, 95, 102, 6, 10, 24, 50, 54, 60, 87, 103, 5, 23, 49, 104, 4, 22, 48, 105, 3, 21, 106, 2, 20, 107, 19, 108, 17, 18, 114, 115, 109, 113, 110, 111, 112]; |

TABLE 3-continued

| Typical K, typical CRC polynomial | Interleaved sequence |
|---|---|
| 100, 0 × 15AC9 | [3, 7, 11, 13, 15, 16, 18, 21, 23, 31, 33, 34, 36, 38, 39, 40, 46, 47, 48, 50, 51, 54, 55, 56, 57, 60, 65, 66, 75, 79, 80, 82, 83, 84, 87, 91, 94, 95, 97, 98, 101, 2, 6, 10, 12, 14, 17, 20, 22, 30, 32, 35, 37, 45, 49, 53, 59, 64, 74, 78, 81, 86, 90, 93, 96, 102, 1, 5, 9, 19, 29, 44, 52, 58, 63, 73, 77, 85, 89, 92, 103, 4, 8, 28, 43, 62, 72, 76, 88, 104, 27, 42, 61, 71, 100, 105, 26, 41, 70, 99, 106, 25, 69, 107, 24, 68, 108, 67, 109, 110, 111, 112, 113, 114, 115, 116]; or [3, 7, 11, 13, 15, 16, 18, 21, 23, 31, 33, 34, 36, 38, 39, 40, 46, 47, 48, 50, 51, 54, 55, 56, 57, 60, 65, 66, 75, 79, 80, 82, 83, 84, 87, 91, 94, 95, 97, 98, 101, 2, 6, 10, 12, 14, 17, 20, 22, 30, 32, 35, 37, 45, 49, 53, 59, 64, 74, 78, 81, 86, 90, 93, 96, 102, 1, 5, 9, 19, 29, 44, 52, 58, 63, 73, 77, 85, 89, 92, 103, 25, 41, 42, 62, 67, 68, 99, 100, 115, 4, 8, 24, 61, 76, 88, 116, 28, 43, 72, 104, 27, 71, 105, 69, 70, 112, 26, 106, 113, 114, 107, 110, 111, 108, 109]; |
| 100, 0 × 17085 | [2, 4, 6, 7, 8, 10, 11, 13, 14, 15, 17, 19, 20, 22, 23, 24, 25, 26, 28, 32, 34, 36, 37, 38, 39, 43, 44, 45, 48, 54, 55, 56, 58, 60, 61, 62, 65, 66, 68, 69, 71, 75, 76, 77, 78, 79, 80, 82, 83, 86, 87, 88, 89, 90, 91, 92, 93, 94, 95, 96, 97, 99, 101, 1, 3, 5, 9, 12, 16, 18, 21, 27, 31, 33, 35, 42, 47, 53, 57, 59, 64, 67, 70, 74, 81, 85, 98, 100, 102, 30, 41, 46, 52, 63, 73, 84, 103, 29, 40, 51, 72, 104, 50, 105, 49, 106, 107, 108, 109, 110, 111, 112, 113, 114, 115, 116]; or [5, 7, 9, 10, 12, 14, 18, 19, 21, 25, 28, 30, 35, 38, 39, 41, 42, 44, 45, 46, 48, 52, 53, 55, 59, 61, 62, 63, 64, 65, 67, 68, 71, 73, 74, 79, 81, 82, 83, 84, 85, 96, 100, 103, 6, 8, 11, 15, 16, 17, 22, 24, 26, 32, 33, 40, 47, 50, 57, 75, 86, 87, 88, 89, 90, 92, 93, 94, 108, 4, 23, 27, 29, 31, 37, 43, 49, 54, 56, 58, 60, 70, 91, 109, 3, 13, 20, 36, 69, 72, 80, 110, 1, 51, 66, 76, 77, 99, 114, 34, 78, 95, 104, 2, 111, 98, 105, 97, 106, 112, 107, 113, 101, 115, 102, 116]; |
| 100, 0 × 1D169 | [3, 5, 8, 9, 10, 11, 13, 16, 18, 19, 21, 24, 25, 27, 28, 29, 30, 32, 33, 36, 39, 41, 42, 43, 44, 45, 53, 55, 58, 60, 63, 64, 66, 67, 68, 69, 73, 74, 77, 79, 80, 83, 84, 85, 86, 87, 88, 92, 93, 95, 97, 99, 100, 101, 2, 4, 7, 12, 15, 17, 20, 23, 26, 31, 35, 38, 40, 52, 54, 57, 59, 62, 65, 72, 76, 78, 82, 91, 94, 96, 98, 102, 1, 6, 14, 22, 34, 37, 51, 56, 61, 71, 75, 81, 90, 103, 50, 70, 89, 104, 49, 105, 48, 106, 47, 107, 46, 108, 109, 110, 111, 112, 113, 114, 115, 116]; or [1, 3, 4, 7, 8, 10, 11, 16, 17, 18, 19, 20, 21, 25, 26, 27, 28, 29, 32, 33, 38, 39, 44, 45, 48, 50, 51, 53, 56, 58, 59, 60, 64, 65, 71, 73, 83, 91, 94, 95, 96, 97, 100, 106, 2, 6, 9, 15, 22, 40, 43, 52, 57, 61, 67, 68, 69, 70, 76, 79, 81, 82, 86, 87, 88, 89, 90, 93, 98, 104, 5, 14, 31, 37, 42, 49, 66, 72, 75, 78, 80, 85, 92, 105, 30, 34, 35, 41, 47, 63, 74, 99, 109, 24, 36, 46, 62, 77, 110, 13, 23, 55, 111, 12, 54, 84, 112, 101, 116, 102, 103, 107, 108, 113, 114, 115]; |
| 100, 0 × 1B55D | [2, 3, 6, 7, 8, 9, 10, 13, 18, 19, 23, 24, 25, 26, 28, 29, 32, 35, 36, 38, 42, 46, 51, 52, 54, 55, 56, 60, 61, 62, 64, 69, 70, 75, 77, 78, 82, 83, 84, 86, 88, 89, 90, 91, 92, 95, 97, 98, 99, 101, 1, 5, 12, 17, 22, 27, 31, 34, 37, 41, 45, 50, 53, 59, 63, 68, 74, 76, 81, 85, 87, 94, 96, 102, 4, 11, 16, 21, 30, 33, 40, 44, 49, 58, 67, 73, 80, 93, 103, 15, 20, 39, 43, 48, 57, 66, 72, 79, 104, 14, 47, 65, 71, 100, 105, 106, 107, 108, 109, 110, 111, 112, 113, 114, 115, 116]; or [2, 5, 11, 12, 14, 19, 20, 21, 24, 25, 27, 29, 31, 36, 39, 43, 44, 45, 47, 48, 49, 50, 51, 54, 56, 60, 63, 65, 68, 70, 75, 78, 83, 85, 86, 87, 91, 92, 93, 99, 100, 107, 1, 4, 10, 13, 18, 23, 26, 28, 30, 35, 38, 42, 46, 53, 55, 59, 62, 64, 67, 69, 74, 77, 82, 84, 90, 98, 108, 3, 6, 8, 15, 16, 22, 32, 34, 37, 40, 41, 66, 71, 73, 79, 81, 88, 89, 95, 97, 114, 7, 33, 52, 58, 61, 72, 76, 80, 94, 96, 115, 9, 101, 17, 102, 109, 57, 110, 116, 104, 113, 105, 106, 111, 103, 112]; |
| 100, 0 × 197CB | [1, 2, 4, 6, 8, 9, 10, 11, 14, 15, 17, 21, 22, 25, 26, 27, 29, 32, 35, 36, 38, 39, 40, 41, 42, 43, 44, 45, 47, 48, 51, 52, 53, 54, 57, 61, 62, 63, 65, 66, 67, 69, 75, 76, 78, 79, 81, 83, 85, 86, 87, 90, 91, 92, 97, 99, 101, 3, 5, 7, 13, 16, 20, 24, 28, 31, 34, 37, 46, 50, 56, 60, 64, 68, 74, 77, 80, 82, 84, 89, 96, 98, 102, 12, 19, 23, 30, 33, 49, 55, 59, 73, 88, 95, 100, 103, 18, 58, 72, 94, 104, 71, 93, 105, 70, 106, 107, 108, 109, 110, 111, 112, 113, 114, 115, 116]; or [3, 5, 6, 8, 10, 13, 17, 18, 20, 21, 30, 34, 36, 38, 39, 40, 41, 42, 45, 46, 47, 51, 53, 55, 57, 58, 63, 69, 72, 74, 76, 77, 80, 82, 83, 86, 91, 92, 94, 95, 96, 100, 104, 2, 4, 7, 9, 12, 16, 19, 29, 33, 35, 37, 44, 50, 52, 54, 56, 62, 68, 71, 73, 75, 79, 81, 85, 90, 93, 99, 105, 1, 11, 15, 28, 32, 43, 49, 61, 67, 70, 78, 84, 89, 98, 106, 24, 26, 31, 60, 64, 87, 88, 113, 22, 25, 65, 107, 14, 23, 27, 48, 59, 66, 114, 97, 102, 115, 103, 111, 110, 112, 109, 108, 101, 116]; |
| 100, 0 × 1A80B | [1, 2, 4, 7, 8, 9, 14, 20, 23, 24, 25, 28, 30, 31, 32, 33, 34, 39, 40, 44, 46, 47, 48, 50, 51, 55, 59, 60, 65, 67, 68, 69, 71, 72, 75, 76, 77, 82, 84, 88, 91, 92, 93, 95, 100, 101, 3, 6, 13, 19, 22, 27, 29, 38, 43, 45, 49, 54, 58, 64, 66, 70, 74, 81, 83, 87, 90, 94, 99, 102, 5, 12, 18, 21, 26, 37, 42, 53, 57, 63, 73, 80, 86, 89, 98, 103, 11, 17, 36, 41, 52, 56, 62, 79, 85, 97, 104, 10, 16, 35, 61, 78, 96, 105, 15, 106, 107, 108, |

TABLE 3-continued

| Typical K, typical CRC polynomial | Interleaved sequence |
|---|---|
| | 109, 110, 111, 112, 113, 114, 115, 116]; or [1, 2, 4, 7, 8, 9, 14, 20, 23, 24, 25, 28, 30, 31, 32, 33, 34, 39, 40, 44, 46, 47, 48, 50, 51, 55, 59, 60, 65, 67, 68, 69, 71, 72, 75, 76, 77, 82, 84, 88, 91, 92, 93, 95, 100, 101, 3, 5, 10, 15, 21, 26, 29, 35, 41, 45, 49, 52, 56, 61, 66, 70, 73, 78, 83, 85, 89, 94, 96, 116, 6, 12, 16, 17, 22, 37, 43, 54, 57, 58, 63, 80, 86, 87, 90, 97, 98, 114, 11, 27, 36, 42, 53, 62, 74, 79, 115, 13, 19, 38, 64, 81, 99, 102, 18, 112, 113, 103, 104, 105, 106, 107, 108, 109, 110, 111]; |
| 100, 0 × 1E771 | [4, 5, 6, 9, 14, 19, 22, 23, 24, 26, 28, 31, 36, 37, 41, 44, 47, 48, 49, 52, 53, 55, 57, 58, 62, 63, 66, 69, 72, 74, 75, 78, 79, 81, 82, 83, 84, 85, 87, 89, 91, 93, 95, 96, 99, 101, 3, 8, 13, 18, 21, 25, 27, 30, 35, 40, 43, 46, 51, 54, 56, 61, 65, 68, 71, 73, 77, 80, 86, 88, 90, 92, 94, 98, 102, 2, 7, 12, 17, 20, 29, 34, 39, 42, 45, 50, 60, 64, 67, 70, 76, 97, 103, 1, 11, 16, 33, 38, 59, 100, 104, 10, 15, 32, 105, 106, 107, 108, 109, 110, 111, 112, 113, 114, 115, 116]; or [4, 5, 6, 9, 14, 19, 22, 23, 24, 26, 28, 31, 36, 37, 41, 44, 47, 48, 49, 52, 53, 55, 57, 58, 62, 63, 66, 69, 72, 74, 75, 78, 79, 81, 82, 83, 84, 85, 87, 89, 91, 93, 95, 96, 99, 101, 3, 8, 13, 18, 21, 25, 27, 30, 35, 40, 43, 46, 51, 54, 56, 61, 65, 68, 71, 73, 77, 80, 86, 88, 90, 92, 94, 98, 102, 2, 7, 12, 17, 20, 29, 34, 39, 42, 45, 50, 60, 64, 67, 70, 76, 97, 103, 1, 10, 15, 32, 33, 59, 100, 105, 11, 16, 38, 104, 116, 110, 107, 111, 112, 113, 108, 109, 106, 115, 114]; |
| 100, 0 × 1D5D3 | [1, 2, 3, 5, 6, 8, 9, 10, 12, 14, 15, 16, 17, 19, 22, 23, 25, 26, 29, 30, 31, 35, 36, 37, 39, 40, 41, 42, 43, 45, 46, 49, 50, 53, 57, 58, 59, 60, 62, 63, 66, 69, 71, 74, 78, 82, 83, 85, 86, 87, 90, 93, 95, 99, 100, 101, 4, 7, 11, 13, 18, 21, 24, 28, 34, 38, 44, 48, 52, 56, 61, 65, 68, 70, 73, 77, 81, 84, 89, 92, 94, 98, 102, 20, 27, 33, 47, 51, 55, 64, 67, 72, 76, 80, 88, 91, 97, 103, 32, 54, 75, 79, 96, 104, 105, 106, 107, 108, 109, 110, 111, 112, 113, 114, 115, 116]; or [2, 4, 5, 6, 7, 12, 17, 18, 19, 20, 21, 22, 26, 28, 29, 30, 34, 36, 37, 39, 42, 46, 47, 59, 65, 67, 68, 69, 70, 75, 80, 81, 82, 83, 84, 85, 89, 91, 92, 93, 97, 99, 100, 105, 1, 3, 11, 16, 25, 27, 33, 35, 38, 41, 45, 58, 64, 66, 74, 79, 88, 90, 96, 98, 106, 13, 24, 31, 32, 40, 43, 50, 51, 52, 53, 57, 61, 72, 73, 94, 109, 10, 15, 23, 49, 56, 60, 71, 78, 95, 110, 8, 9, 14, 44, 62, 86, 107, 54, 55, 76, 77, 113, 48, 63, 87, 102, 103, 104, 114, 115, 101, 111, 112, 116, 108]; |
| 100, 0 × 1F29F | [1, 5, 6, 7, 10, 12, 13, 14, 17, 20, 21, 23, 25, 26, 27, 28, 30, 33, 36, 37, 38, 44, 45, 46, 47, 50, 52, 54, 55, 56, 60, 62, 64, 65, 70, 71, 72, 73, 74, 78, 79, 81, 82, 84, 89, 91, 94, 95, 97, 98, 101, 4, 9, 11, 16, 19, 22, 24, 29, 32, 35, 43, 49, 51, 53, 59, 61, 63, 69, 77, 80, 83, 88, 90, 93, 96, 102, 3, 8, 15, 18, 31, 34, 42, 48, 58, 68, 76, 87, 92, 100, 103, 2, 41, 57, 67, 75, 86, 99, 104, 40, 66, 85, 105, 39, 106, 107, 108, 109, 110, 111, 112, 113, 114, 115, 116]; or [3, 10, 11, 12, 13, 16, 18, 19, 20, 22, 24, 26, 27, 28, 29, 34, 38, 40, 41, 42, 43, 45, 47, 49, 52, 53, 57, 58, 60, 61, 64, 67, 68, 69, 72, 73, 75, 77, 79, 84, 86, 87, 88, 90, 91, 92, 93, 98, 100, 110, 2, 9, 15, 17, 21, 23, 25, 33, 37, 39, 44, 46, 48, 51, 56, 59, 63, 66, 71, 74, 76, 78, 83, 85, 89, 97, 99, 111, 1, 5, 6, 8, 14, 30, 31, 35, 36, 62, 82, 94, 113, 7, 50, 54, 55, 65, 70, 81, 95, 101, 4, 80, 105, 32, 96, 112, 114, 102, 103, 104, 106, 116, 107, 115, 108, 109]; |
| 100, 0 × 15935 | [2, 5, 6, 9, 10, 11, 14, 16, 17, 18, 21, 25, 27, 28, 29, 30, 31, 34, 37, 38, 40, 41, 42, 43, 45, 46, 48, 53, 54, 55, 56, 58, 59, 60, 62, 63, 69, 70, 71, 76, 78, 80, 81, 84, 88, 89, 90, 92, 93, 94, 96, 98, 101, 1, 4, 8, 13, 15, 20, 24, 26, 33, 36, 39, 44, 47, 52, 57, 61, 68, 75, 77, 79, 83, 87, 91, 95, 97, 102, 3, 7, 12, 19, 23, 32, 35, 51, 67, 74, 82, 86, 103, 22, 50, 66, 73, 85, 100, 104, 49, 65, 72, 99, 105, 64, 106, 107, 108, 109, 110, 111, 112, 113, 114, 115, 116]; or [3, 5, 6, 7, 9, 11, 12, 13, 16, 21, 23, 24, 25, 26, 27, 28, 29, 32, 38, 41, 42, 43, 44, 45, 46, 47, 49, 54, 57, 58, 59, 61, 63, 64, 65, 67, 75, 86, 87, 88, 91, 94, 96, 97, 99, 100, 106, 2, 4, 8, 10, 15, 20, 22, 31, 37, 40, 48, 53, 56, 60, 62, 66, 74, 85, 90, 93, 95, 98, 107, 1, 14, 19, 30, 36, 39, 52, 55, 73, 84, 89, 92, 108, 17, 34, 35, 51, 69, 70, 71, 72, 76, 78, 80, 81, 83, 109, 33, 50, 68, 77, 79, 82, 110, 18, 111, 112, 101, 102, 105, 103, 113, 114, 115, 116, 104]; |
| 100, 0 × 18DED | [2, 3, 4, 5, 6, 8, 13, 15, 16, 17, 20, 21, 22, 23, 25, 26, 29, 30, 34, 36, 41, 42, 44, 50, 51, 52, 53, 54, 56, 60, 61, 62, 63, 64, 65, 66, 69, 72, 74, 75, 77, 80, 84, 85, 86, 87, 88, 90, 96, 97, 101, 1, 7, 12, 14, 19, 24, 28, 33, 35, 40, 43, 49, 55, 59, 68, 71, 73, 76, 79, 83, 89, 95, 102, 11, 18, 27, 32, 39, 48, 58, 67, 70, 78, 82, 94, 103, 10, 31, 38, 47, 57, 81, 93, 104, 9, 37, 46, 92, 100, 105, 45, 91, 99, 106, 98, 107, 108, 109, 110, 111, 112, 113, 114, 115, 116]; or [1, 6, 7, 8, 11, 12, 14, 15, 16, 17, 21, 23, 24, 31, 33, 34, 37, 38, 40, 46, 47, 48, 49, 53, 54, 55, 57, 59, 60, 61, 62, 63, 66, 67, 68, 72, 75, 79, 81, 82, 83, 91, 93, 94, 108, 4, 5, 13, 18, 19, 22, 28, 29, 35, 39, 41, 45, 64, 71, 73, 74, 76, 77, 78, 80, 84, 85, 88, 95, 100, 112, 3, 10, 27, 30, 32, 44, 58, 70, 87, 92, 99, 113, 2, 50, 65, 69, 90, 96, 97, 106, 9, 20, 26, 36, 43, 52, 86, |

TABLE 3-continued

| Typical K, typical CRC polynomial | Interleaved sequence |
|---|---|
| | 98, 114, 25, 42, 51, 56, 115, 103, 101, 89, 102, 109, 110, 116, 104, 105, 111, 107]; |
| 100, 0 × 1AAE5 | [2, 4, 5, 7, 8, 10, 12, 13, 17, 18, 20, 27, 28, 33, 34, 35, 36, 38, 39, 40, 41, 42, 45, 46, 47, 49, 50, 52, 53, 54, 55, 56, 58, 59, 60, 62, 66, 70, 75, 78, 81, 83, 85, 86, 87, 89, 91, 92, 94, 96, 98, 101, 1, 3, 6, 9, 11, 16, 19, 26, 32, 37, 44, 48, 51, 57, 61, 65, 69, 74, 77, 80, 82, 84, 88, 90, 93, 95, 97, 100, 102, 15, 25, 31, 43, 64, 68, 73, 76, 79, 99, 103, 14, 24, 30, 63, 67, 72, 104, 23, 29, 71, 105, 22, 106, 21, 107, 108, 109, 110, 111, 112, 113, 114, 115, 116]; or [3, 4, 6, 7, 11, 12, 13, 15, 16, 17, 20, 25, 26, 27, 28, 31, 32, 35, 37, 41, 42, 43, 44, 46, 48, 49, 51, 55, 57, 59, 62, 64, 66, 68, 70, 73, 75, 76, 78, 79, 84, 86, 90, 91, 98, 99, 100, 103, 2, 5, 10, 14, 19, 24, 30, 34, 36, 40, 45, 47, 50, 54, 56, 58, 61, 63, 65, 67, 69, 72, 74, 77, 83, 85, 89, 97, 104, 1, 9, 18, 23, 29, 33, 39, 53, 60, 71, 82, 88, 96, 105, 21, 22, 38, 81, 92, 93, 107, 94, 95, 106, 8, 52, 87, 101, 80, 102, 116, 112, 108, 113, 109, 114, 115, 110, 111]; |
| 100, 0 × 193B5 | [2, 5, 6, 7, 10, 11, 13, 14, 20, 23, 24, 27, 29, 35, 41, 43, 45, 46, 47, 48, 49, 51, 55, 56, 57, 58, 59, 62, 63, 64, 65, 67, 69, 70, 72, 73, 75, 77, 78, 79, 84, 85, 86, 87, 88, 89, 90, 93, 94, 96, 97, 99, 100, 101, 1, 4, 9, 12, 19, 22, 26, 28, 34, 40, 42, 44, 50, 54, 61, 66, 68, 71, 74, 76, 83, 92, 95, 98, 102, 3, 8, 18, 21, 25, 33, 39, 53, 60, 82, 91, 103, 17, 32, 38, 52, 81, 104, 16, 31, 37, 80, 105, 15, 30, 36, 106, 107, 108, 109, 110, 111, 112, 113, 114, 115, 116]; or [1, 4, 8, 12, 13, 14, 16, 18, 19, 21, 22, 24, 29, 31, 33, 35, 37, 41, 42, 43, 45, 47, 48, 52, 55, 63, 64, 65, 66, 72, 73, 74, 75, 76, 78, 79, 80, 81, 84, 85, 86, 91, 100, 105, 3, 5, 6, 11, 15, 23, 26, 28, 30, 32, 38, 39, 44, 46, 53, 54, 58, 69, 70, 71, 77, 83, 87, 94, 96, 98, 99, 113, 2, 7, 10, 17, 25, 27, 57, 62, 68, 82, 93, 95, 97, 114, 34, 36, 40, 49, 56, 59, 67, 88, 89, 106, 9, 20, 92, 107, 50, 61, 109, 60, 110, 51, 115, 90, 103, 111, 112, 104, 101, 102, 116, 108]; |
| 100, 0 × 12341 | [6, 8, 9, 12, 13, 20, 21, 22, 24, 27, 28, 29, 30, 31, 32, 33, 35, 37, 39, 44, 46, 48, 49, 51, 52, 55, 56, 60, 61, 62, 63, 65, 66, 72, 74, 77, 78, 84, 88, 90, 91, 92, 97, 100, 101, 5, 7, 11, 19, 23, 26, 34, 36, 38, 43, 45, 47, 50, 54, 59, 64, 71, 73, 76, 83, 87, 89, 96, 99, 102, 4, 10, 18, 25, 42, 53, 58, 70, 75, 82, 86, 95, 98, 103, 3, 17, 41, 57, 69, 81, 85, 94, 104, 2, 16, 40, 68, 80, 93, 105, 1, 15, 67, 79, 106, 14, 107, 108, 109, 110, 111, 112, 113, 114, 115, 116]; or [6, 8, 9, 12, 13, 20, 21, 22, 24, 27, 28, 29, 30, 31, 32, 33, 35, 37, 39, 44, 46, 48, 49, 51, 52, 55, 56, 60, 61, 62, 63, 65, 66, 72, 74, 77, 78, 84, 88, 90, 91, 92, 97, 100, 101, 5, 7, 11, 19, 23, 26, 34, 36, 38, 43, 45, 47, 50, 54, 59, 64, 71, 73, 76, 83, 87, 89, 96, 99, 102, 4, 10, 18, 25, 42, 53, 58, 70, 75, 82, 86, 95, 98, 103, 3, 17, 41, 57, 69, 81, 85, 94, 104, 2, 16, 40, 68, 80, 93, 105, 1, 15, 67, 79, 106, 114, 14, 115, 116, 109, 107, 110, 108, 111, 112, 113]; |
| 100, 0 × 14D79 | [3, 4, 5, 9, 10, 11, 15, 17, 18, 19, 20, 27, 28, 29, 30, 31, 35, 37, 41, 42, 44, 47, 48, 49, 50, 51, 54, 57, 60, 65, 69, 70, 71, 72, 75, 76, 77, 78, 79, 81, 84, 89, 90, 91, 92, 94, 95, 96, 97, 98, 99, 101, 2, 8, 14, 16, 26, 34, 36, 40, 43, 46, 53, 56, 59, 64, 68, 74, 80, 83, 88, 93, 102, 1, 7, 13, 25, 33, 39, 45, 52, 55, 58, 63, 67, 73, 82, 87, 100, 103, 6, 12, 24, 32, 38, 62, 66, 86, 104, 23, 61, 85, 105, 22, 106, 21, 107, 108, 109, 110, 111, 112, 113, 114, 115, 116]; or [1, 2, 6, 7, 8, 13, 20, 23, 24, 25, 27, 33, 34, 35, 36, 38, 42, 45, 47, 50, 51, 54, 57, 59, 60, 61, 64, 66, 67, 71, 73, 75, 77, 79, 81, 83, 84, 85, 86, 87, 90, 91, 94, 95, 98, 99, 100, 105, 3, 5, 9, 10, 11, 12, 14, 15, 16, 17, 21, 28, 29, 37, 40, 41, 43, 46, 48, 52, 53, 56, 58, 65, 76, 80, 89, 92, 109, 18, 22, 26, 30, 39, 49, 55, 63, 69, 70, 72, 74, 82, 88, 96, 111, 4, 32, 78, 110, 44, 62, 68, 97, 107, 19, 31, 108, 93, 112, 113, 114, 101, 102, 115, 103, 116, 104, 106]; |
| 100 0 × 13613 | [1, 2, 3, 5, 7, 8, 9, 10, 15, 19, 21, 22, 25, 26, 33, 36, 38, 40, 42, 44, 45, 47, 51, 55, 57, 58, 59, 61, 63, 64, 65, 67, 68, 70, 72, 73, 75, 76, 77, 78, 79, 84, 85, 86, 89, 91, 92, 94, 95, 99, 100, 101, 4, 6, 14, 18, 20, 24, 32, 35, 37, 39, 41, 43, 46, 50, 54, 56, 60, 62, 66, 69, 71, 74, 83, 88, 90, 93, 98, 102, 13, 17, 23, 31, 34, 49, 53, 82, 87, 97, 103, 12, 16, 30, 48, 52, 81, 96, 104, 11, 29, 80, 105, 28, 106, 27, 107, 108, 109, 110, 111, 112, 113, 114, 115, 116]; or [5, 8, 9, 10, 11, 12, 16, 17, 22, 23, 25, 26, 29, 30, 32, 34, 35, 37, 39, 43, 45, 48, 52, 53, 55, 56, 61, 62, 64, 66, 71, 72, 73, 75, 77, 78, 79, 80, 83, 84, 87, 90, 91, 94, 98, 105, 2, 14, 15, 18, 28, 31, 36, 38, 40, 41, 49, 51, 54, 58, 59, 67, 68, 70, 81, 85, 86, 89, 93, 96, 97, 100, 111, 1, 13, 21, 27, 42, 44, 50, 57, 60, 69, 76, 82, 88, 92, 95, 99, 112, 4, 7, 24, 33, 47, 63, 65, 74, 106, 3, 6, 20, 46, 107, 19, 108, 109, 114, 115, 101, 110, 116, 113, 102, 103, 104]; |
| 100, 0 × 1F497 | [1, 3, 8, 9, 20, 21, 23, 25, 26, 29, 33, 34, 40, 41, 43, 48, 49, 50, 51, 53, 58, 59, 60, 61, 63, 65, 66, 69, 70, 71, 74, 75, 76, 79, 80, 81, 84, 88, 89, 101, 2, 7, 19, 22, 24, 28, 32, 39, 42, 47, 52, 57, 62, 64, 68, 73, 78, 83, 87, 102, 6, 18, 27, 31, 38, 46, 56, 67, 72, 77, 82, 86, 103, |

TABLE 3-continued

| Typical K, typical CRC polynomial | Interleaved sequence |
|---|---|
| | 5, 17, 30, 37, 45, 55, 85, 104, 4, 16, 36, 44, 54, 105, 15, 35, 100, 106, 14, 99, 107, 13, 98, 108, 12, 97, 109, 11, 96, 110, 10, 95, 111, 94, 112, 93, 113, 92, 114, 91, 115, 90, 116]; or [1, 3, 8, 9, 20, 21, 23, 25, 26, 29, 33, 34, 40, 41, 43, 48, 49, 50, 51, 53, 58, 59, 60, 61, 63, 65, 66, 69, 70, 71, 74, 75, 76, 79, 80, 81, 84, 88, 89, 101, 2, 7, 19, 22, 24, 28, 32, 39, 42, 47, 52, 57, 62, 64, 68, 73, 78, 83, 87, 102, 6, 18, 27, 31, 38, 46, 56, 67, 72, 77, 82, 86, 103, 5, 17, 30, 37, 45, 55, 85, 104, 4, 16, 36, 44, 54, 105, 15, 35, 100, 106, 14, 99, 107, 13, 98, 108, 12, 97, 109, 11, 96, 110, 93, 113, 92, 114, 91, 115, 10, 90, 116, 95, 111, 94, 112]; |
| 100, 0 × 3CBED | [2, 3, 4, 5, 6, 8, 9, 10, 17, 18, 19, 20, 25, 27, 29, 30, 34, 36, 40, 41, 42, 47, 49, 50, 51, 52, 53, 54, 55, 56, 57, 60, 61, 63, 66, 67, 68, 69, 71, 77, 78, 81, 82, 83, 84, 85, 86, 88, 91, 92, 96, 97, 98, 99, 101, 1, 7, 16, 24, 26, 28, 33, 35, 39, 46, 48, 59, 62, 65, 70, 76, 80, 87, 90, 95, 100, 102, 15, 23, 32, 38, 45, 58, 64, 75, 79, 89, 94, 103, 14, 22, 31, 37, 44, 74, 93, 104, 13, 21, 43, 73, 105, 12, 72, 106, 11, 107, 108, 109, 110, 111, 112, 113, 114, 115, 116, 117]; or [1, 2, 3, 4, 6, 8, 11, 13, 15, 16, 17, 20, 21, 23, 27, 31, 34, 35, 36, 42, 47, 48, 51, 52, 53, 56, 60, 63, 65, 72, 77, 84, 85, 86, 87, 90, 96, 100, 108, 9, 12, 18, 22, 26, 28, 29, 30, 32, 37, 38, 41, 44, 49, 50, 59, 61, 64, 67, 71, 73, 78, 80, 82, 88, 89, 92, 94, 97, 116, 7, 10, 14, 24, 33, 43, 45, 46, 54, 66, 68, 74, 76, 91, 93, 98, 99, 112, 5, 19, 25, 55, 58, 62, 79, 106, 69, 70, 83, 107, 40, 75, 113, 39, 114, 57, 95, 103, 81, 109, 101, 104, 115, 102, 105, 117, 110, 111]; |
| 100, 0 × 3D173 | [1, 2, 3, 6, 8, 9, 10, 11, 13, 14, 15, 16, 18, 19, 20, 23, 25, 26, 27, 28, 30, 31, 35, 38, 40, 41, 42, 43, 45, 46, 47, 48, 49, 51, 52, 53, 54, 57, 59, 60, 61, 62, 66, 67, 68, 71, 73, 74, 77, 79, 82, 83, 85, 87, 89, 90, 91, 92, 94, 95, 98, 100, 101, 5, 7, 12, 17, 22, 24, 29, 34, 37, 39, 44, 50, 56, 58, 65, 70, 72, 76, 78, 81, 84, 86, 88, 93, 97, 99, 102, 4, 21, 33, 36, 55, 64, 69, 75, 80, 96, 103, 32, 63, 104, 105, 106, 107, 108, 109, 110, 111, 112, 113, 114, 115, 116, 117]; or [1, 4, 6, 10, 11, 15, 16, 17, 18, 21, 23, 27, 30, 32, 34, 36, 38, 42, 43, 45, 48, 49, 52, 55, 57, 60, 61, 65, 66, 69, 75, 76, 77, 78, 79, 80, 81, 84, 87, 91, 96, 99, 100, 105, 5, 7, 8, 12, 14, 22, 25, 26, 29, 31, 33, 37, 39, 40, 41, 44, 46, 59, 63, 67, 70, 74, 83, 86, 89, 93, 94, 95, 97, 98, 109, 3, 13, 20, 24, 28, 35, 47, 54, 58, 62, 64, 68, 73, 82, 85, 88, 92, 110, 2, 19, 53, 72, 111, 9, 56, 71, 90, 112, 50, 102, 106, 51, 116, 103, 115, 104, 113, 114, 101, 117, 107, 108]; |
| 100, 0 × 38355 | [2, 9, 10, 12, 13, 15, 16, 17, 18, 19, 20, 21, 24, 27, 28, 29, 30, 34, 35, 36, 37, 38, 41, 47, 49, 50, 51, 54, 57, 59, 67, 70, 74, 79, 80, 81, 82, 84, 85, 91, 92, 93, 94, 96, 97, 98, 99, 100, 101, 1, 8, 11, 14, 23, 26, 33, 40, 46, 48, 53, 56, 58, 66, 69, 73, 78, 83, 90, 95, 102, 7, 22, 25, 32, 39, 45, 52, 55, 65, 68, 72, 77, 89, 103, 6, 31, 44, 64, 71, 76, 88, 104, 5, 43, 63, 75, 87, 105, 4, 42, 62, 86, 106, 3, 61, 107, 60, 108, 109, 110, 111, 112, 113, 114, 115, 116, 117]; or [1, 2, 3, 4, 10, 12, 13, 15, 16, 23, 25, 26, 28, 32, 35, 40, 42, 43, 48, 49, 50, 53, 55, 56, 58, 59, 60, 61, 68, 69, 71, 72, 75, 76, 80, 84, 85, 87, 92, 96, 97, 116, 5, 6, 7, 17, 21, 22, 29, 31, 34, 38, 39, 41, 46, 47, 51, 52, 54, 63, 65, 66, 67, 74, 83, 88, 94, 105, 14, 20, 30, 33, 37, 45, 62, 64, 73, 79, 82, 86, 91, 93, 95, 100, 106, 8, 9, 11, 24, 70, 77, 78, 81, 89, 90, 99, 103, 18, 19, 27, 36, 57, 98, 101, 102, 44, 104, 107, 108, 117, 109, 110, 111, 112, 113, 114, 115]; |
| 100, 0 × 3B43B | [1, 2, 5, 6, 8, 9, 11, 12, 13, 14, 17, 20, 21, 23, 27, 28, 29, 32, 33, 35, 37, 40, 44, 45, 46, 47, 50, 53, 55, 56, 59, 60, 61, 65, 66, 67, 68, 71, 72, 73, 75, 79, 80, 81, 83, 88, 90, 91, 92, 97, 99, 100, 101, 4, 7, 10, 16, 19, 22, 26, 31, 34, 36, 39, 43, 49, 52, 54, 58, 64, 70, 74, 78, 82, 87, 89, 96, 98, 102, 3, 15, 18, 25, 30, 38, 42, 48, 51, 57, 63, 69, 77, 86, 95, 103, 24, 41, 62, 76, 85, 94, 104, 84, 93, 105, 106, 107, 108, 109, 110, 111, 112, 113, 114, 115, 116, 117]; or [2, 12, 13, 17, 18, 20, 21, 23, 26, 30, 38, 39, 40, 41, 42, 44, 45, 47, 49, 50, 51, 53, 54, 58, 61, 63, 66, 67, 68, 70, 71, 72, 75, 77, 82, 85, 89, 91, 92, 93, 94, 95, 97, 100, 111, 1, 4, 6, 7, 9, 11, 15, 19, 24, 28, 31, 34, 46, 48, 52, 55, 60, 62, 65, 76, 83, 86, 87, 88, 96, 98, 99, 104, 16, 22, 25, 29, 37, 43, 57, 69, 74, 81, 84, 90, 112, 5, 10, 14, 32, 33, 35, 56, 59, 64, 78, 106, 36, 107, 3, 8, 73, 80, 108, 79, 109, 27, 110, 102, 103, 105, 116, 101, 117, 113, 114, 115]; |
| 100, 0 × 3D5F3 | [1, 2, 3, 6, 7, 8, 12, 14, 18, 20, 25, 26, 27, 28, 30, 31, 32, 35, 36, 37, 39, 41, 44, 47, 50, 52, 54, 55, 58, 60, 61, 62, 65, 72, 74, 75, 76, 79, 82, 86, 87, 88, 90, 91, 92, 95, 97, 98, 100, 101, 5, 11, 13, 17, 19, 24, 29, 34, 38, 40, 43, 46, 49, 51, 53, 57, 59, 64, 71, 73, 78, 81, 85, 89, 94, 96, 99, 102, 4, 10, 16, 23, 33, 42, 45, 48, 56, 63, 70, 77, 80, 84, 93, 103, 9, 15, 22, 69, 83, 104, 21, 68, 105, 67, 106, 66, 107, 108, 109, 110, 111, 112, 113, 114, 115, 116, 117]; or [2, 3, 7, 9, 10, 11, 12, 15, 17, 19, 20, 22, 23, 25, 27, 29, 39, 40, 43, 44, 46, 48, 54, 55, 58, 59, 60, 61, 63, 66, 68, 72, 73, 77, 78, 80, 82, 84, 87, 88, 90, 92, 93, 94, 98, 99, 100, 109, 1, 6, 8, 14, 16, 18, 21, 24, 26, 28, 38, 42, |

TABLE 3-continued

| Typical K, typical CRC polynomial | Interleaved sequence |
|---|---|
| | 45, 47, 53, 57, 62, 65, 67, 71, 76, 79, 81, 83, 86, 89, 91, 97, 110, 30, 31, 32, 35, 36, 37, 41, 50, 52, 74, 75, 95, 101, 5, 34, 49, 56, 69, 70, 85, 96, 105, 13, 64, 111, 4, 112, 33, 51, 117, 106, 107, 108, 116, 102, 103, 104, 113, 114, 115]; |
| 100, 0 × 32861 | [5, 6, 10, 11, 12, 13, 15, 18, 20, 21, 22, 24, 26, 32, 35, 36, 37, 38, 41, 42, 44, 45, 47, 50, 51, 54, 56, 57, 60, 63, 68, 72, 74, 78, 79, 81, 84, 86, 88, 89, 90, 91, 92, 93, 95, 96, 97, 98, 99, 100, 101, 4, 9, 14, 17, 19, 23, 25, 31, 34, 40, 43, 46, 49, 53, 55, 59, 62, 67, 71, 73, 77, 80, 83, 85, 87, 94, 102, 3, 8, 16, 30, 33, 39, 48, 52, 58, 61, 66, 70, 76, 82, 103, 2, 7, 29, 65, 69, 75, 104, 1, 28, 64, 105, 27, 106, 107, 108, 109, 110, 111, 112, 113, 114, 115, 116, 117]; or [1, 7, 8, 11, 12, 16, 17, 18, 19, 20, 22, 24, 26, 27, 30, 31, 33, 35, 38, 39, 40, 41, 44, 46, 47, 49, 50, 52, 54, 55, 56, 57, 58, 60, 67, 68, 69, 72, 73, 76, 78, 83, 85, 87, 89, 94, 106, 5, 6, 10, 13, 15, 21, 32, 36, 37, 42, 45, 51, 63, 74, 79, 81, 84, 86, 88, 90, 91, 92, 93, 95, 96, 97, 98, 99, 100, 101, 2, 14, 25, 29, 34, 43, 48, 61, 62, 66, 70, 77, 112, 23, 64, 75, 80, 82, 117, 4, 9, 53, 59, 71, 102, 28, 65, 113, 3, 103, 107, 104, 108, 109, 110, 114, 115, 116, 105, 111]; |
| 100, 0 × 37B89 | [3, 6, 7, 8, 11, 14, 17, 18, 19, 22, 29, 30, 31, 32, 36, 39, 40, 41, 44, 50, 51, 52, 54, 56, 57, 62, 63, 64, 66, 67, 68, 69, 73, 74, 76, 78, 80, 81, 82, 84, 85, 88, 94, 95, 96, 98, 101, 2, 5, 10, 13, 16, 21, 28, 35, 38, 43, 49, 53, 55, 61, 65, 72, 75, 77, 79, 83, 87, 93, 97, 100, 102, 1, 4, 9, 12, 15, 20, 27, 34, 37, 42, 48, 60, 71, 86, 92, 99, 103, 26, 33, 47, 59, 70, 91, 104, 25, 46, 58, 90, 105, 24, 45, 89, 106, 23, 107, 108, 109, 110, 111, 112, 113, 114, 115, 116, 117]; or [1, 2, 8, 12, 19, 23, 26, 27, 30, 33, 34, 38, 41, 45, 48, 49, 51, 55, 56, 58, 60, 62, 63, 67, 69, 70, 71, 76, 78, 82, 83, 85, 88, 89, 92, 93, 95, 99, 100, 113, 3, 6, 14, 17, 25, 31, 36, 37, 39, 47, 52, 59, 61, 64, 73, 74, 75, 77, 80, 87, 91, 96, 114, 7, 11, 18, 22, 29, 32, 40, 44, 50, 54, 57, 66, 68, 81, 84, 94, 98, 101, 5, 16, 42, 53, 86, 97, 109, 10, 13, 21, 28, 35, 43, 65, 72, 79, 102, 4, 9, 15, 20, 103, 24, 46, 90, 115, 117, 116, 104, 112, 105, 106, 110, 107, 111, 108]; |
| 100, 0 × 24001 | [14, 17, 28, 34, 42, 45, 48, 51, 56, 68, 70, 73, 82, 84, 85, 90, 96, 98, 101, 13, 16, 27, 33, 41, 44, 47, 50, 55, 67, 69, 72, 81, 83, 89, 95, 97, 100, 102, 12, 15, 26, 32, 40, 43, 46, 49, 54, 66, 71, 80, 88, 94, 99, 103, 11, 25, 31, 39, 53, 65, 79, 87, 93, 104, 10, 24, 30, 38, 52, 64, 78, 86, 92, 105, 9, 23, 29, 37, 63, 77, 91, 106, 8, 22, 36, 62, 76, 107, 7, 21, 35, 61, 75, 108, 6, 20, 60, 74, 109, 5, 19, 59, 110, 4, 18, 58, 111, 3, 57, 112, 2, 113, 1, 114, 115, 116, 117]; or [14, 17, 28, 34, 42, 45, 48, 51, 56, 68, 70, 73, 82, 84, 85, 90, 96, 98, 101, 3, 20, 31, 37, 54, 59, 71, 76, 87, 88, 93, 99, 115, 13, 16, 27, 33, 41, 44, 47, 50, 55, 67, 69, 72, 81, 83, 89, 95, 97, 100, 102, 2, 19, 30, 36, 53, 58, 75, 86, 92, 116, 1, 15, 18, 29, 35, 43, 46, 49, 52, 57, 74, 91, 117, 12, 26, 32, 40, 66, 80, 94, 103, 11, 25, 39, 65, 79, 104, 10, 24, 38, 64, 78, 105, 9, 23, 63, 77, 106, 8, 22, 62, 107, 7, 21, 61, 108, 6, 60, 109, 5, 110, 4, 111, 112, 113, 114]; |
| 100, 0 × 374D1 | [4, 6, 7, 8, 10, 12, 13, 14, 15, 16, 17, 18, 19, 22, 23, 24, 26, 28, 32, 33, 34, 35, 37, 41, 43, 45, 46, 50, 51, 52, 54, 57, 64, 66, 71, 72, 75, 76, 79, 80, 81, 84, 85, 89, 90, 91, 92, 93, 95, 97, 98, 99, 100, 101, 3, 5, 9, 11, 21, 25, 27, 31, 36, 40, 42, 44, 49, 53, 56, 63, 65, 70, 74, 78, 83, 88, 94, 96, 102, 2, 20, 30, 39, 48, 55, 62, 69, 73, 77, 82, 87, 103, 1, 29, 38, 47, 61, 68, 86, 104, 60, 67, 105, 59, 106, 58, 107, 108, 109, 110, 111, 112, 113, 114, 115, 116, 117]; or [3, 5, 6, 9, 10, 11, 13, 14, 17, 19, 20, 21, 23, 24, 25, 29, 32, 35, 37, 39, 41, 43, 45, 46, 48, 50, 51, 52, 53, 56, 59, 61, 66, 70, 72, 78, 84, 87, 88, 89, 91, 97, 98, 100, 108, 2, 4, 8, 12, 16, 18, 22, 28, 31, 34, 36, 38, 40, 42, 44, 47, 49, 55, 58, 60, 65, 69, 71, 77, 83, 86, 90, 96, 99, 109, 1, 7, 15, 27, 30, 33, 54, 57, 64, 68, 76, 82, 85, 95, 110, 26, 62, 79, 80, 81, 93, 94, 107, 67, 92, 105, 63, 106, 73, 75, 115, 74, 116, 101, 102, 103, 104, 111, 112, 117, 114, 113]; |
| 100, 0 × 3B001 | [12, 13, 15, 16, 17, 24, 26, 30, 32, 34, 36, 37, 38, 40, 44, 47, 50, 51, 52, 61, 63, 64, 67, 69, 73, 74, 75, 76, 79, 80, 83, 86, 88, 89, 90, 94, 95, 96, 97, 101, 11, 14, 23, 25, 29, 31, 33, 35, 39, 43, 46, 49, 60, 62, 66, 68, 72, 78, 82, 85, 87, 93, 100, 102, 10, 22, 28, 42, 45, 48, 59, 65, 71, 77, 81, 84, 92, 99, 103, 9, 21, 27, 41, 58, 70, 91, 98, 104, 8, 20, 57, 105, 7, 19, 56, 106, 6, 18, 55, 107, 5, 54, 108, 4, 53, 109, 3, 110, 2, 111, 1, 112, 113, 114, 115, 116, 117]; or [12, 13, 15, 16, 17, 24, 26, 30, 32, 34, 36, 37, 38, 40, 44, 47, 50, 51, 52, 61, 63, 64, 67, 69, 73, 74, 75, 76, 79, 80, 83, 86, 88, 89, 90, 94, 95, 96, 97, 101, 11, 14, 23, 25, 29, 31, 33, 35, 39, 43, 46, 49, 60, 62, 66, 68, 72, 78, 82, 85, 87, 93, 100, 102, 1, 18, 27, 41, 45, 48, 53, 65, 70, 77, 81, 84, 91, 98, 117, 10, 22, 28, 42, 59, 71, 92, 99, 103, 9, 21, 58, 104, 8, 20, 57, 105, 7, 19, 56, 106, 6, 55, 107, 5, 54, 108, 4, 109, 3, 110, 2, 116, 111, 113, 112, 114, 115]; |
| 100, 0 × 3CADD | [2, 3, 6, 21, 22, 26, 27, 28, 29, 42, 45, 47, 49, 50, 52, 63, 64, 65, 66, 67, 69, 74, 75, 84, 86, 87, 88, 91, 92, 95, 98, 101, 1, 5, 20, 25, 41, |

TABLE 3-continued

| Typical K, typical CRC polynomial | Interleaved sequence |
|---|---|
| | 44, 46, 48, 51, 62, 68, 73, 83, 85, 90, 94, 97, 102, 4, 19, 24, 40, 43, 61, 72, 82, 89, 93, 96, 103, 18, 23, 39, 60, 71, 81, 104, 17, 38, 59, 70, 80, 105, 16, 37, 58, 79, 100, 106, 15, 36, 57, 78, 99, 107, 14, 35, 56, 77, 108, 13, 34, 55, 76, 109, 12, 33, 54, 110, 11, 32, 53, 111, 10, 31, 112, 9, 30, 113, 8, 114, 7, 115, 116, 117]; or [2, 3, 6, 21, 22, 26, 27, 28, 29, 42, 45, 47, 49, 50, 52, 63, 64, 65, 66, 67, 69, 74, 75, 84, 86, 87, 88, 91, 92, 95, 98, 101, 1, 5, 20, 25, 41, 44, 46, 48, 51, 62, 68, 73, 83, 85, 90, 94, 97, 102, 4, 7, 23, 30, 43, 53, 70, 76, 89, 93, 96, 99, 117, 10, 11, 12, 24, 31, 33, 35, 55, 57, 58, 71, 72, 77, 81, 100, 112, 9, 32, 34, 54, 56, 80, 113, 8, 79, 114, 116, 18, 19, 39, 60, 61, 104, 13, 14, 37, 59, 110, 36, 78, 82, 111, 40, 103, 115, 15, 16, 108, 38, 109, 17, 105, 106, 107]; |
| 100, 0 × 2E49D | [2, 3, 9, 11, 15, 16, 21, 23, 24, 26, 28, 29, 30, 31, 35, 40, 43, 45, 46, 49, 51, 52, 53, 54, 55, 57, 58, 61, 62, 66, 68, 69, 70, 72, 75, 76, 77, 79, 82, 85, 86, 88, 89, 90, 93, 94, 98, 100, 101, 1, 8, 10, 14, 20, 22, 25, 27, 34, 39, 42, 44, 48, 50, 56, 60, 65, 67, 71, 74, 78, 81, 84, 87, 92, 97, 99, 102, 7, 13, 19, 33, 38, 41, 47, 59, 64, 73, 80, 83, 91, 96, 103, 6, 12, 18, 32, 37, 63, 95, 104, 5, 17, 36, 105, 4, 106, 107, 108, 109, 110, 111, 112, 113, 114, 115, 116, 117]; or [3, 5, 8, 10, 12, 13, 16, 17, 22, 24, 26, 27, 28, 29, 33, 34, 35, 36, 38, 40, 45, 46, 49, 50, 52, 54, 57, 59, 66, 79, 80, 83, 84, 85, 86, 88, 89, 91, 97, 98, 99, 100, 105, 2, 4, 7, 9, 11, 15, 21, 23, 25, 32, 37, 39, 44, 48, 51, 53, 56, 58, 65, 78, 82, 87, 90, 96, 106, 1, 6, 14, 20, 31, 43, 47, 55, 64, 77, 81, 95, 107, 19, 42, 61, 62, 63, 68, 69, 70, 72, 75, 93, 108, 18, 60, 71, 73, 76, 92, 94, 104, 41, 67, 74, 109, 30, 101, 102, 110, 116, 117, 111, 112, 113, 103, 115, 114]; |
| 100, 0 × 3685B | [1, 2, 7, 10, 11, 15, 17, 18, 19, 20, 22, 24, 27, 31, 33, 34, 37, 38, 39, 40, 41, 48, 49, 50, 52, 55, 56, 57, 59, 63, 64, 65, 68, 73, 77, 78, 79, 81, 82, 83, 84, 85, 91, 93, 96, 99, 101, 6, 9, 14, 16, 21, 23, 26, 30, 32, 36, 47, 51, 54, 58, 62, 67, 72, 76, 80, 90, 92, 95, 98, 102, 5, 8, 13, 25, 29, 35, 46, 53, 61, 66, 71, 75, 89, 94, 97, 103, 4, 12, 28, 45, 60, 70, 74, 88, 100, 104, 3, 44, 69, 87, 105, 43, 86, 106, 42, 107, 108, 109, 110, 111, 112, 113, 114, 115, 116, 117]; or [1, 2, 7, 10, 11, 15, 17, 18, 19, 20, 22, 24, 27, 31, 33, 34, 37, 38, 39, 40, 41, 48, 49, 50, 52, 55, 56, 57, 59, 63, 64, 65, 68, 73, 77, 78, 79, 81, 82, 83, 84, 85, 91, 93, 96, 99, 101, 5, 9, 12, 14, 23, 25, 26, 29, 30, 35, 44, 53, 54, 60, 61, 62, 70, 71, 75, 76, 88, 94, 95, 98, 115, 6, 16, 21, 32, 36, 47, 51, 58, 67, 72, 80, 90, 92, 102, 8, 13, 46, 66, 89, 97, 103, 4, 28, 45, 74, 100, 104, 43, 69, 87, 116, 3, 42, 86, 117, 107, 108, 114, 105, 106, 109, 110, 112, 113, 111]; |
| 100, 0 × 35FB1 | [4, 5, 7, 9, 11, 13, 14, 17, 19, 22, 24, 25, 26, 27, 28, 31, 32, 33, 35, 36, 38, 39, 41, 43, 44, 45, 47, 50, 57, 60, 61, 62, 63, 65, 67, 69, 70, 75, 76, 77, 78, 79, 80, 82, 84, 89, 90, 94, 96, 97, 98, 101, 3, 6, 8, 10, 12, 16, 18, 21, 23, 30, 34, 37, 40, 42, 46, 49, 56, 59, 64, 66, 68, 74, 81, 83, 88, 93, 95, 102, 2, 15, 20, 29, 48, 55, 58, 73, 87, 92, 103, 1, 54, 72, 86, 91, 104, 53, 71, 85, 105, 52, 100, 106, 51, 99, 107, 108, 109, 110, 111, 112, 113, 114, 115, 116, 117]; or [1, 2, 4, 5, 6, 13, 18, 20, 21, 23, 30, 31, 35, 38, 43, 45, 46, 47, 48, 49, 53, 56, 57, 58, 59, 63, 66, 68, 75, 76, 77, 79, 80, 85, 87, 89, 91, 92, 93, 94, 96, 98, 100, 111, 3, 7, 8, 11, 16, 17, 19, 22, 26, 27, 28, 29, 32, 33, 41, 62, 64, 67, 71, 73, 81, 82, 83, 84, 86, 88, 97, 108, 10, 37, 50, 52, 55, 60, 72, 90, 95, 106, 9, 15, 25, 36, 40, 51, 54, 61, 65, 70, 74, 78, 99, 107, 14, 24, 39, 44, 69, 101, 12, 34, 42, 102, 103, 104, 113, 114, 117, 105, 110, 112, 115, 116, 109]; |
| 100, 0 × 3B15D | [2, 3, 6, 7, 8, 9, 13, 14, 16, 17, 18, 19, 20, 21, 23, 24, 25, 26, 34, 37, 38, 41, 43, 45, 46, 63, 65, 66, 69, 70, 71, 72, 76, 77, 79, 80, 81, 82, 83, 84, 86, 87, 88, 89, 97, 100, 101, 1, 5, 12, 15, 22, 33, 36, 40, 42, 44, 62, 64, 68, 75, 78, 85, 96, 99, 102, 4, 11, 32, 35, 39, 61, 67, 74, 95, 98, 103, 10, 31, 60, 73, 94, 104, 30, 59, 93, 105, 29, 58, 92, 106, 28, 57, 91, 107, 27, 56, 90, 108, 55, 109, 54, 110, 53, 111, 52, 112, 51, 113, 50, 114, 49, 115, 48, 116, 47, 117]; or [1, 2, 3, 5, 7, 11, 14, 16, 17, 23, 24, 28, 35, 36, 38, 40, 42, 43, 44, 45, 46, 48, 64, 65, 66, 68, 70, 74, 77, 79, 80, 86, 87, 91, 98, 99, 116, 4, 6, 9, 10, 12, 13, 18, 20, 26, 31, 33, 41, 60, 67, 69, 72, 73, 75, 76, 81, 83, 89, 94, 96, 104, 8, 15, 21, 22, 27, 30, 37, 39, 50, 71, 78, 84, 85, 90, 93, 100, 114, 19, 29, 49, 82, 92, 115, 25, 32, 55, 88, 95, 109, 34, 63, 97, 101, 61, 103, 54, 110, 51, 113, 47, 117, 62, 102, 59, 105, 53, 111, 52, 112, 58, 106, 57, 107, 56, 108]; |
| 100, 0 × 67A71 | [4, 5, 6, 8, 9, 10, 11, 12, 14, 15, 16, 17, 18, 20, 22, 23, 24, 28, 29, 30, 31, 33, 40, 41, 43, 45, 46, 47, 48, 51, 54, 61, 62, 64, 65, 67, 69, 70, 72, 73, 74, 75, 80, 82, 83, 85, 86, 87, 88, 89, 91, 92, 95, 97, 101, 3, 7, 13, 19, 21, 27, 32, 39, 42, 44, 50, 53, 60, 63, 66, 68, 71, 79, 81, 84, 90, 94, 96, 100, 102, 2, 26, 38, 49, 52, 59, 78, 93, 99, 103, 1, 25, 37, 58, 77, 98, 104, 36, 57, 76, 105, 35, 56, 106, 34, 55, 107, 108, 109, 110, 111, 112, 113, 114, 115, 116, 117, 118]; or [2, 3, 4, 5, 6, 10, 11, 17, 18, 25, 26, 28, 32, 33, 34, 35, 36, 37, 38, 40, 41, 45, 49, |

TABLE 3-continued

| Typical K, typical CRC polynomial | Interleaved sequence |
|---|---|
| | 50, 52, 53, 54, 55, 58, 60, 62, 66, 67, 71, 77, 78, 79, 82, 83, 84, 85, 87, 90, 94, 99, 110, 1, 9, 16, 24, 27, 31, 39, 44, 48, 51, 57, 59, 61, 65, 70, 76, 81, 86, 89, 93, 98, 111, 7, 8, 13, 15, 19, 21, 30, 42, 56, 63, 72, 74, 80, 92, 95, 96, 97, 100, 114, 22, 23, 43, 46, 47, 64, 69, 75, 88, 115, 68, 73, 116, 14, 20, 29, 91, 117, 106, 12, 112, 101, 102, 118, 103, 104, 105, 113, 107, 108, 109]; |
| 100, 0 × 72001 | [13, 16, 17, 18, 26, 32, 34, 36, 39, 42, 43, 44, 45, 47, 48, 51, 52, 53, 54, 64, 65, 69, 70, 72, 77, 78, 80, 82, 89, 91, 95, 97, 99, 100, 101, 12, 15, 25, 31, 33, 35, 38, 41, 46, 50, 63, 68, 71, 76, 79, 81, 88, 90, 94, 96, 98, 102, 11, 14, 24, 30, 37, 40, 49, 62, 67, 75, 87, 93, 103, 10, 23, 29, 61, 66, 74, 86, 92, 104, 9, 22, 28, 60, 73, 85, 105, 8, 21, 27, 59, 84, 106, 7, 20, 58, 83, 107, 6, 19, 57, 108, 5, 56, 109, 4, 55, 110, 3, 111, 2, 112, 1, 113, 114, 115, 116, 117, 118]; or [13, 16, 17, 18, 26, 32, 34, 36, 39, 42, 43, 44, 45, 47, 48, 51, 52, 53, 54, 64, 65, 69, 70, 72, 77, 78, 80, 82, 89, 91, 95, 97, 99, 100, 101, 12, 15, 25, 31, 33, 35, 38, 41, 46, 50, 63, 68, 71, 76, 79, 81, 88, 90, 94, 96, 98, 102, 1, 14, 19, 27, 37, 40, 49, 55, 66, 73, 83, 92, 118, 11, 24, 30, 62, 67, 75, 87, 93, 103, 10, 23, 29, 61, 74, 86, 104, 9, 22, 28, 60, 85, 105, 8, 21, 59, 84, 106, 7, 20, 58, 107, 6, 57, 108, 5, 56, 109, 4, 110, 3, 111, 2, 112, 113, 114, 117, 115, 116]; |
| 100, 0 × 5F471 | [4, 5, 6, 8, 12, 14, 17, 18, 20, 27, 28, 30, 31, 33, 37, 38, 40, 42, 43, 44, 45, 47, 50, 51, 52, 53, 54, 55, 59, 60, 61, 65, 66, 68, 72, 73, 77, 80, 85, 87, 89, 92, 97, 98, 99, 101, 3, 7, 11, 13, 16, 19, 26, 29, 32, 36, 39, 41, 46, 49, 58, 64, 67, 71, 76, 79, 84, 86, 88, 91, 96, 102, 2, 10, 15, 25, 35, 48, 57, 63, 70, 75, 78, 83, 90, 95, 100, 103, 1, 9, 24, 34, 56, 62, 69, 74, 82, 94, 104, 23, 81, 93, 105, 22, 106, 21, 107, 108, 109, 110, 111, 112, 113, 114, 115, 116, 117, 118]; or [1, 2, 3, 7, 9, 14, 16, 18, 19, 25, 28, 32, 33, 43, 46, 47, 48, 51, 52, 53, 54, 57, 59, 62, 65, 76, 77, 79, 80, 81, 83, 85, 86, 87, 89, 90, 91, 93, 95, 97, 98, 100, 114, 4, 5, 6, 8, 12, 17, 20, 27, 30, 31, 37, 38, 40, 42, 44, 45, 50, 55, 60, 61, 66, 68, 72, 73, 92, 99, 101, 11, 13, 26, 29, 36, 39, 41, 49, 58, 64, 67, 71, 84, 88, 96, 102, 10, 22, 35, 56, 63, 70, 74, 75, 82, 94, 117, 15, 78, 103, 24, 34, 69, 104, 115, 21, 118, 23, 106, 113, 116, 111, 112, 105, 107, 108, 109, 110]; |
| 100, 0 × 7E42D | [2, 3, 4, 5, 7, 10, 12, 13, 14, 16, 17, 18, 19, 21, 24, 25, 27, 29, 30, 31, 38, 40, 41, 42, 43, 45, 46, 47, 49, 50, 52, 54, 55, 56, 58, 62, 67, 68, 69, 72, 75, 78, 81, 83, 86, 88, 89, 90, 93, 94, 97, 101, 1, 6, 9, 11, 15, 20, 23, 26, 28, 37, 39, 44, 48, 51, 53, 57, 61, 66, 71, 74, 77, 80, 82, 85, 87, 92, 96, 100, 102, 8, 22, 36, 60, 65, 70, 73, 76, 79, 84, 91, 95, 99, 103, 35, 59, 64, 98, 104, 34, 63, 105, 33, 106, 32, 107, 108, 109, 110, 111, 112, 113, 114, 115, 116, 117, 118]; or [2, 4, 5, 6, 13, 16, 18, 19, 20, 22, 23, 24, 25, 31, 35, 40, 42, 46, 48, 49, 50, 55, 56, 57, 58, 59, 61, 62, 64, 65, 71, 74, 77, 81, 82, 91, 92, 96, 97, 98, 100, 104, 1, 3, 12, 15, 17, 21, 30, 34, 39, 41, 45, 47, 54, 60, 63, 70, 73, 76, 80, 90, 95, 99, 105, 8, 10, 26, 27, 28, 29, 36, 37, 44, 53, 67, 68, 69, 72, 86, 89, 111, 9, 14, 33, 52, 66, 75, 78, 93, 94, 114, 7, 11, 43, 79, 83, 88, 106, 32, 51, 85, 87, 107, 38, 112, 84, 113, 108, 109, 110, 103, 101, 102, 118, 116, 117, 115]; |
| 100, 0 × 75761 | [5, 6, 8, 9, 14, 15, 16, 19, 22, 23, 25, 28, 29, 32, 34, 36, 39, 40, 41, 42, 43, 44, 45, 46, 48, 51, 52, 53, 54, 55, 56, 59, 60, 64, 65, 66, 69, 70, 73, 75, 76, 83, 86, 88, 89, 95, 97, 98, 101, 4, 7, 13, 18, 21, 24, 27, 31, 33, 35, 38, 47, 50, 58, 63, 68, 72, 74, 82, 85, 87, 94, 96, 100, 102, 3, 12, 17, 20, 26, 30, 37, 49, 57, 62, 67, 71, 81, 84, 93, 99, 103, 2, 11, 61, 80, 92, 104, 1, 10, 79, 91, 105, 78, 90, 106, 77, 107, 108, 109, 110, 111, 112, 113, 114, 115, 116, 117, 118]; or [2, 4, 5, 6, 7, 8, 9, 10, 11, 15, 16, 17, 20, 21, 22, 23, 26, 27, 32, 34, 35, 37, 38, 39, 44, 49, 56, 59, 60, 61, 63, 67, 70, 71, 73, 75, 76, 82, 85, 87, 89, 95, 97, 113, 1, 3, 14, 19, 25, 31, 33, 36, 43, 48, 55, 58, 62, 66, 69, 72, 74, 81, 84, 86, 88, 94, 96, 114, 13, 28, 42, 47, 51, 53, 64, 65, 68, 77, 91, 98, 99, 110, 29, 40, 41, 45, 46, 52, 54, 83, 101, 12, 30, 50, 57, 90, 100, 111, 18, 112, 78, 117, 24, 102, 80, 92, 107, 79, 93, 108, 109, 118, 103, 104, 105, 106, 115, 116]; |
| 100, 0 × 5ADF5 | [2, 5, 7, 9, 10, 13, 14, 15, 16, 20, 24, 28, 30, 31, 32, 34, 35, 37, 39, 40, 41, 42, 43, 44, 45, 46, 50, 51, 52, 54, 56, 58, 59, 62, 64, 65, 66, 67, 69, 70, 71, 72, 73, 74, 75, 77, 79, 81, 82, 83, 86, 87, 88, 90, 92, 93, 95, 97, 98, 100, 101, 1, 4, 6, 8, 12, 19, 23, 27, 29, 33, 36, 38, 49, 53, 55, 57, 61, 63, 68, 76, 78, 80, 85, 89, 91, 94, 96, 99, 102, 3, 11, 18, 22, 26, 48, 60, 84, 103, 17, 21, 25, 47, 104, 105, 106, 107, 108, 109, 110, 111, 112, 113, 114, 115, 116, 117, 118]; or [2, 3, 8, 9, 10, 11, 12, 15, 16, 18, 20, 22, 24, 26, 29, 31, 33, 34, 38, 45, 46, 48, 49, 51, 57, 58, 59, 60, 63, 66, 68, 74, 80, 82, 83, 84, 85, 87, 91, 92, 96, 97, 99, 103, 1, 7, 14, 17, 19, 21, 23, 25, 28, 30, 32, 37, 44, 47, 50, 56, 62, 65, 67, 73, 79, 81, 86, 90, 95, 98, 104, 5, 6, 13, 27, 36, 41, 52, 54, 61, 69, 71, 77, 88, 94, 100, 116, 35, 40, 53, 55, 64, 70, 72, 75, 78, 111, 39, 43, 89, 93, 107, 4, 42, 76, 106, 109, 110, 112, 105, 113, 114, 115, 108, 101, 117, 118, 102]; |

TABLE 3-continued

| Typical K, typical CRC polynomial | Interleaved sequence |
|---|---|
| 100, 0 × 649DD | [2, 3, 6, 8, 9, 12, 13, 14, 18, 22, 23, 25, 28, 29, 30, 34, 35, 36, 37, 41, 42, 44, 45, 46, 49, 51, 52, 53, 54, 55, 59, 61, 63, 64, 65, 67, 68, 69, 70, 75, 76, 77, 82, 83, 84, 85, 88, 90, 91, 92, 94, 95, 97, 99, 100, 101, 1, 5, 7, 11, 17, 21, 24, 27, 33, 40, 43, 48, 50, 58, 60, 62, 66, 74, 81, 87, 89, 93, 96, 98, 102, 4, 10, 16, 20, 26, 32, 39, 47, 57, 73, 80, 86, 103, 15, 19, 31, 38, 56, 72, 79, 104, 71, 78, 105, 106, 107, 108, 109, 110, 111, 112, 113, 114, 115, 116, 117, 118]; or [1, 7, 10, 14, 15, 17, 18, 19, 20, 21, 22, 23, 24, 26, 30, 31, 32, 34, 37, 38, 39, 40, 41, 51, 52, 55, 56, 59, 64, 67, 70, 72, 73, 77, 79, 80, 82, 91, 93, 94, 95, 100, 104, 3, 5, 8, 9, 11, 13, 33, 45, 48, 50, 53, 54, 58, 65, 69, 71, 78, 81, 84, 85, 86, 87, 92, 96, 97, 98, 99, 112, 2, 4, 6, 12, 16, 25, 29, 44, 47, 49, 57, 63, 68, 76, 83, 90, 113, 28, 36, 43, 46, 62, 75, 89, 114, 27, 66, 74, 115, 61, 88, 116, 35, 42, 60, 117, 108, 105, 106, 101, 109, 118, 102, 103, 110, 111, 107]; |
| 100, 0 × 6F159 | [3, 4, 9, 10, 11, 12, 13, 14, 15, 16, 17, 18, 19, 20, 21, 22, 23, 26, 27, 29, 30, 33, 36, 38, 40, 42, 44, 46, 51, 53, 54, 59, 60, 61, 62, 65, 66, 69, 70, 72, 75, 76, 77, 78, 81, 82, 84, 85, 90, 94, 96, 98, 99, 101, 2, 8, 25, 28, 32, 35, 37, 39, 41, 43, 45, 50, 52, 58, 64, 68, 71, 74, 80, 83, 89, 93, 95, 97, 102, 1, 7, 24, 31, 34, 49, 57, 63, 67, 73, 79, 88, 92, 100, 103, 6, 48, 56, 87, 91, 104, 5, 47, 55, 86, 105, 106, 107, 108, 109, 110, 111, 112, 113, 114, 115, 116, 117, 118]; or [1, 3, 4, 6, 7, 8, 21, 22, 24, 29, 35, 36, 37, 38, 39, 40, 41, 42, 43, 44, 46, 48, 50, 53, 54, 56, 57, 58, 60, 61, 63, 65, 67, 70, 73, 74, 76, 77, 79, 84, 85, 87, 90, 91, 93, 94, 95, 98, 100, 104, 2, 5, 11, 26, 28, 30, 31, 33, 45, 47, 49, 55, 69, 71, 75, 81, 83, 86, 88, 92, 96, 97, 99, 116, 10, 25, 27, 32, 34, 52, 64, 66, 68, 72, 80, 82, 117, 9, 12, 13, 14, 15, 18, 51, 62, 89, 109, 17, 59, 110, 16, 78, 111, 112, 114, 19, 20, 23, 101, 102, 103, 107, 118, 108, 115, 105, 106, 113]; |
| 100, 0 × 67785 | [2, 4, 6, 7, 9, 11, 12, 15, 16, 17, 19, 20, 22, 23, 25, 26, 33, 38, 39, 40, 41, 42, 46, 48, 51, 53, 56, 57, 59, 60, 62, 64, 65, 67, 69, 70, 73, 74, 75, 78, 79, 80, 86, 88, 89, 91, 92, 93, 94, 98, 101, 1, 3, 5, 8, 10, 14, 18, 21, 24, 32, 37, 45, 47, 50, 52, 55, 58, 61, 63, 66, 68, 72, 77, 85, 87, 90, 97, 102, 13, 31, 36, 44, 49, 54, 71, 76, 84, 96, 100, 103, 30, 35, 43, 83, 95, 99, 104, 29, 34, 82, 105, 28, 81, 106, 27, 107, 108, 109, 110, 111, 112, 113, 114, 115, 116, 117, 118]; or [1, 2, 4, 5, 8, 12, 13, 14, 15, 21, 22, 23, 25, 28, 31, 32, 33, 36, 37, 38, 40, 41, 42, 43, 44, 46, 49, 50, 54, 56, 57, 58, 60, 62, 63, 66, 71, 72, 73, 78, 80, 82, 83, 85, 86, 92, 94, 95, 96, 108, 3, 6, 9, 16, 18, 19, 20, 24, 27, 29, 34, 39, 51, 53, 55, 61, 67, 74, 76, 77, 79, 81, 87, 89, 91, 93, 114, 7, 11, 17, 26, 48, 59, 64, 65, 69, 70, 75, 88, 98, 101, 10, 45, 47, 52, 68, 90, 97, 102, 99, 118, 84, 100, 103, 30, 35, 113, 104, 105, 106, 107, 115, 109, 116, 117, 111, 112, 110]; |
| 100, 0 × 46001 | [13, 14, 18, 26, 28, 36, 39, 40, 41, 42, 44, 46, 49, 50, 52, 54, 56, 65, 66, 69, 72, 74, 78, 80, 82, 84, 85, 86, 88, 90, 91, 93, 94, 95, 97, 98, 101, 12, 17, 25, 27, 35, 38, 43, 45, 48, 51, 53, 55, 64, 68, 71, 73, 77, 79, 81, 83, 87, 89, 92, 96, 100, 102, 11, 16, 24, 34, 37, 47, 63, 67, 70, 76, 99, 103, 10, 15, 23, 33, 62, 75, 104, 9, 22, 32, 61, 105, 8, 21, 31, 60, 106, 7, 20, 30, 59, 107, 6, 19, 29, 58, 108, 5, 57, 109, 4, 110, 3, 111, 2, 112, 1, 113, 114, 115, 116, 117, 118]; or [4, 17, 18, 22, 30, 32, 40, 43, 44, 45, 46, 48, 50, 53, 54, 56, 58, 60, 69, 70, 73, 76, 78, 82, 84, 86, 88, 89, 90, 92, 94, 95, 97, 98, 99, 115, 13, 14, 26, 28, 36, 39, 41, 42, 49, 52, 65, 66, 72, 74, 80, 85, 91, 93, 101, 1, 5, 15, 23, 27, 29, 31, 33, 37, 59, 61, 67, 71, 75, 77, 81, 100, 114, 3, 16, 21, 47, 55, 57, 68, 83, 87, 96, 116, 12, 25, 35, 38, 51, 64, 79, 102, 11, 24, 34, 63, 103, 10, 62, 104, 2, 20, 117, 19, 118, 9, 105, 8, 106, 7, 107, 6, 108, 109, 110, 111, 112, 113]; |
| 100, 0 × 72BE9 | [3, 5, 7, 8, 10, 12, 13, 16, 21, 22, 23, 24, 25, 26, 27, 32, 35, 36, 42, 46, 48, 52, 53, 54, 58, 61, 62, 64, 65, 67, 72, 75, 76, 77, 81, 82, 84, 85, 86, 91, 93, 96, 98, 101, 2, 4, 6, 9, 11, 15, 20, 31, 34, 41, 45, 47, 51, 57, 60, 63, 66, 71, 74, 80, 83, 90, 92, 95, 97, 100, 102, 1, 14, 19, 30, 33, 40, 44, 50, 56, 59, 70, 73, 79, 89, 94, 99, 103, 18, 29, 39, 43, 49, 55, 69, 78, 88, 104, 17, 28, 38, 68, 87, 105, 37, 106, 107, 108, 109, 110, 111, 112, 113, 114, 115, 116, 117, 118]; or [3, 5, 7, 8, 10, 12, 13, 16, 21, 22, 23, 24, 25, 26, 27, 32, 35, 36, 42, 46, 48, 52, 53, 54, 58, 61, 62, 64, 65, 67, 72, 75, 76, 77, 81, 82, 84, 85, 86, 91, 93, 96, 98, 101, 2, 4, 6, 9, 11, 15, 20, 31, 34, 41, 45, 47, 51, 57, 60, 63, 66, 71, 74, 80, 83, 90, 92, 95, 97, 100, 102, 1, 14, 19, 30, 33, 40, 44, 50, 56, 59, 70, 73, 79, 89, 94, 99, 103, 17, 28, 37, 43, 49, 55, 68, 78, 87, 118, 29, 38, 39, 69, 108, 18, 88, 112, 106, 107, 113, 104, 105, 117, 114, 115, 109, 110, 116, 111]; |
| 100, 0 × 5EF9D | [2, 3, 8, 12, 13, 14, 15, 16, 18, 19, 20, 21, 23, 24, 25, 26, 28, 31, 32, 33, 34, 38, 40, 41, 42, 43, 45, 46, 49, 50, 51, 53, 55, 56, 58, 59, 60, 66, 67, 68, 69, 70, 73, 74, 80, 82, 83, 86, 87, 88, 90, 92, 93, 95, 98, 100, 101, 1, 7, 11, 17, 22, 27, 30, 37, 39, 44, 48, 52, 54, 57, 65, 72, 79, 81, 85, 89, 91, 94, 97, 99, 102, 6, 10, 29, 36, 47, 64, 71, 78, 84, 96, 103, 5, 9, 35, 63, 77, 104, 4, 62, 76, 105, 61, 75, 106, 107, 108, |

TABLE 3-continued

| Typical K, typical CRC polynomial | Interleaved sequence |
|---|---|
| | 109, 110, 111, 112, 113, 114, 115, 116, 117, 118]; or [3, 4, 6, 7, 9, 11, 13, 15, 16, 17, 18, 20, 21, 22, 23, 30, 31, 32, 38, 39, 40, 42, 45, 51, 54, 55, 56, 58, 60, 62, 63, 65, 67, 68, 69, 71, 74, 76, 82, 88, 91, 95, 97, 100, 105, 1, 8, 10, 12, 19, 26, 27, 33, 35, 41, 43, 52, 53, 59, 61, 70, 77, 78, 80, 86, 87, 89, 90, 92, 96, 99, 111, 2, 5, 14, 29, 37, 44, 50, 57, 64, 66, 73, 75, 81, 94, 106, 28, 36, 49, 72, 93, 98, 107, 25, 34, 47, 84, 104, 24, 79, 110, 46, 48, 83, 85, 103, 109, 115, 116, 112, 113, 101, 102, 108, 117, 118, 114]; |
| 100, 0 × 4F779 | [3, 4, 5, 10, 12, 13, 15, 16, 17, 23, 26, 27, 28, 29, 31, 33, 34, 37, 46, 51, 52, 56, 59, 62, 64, 65, 68, 69, 70, 71, 72, 74, 77, 78, 87, 88, 89, 95, 96, 97, 98, 100, 101, 2, 9, 11, 14, 22, 25, 30, 32, 36, 45, 50, 55, 58, 61, 63, 67, 73, 76, 86, 94, 99, 102, 1, 8, 21, 24, 35, 44, 49, 54, 57, 60, 66, 75, 85, 93, 103, 7, 20, 43, 48, 53, 84, 92, 104, 6, 19, 42, 47, 83, 91, 105, 18, 41, 82, 90, 106, 40, 81, 107, 39, 80, 108, 38, 79, 109, 110, 111, 112, 113, 114, 115, 116, 117, 118]; or [3, 6, 7, 8, 13, 15, 16, 18, 19, 20, 26, 29, 30, 31, 32, 34, 36, 37, 40, 49, 54, 55, 59, 62, 65, 67, 68, 71, 72, 73, 74, 75, 77, 80, 81, 90, 91, 92, 98, 99, 100, 116, 4, 5, 10, 12, 17, 23, 27, 28, 33, 46, 51, 52, 56, 64, 69, 70, 78, 87, 88, 89, 95, 96, 97, 101, 2, 14, 25, 35, 39, 48, 53, 58, 61, 66, 76, 79, 117, 1, 11, 24, 38, 47, 57, 60, 63, 118, 9, 22, 45, 50, 86, 94, 102, 21, 44, 85, 93, 103, 43, 84, 104, 41, 82, 115, 42, 83, 114, 105, 106, 107, 108, 109, 113, 110, 111, 112]; |
| 100, 0 × 658D3 | [1, 2, 3, 5, 6, 9, 10, 11, 12, 13, 14, 15, 17, 18, 19, 20, 21, 23, 27, 30, 31, 34, 36, 38, 39, 43, 45, 46, 50, 53, 58, 59, 62, 65, 66, 67, 68, 74, 75, 76, 78, 80, 82, 86, 88, 90, 91, 92, 93, 95, 96, 99, 101, 4, 8, 16, 22, 26, 29, 33, 35, 37, 42, 44, 49, 52, 57, 61, 64, 73, 77, 79, 81, 85, 87, 89, 94, 98, 102, 7, 25, 28, 32, 41, 48, 51, 56, 60, 63, 72, 84, 97, 100, 103, 24, 40, 47, 55, 71, 83, 104, 54, 70, 105, 69, 106, 107, 108, 109, 110, 111, 112, 113, 114, 115, 116, 117, 118]; or [2, 6, 9, 10, 11, 14, 15, 17, 21, 24, 26, 27, 28, 32, 33, 38, 40, 41, 45, 47, 49, 53, 54, 56, 61, 62, 66, 67, 68, 70, 73, 77, 79, 80, 83, 84, 85, 88, 92, 98, 105, 1, 5, 8, 13, 16, 20, 23, 25, 31, 37, 39, 44, 46, 48, 52, 55, 60, 65, 69, 72, 76, 78, 82, 87, 91, 97, 106, 4, 7, 12, 18, 22, 30, 34, 36, 43, 51, 57, 58, 63, 74, 86, 93, 94, 95, 96, 99, 108, 3, 50, 64, 71, 81, 107, 29, 35, 42, 100, 109, 59, 110, 19, 75, 90, 111, 89, 112, 115, 116, 102, 117, 101, 103, 104, 113, 118, 114]; |
| 100, 0 × 72AA7 | [1, 3, 4, 5, 6, 7, 9, 13, 15, 17, 18, 19, 22, 23, 26, 28, 30, 33, 36, 37, 40, 41, 42, 43, 46, 47, 49, 50, 52, 54, 55, 58, 62, 63, 64, 65, 66, 67, 69, 70, 74, 77, 78, 79, 80, 81, 82, 84, 91, 93, 98, 99, 101, 2, 8, 12, 14, 16, 21, 25, 27, 29, 32, 35, 39, 45, 48, 51, 53, 57, 61, 68, 73, 76, 83, 90, 92, 97, 102, 11, 20, 24, 31, 34, 38, 44, 56, 60, 72, 75, 89, 96, 100, 103, 10, 59, 71, 88, 95, 104, 87, 94, 105, 86, 106, 85, 107, 108, 109, 110, 111, 112, 113, 114, 115, 116, 117, 118]; or [2, 3, 4, 6, 7, 10, 12, 14, 15, 17, 18, 21, 22, 24, 25, 27, 29, 32, 33, 35, 36, 37, 48, 57, 58, 59, 62, 66, 67, 69, 70, 71, 76, 78, 80, 81, 82, 83, 84, 85, 86, 87, 89, 92, 97, 98, 99, 100, 110, 1, 5, 9, 11, 13, 16, 20, 23, 26, 28, 31, 34, 47, 56, 61, 65, 68, 75, 77, 79, 88, 91, 96, 111, 8, 19, 30, 39, 43, 45, 50, 51, 52, 53, 55, 73, 74, 90, 93, 102, 40, 41, 42, 49, 54, 60, 63, 95, 112, 72, 94, 117, 46, 64, 101, 44, 108, 109, 113, 38, 114, 118, 115, 116, 103, 104, 105, 106, 107]; |
| 100, 0 × 55BE9 | [3, 5, 7, 8, 10, 14, 16, 17, 18, 19, 20, 21, 23, 24, 25, 26, 28, 29, 33, 36, 37, 38, 43, 45, 63, 66, 68, 70, 71, 73, 77, 79, 80, 81, 82, 83, 84, 86, 87, 88, 89, 91, 92, 96, 99, 100, 101, 2, 4, 6, 9, 13, 15, 22, 27, 32, 35, 42, 44, 62, 65, 67, 69, 72, 76, 78, 85, 90, 95, 98, 102, 1, 12, 31, 34, 41, 61, 64, 75, 94, 97, 103, 11, 30, 40, 60, 74, 93, 104, 39, 59, 105, 58, 106, 57, 107, 56, 108, 55, 109, 54, 110, 53, 111, 52, 112, 51, 113, 50, 114, 49, 115, 48, 116, 47, 117, 46, 118]; or [2, 3, 6, 11, 17, 18, 22, 23, 24, 26, 28, 29, 32, 33, 35, 37, 38, 40, 44, 45, 54, 65, 66, 69, 74, 80, 81, 85, 86, 87, 89, 91, 92, 95, 96, 98, 100, 110, 1, 5, 10, 16, 21, 25, 27, 31, 34, 36, 39, 43, 53, 64, 68, 73, 79, 84, 88, 90, 94, 97, 99, 111, 4, 14, 19, 41, 42, 49, 67, 77, 82, 115, 9, 13, 15, 30, 48, 72, 76, 78, 93, 116, 7, 8, 12, 20, 55, 70, 71, 75, 83, 109, 51, 113, 56, 108, 50, 114, 60, 104, 59, 105, 57, 107, 47, 117, 63, 101, 46, 118, 62, 102, 61, 103, 52, 112, 58, 106]; |
| 100, 0 × F56FB | [1, 2, 5, 7, 9, 10, 11, 14, 17, 18, 19, 20, 21, 23, 25, 28, 30, 31, 32, 34, 35, 37, 38, 39, 40, 41, 43, 45, 47, 49, 54, 58, 60, 61, 65, 68, 69, 74, 76, 77, 80, 84, 85, 86, 88, 95, 96, 98, 99, 101, 4, 6, 8, 13, 16, 22, 24, 27, 29, 33, 36, 42, 44, 46, 48, 53, 57, 59, 64, 67, 73, 75, 79, 83, 87, 94, 97, 100, 102, 3, 12, 15, 26, 52, 56, 63, 66, 72, 78, 82, 93, 103, 51, 55, 62, 71, 81, 92, 104, 50, 70, 91, 105, 90, 106, 89, 107, 108, 109, 110, 111, 112, 113, 114, 115, 116, 117, 118, 119]; or [1, 2, 4, 9, 11, 12, 16, 19, 23, 24, 25, 32, 33, 35, 36, 38, 39, 41, 48, 49, 54, 55, 57, 58, 59, 61, 63, 66, 69, 75, 78, 79, 80, 81, 83, 84, 86, 91, 94, 95, 96, 110, 3, 5, 7, 8, 14, 15, 17, 20, 21, 22, 28, 30, 43, 45, 53, 56, 62, 76, 82, 88, 90, 93, 98, 99, 111, 6, 13, 18, 27, 29, 40, 42, 44, 47, 52, 60, 68, 77, 85, 87, 89, 92, 97, 112, 10, 26, 31, 34, 46, 51, 65, 67, |

TABLE 3-continued

| Typical K, typical CRC polynomial | Interleaved sequence |
|---|---|
| | 100, 113, 37, 50, 64, 114, 70, 108, 71, 107, 109, 72, 106, 74, 101, 73, 105, 119, 117, 104, 115, 116, 118, 102, 103]; |
| 100, 0 × FC809 | [3, 6, 9, 11, 12, 14, 16, 19, 20, 26, 30, 34, 35, 38, 39, 40, 41, 44, 45, 48, 50, 53, 55, 58, 59, 60, 66, 67, 69, 71, 73, 74, 75, 77, 79, 80, 85, 87, 91, 94, 95, 97, 101, 2, 5, 8, 10, 13, 15, 18, 25, 29, 33, 37, 43, 47, 49, 52, 54, 57, 65, 68, 70, 72, 76, 78, 84, 86, 90, 93, 96, 102, 1, 4, 7, 17, 24, 28, 32, 36, 42, 46, 51, 56, 64, 83, 89, 92, 100, 103, 23, 27, 31, 63, 82, 88, 99, 104, 22, 62, 81, 98, 105, 21, 61, 106, 107, 108, 109, 110, 111, 112, 113, 114, 115, 116, 117, 118, 119]; or [3, 6, 9, 11, 12, 14, 16, 19, 20, 26, 30, 34, 35, 38, 39, 40, 41, 44, 45, 48, 50, 53, 55, 58, 59, 60, 66, 67, 69, 71, 73, 74, 75, 77, 79, 80, 85, 87, 91, 94, 95, 97, 101, 2, 5, 8, 10, 13, 15, 18, 25, 29, 33, 37, 43, 47, 49, 52, 54, 57, 65, 68, 70, 72, 76, 78, 84, 86, 90, 93, 96, 102, 1, 4, 7, 17, 24, 28, 32, 36, 42, 46, 51, 56, 64, 83, 89, 92, 100, 103, 21, 27, 31, 61, 81, 88, 98, 119, 22, 23, 62, 99, 112, 63, 113, 82, 114, 116, 104, 105, 106, 115, 107, 108, 109, 110, 111, 117, 118]; |
| 100, 0 × AEC81 | [7, 10, 11, 13, 15, 17, 19, 20, 21, 22, 24, 25, 26, 28, 32, 38, 39, 40, 42, 44, 47, 48, 52, 55, 57, 59, 60, 63, 65, 69, 70, 71, 73, 74, 76, 77, 79, 80, 81, 84, 85, 86, 92, 93, 94, 95, 96, 97, 99, 101, 6, 9, 12, 14, 16, 18, 23, 27, 31, 37, 41, 43, 46, 51, 54, 56, 58, 62, 64, 68, 72, 75, 78, 83, 91, 98, 100, 102, 5, 8, 30, 36, 45, 50, 53, 61, 67, 82, 90, 103, 4, 29, 35, 49, 66, 89, 104, 3, 34, 88, 105, 2, 33, 87, 106, 1, 107, 108, 109, 110, 111, 112, 113, 114, 115, 116, 117, 118, 119]; or [1, 3, 4, 5, 7, 8, 9, 10, 13, 20, 22, 23, 24, 26, 30, 34, 35, 36, 40, 41, 48, 50, 53, 54, 56, 60, 61, 62, 64, 65, 68, 70, 71, 74, 75, 76, 78, 79, 80, 87, 90, 92, 93, 95, 96, 100, 111, 2, 6, 11, 12, 15, 17, 28, 29, 32, 33, 38, 42, 44, 49, 57, 67, 81, 84, 85, 89, 91, 97, 112, 14, 16, 19, 25, 27, 31, 37, 43, 47, 52, 63, 66, 77, 83, 88, 113, 18, 39, 46, 51, 82, 86, 99, 114, 69, 72, 94, 116, 21, 55, 73, 117, 59, 101, 98, 118, 58, 102, 45, 115, 119, 103, 104, 105, 106, 108, 109, 107, 110]; |
| 100, 0 × E645B | [1, 2, 7, 12, 13, 14, 16, 17, 18, 22, 23, 25, 26, 27, 28, 34, 36, 37, 40, 44, 49, 50, 51, 52, 55, 57, 58, 61, 62, 63, 64, 68, 71, 72, 73, 74, 75, 76, 77, 78, 83, 86, 91, 97, 98, 100, 101, 6, 11, 15, 21, 24, 33, 35, 39, 43, 48, 54, 56, 60, 67, 70, 82, 85, 90, 96, 99, 102, 5, 10, 20, 32, 38, 42, 47, 53, 59, 66, 69, 81, 84, 89, 95, 103, 4, 9, 19, 31, 41, 46, 65, 80, 88, 94, 104, 3, 8, 30, 45, 79, 87, 93, 105, 29, 92, 106, 107, 108, 109, 110, 111, 112, 113, 114, 115, 116, 117, 118, 119]; or [2, 6, 7, 11, 14, 15, 18, 21, 23, 24, 28, 33, 34, 35, 37, 39, 40, 43, 44, 48, 52, 54, 55, 56, 58, 60, 64, 67, 68, 70, 78, 82, 83, 85, 86, 90, 91, 96, 98, 99, 102, 1, 5, 10, 13, 17, 20, 22, 27, 32, 36, 38, 42, 47, 51, 53, 57, 59, 63, 66, 69, 77, 81, 84, 89, 95, 97, 103, 4, 8, 9, 16, 25, 26, 30, 41, 45, 46, 50, 62, 72, 80, 87, 88, 92, 93, 100, 118, 29, 31, 61, 71, 74, 75, 107, 12, 49, 73, 76, 101, 3, 65, 108, 19, 94, 109, 79, 119, 110, 111, 112, 113, 105, 106, 114, 115, 116, 117, 104]; |
| 100, 0 × 9C7D1 | [4, 6, 7, 9, 10, 14, 16, 17, 20, 25, 26, 28, 31, 32, 36, 38, 40, 42, 44, 47, 48, 50, 51, 52, 53, 55, 57, 59, 60, 61, 62, 63, 64, 67, 68, 70, 73, 74, 75, 76, 77, 78, 84, 85, 86, 89, 90, 91, 92, 93, 95, 96, 97, 98, 101, 3, 5, 8, 13, 15, 19, 24, 27, 30, 35, 37, 39, 41, 43, 46, 49, 54, 56, 58, 66, 69, 72, 83, 88, 94, 100, 102, 2, 12, 18, 23, 29, 34, 45, 65, 71, 82, 87, 99, 103, 1, 11, 22, 33, 81, 104, 21, 80, 105, 79, 106, 107, 108, 109, 110, 111, 112, 113, 114, 115, 116, 117, 118, 119]; or [4, 5, 6, 8, 13, 15, 24, 33, 37, 38, 43, 50, 53, 59, 61, 64, 65, 67, 69, 72, 73, 75, 80, 81, 83, 85, 86, 87, 88, 90, 92, 94, 96, 97, 98, 99, 100, 111, 3, 7, 12, 14, 23, 32, 36, 42, 49, 52, 58, 60, 63, 66, 68, 71, 74, 79, 82, 84, 89, 91, 93, 95, 112, 2, 11, 22, 31, 35, 41, 48, 51, 57, 62, 70, 78, 113, 1, 10, 21, 30, 34, 40, 47, 56, 77, 114, 9, 17, 20, 25, 26, 27, 46, 76, 105, 16, 19, 45, 55, 106, 28, 29, 44, 109, 18, 54, 107, 39, 116, 101, 115, 117, 102, 103, 104, 110, 118, 119, 108]; |
| 100, 0 × FE757 | [1, 3, 6, 7, 8, 9, 10, 11, 12, 17, 20, 22, 23, 24, 27, 31, 32, 33, 34, 35, 39, 41, 42, 44, 45, 46, 48, 49, 50, 51, 53, 54, 55, 57, 59, 60, 61, 62, 63, 64, 65, 67, 68, 71, 77, 78, 79, 80, 82, 83, 86, 87, 88, 91, 93, 94, 97, 98, 100, 101, 2, 5, 16, 19, 21, 26, 30, 38, 40, 43, 47, 52, 56, 58, 66, 70, 76, 81, 85, 90, 92, 96, 99, 102, 4, 15, 18, 25, 29, 37, 69, 75, 84, 89, 95, 103, 14, 28, 36, 74, 104, 13, 73, 105, 72, 106, 107, 108, 109, 110, 111, 112, 113, 114, 115, 116, 117, 118, 119]; or [1, 2, 10, 11, 12, 14, 16, 20, 24, 25, 26, 28, 32, 34, 35, 39, 41, 42, 43, 44, 53, 54, 55, 57, 58, 62, 68, 72, 73, 76, 77, 78, 81, 84, 86, 87, 89, 95, 98, 100, 110, 3, 5, 17, 19, 21, 27, 30, 38, 40, 46, 47, 51, 52, 56, 65, 66, 70, 71, 80, 83, 85, 88, 90, 91, 92, 94, 96, 99, 102, 4, 7, 18, 22, 23, 29, 37, 45, 48, 49, 59, 60, 67, 82, 93, 118, 6, 8, 13, 15, 50, 63, 64, 75, 79, 111, 31, 61, 74, 97, 112, 33, 36, 113, 9, 69, 105, 107, 108, 106, 109, 103, 104, 115, 117, 116, 114, 101, 119]; |
| 100, 0 × A2B79 | [3, 4, 5, 11, 13, 14, 17, 18, 22, 25, 27, 31, 34, 37, 38, 39, 41, 48, 51, 52, 55, 56, 60, 63, 66, 67, 69, 70, 71, 72, 73, 75, 87, 88, 90, 91, 93, 95, 96, 97, 100, 101, 2, 10, 12, 16, 21, 24, 26, 30, 33, 36, 40, 47, 50, 54, 59, 62, 65, 68, 74, 86, 89, 92, 94, 99, 102, 1, 9, 15, 20, 23, 29, |

TABLE 3-continued

| Typical K, typical CRC polynomial | Interleaved sequence |
|---|---|
| | 32, 35, 46, 49, 53, 58, 61, 64, 85, 98, 103, 8, 19, 28, 45, 57, 84, 104, 7, 44, 83, 105, 6, 43, 82, 106, 42, 81, 107, 80, 108, 79, 109, 78, 110, 77, 111, 76, 112, 113, 114, 115, 116, 117, 118, 119]; or [3, 4, 5, 11, 13, 14, 17, 18, 22, 25, 27, 31, 34, 37, 38, 39, 41, 48, 51, 52, 55, 56, 60, 63, 66, 67, 69, 70, 71, 72, 73, 75, 87, 88, 90, 91, 93, 95, 96, 97, 100, 101, 2, 10, 12, 16, 21, 24, 26, 30, 33, 36, 40, 47, 50, 54, 59, 62, 65, 68, 74, 86, 89, 92, 94, 99, 102, 1, 9, 15, 20, 23, 29, 32, 35, 46, 49, 53, 58, 61, 64, 85, 98, 103, 8, 19, 28, 45, 57, 84, 104, 7, 44, 83, 105, 6, 43, 77, 118, 42, 76, 119, 79, 80, 109, 81, 82, 107, 112, 113, 108, 78, 114, 115, 106, 116, 117, 110, 111]; |
| 100, 0 × E4001 | [14, 17, 18, 19, 28, 34, 36, 38, 42, 45, 46, 47, 48, 50, 51, 54, 57, 68, 70, 72, 73, 74, 75, 76, 82, 84, 85, 87, 89, 90, 91, 92, 93, 95, 96, 98, 100, 101, 13, 16, 27, 33, 35, 37, 41, 44, 49, 53, 56, 67, 69, 71, 81, 83, 86, 88, 94, 97, 99, 102, 12, 15, 26, 32, 40, 43, 52, 55, 66, 80, 103, 11, 25, 31, 39, 65, 79, 104, 10, 24, 30, 64, 78, 105, 9, 23, 29, 63, 77, 106, 8, 22, 62, 107, 7, 21, 61, 108, 6, 20, 60, 109, 5, 59, 110, 4, 58, 111, 3, 112, 2, 113, 1, 114, 115, 116, 117, 118, 119]; or [14, 17, 18, 19, 28, 34, 36, 38, 42, 45, 46, 47, 48, 50, 51, 54, 57, 68, 70, 72, 73, 74, 75, 76, 82, 84, 85, 87, 89, 90, 91, 92, 93, 95, 96, 98, 100, 101, 1, 15, 20, 29, 35, 37, 39, 43, 49, 52, 55, 58, 69, 71, 77, 83, 86, 88, 94, 97, 99, 119, 13, 16, 27, 33, 41, 44, 53, 56, 67, 81, 102, 12, 26, 32, 40, 66, 80, 103, 11, 25, 31, 65, 79, 104, 10, 24, 30, 64, 78, 105, 9, 23, 63, 106, 8, 22, 62, 107, 7, 21, 61, 108, 2, 59, 118, 6, 60, 109, 5, 110, 4, 111, 3, 112, 115, 116, 113, 114, 117]; |
| 100, 0 × 99AE9 | [3, 5, 7, 10, 14, 15, 17, 18, 19, 21, 26, 27, 28, 29, 32, 33, 35, 36, 37, 38, 39, 42, 45, 53, 54, 56, 58, 59, 60, 61, 62, 64, 65, 72, 73, 75, 76, 77, 78, 79, 82, 83, 84, 85, 91, 92, 94, 95, 100, 101, 2, 4, 6, 9, 13, 16, 20, 25, 31, 34, 41, 44, 52, 55, 57, 63, 71, 74, 81, 90, 93, 99, 102, 1, 8, 12, 24, 30, 40, 43, 51, 70, 80, 89, 98, 103, 11, 23, 50, 69, 88, 97, 104, 22, 49, 68, 87, 96, 105, 48, 67, 86, 106, 47, 66, 107, 46, 108, 109, 110, 111, 112, 113, 114, 115, 116, 117, 118, 119]; or [1, 6, 7, 8, 9, 14, 15, 16, 20, 21, 23, 25, 27, 28, 29, 31, 32, 34, 38, 41, 42, 49, 54, 55, 58, 59, 61, 64, 68, 69, 73, 74, 78, 81, 82, 84, 85, 87, 88, 89, 92, 93, 98, 99, 116, 2, 3, 4, 5, 10, 11, 12, 17, 19, 24, 30, 37, 45, 50, 51, 57, 60, 65, 70, 77, 80, 83, 94, 95, 97, 104, 18, 22, 26, 33, 36, 44, 53, 56, 63, 76, 79, 96, 100, 105, 39, 43, 48, 52, 67, 86, 91, 106, 35, 47, 66, 75, 90, 107, 13, 40, 46, 108, 72, 109, 62, 112, 101, 71, 113, 117, 118, 119, 102, 110, 114, 103, 111, 115]; |
| 100, 0 × F86F7 | [1, 3, 5, 6, 7, 10, 11, 14, 16, 19, 21, 23, 25, 26, 31, 33, 38, 42, 43, 44, 46, 47, 50, 53, 54, 55, 59, 61, 62, 66, 69, 71, 73, 75, 79, 81, 85, 86, 87, 88, 90, 91, 93, 94, 96, 98, 99, 100, 101, 2, 4, 9, 13, 15, 18, 20, 22, 24, 30, 32, 37, 41, 45, 49, 52, 58, 60, 65, 68, 70, 72, 74, 78, 80, 84, 89, 92, 95, 97, 102, 8, 12, 17, 29, 36, 40, 48, 51, 57, 64, 67, 77, 83, 103, 28, 35, 39, 56, 63, 76, 82, 104, 27, 34, 105, 106, 107, 108, 109, 110, 111, 112, 113, 114, 115, 116, 117, 118, 119]; or [5, 8, 9, 10, 11, 13, 14, 15, 16, 19, 28, 30, 31, 32, 35, 36, 37, 41, 42, 43, 44, 45, 46, 49, 50, 53, 55, 57, 59, 60, 61, 62, 65, 67, 68, 72, 73, 78, 80, 83, 85, 89, 92, 97, 98, 100, 111, 1, 2, 3, 4, 17, 20, 25, 34, 40, 48, 54, 63, 71, 75, 76, 79, 82, 86, 91, 94, 107, 6, 7, 21, 23, 24, 26, 27, 29, 38, 39, 56, 64, 69, 70, 74, 77, 84, 87, 88, 99, 108, 12, 18, 52, 58, 66, 96, 112, 33, 47, 81, 90, 93, 101, 22, 109, 51, 95, 113, 119, 114, 115, 106, 116, 117, 103, 104, 110, 105, 102, 118]; |
| 100, 0 × 94001 | [14, 16, 19, 28, 32, 38, 42, 44, 46, 47, 48, 51, 52, 54, 56, 57, 64, 70, 72, 75, 76, 78, 80, 83, 84, 88, 90, 94, 95, 96, 98, 100, 101, 13, 15, 18, 27, 31, 37, 41, 43, 45, 50, 53, 55, 63, 69, 71, 74, 77, 79, 82, 87, 89, 93, 97, 99, 102, 12, 17, 26, 30, 36, 40, 49, 62, 68, 73, 81, 86, 92, 103, 11, 25, 29, 35, 39, 61, 67, 85, 91, 104, 10, 24, 34, 60, 66, 105, 9, 23, 33, 59, 65, 106, 8, 22, 58, 107, 7, 21, 108, 6, 20, 109, 5, 110, 4, 111, 3, 112, 2, 113, 1, 114, 115, 116, 117, 118, 119]; or [3, 17, 19, 22, 31, 35, 41, 45, 47, 49, 50, 51, 54, 55, 57, 59, 60, 67, 73, 75, 78, 79, 81, 83, 86, 87, 91, 93, 97, 98, 99, 117, 14, 16, 28, 32, 38, 42, 44, 46, 48, 52, 56, 64, 70, 72, 76, 80, 84, 88, 90, 94, 95, 96, 100, 101, 13, 15, 18, 27, 37, 43, 53, 63, 69, 71, 74, 77, 82, 89, 102, 12, 26, 30, 36, 40, 62, 68, 92, 103, 2, 21, 34, 58, 66, 85, 118, 1, 20, 29, 33, 39, 65, 119, 11, 25, 61, 104, 10, 24, 105, 9, 23, 106, 8, 107, 7, 108, 6, 109, 5, 110, 4, 111, 112, 113, 114, 115, 116]; |
| 100, 0 × CF5C5 | [2, 4, 7, 10, 11, 13, 16, 17, 18, 20, 22, 27, 32, 33, 34, 37, 39, 40, 41, 43, 44, 46, 47, 48, 51, 52, 57, 60, 61, 63, 66, 67, 68, 69, 71, 72, 75, 77, 80, 81, 82, 86, 87, 91, 95, 98, 99, 100, 101, 1, 3, 6, 9, 12, 15, 19, 21, 26, 31, 36, 38, 42, 45, 50, 56, 59, 62, 65, 70, 74, 76, 79, 85, 90, 94, 97, 102, 5, 8, 14, 25, 30, 35, 49, 55, 58, 64, 73, 78, 84, 89, 93, 96, 103, 24, 29, 54, 83, 88, 92, 104, 23, 28, 53, 105, 106, 107, 108, 109, 110, 111, 112, 113, 114, 115, 116, 117, 118, 119]; or [2, 3, 9, 12, 13, 16, 17, 18, 24, 26, 28, 32, 34, 35, 37, 42, 44, 47, 48, 49, 53, 54, 60, 66, 67, 68, 71, 73, 79, 83, 86, 87, 91, 92, 93, 95, 97, 98, 100, 111, 1, 8, 11, 15, 23, 25, 27, 31, 33, 36, 41, 43, 46, 52, 59, 65, 70, |

TABLE 3-continued

| Typical K, typical CRC polynomial | Interleaved sequence |
|---|---|
| | 72, 78, 82, 85, 90, 94, 96, 99, 112, 5, 6, 14, 22, 29, 30, 45, 51, 55, 56, 63, 74, 75, 77, 81, 84, 109, 4, 10, 21, 40, 50, 58, 62, 64, 76, 80, 110, 7, 20, 38, 57, 89, 107, 39, 61, 113, 69, 101, 19, 102, 88, 119, 115, 114, 116, 108, 117, 118, 103, 104, 105, 106]; |
| 100, 0 × D7791 | [4, 7, 9, 10, 13, 15, 17, 19, 22, 23, 24, 25, 28, 29, 30, 31, 32, 33, 34, 35, 36, 38, 39, 41, 48, 49, 53, 56, 58, 61, 63, 65, 67, 71, 72, 73, 74, 78, 80, 81, 82, 83, 84, 89, 91, 92, 94, 96, 97, 101, 3, 6, 8, 12, 14, 16, 18, 21, 27, 37, 40, 47, 52, 55, 57, 60, 62, 64, 66, 70, 77, 79, 88, 90, 93, 95, 100, 102, 2, 5, 11, 20, 26, 46, 51, 54, 59, 69, 76, 87, 99, 103, 1, 45, 50, 68, 75, 86, 98, 104, 44, 85, 105, 43, 106, 42, 107, 108, 109, 110, 111, 112, 113, 114, 115, 116, 117, 118, 119]; or [1, 2, 4, 8, 10, 12, 15, 21, 22, 23, 25, 27, 29, 32, 33, 34, 35, 36, 39, 44, 47, 48, 50, 54, 56, 57, 58, 60, 62, 63, 68, 69, 70, 72, 73, 74, 75, 80, 81, 83, 85, 86, 87, 88, 93, 96, 109, 3, 11, 13, 14, 17, 19, 20, 26, 30, 41, 43, 46, 55, 59, 65, 78, 79, 89, 91, 94, 95, 97, 100, 110, 9, 18, 28, 31, 42, 45, 51, 61, 66, 71, 76, 90, 92, 98, 108, 7, 24, 38, 49, 53, 67, 82, 84, 101, 6, 16, 37, 40, 52, 64, 77, 102, 5, 119, 99, 103, 115, 116, 104, 111, 112, 117, 118, 105, 106, 107, 114, 113]; |
| 100, 0 × AD0B5 | [2, 5, 6, 7, 8, 9, 10, 11, 12, 17, 20, 21, 23, 24, 25, 28, 29, 33, 34, 35, 36, 37, 40, 41, 43, 45, 46, 48, 50, 52, 53, 54, 55, 57, 58, 61, 62, 64, 66, 68, 69, 70, 74, 77, 80, 87, 91, 92, 96, 99, 100, 101, 1, 4, 16, 19, 22, 27, 32, 39, 42, 44, 47, 49, 51, 56, 60, 63, 65, 67, 73, 76, 79, 86, 90, 95, 98, 102, 3, 15, 18, 26, 31, 38, 59, 72, 75, 78, 85, 89, 94, 97, 103, 14, 30, 71, 84, 88, 93, 104, 13, 83, 105, 82, 106, 81, 107, 108, 109, 110, 111, 112, 113, 114, 115, 116, 117, 118, 119]; or [2, 3, 4, 7, 9, 10, 11, 15, 18, 20, 26, 27, 28, 29, 30, 31, 33, 34, 36, 38, 39, 40, 42, 43, 49, 50, 53, 54, 59, 64, 69, 70, 73, 74, 80, 81, 83, 84, 85, 87, 89, 90, 92, 93, 94, 95, 96, 97, 113, 1, 6, 8, 14, 17, 19, 25, 32, 35, 37, 41, 48, 52, 58, 63, 68, 72, 79, 82, 86, 88, 91, 114, 5, 13, 22, 23, 44, 46, 47, 51, 57, 60, 62, 66, 67, 71, 78, 98, 99, 100, 108, 12, 16, 21, 45, 56, 61, 65, 77, 109, 24, 55, 76, 110, 75, 111, 118, 101, 106, 107, 112, 119, 102, 116, 117, 103, 115, 104, 105]; |
| 100, 0 × C9685 | [2, 4, 6, 7, 8, 9, 11, 13, 14, 16, 17, 19, 22, 24, 27, 30, 31, 32, 33, 35, 36, 37, 38, 39, 40, 42, 46, 47, 49, 50, 52, 53, 55, 56, 58, 59, 61, 62, 63, 64, 68, 69, 72, 73, 83, 86, 87, 88, 89, 90, 91, 92, 93, 96, 97, 99, 101, 1, 3, 5, 10, 12, 15, 18, 21, 23, 26, 29, 34, 41, 45, 48, 51, 54, 57, 60, 67, 71, 82, 85, 95, 98, 102, 20, 25, 28, 44, 66, 70, 81, 84, 94, 100, 103, 43, 65, 80, 104, 79, 105, 78, 106, 77, 107, 76, 108, 75, 109, 74, 110, 111, 112, 113, 114, 115, 116, 117, 118, 119]; or [3, 5, 6, 8, 14, 18, 20, 21, 24, 26, 27, 28, 29, 31, 35, 38, 39, 42, 43, 45, 47, 48, 50, 53, 54, 56, 57, 59, 60, 62, 63, 65, 72, 74, 75, 78, 80, 86, 91, 93, 94, 95, 96, 99, 113, 2, 4, 7, 13, 17, 19, 23, 25, 30, 34, 37, 41, 44, 46, 49, 52, 55, 58, 61, 64, 71, 73, 77, 79, 85, 90, 92, 98, 114, 1, 12, 16, 22, 33, 36, 40, 51, 70, 76, 84, 89, 97, 115, 9, 10, 15, 32, 66, 67, 69, 83, 108, 68, 82, 100, 109, 87, 116, 81, 103, 11, 104, 105, 88, 117, 106, 107, 118, 110, 111, 112, 101, 102, 119]; |
| 100, 0 × F1CF7 | [1, 3, 5, 6, 7, 9, 10, 11, 12, 13, 16, 19, 20, 24, 25, 29, 31, 32, 36, 38, 41, 42, 45, 46, 47, 48, 49, 50, 51, 52, 53, 54, 55, 56, 57, 58, 59, 60, 61, 62, 65, 67, 71, 77, 78, 80, 81, 84, 85, 86, 89, 90, 91, 93, 96, 97, 98, 100, 101, 2, 4, 8, 15, 18, 23, 28, 30, 35, 37, 40, 44, 64, 66, 70, 76, 79, 83, 88, 92, 95, 99, 102, 14, 17, 22, 27, 34, 39, 43, 63, 69, 75, 82, 87, 94, 103, 21, 26, 33, 68, 74, 104, 73, 105, 72, 106, 107, 108, 109, 110, 111, 112, 113, 114, 115, 116, 117, 118, 119]; or [4, 7, 10, 11, 12, 13, 14, 15, 18, 21, 22, 27, 28, 32, 33, 34, 36, 39, 40, 41, 44, 51, 67, 70, 73, 74, 75, 76, 77, 78, 81, 84, 85, 90, 91, 95, 96, 97, 99, 113, 3, 6, 9, 17, 20, 26, 31, 35, 38, 43, 50, 66, 69, 72, 80, 83, 89, 94, 98, 114, 2, 5, 8, 16, 19, 25, 30, 37, 42, 49, 65, 68, 71, 79, 82, 88, 93, 100, 115, 1, 24, 29, 48, 64, 87, 92, 116, 23, 59, 86, 105, 46, 118, 62, 102, 57, 107, 53, 111, 45, 47, 52, 54, 55, 56, 58, 60, 61, 101, 63, 106, 119, 103, 104, 112, 117, 108, 109, 110]; |
| 100, 0 × BBBCF | [1, 4, 5, 6, 7, 8, 9, 10, 12, 15, 16, 18, 19, 20, 21, 24, 25, 26, 28, 31, 32, 33, 35, 37, 41, 45, 46, 47, 48, 49, 51, 62, 63, 64, 66, 69, 70, 71, 73, 74, 75, 76, 77, 78, 81, 83, 84, 88, 89, 90, 91, 94, 95, 96, 98, 99, 100, 101, 3, 11, 14, 17, 23, 27, 30, 34, 36, 40, 44, 50, 61, 65, 68, 72, 80, 82, 87, 93, 97, 102, 2, 13, 22, 29, 39, 43, 60, 67, 79, 86, 92, 103, 38, 42, 59, 85, 104, 58, 105, 57, 106, 56, 107, 55, 108, 54, 109, 53, 110, 52, 111, 112, 113, 114, 115, 116, 117, 118, 119]; or [1, 3, 4, 8, 9, 10, 11, 18, 20, 22, 24, 38, 41, 42, 43, 45, 46, 49, 50, 55, 63, 75, 77, 78, 79, 81, 83, 84, 85, 86, 87, 88, 89, 92, 94, 100, 116, 5, 7, 12, 13, 14, 15, 26, 28, 47, 53, 54, 59, 67, 82, 90, 91, 93, 96, 98, 112, 16, 17, 21, 23, 27, 30, 33, 34, 35, 36, 37, 40, 44, 51, 61, 64, 65, 66, 68, 71, 72, 80, 97, 102, 19, 32, 57, 58, 95, 108, 2, 25, 29, 56, 62, 69, 73, 99, 109, 39, 48, 76, 110, 52, 60, 70, 74, 111, 114, 6, 115, 31, 107, 117, 104, 105, 106, 103, 113, 118, 101, 119]; |
| 100, 0 × 90CBF | [1, 6, 9, 10, 11, 14, 15, 17, 19, 21, 25, 26, 28, 29, 30, 32, 33, 34, 35, 37, 44, 45, 48, 49, 51, 52, 54, 58, 59, 61, 62, 65, 68, 69, 72, 73, 75, |

TABLE 3-continued

| Typical K, typical CRC polynomial | Interleaved sequence |
|---|---|
| | 76, 79, 82, 83, 86, 87, 88, 90, 93, 94, 96, 98, 99, 100, 101, 5, 8, 13, 16, 18, 20, 24, 27, 31, 36, 43, 47, 50, 53, 57, 60, 64, 67, 71, 74, 78, 81, 85, 89, 92, 95, 97, 102, 4, 7, 12, 23, 42, 46, 56, 63, 66, 70, 77, 80, 84, 91, 103, 3, 22, 41, 55, 104, 2, 40, 105, 39, 106, 38, 107, 108, 109, 110, 111, 112, 113, 114, 115, 116, 117, 118, 119]; or [3, 5, 13, 17, 23, 25, 27, 29, 33, 41, 43, 45, 51, 57, 61, 63, 67, 69, 71, 75, 77, 83, 85, 89, 93, 97, 99, 108, 2, 4, 12, 16, 22, 24, 26, 28, 32, 40, 42, 44, 50, 56, 60, 62, 66, 68, 70, 74, 76, 82, 84, 88, 92, 96, 98, 100, 109, 1, 11, 15, 21, 31, 39, 49, 55, 59, 65, 73, 81, 87, 91, 95, 110, 6, 8, 9, 18, 20, 30, 35, 36, 52, 54, 64, 78, 90, 94, 112, 7, 10, 14, 19, 34, 38, 48, 53, 113, 37, 46, 79, 80, 86, 103, 58, 72, 104, 47, 114, 115, 116, 111, 117, 105, 118, 101, 119, 102, 106, 107]; |
| 120, 0 × 1A9B1 | [4, 5, 7, 10, 11, 12, 15, 17, 20, 21, 24, 25, 27, 29, 30, 32, 36, 37, 38, 43, 44, 45, 47, 50, 51, 52, 53, 60, 61, 63, 64, 69, 70, 71, 76, 78, 79, 80, 82, 84, 86, 87, 90, 94, 96, 99, 100, 102, 104, 105, 106, 107, 109, 110, 111, 112, 113, 114, 115, 116, 117, 118, 121, 3, 6, 9, 14, 16, 19, 23, 26, 28, 31, 35, 42, 46, 49, 59, 62, 68, 75, 77, 81, 83, 85, 89, 93, 95, 98, 101, 103, 108, 120, 122, 2, 8, 13, 18, 22, 34, 41, 48, 58, 67, 74, 88, 92, 97, 119, 123, 1, 33, 40, 57, 66, 73, 91, 124, 39, 56, 65, 72, 125, 55, 126, 54, 127, 128, 129, 130, 131, 132, 133, 134, 135, 136]; or [3, 5, 9, 11, 12, 15, 16, 18, 20, 26, 28, 31, 35, 36, 37, 38, 42, 47, 49, 50, 52, 55, 58, 61, 63, 64, 65, 68, 70, 73, 75, 82, 83, 85, 88, 89, 98, 106, 109, 110, 113, 115, 116, 129, 2, 4, 8, 10, 14, 17, 19, 25, 27, 30, 34, 41, 46, 48, 51, 54, 57, 60, 62, 67, 69, 72, 74, 81, 84, 87, 97, 105, 108, 112, 114, 130, 1, 7, 13, 24, 29, 33, 40, 45, 53, 56, 59, 66, 71, 80, 86, 96, 104, 107, 111, 120, 131, 21, 22, 23, 39, 76, 79, 90, 91, 93, 99, 103, 118, 119, 126, 32, 78, 92, 95, 102, 117, 127, 6, 101, 134, 44, 77, 100, 135, 43, 94, 121, 128, 122, 123, 124, 136, 132, 133, 125]; |
| 120, 0 × 1FDBF | [1, 6, 8, 9, 11, 12, 13, 14, 15, 17, 18, 19, 20, 22, 27, 33, 35, 40, 41, 43, 45, 46, 48, 55, 56, 60, 61, 62, 64, 65, 70, 72, 75, 76, 79, 80, 81, 83, 84, 85, 86, 87, 91, 93, 94, 96, 97, 99, 101, 102, 103, 104, 106, 109, 112, 116, 118, 119, 120, 121, 5, 7, 10, 16, 21, 26, 32, 34, 39, 42, 44, 47, 54, 59, 63, 69, 71, 74, 78, 82, 90, 92, 95, 98, 100, 105, 108, 111, 115, 117, 122, 4, 25, 31, 38, 53, 58, 68, 73, 77, 89, 107, 110, 114, 123, 3, 24, 30, 37, 52, 57, 67, 88, 113, 124, 2, 23, 29, 36, 51, 66, 125, 28, 50, 126, 49, 127, 128, 129, 130, 131, 132, 133, 134, 135, 136]; or [1, 2, 3, 7, 10, 14, 18, 20, 21, 23, 24, 25, 26, 32, 33, 35, 36, 37, 41, 42, 53, 54, 58, 61, 62, 65, 68, 69, 76, 77, 78, 85, 86, 88, 91, 94, 96, 103, 104, 106, 108, 109, 115, 117, 119, 120, 128, 8, 11, 12, 15, 27, 31, 34, 43, 45, 46, 48, 52, 55, 56, 57, 67, 70, 72, 79, 80, 81, 83, 90, 95, 97, 99, 101, 105, 107, 112, 114, 129, 4, 16, 28, 29, 30, 38, 50, 51, 59, 63, 71, 74, 75, 82, 87, 92, 93, 110, 111, 113, 118, 134, 5, 13, 17, 22, 47, 60, 73, 84, 89, 98, 102, 123, 44, 64, 66, 100, 130, 6, 9, 19, 40, 116, 121, 131, 39, 49, 132, 136, 125, 122, 135, 126, 127, 133, 124]; |
| 120, 0 × 16801 | [11, 13, 14, 16, 22, 26, 28, 32, 33, 35, 36, 37, 38, 40, 41, 43, 45, 46, 48, 52, 55, 56, 57, 58, 60, 63, 64, 65, 67, 68, 69, 74, 75, 76, 78, 79, 80, 81, 84, 86, 89, 90, 91, 94, 95, 96, 97, 98, 99, 100, 101, 102, 105, 107, 108, 109, 114, 115, 116, 117, 118, 121, 10, 12, 15, 21, 25, 27, 31, 34, 39, 42, 44, 47, 51, 54, 59, 62, 66, 73, 77, 83, 85, 88, 93, 104, 106, 113, 120, 122, 9, 20, 24, 30, 50, 53, 61, 72, 82, 87, 92, 103, 112, 119, 123, 8, 19, 23, 29, 49, 71, 111, 124, 7, 18, 70, 110, 125, 6, 17, 126, 5, 127, 4, 128, 3, 129, 2, 130, 1, 131, 132, 133, 134, 135, 136]; or [2, 3, 5, 13, 14, 15, 16, 17, 21, 24, 25, 27, 28, 29, 30, 33, 34, 36, 38, 40, 43, 44, 47, 48, 49, 53, 54, 55, 60, 70, 73, 74, 76, 81, 83, 85, 87, 88, 95, 99, 100, 101, 102, 103, 104, 106, 108, 109, 110, 113, 114, 116, 119, 120, 132, 1, 4, 12, 20, 23, 26, 32, 35, 37, 39, 42, 46, 52, 59, 69, 72, 75, 80, 82, 84, 86, 94, 98, 105, 107, 112, 115, 118, 133, 19, 31, 51, 56, 57, 63, 64, 65, 67, 71, 78, 89, 90, 91, 93, 96, 111, 134, 11, 22, 41, 45, 58, 68, 79, 97, 117, 121, 10, 62, 66, 77, 122, 9, 50, 61, 92, 123, 8, 124, 18, 135, 136, 7, 125, 6, 126, 127, 128, 129, 130, 131]; |
| 120, 0 × 1D5E3 | [1, 2, 3, 4, 7, 8, 9, 10, 15, 18, 19, 20, 23, 27, 29, 30, 32, 33, 36, 39, 44, 45, 46, 48, 50, 60, 61, 63, 64, 65, 68, 72, 73, 75, 76, 77, 79, 80, 81, 83, 85, 87, 88, 89, 91, 93, 96, 97, 98, 99, 108, 111, 114, 115, 116, 120, 121, 6, 14, 17, 22, 26, 28, 31, 35, 38, 43, 47, 49, 59, 62, 67, 71, 74, 78, 82, 84, 86, 90, 92, 95, 107, 110, 113, 119, 122, 5, 13, 16, 21, 25, 34, 37, 42, 58, 66, 70, 94, 106, 109, 112, 118, 123, 12, 24, 41, 57, 69, 105, 117, 124, 11, 40, 56, 104, 125, 55, 103, 126, 54, 102, 127, 53, 101, 128, 52, 100, 129, 51, 130, 131, 132, 133, 134, 135, 136]; or [1, 2, 3, 4, 7, 8, 9, 10, 15, 18, 19, 20, 23, 27, 29, 30, 32, 33, 36, 39, 44, 45, 46, 48, 50, 60, 61, 63, 64, 65, 68, 72, 73, 75, 76, 77, 79, 80, 81, 83, 85, 87, 88, 89, 91, 93, 96, 97, 98, 99, 108, 111, 114, 115, 116, 120, 121, 6, 14, 17, 22, 26, 28, 31, 35, 38, 43, 47, 49, 59, 62, 67, 71, 74, 78, 82, 84, 86, 90, 92, 95, 107, 110, 113, |

TABLE 3-continued

| Typical K, typical CRC polynomial | Interleaved sequence |
|---|---|
| | 119, 122, 5, 13, 16, 21, 25, 34, 37, 42, 58, 66, 70, 94, 106, 109, 112, 118, 123, 12, 24, 41, 57, 69, 105, 117, 124, 40, 51, 52, 101, 135, 11, 100, 136, 56, 104, 125, 55, 103, 126, 53, 54, 133, 102, 134, 127, 129, 130, 131, 132, 128]; |
| 120, 0 × 179E9 | [3, 5, 7, 8, 9, 10, 13, 14, 15, 16, 17, 18, 19, 20, 24, 25, 26, 27, 29, 32, 34, 35, 39, 40, 41, 42, 43, 44, 46, 47, 48, 51, 53, 55, 56, 57, 58, 59, 60, 62, 63, 64, 65, 68, 71, 75, 76, 78, 79, 80, 81, 82, 83, 85, 87, 88, 90, 91, 92, 96, 99, 100, 101, 102, 104, 105, 106, 107, 109, 111, 112, 113, 114, 115, 116, 118, 121, 2, 4, 6, 12, 23, 28, 31, 33, 38, 45, 50, 52, 54, 61, 67, 70, 74, 77, 84, 86, 89, 95, 98, 103, 108, 110, 117, 122, 1, 11, 22, 30, 37, 49, 66, 69, 73, 94, 97, 123, 21, 36, 72, 93, 120, 124, 119, 125, 126, 127, 128, 129, 130, 131, 132, 133, 134, 135, 136]; or [1, 3, 4, 9, 12, 13, 14, 15, 22, 23, 25, 26, 29, 32, 33, 36, 37, 38, 40, 41, 46, 48, 50, 51, 52, 57, 62, 64, 67, 68, 69, 71, 72, 74, 76, 77, 78, 80, 85, 89, 90, 92, 94, 95, 97, 99, 100, 101, 104, 106, 109, 113, 118, 134, 5, 7, 8, 16, 17, 21, 28, 31, 35, 43, 44, 47, 54, 56, 60, 61, 63, 70, 75, 79, 81, 82, 84, 86, 110, 111, 114, 116, 117, 119, 129, 2, 6, 11, 20, 24, 27, 30, 34, 39, 42, 53, 55, 59, 83, 88, 93, 105, 112, 115, 130, 18, 19, 45, 58, 73, 91, 98, 103, 107, 108, 120, 124, 10, 66, 87, 131, 49, 96, 102, 125, 65, 126, 132, 127, 133, 128, 121, 122, 123, 135, 136]; |
| 120, 0 × 1E469 | [3, 5, 9, 11, 12, 14, 16, 18, 19, 24, 26, 28, 29, 30, 32, 34, 37, 38, 40, 41, 42, 45, 47, 48, 49, 50, 51, 52, 55, 56, 57, 58, 59, 60, 61, 62, 63, 64, 66, 68, 70, 71, 73, 74, 75, 79, 80, 82, 84, 87, 89, 90, 91, 94, 95, 97, 98, 99, 103, 105, 106, 107, 108, 109, 110, 113, 119, 121, 2, 4, 8, 10, 13, 15, 17, 23, 25, 27, 31, 33, 36, 39, 44, 46, 54, 65, 67, 69, 72, 78, 81, 83, 86, 88, 93, 96, 102, 104, 112, 118, 122, 1, 7, 22, 35, 43, 53, 77, 85, 92, 101, 111, 117, 120, 123, 6, 21, 76, 100, 116, 124, 20, 115, 125, 114, 126, 127, 128, 129, 130, 131, 132, 133, 134, 135, 136]; or [1, 4, 5, 6, 9, 10, 13, 14, 17, 18, 21, 22, 23, 24, 25, 32, 33, 34, 39, 40, 41, 44, 45, 47, 50, 55, 56, 57, 58, 59, 61, 65, 66, 68, 72, 78, 82, 86, 88, 89, 91, 96, 99, 100, 102, 103, 105, 108, 109, 110, 111, 113, 114, 118, 119, 120, 126, 3, 7, 11, 12, 15, 27, 28, 35, 43, 46, 49, 51, 52, 60, 69, 74, 76, 77, 79, 81, 85, 93, 94, 95, 101, 106, 107, 117, 131, 2, 16, 26, 31, 38, 42, 48, 67, 73, 75, 80, 84, 90, 92, 104, 116, 132, 8, 20, 30, 37, 54, 83, 87, 98, 112, 115, 133, 19, 53, 62, 64, 97, 124, 29, 63, 71, 125, 36, 70, 134, 135, 127, 121, 122, 128, 123, 129, 130, 136]; |
| 120, 0 × 1CC27 | [1, 3, 4, 5, 6, 9, 10, 11, 12, 13, 16, 17, 18, 21, 22, 25, 27, 28, 30, 32, 33, 34, 35, 36, 38, 42, 44, 46, 47, 50, 52, 53, 55, 56, 58, 60, 61, 62, 64, 68, 69, 70, 72, 74, 75, 76, 77, 78, 80, 81, 82, 84, 91, 94, 96, 97, 99, 101, 102, 104, 105, 106, 108, 110, 111, 113, 114, 115, 116, 117, 119, 121, 2, 8, 15, 20, 24, 26, 29, 31, 37, 41, 43, 45, 49, 51, 54, 57, 59, 63, 67, 71, 73, 79, 83, 90, 93, 95, 98, 100, 103, 107, 109, 112, 118, 122, 7, 14, 19, 23, 40, 48, 66, 89, 92, 123, 39, 65, 88, 124, 87, 120, 125, 86, 126, 85, 127, 128, 129, 130, 131, 132, 133, 134, 135, 136]; or [3, 8, 9, 11, 12, 14, 15, 16, 18, 19, 21, 23, 24, 27, 28, 29, 34, 37, 38, 39, 42, 43, 45, 46, 48, 52, 53, 54, 62, 65, 68, 69, 71, 73, 76, 79, 80, 81, 85, 88, 89, 94, 95, 96, 97, 98, 103, 109, 112, 118, 119, 120, 132, 2, 7, 10, 13, 17, 20, 22, 26, 33, 36, 41, 44, 47, 51, 61, 64, 67, 70, 72, 75, 78, 84, 87, 93, 102, 108, 111, 117, 133, 1, 6, 25, 32, 35, 40, 50, 60, 63, 66, 74, 77, 83, 86, 92, 101, 107, 110, 116, 134, 4, 49, 57, 90, 91, 104, 113, 114, 115, 123, 5, 31, 56, 59, 82, 106, 124, 30, 55, 58, 105, 125, 99, 126, 127, 100, 128, 122, 129, 130, 135, 121, 136, 131]; |
| 120, 0 × 1DBA3 | [1, 2, 3, 4, 6, 7, 10, 12, 13, 15, 18, 20, 22, 23, 24, 25, 26, 27, 28, 29, 36, 37, 38, 40, 43, 44, 47, 48, 49, 51, 54, 57, 61, 63, 67, 68, 70, 71, 72, 75, 76, 82, 83, 85, 86, 88, 89, 91, 94, 96, 97, 99, 101, 103, 105, 107, 108, 113, 114, 118, 120, 121, 5, 9, 11, 14, 17, 19, 21, 35, 39, 42, 46, 50, 53, 56, 60, 62, 66, 69, 74, 81, 84, 87, 90, 93, 95, 98, 100, 102, 104, 106, 112, 117, 119, 122, 8, 16, 34, 41, 45, 52, 55, 59, 65, 73, 80, 92, 111, 116, 123, 33, 58, 64, 79, 110, 115, 124, 32, 78, 109, 125, 31, 77, 126, 30, 127, 128, 129, 130, 131, 132, 133, 134, 135, 136]; or [1, 4, 6, 9, 13, 14, 16, 21, 23, 28, 32, 33, 35, 36, 37, 38, 41, 42, 46, 47, 50, 52, 56, 59, 60, 62, 65, 67, 68, 69, 70, 71, 72, 73, 74, 76, 77, 78, 82, 83, 89, 93, 94, 97, 98, 99, 100, 102, 107, 114, 116, 128, 2, 5, 10, 12, 15, 17, 18, 20, 26, 29, 30, 31, 34, 45, 48, 49, 51, 53, 58, 61, 75, 80, 84, 86, 90, 92, 96, 101, 103, 104, 106, 108, 117, 118, 120, 130, 8, 11, 19, 25, 44, 55, 57, 64, 66, 79, 85, 88, 91, 95, 105, 119, 131, 7, 24, 43, 54, 63, 81, 115, 129, 22, 87, 113, 132, 27, 40, 112, 133, 3, 39, 111, 134, 121, 109, 136, 110, 126, 127, 122, 123, 124, 125, 135]; |
| 120, 0 × 1F635 | [2, 5, 6, 8, 12, 20, 23, 24, 25, 27, 28, 30, 31, 32, 33, 34, 36, 37, 38, 39, 42, 44, 45, 46, 49, 51, 52, 54, 55, 57, 59, 60, 61, 62, 63, 65, 68, 70, 71, 72, 73, 74, 75, 76, 78, 79, 80, 83, 87, 89, 90, 92, 93, 95, 97, 98, 102, 103, 104, 107, 109, 110, 113, 114, 116, 117, 118, 119, 120, |

TABLE 3-continued

| Typical K, typical CRC polynomial | Interleaved sequence |
|---|---|
| | 121, 1, 4, 7, 11, 19, 22, 26, 29, 35, 41, 43, 48, 50, 53, 56, 58, 64, 67, 69, 77, 82, 86, 88, 91, 94, 96, 101, 106, 108, 112, 115, 122, 3, 10, 18, 21, 40, 47, 66, 81, 85, 100, 105, 111, 123, 9, 17, 84, 99, 124, 16, 125, 15, 126, 14, 127, 13, 128, 129, 130, 131, 132, 133, 134, 135, 136]; or [1, 3, 5, 10, 12, 16, 18, 19, 22, 23, 28, 30, 32, 34, 39, 41, 42, 43, 46, 48, 54, 55, 56, 57, 59, 61, 62, 64, 65, 67, 68, 70, 71, 72, 74, 76, 77, 80, 81, 86, 92, 93, 94, 96, 97, 99, 101, 104, 106, 108, 111, 114, 116, 117, 118, 125, 2, 4, 6, 11, 13, 14, 15, 21, 24, 26, 33, 35, 40, 44, 47, 49, 50, 51, 63, 69, 73, 75, 83, 84, 85, 88, 89, 103, 105, 107, 109, 113, 119, 120, 134, 8, 20, 27, 29, 38, 45, 53, 58, 66, 79, 91, 98, 100, 110, 112, 115, 123, 7, 9, 17, 25, 37, 52, 78, 82, 87, 90, 95, 102, 124, 31, 130, 36, 60, 131, 132, 135, 126, 127, 128, 129, 133, 121, 136, 122]; |
| 120, 0 × 1B41D | [2, 3, 7, 9, 12, 13, 15, 18, 26, 28, 31, 32, 34, 36, 37, 39, 40, 41, 43, 45, 48, 49, 51, 54, 55, 58, 59, 60, 64, 66, 69, 70, 76, 77, 79, 84, 86, 88, 90, 91, 92, 93, 94, 96, 97, 100, 103, 104, 106, 108, 109, 110, 111, 114, 115, 116, 117, 119, 120, 121, 1, 6, 8, 11, 14, 17, 25, 27, 30, 33, 35, 38, 42, 44, 47, 50, 53, 57, 63, 65, 68, 75, 78, 83, 85, 87, 89, 95, 99, 102, 105, 107, 113, 118, 122, 5, 10, 16, 24, 29, 46, 52, 56, 62, 67, 74, 82, 98, 101, 112, 123, 4, 23, 61, 73, 81, 124, 22, 72, 80, 125, 21, 71, 126, 20, 127, 19, 128, 129, 130, 131, 132, 133, 134, 135, 136]; or [6, 10, 11, 15, 16, 17, 18, 22, 25, 29, 30, 32, 35, 36, 37, 41, 42, 46, 47, 52, 54, 58, 63, 67, 70, 72, 73, 74, 75, 78, 79, 80, 83, 84, 85, 86, 88, 89, 91, 93, 96, 97, 98, 101, 102, 104, 106, 107, 108, 109, 110, 113, 114, 116, 118, 119, 125, 5, 9, 14, 21, 24, 28, 31, 34, 40, 45, 51, 53, 57, 62, 66, 69, 71, 77, 82, 87, 90, 92, 95, 100, 103, 105, 112, 115, 117, 120, 126, 4, 8, 13, 20, 23, 27, 33, 39, 44, 50, 56, 61, 65, 68, 76, 81, 94, 99, 111, 127, 3, 7, 12, 19, 26, 38, 43, 49, 55, 60, 64, 128, 2, 48, 59, 129, 1, 130, 121, 122, 136, 123, 133, 124, 134, 131, 135, 132]; |
| 120, 0 × 19F11 | [4, 9, 10, 11, 15, 17, 19, 23, 27, 35, 36, 37, 39, 40, 41, 42, 43, 44, 47, 48, 50, 53, 54, 55, 56, 57, 61, 63, 64, 65, 66, 69, 72, 76, 78, 79, 80, 82, 86, 88, 89, 90, 93, 94, 95, 96, 97, 101, 106, 107, 108, 114, 120, 121, 3, 8, 14, 16, 18, 22, 26, 34, 38, 46, 49, 52, 60, 62, 68, 71, 75, 77, 81, 85, 87, 92, 100, 105, 113, 119, 122, 2, 7, 13, 21, 25, 33, 45, 51, 59, 67, 70, 74, 84, 91, 99, 104, 112, 118, 123, 1, 6, 12, 20, 24, 32, 58, 73, 83, 98, 103, 111, 117, 124, 5, 31, 102, 110, 116, 125, 30, 109, 115, 126, 29, 127, 28, 128, 129, 130, 131, 132, 133, 134, 135, 136]; or [1, 2, 9, 13, 14, 16, 18, 19, 22, 23, 32, 33, 36, 39, 43, 44, 46, 48, 51, 55, 56, 58, 59, 62, 64, 66, 67, 70, 71, 72, 73, 75, 79, 81, 84, 86, 89, 91, 93, 94, 96, 98, 99, 102, 106, 110, 111, 114, 115, 116, 119, 120, 131, 3, 4, 7, 8, 12, 15, 20, 21, 26, 27, 30, 31, 38, 41, 42, 50, 52, 53, 54, 61, 65, 76, 80, 85, 90, 101, 104, 105, 109, 112, 117, 118, 133, 6, 11, 17, 25, 29, 37, 40, 47, 49, 60, 63, 69, 74, 78, 83, 88, 95, 100, 103, 108, 134, 5, 10, 24, 28, 68, 77, 82, 87, 92, 107, 135, 35, 57, 97, 121, 45, 113, 132, 136, 34, 122, 123, 124, 125, 126, 127, 128, 130, 129]; |
| 120, 0 × 14F61 | [5, 6, 8, 9, 11, 12, 14, 15, 16, 17, 18, 19, 21, 22, 25, 27, 31, 32, 33, 39, 41, 42, 43, 47, 50, 51, 54, 58, 60, 61, 63, 64, 65, 67, 69, 70, 72, 77, 78, 83, 97, 99, 102, 103, 104, 106, 107, 109, 110, 112, 117, 119, 120, 121, 4, 7, 10, 13, 20, 24, 26, 30, 38, 40, 46, 49, 53, 57, 59, 62, 66, 68, 71, 76, 82, 96, 98, 101, 105, 108, 111, 116, 118, 122, 3, 23, 29, 37, 45, 48, 52, 56, 75, 81, 95, 100, 115, 123, 2, 28, 36, 44, 55, 74, 80, 94, 114, 124, 1, 35, 73, 79, 93, 113, 125, 34, 92, 126, 91, 127, 90, 128, 89, 129, 88, 130, 87, 131, 86, 132, 85, 133, 84, 134, 135, 136]; or [2, 7, 8, 10, 11, 13, 14, 16, 17, 18, 19, 20, 21, 23, 24, 27, 29, 33, 34, 35, 41, 43, 44, 45, 49, 52, 53, 56, 60, 62, 63, 65, 66, 67, 69, 71, 72, 74, 79, 80, 85, 99, 101, 104, 105, 106, 108, 109, 111, 112, 114, 119, 135, 5, 6, 9, 12, 15, 22, 25, 31, 32, 39, 42, 47, 50, 51, 54, 58, 61, 64, 70, 77, 78, 83, 97, 102, 103, 107, 110, 117, 120, 121, 1, 26, 28, 40, 48, 55, 59, 68, 73, 84, 98, 100, 113, 118, 136, 4, 30, 38, 46, 57, 76, 82, 96, 116, 122, 3, 37, 75, 81, 95, 115, 123, 36, 94, 124, 93, 125, 86, 88, 132, 87, 133, 134, 92, 126, 89, 131, 91, 127, 90, 128, 129, 130]; |
| 120, 0 × 151E9 | [3, 5, 7, 8, 9, 10, 11, 14, 15, 16, 18, 20, 21, 22, 23, 24, 25, 28, 29, 30, 31, 35, 36, 38, 40, 41, 44, 47, 48, 49, 51, 53, 57, 58, 59, 62, 63, 65, 66, 68, 69, 73, 74, 78, 81, 82, 84, 86, 88, 89, 91, 93, 95, 97, 101, 104, 106, 107, 108, 111, 112, 113, 117, 118, 121, 2, 4, 6, 13, 17, 19, 27, 34, 37, 39, 43, 46, 50, 52, 56, 61, 64, 67, 72, 77, 80, 83, 85, 87, 90, 92, 94, 96, 100, 103, 105, 110, 116, 120, 122, 1, 12, 26, 33, 42, 45, 55, 60, 71, 76, 79, 99, 102, 109, 115, 119, 123, 32, 54, 70, 75, 98, 114, 124, 125, 126, 127, 128, 129, 130, 131, 132, 133, 134, 135, 136]; or [1, 2, 3, 4, 5, 9, 12, 16, 17, 18, 20, 23, 27, 34, 36, 40, 41, 43, 45, 52, 54, 55, 56, 57, 59, 62, 63, 65, 67, 71, 72, 74, 77, 78, 80, 83, 84, 86, 87, 90, 92, 96, 97, 103, 105, 106, 109, 110, 115, 118, 126, 6, 7, 10, 11, 13, 14, 15, 19, 21, 31, 32, 37, 44, 46, 49, 51, 60, |

TABLE 3-continued

| Typical K, typical CRC polynomial | Interleaved sequence |
|---|---|
| | 64, 66, 70, 75, 76, 81, 88, 89, 91, 93, 100, 107, 128, 8, 22, 24, 25, 26, 28, 29, 38, 47, 50, 68, 79, 85, 99, 101, 108, 111, 112, 113, 120, 129, 39, 42, 48, 53, 61, 95, 98, 117, 119, 130, 73, 82, 94, 116, 131, 35, 104, 132, 30, 58, 69, 121, 114, 133, 122, 33, 102, 134, 135, 136, 123, 127, 124, 125]; |
| 120, 0 × 1AE8B | [1, 2, 4, 8, 9, 10, 12, 13, 14, 18, 21, 23, 25, 27, 29, 30, 31, 32, 36, 38, 40, 43, 44, 49, 50, 51, 53, 54, 55, 56, 59, 61, 65, 66, 68, 73, 77, 78, 79, 82, 83, 90, 91, 92, 95, 99, 100, 103, 104, 106, 107, 109, 111, 114, 115, 118, 119, 120, 121, 3, 7, 11, 17, 20, 22, 24, 26, 28, 35, 37, 39, 42, 48, 52, 58, 60, 64, 67, 72, 76, 81, 89, 94, 98, 102, 105, 108, 110, 113, 117, 122, 6, 16, 19, 34, 41, 47, 57, 63, 71, 75, 80, 88, 93, 97, 101, 112, 116, 123, 5, 15, 33, 46, 62, 70, 74, 87, 96, 124, 45, 69, 86, 125, 85, 126, 84, 127, 128, 129, 130, 131, 132, 133, 134, 135, 136]; or [2, 4, 6, 8, 11, 13, 14, 15, 16, 20, 21, 22, 28, 32, 33, 36, 39, 42, 43, 44, 47, 50, 55, 56, 57, 58, 59, 60, 61, 64, 65, 67, 68, 69, 70, 73, 74, 82, 87, 89, 90, 94, 98, 99, 101, 103, 106, 107, 110, 111, 118, 120, 128, 1, 3, 5, 7, 10, 12, 19, 27, 31, 35, 38, 41, 46, 49, 54, 63, 66, 72, 81, 86, 88, 93, 97, 100, 102, 105, 109, 117, 119, 129, 24, 26, 29, 34, 37, 51, 53, 62, 71, 78, 83, 91, 95, 96, 104, 108, 113, 114, 124, 9, 18, 23, 25, 30, 45, 52, 77, 80, 92, 112, 125, 17, 40, 76, 79, 85, 116, 126, 48, 75, 84, 115, 127, 121, 136, 122, 123, 130, 131, 132, 134, 135, 133]; |
| 120, 0 × 1DBF1 | [4, 5, 6, 7, 9, 10, 11, 12, 13, 15, 17, 21, 22, 26, 28, 29, 37, 38, 39, 40, 41, 43, 46, 47, 48, 49, 50, 54, 55, 60, 63, 64, 67, 69, 71, 73, 76, 79, 80, 83, 84, 86, 90, 92, 93, 94, 97, 98, 100, 108, 109, 115, 116, 118, 121, 3, 8, 14, 16, 20, 25, 27, 36, 42, 45, 53, 59, 62, 66, 68, 70, 72, 75, 78, 82, 85, 89, 91, 96, 99, 107, 114, 117, 120, 122, 2, 19, 24, 35, 44, 52, 58, 61, 65, 74, 77, 81, 88, 95, 106, 113, 119, 123, 1, 18, 23, 34, 51, 57, 87, 105, 112, 124, 33, 56, 104, 111, 125, 32, 103, 110, 126, 31, 102, 127, 30, 101, 128, 129, 130, 131, 132, 133, 134, 135, 136]; or [4, 5, 6, 7, 9, 10, 11, 12, 13, 15, 17, 21, 22, 26, 28, 29, 37, 38, 39, 40, 41, 43, 46, 47, 48, 49, 50, 54, 55, 60, 63, 64, 67, 69, 71, 73, 76, 79, 80, 83, 84, 86, 90, 92, 93, 94, 97, 98, 100, 108, 109, 115, 116, 118, 121, 3, 8, 14, 16, 20, 25, 27, 36, 42, 45, 53, 59, 62, 66, 68, 70, 72, 75, 78, 82, 85, 89, 91, 96, 99, 107, 114, 117, 120, 122, 2, 19, 24, 35, 44, 52, 58, 61, 65, 74, 77, 81, 88, 95, 106, 113, 119, 123, 1, 18, 23, 30, 51, 56, 87, 101, 110, 136, 34, 57, 105, 112, 124, 31, 103, 130, 102, 111, 131, 104, 132, 135, 32, 33, 127, 133, 134, 128, 125, 126, 129]; |
| 120, 0 × 1F4B7 | [1, 3, 5, 7, 8, 9, 10, 12, 16, 17, 18, 19, 20, 23, 29, 31, 33, 34, 36, 37, 41, 42, 44, 45, 48, 50, 51, 52, 53, 55, 61, 62, 64, 65, 68, 70, 75, 79, 81, 84, 87, 90, 92, 93, 94, 95, 96, 99, 100, 101, 104, 105, 106, 107, 108, 109, 115, 117, 118, 120, 121, 2, 4, 6, 11, 15, 22, 28, 30, 32, 35, 40, 43, 47, 49, 54, 60, 63, 67, 69, 74, 78, 80, 83, 86, 89, 91, 98, 103, 114, 116, 119, 122, 14, 21, 27, 39, 46, 59, 66, 73, 77, 82, 85, 88, 97, 102, 113, 123, 13, 26, 38, 58, 72, 76, 112, 124, 25, 57, 71, 111, 125, 24, 56, 110, 126, 127, 128, 129, 130, 131, 132, 133, 134, 135, 136]; or [1, 2, 3, 6, 7, 8, 14, 15, 17, 21, 23, 25, 26, 28, 29, 31, 33, 34, 35, 36, 41, 42, 43, 49, 50, 51, 55, 57, 61, 62, 63, 67, 70, 71, 72, 73, 76, 78, 80, 82, 83, 85, 86, 91, 93, 96, 97, 101, 102, 103, 106, 108, 109, 111, 112, 115, 117, 120, 125, 4, 9, 10, 12, 13, 16, 19, 22, 27, 30, 37, 38, 45, 46, 52, 53, 56, 58, 59, 65, 66, 74, 77, 79, 81, 84, 87, 89, 90, 92, 94, 95, 98, 107, 113, 116, 119, 133, 5, 18, 20, 44, 48, 64, 68, 75, 99, 100, 104, 105, 118, 121, 24, 32, 40, 60, 88, 110, 131, 11, 54, 69, 136, 47, 114, 128, 129, 39, 130, 132, 122, 135, 123, 124, 126, 127, 134]; |
| 120, 0 × 1BD23 | [1, 2, 3, 4, 6, 14, 15, 18, 19, 20, 25, 27, 29, 30, 31, 33, 35, 37, 38, 40, 42, 43, 46, 47, 48, 50, 55, 56, 62, 63, 64, 65, 67, 70, 73, 76, 77, 78, 82, 83, 84, 87, 89, 91, 94, 95, 98, 99, 100, 101, 102, 103, 104, 105, 107, 108, 110, 111, 112, 116, 117, 118, 121, 5, 13, 17, 24, 26, 28, 32, 34, 36, 39, 41, 45, 49, 54, 61, 66, 69, 72, 75, 81, 86, 88, 90, 93, 97, 106, 109, 115, 120, 122, 12, 16, 23, 44, 53, 60, 68, 71, 74, 80, 85, 92, 96, 114, 119, 123, 11, 22, 52, 59, 79, 113, 124, 10, 21, 51, 58, 125, 9, 57, 126, 8, 127, 7, 128, 129, 130, 131, 132, 133, 134, 135, 136]; or [1, 4, 6, 7, 8, 9, 10, 11, 15, 17, 18, 19, 20, 25, 26, 27, 28, 31, 32, 34, 35, 39, 42, 44, 46, 47, 48, 51, 52, 53, 54, 55, 56, 58, 59, 61, 63, 66, 67, 68, 69, 70, 78, 88, 90, 94, 96, 97, 98, 99, 100, 102, 107, 108, 113, 132, 2, 16, 23, 29, 30, 36, 37, 38, 41, 43, 57, 64, 72, 73, 75, 76, 81, 84, 87, 89, 91, 92, 93, 109, 111, 112, 115, 118, 134, 5, 13, 24, 33, 40, 45, 49, 50, 65, 86, 95, 105, 106, 120, 122, 12, 14, 21, 22, 62, 71, 101, 103, 110, 116, 129, 74, 77, 80, 83, 114, 117, 135, 3, 60, 85, 104, 119, 123, 79, 82, 124, 125, 130, 133, 121, 131, 126, 127, 128, 136]; |
| 120, 0 × 1BEAD | [2, 3, 4, 5, 9, 10, 13, 14, 15, 16, 18, 20, 22, 24, 25, 28, 29, 32, 33, 35, 36, 38, 39, 40, 41, 43, 44, 46, 48, 49, 50, 52, 54, 56, 57, 58, 62, 65, 67, 68, 72, 74, 76, 78, 79, 81, 82, 83, 86, 87, 88, 89, 90, 93, 94, |

TABLE 3-continued

| Typical K, typical CRC polynomial | Interleaved sequence |
|---|---|
| | 95, 96, 98, 100, 101, 102, 103, 104, 107, 110, 111, 112, 119, 121, 1, 8, 12, 17, 19, 21, 23, 27, 31, 34, 37, 42, 45, 47, 51, 53, 55, 61, 64, 66, 71, 73, 75, 77, 80, 85, 92, 97, 99, 106, 109, 118, 122, 7, 11, 26, 30, 60, 63, 70, 84, 91, 105, 108, 117, 120, 123, 6, 59, 69, 116, 124, 115, 125, 114, 126, 113, 127, 128, 129, 130, 131, 132, 133, 134, 135, 136]; or [2, 5, 6, 7, 8, 11, 13, 15, 16, 18, 20, 23, 26, 27, 30, 31, 32, 34, 35, 38, 40, 42, 43, 44, 49, 50, 52, 58, 59, 61, 66, 68, 69, 72, 74, 77, 78, 84, 86, 87, 91, 93, 95, 96, 100, 101, 106, 108, 112, 116, 118, 124, 1, 9, 10, 12, 17, 19, 22, 24, 36, 39, 46, 47, 48, 53, 54, 56, 62, 63, 65, 70, 73, 76, 81, 82, 88, 90, 97, 99, 104, 105, 110, 120, 133, 4, 14, 25, 29, 33, 37, 41, 51, 57, 60, 67, 71, 83, 85, 92, 94, 107, 111, 115, 117, 125, 21, 64, 75, 79, 102, 103, 114, 126, 3, 45, 109, 128, 28, 89, 98, 113, 129, 80, 127, 119, 130, 131, 132, 55, 123, 134, 135, 121, 122, 136]; |
| 120, 0 × 1FFF7 | [1, 3, 5, 6, 7, 8, 12, 15, 16, 17, 20, 21, 22, 24, 25, 26, 27, 29, 31, 35, 37, 40, 42, 45, 49, 53, 54, 56, 57, 58, 66, 69, 71, 72, 75, 76, 78, 80, 81, 82, 88, 89, 91, 92, 94, 95, 96, 98, 99, 100, 101, 106, 108, 110, 114, 115, 116, 118, 120, 121, 2, 4, 11, 14, 19, 23, 28, 30, 34, 36, 39, 41, 44, 48, 52, 55, 65, 68, 70, 74, 77, 79, 87, 90, 93, 97, 105, 107, 109, 113, 117, 119, 122, 10, 13, 18, 33, 38, 43, 47, 51, 64, 67, 73, 86, 104, 112, 123, 9, 32, 46, 50, 63, 85, 103, 111, 124, 62, 84, 102, 125, 61, 83, 126, 60, 127, 59, 128, 129, 130, 131, 132, 133, 134, 135, 136]; or [1, 4, 5, 7, 9, 10, 11, 15, 19, 21, 23, 25, 29, 33, 37, 38, 46, 49, 52, 53, 54, 58, 61, 62, 63, 64, 66, 68, 72, 76, 78, 82, 83, 87, 89, 90, 91, 92, 93, 95, 97, 98, 102, 104, 105, 108, 110, 111, 113, 114, 116, 118, 120, 126, 12, 13, 17, 20, 24, 26, 27, 28, 30, 41, 43, 55, 57, 59, 67, 69, 73, 74, 75, 79, 80, 85, 86, 88, 100, 101, 112, 117, 131, 18, 32, 34, 36, 39, 47, 65, 70, 81, 84, 94, 103, 106, 107, 125, 6, 14, 22, 31, 35, 48, 51, 60, 77, 132, 2, 8, 42, 44, 45, 56, 99, 109, 123, 16, 40, 50, 71, 119, 124, 115, 134, 3, 96, 121, 136, 130, 129, 122, 128, 135, 127, 133]; |
| 120, 0 × 18005 | [2, 4, 6, 8, 10, 12, 14, 15, 18, 19, 22, 23, 26, 27, 31, 35, 39, 43, 45, 46, 48, 51, 53, 54, 56, 59, 60, 61, 64, 67, 68, 69, 72, 77, 80, 85, 88, 90, 93, 96, 98, 101, 104, 105, 107, 108, 110, 111, 114, 117, 121, 1, 3, 5, 7, 9, 11, 13, 17, 21, 25, 30, 34, 38, 42, 44, 47, 50, 52, 55, 58, 63, 66, 71, 76, 79, 84, 87, 89, 92, 95, 97, 100, 103, 106, 109, 113, 116, 120, 122, 16, 20, 24, 29, 33, 37, 41, 49, 57, 62, 65, 70, 75, 78, 83, 86, 91, 94, 99, 102, 112, 115, 119, 123, 28, 32, 36, 40, 74, 82, 118, 124, 73, 81, 125, 126, 127, 128, 129, 130, 131, 132, 133, 134, 135, 136]; or [2, 4, 6, 8, 10, 12, 14, 15, 18, 19, 22, 23, 26, 27, 31, 35, 39, 43, 45, 46, 48, 51, 53, 54, 56, 59, 60, 61, 64, 67, 68, 69, 72, 77, 80, 85, 88, 90, 93, 96, 98, 101, 104, 105, 107, 108, 110, 111, 114, 117, 121, 1, 3, 5, 7, 9, 11, 13, 17, 21, 25, 30, 34, 38, 42, 44, 47, 50, 52, 55, 58, 63, 66, 71, 76, 79, 84, 87, 89, 92, 95, 97, 100, 103, 106, 109, 113, 116, 120, 122, 16, 20, 24, 28, 32, 36, 40, 49, 57, 62, 65, 70, 73, 78, 81, 86, 91, 94, 99, 102, 112, 115, 118, 136, 29, 33, 37, 41, 75, 83, 119, 123, 74, 82, 124, 125, 126, 127, 128, 129, 130, 131, 132, 133, 134, 135]; |
| 120, 0 × 1C001 | [14, 15, 16, 28, 30, 32, 42, 43, 45, 47, 48, 56, 60, 64, 70, 71, 72, 74, 75, 76, 78, 79, 80, 84, 86, 90, 94, 96, 98, 99, 101, 102, 104, 105, 106, 108, 109, 111, 120, 121, 13, 27, 29, 31, 41, 44, 46, 55, 59, 63, 69, 73, 77, 83, 85, 89, 93, 95, 97, 100, 103, 107, 110, 119, 122, 12, 26, 40, 54, 58, 62, 68, 82, 88, 92, 118, 123, 11, 25, 39, 53, 57, 61, 67, 81, 87, 91, 117, 124, 10, 24, 38, 52, 66, 116, 125, 9, 23, 37, 51, 65, 115, 126, 8, 22, 36, 50, 114, 127, 7, 21, 35, 49, 113, 128, 6, 20, 34, 112, 129, 5, 19, 33, 130, 4, 18, 131, 3, 17, 132, 2, 133, 1, 134, 135, 136]; or [14, 15, 16, 28, 30, 32, 42, 43, 45, 47, 48, 56, 60, 64, 70, 71, 72, 74, 75, 76, 78, 79, 80, 84, 86, 90, 94, 96, 98, 99, 101, 102, 104, 105, 106, 108, 109, 111, 120, 121, 13, 27, 29, 31, 41, 44, 46, 55, 59, 63, 69, 73, 77, 83, 85, 89, 93, 95, 97, 100, 103, 107, 110, 119, 122, 12, 26, 40, 54, 58, 62, 68, 82, 88, 92, 118, 123, 11, 25, 39, 53, 57, 61, 67, 81, 87, 91, 117, 124, 10, 24, 38, 52, 66, 116, 125, 9, 23, 37, 51, 65, 115, 126, 1, 17, 33, 49, 112, 136, 8, 22, 36, 50, 114, 127, 7, 21, 35, 113, 128, 6, 20, 34, 129, 5, 19, 130, 4, 18, 131, 3, 132, 2, 133, 134, 135]; |
| 120, 0 × 10811 | [4, 8, 11, 12, 19, 20, 22, 26, 27, 28, 32, 33, 35, 42, 48, 49, 51, 52, 55, 56, 58, 63, 64, 65, 66, 67, 70, 72, 74, 75, 77, 80, 81, 82, 84, 86, 88, 95, 96, 98, 104, 106, 107, 108, 109, 110, 113, 115, 118, 121, 3, 7, 10, 18, 21, 25, 31, 34, 41, 47, 50, 54, 57, 62, 69, 71, 73, 76, 79, 83, 85, 87, 94, 97, 103, 105, 112, 114, 117, 120, 122, 2, 6, 9, 17, 24, 30, 40, 46, 53, 61, 68, 78, 93, 102, 111, 116, 119, 123, 1, 5, 16, 23, 29, 39, 45, 60, 92, 101, 124, 15, 38, 44, 59, 91, 100, 125, 14, 37, 43, 90, 99, 126, 13, 36, 89, 127, 128, 129, 130, 131, 132, 133, 134, 135, 136]; or [4, 8, 11, 12, 19, 20, 22, 26, 27, 28, 32, 33, 35, 42, 48, 49, 51, 52, 55, 56, 58, 63, 64, 65, 66, 67, 70, 72, 74, 75, 77, 80, 81, 82, 84, 86, 88, 95, 96, 98, 104, 106, 107, 108, 109, 110, 113, 115, 118, |

TABLE 3-continued

| Typical K, typical CRC polynomial | Interleaved sequence |
|---|---|
| | 121, 5, 9, 13, 16, 17, 24, 25, 31, 37, 38, 40, 47, 53, 54, 57, 60, 61, 68, 69, 71, 79, 85, 87, 89, 91, 93, 100, 101, 103, 111, 112, 114, 120, 132, 15, 23, 30, 36, 39, 46, 59, 62, 76, 78, 90, 92, 99, 102, 117, 119, 133, 3, 7, 14, 29, 45, 73, 83, 116, 134, 10, 18, 21, 34, 41, 50, 94, 97, 105, 122, 2, 6, 123, 44, 135, 1, 43, 136, 124, 125, 126, 127, 128, 129, 130, 131]; |
| 120, 0 × 1E2E9 | [3, 5, 7, 10, 11, 12, 13, 15, 19, 20, 23, 25, 26, 29, 30, 31, 32, 34, 36, 37, 38, 39, 40, 42, 43, 45, 46, 50, 52, 59, 61, 63, 64, 65, 66, 67, 68, 69, 70, 76, 77, 80, 81, 83, 84, 86, 87, 89, 93, 97, 100, 102, 105, 106, 107, 108, 110, 111, 114, 115, 116, 117, 119, 120, 121, 2, 4, 6, 9, 14, 18, 22, 24, 28, 33, 35, 41, 44, 49, 51, 58, 60, 62, 75, 79, 82, 85, 88, 92, 96, 99, 101, 104, 109, 113, 118, 122, 1, 8, 17, 21, 27, 48, 57, 74, 78, 91, 95, 98, 103, 112, 123, 16, 47, 56, 73, 90, 94, 124, 55, 72, 125, 54, 71, 126, 53, 127, 128, 129, 130, 131, 132, 133, 134, 135, 136]; or [2, 3, 4, 5, 8, 9, 11, 13, 15, 16, 17, 19, 22, 25, 27, 28, 30, 32, 33, 35, 38, 45, 46, 47, 49, 50, 52, 56, 58, 59, 60, 62, 68, 69, 70, 73, 74, 76, 78, 87, 89, 90, 93, 94, 99, 100, 103, 104, 106, 110, 112, 113, 115, 118, 124, 1, 7, 10, 12, 14, 18, 21, 24, 26, 29, 31, 34, 37, 44, 48, 51, 55, 57, 61, 67, 72, 75, 77, 86, 88, 92, 98, 102, 105, 109, 111, 114, 117, 125, 6, 23, 41, 42, 53, 54, 63, 64, 80, 91, 95, 96, 97, 101, 108, 120, 130, 20, 36, 40, 79, 107, 119, 131, 39, 43, 66, 85, 132, 65, 84, 133, 83, 128, 71, 81, 134, 82, 129, 135, 116, 121, 126, 136, 122, 123, 127]; |
| 120, 0 × 1D20B | [1, 2, 4, 7, 8, 12, 13, 14, 22, 28, 29, 32, 33, 35, 36, 37, 39, 40, 41, 43, 45, 47, 53, 57, 59, 60, 61, 64, 66, 67, 68, 69, 70, 72, 75, 76, 77, 78, 79, 80, 82, 83, 87, 89, 90, 95, 99, 100, 101, 103, 104, 105, 106, 107, 108, 110, 114, 117, 119, 121, 3, 6, 11, 21, 27, 31, 34, 38, 42, 44, 46, 52, 56, 58, 63, 65, 71, 74, 81, 86, 88, 94, 98, 102, 109, 113, 116, 118, 120, 122, 5, 10, 20, 26, 30, 51, 55, 62, 73, 85, 93, 97, 112, 115, 123, 9, 19, 25, 50, 54, 84, 92, 96, 111, 124, 18, 24, 49, 91, 125, 17, 23, 48, 126, 16, 127, 15, 128, 129, 130, 131, 132, 133, 134, 135, 136]; or [3, 4, 12, 16, 19, 21, 25, 27, 28, 29, 31, 32, 33, 35, 37, 38, 39, 40, 43, 44, 48, 49, 50, 51, 53, 54, 56, 58, 59, 64, 66, 67, 68, 71, 72, 74, 81, 84, 86, 97, 98, 100, 101, 103, 107, 108, 109, 112, 116, 119, 130, 2, 11, 15, 18, 20, 24, 26, 30, 34, 36, 42, 47, 52, 55, 57, 63, 65, 70, 73, 80, 83, 85, 96, 99, 102, 106, 111, 115, 118, 120, 131, 1, 10, 14, 17, 23, 41, 46, 62, 69, 79, 82, 95, 105, 110, 114, 117, 132, 5, 6, 8, 13, 45, 60, 76, 88, 89, 90, 92, 104, 135, 22, 61, 87, 94, 113, 122, 7, 75, 77, 78, 121, 93, 123, 9, 124, 91, 125, 133, 134, 136, 126, 127, 128, 129]; |
| 120, 0 × 1B101 | [8, 12, 13, 15, 26, 28, 29, 30, 31, 34, 36, 37, 40, 41, 43, 45, 46, 52, 56, 58, 62, 65, 66, 67, 69, 72, 74, 77, 78, 80, 81, 83, 85, 89, 90, 93, 96, 97, 98, 99, 100, 101, 103, 106, 107, 108, 117, 119, 121, 7, 11, 14, 25, 27, 33, 35, 39, 42, 44, 51, 55, 57, 61, 64, 68, 71, 73, 76, 79, 82, 84, 88, 92, 95, 102, 105, 116, 118, 122, 6, 10, 24, 32, 38, 50, 54, 60, 63, 70, 75, 87, 91, 94, 104, 115, 123, 5, 9, 23, 49, 53, 59, 86, 114, 124, 4, 22, 48, 113, 120, 125, 3, 21, 47, 112, 126, 2, 20, 111, 127, 1, 19, 110, 128, 18, 109, 129, 17, 130, 16, 131, 132, 133, 134, 135, 136]; or [8, 12, 13, 15, 26, 28, 29, 30, 31, 34, 36, 37, 40, 41, 43, 45, 46, 52, 56, 58, 62, 65, 66, 67, 69, 72, 74, 77, 78, 80, 81, 83, 85, 89, 90, 93, 96, 97, 98, 99, 100, 101, 103, 106, 107, 108, 117, 119, 121, 7, 11, 14, 25, 27, 33, 35, 39, 42, 44, 51, 55, 57, 61, 64, 68, 71, 73, 76, 79, 82, 84, 88, 92, 95, 102, 105, 116, 118, 122, 6, 10, 24, 32, 38, 50, 54, 60, 63, 70, 75, 87, 91, 94, 104, 115, 123, 5, 9, 23, 49, 53, 59, 86, 114, 124, 4, 22, 48, 113, 120, 125, 1, 16, 47, 109, 136, 3, 21, 112, 126, 2, 20, 111, 127, 19, 110, 128, 17, 18, 134, 135, 129, 133, 130, 131, 132]; |
| 120, 0 × 15AC9 | [3, 7, 11, 13, 15, 16, 18, 21, 23, 31, 33, 34, 36, 38, 39, 40, 46, 47, 48, 50, 51, 54, 55, 56, 57, 60, 65, 66, 75, 79, 80, 82, 83, 84, 87, 91, 94, 95, 97, 98, 104, 105, 106, 108, 110, 111, 112, 116, 117, 119, 120, 121, 2, 6, 10, 12, 14, 17, 20, 22, 30, 32, 35, 37, 45, 49, 53, 59, 64, 74, 78, 81, 86, 90, 93, 96, 103, 107, 109, 115, 118, 122, 1, 5, 9, 19, 29, 44, 52, 58, 63, 73, 77, 85, 89, 92, 102, 114, 123, 4, 8, 28, 43, 62, 72, 76, 88, 101, 113, 124, 27, 42, 61, 71, 100, 125, 26, 41, 70, 99, 126, 25, 69, 127, 24, 68, 128, 67, 129, 130, 131, 132, 133, 134, 135, 136]; or [2, 5, 9, 13, 15, 17, 18, 20, 23, 25, 33, 35, 36, 38, 40, 41, 42, 48, 49, 50, 52, 53, 56, 57, 58, 59, 62, 67, 68, 77, 81, 82, 84, 85, 86, 89, 93, 96, 97, 99, 100, 106, 107, 108, 110, 112, 113, 114, 118, 119, 135, 3, 7, 11, 16, 21, 31, 34, 39, 46, 47, 51, 54, 55, 60, 65, 66, 75, 79, 80, 83, 87, 91, 94, 95, 98, 104, 105, 111, 116, 117, 120, 121, 1, 4, 8, 12, 14, 19, 22, 24, 32, 37, 61, 76, 88, 92, 109, 136, 6, 10, 30, 45, 64, 74, 78, 90, 103, 115, 122, 29, 44, 63, 73, 102, 123, 28, 43, 72, 101, 124, 27, 71, 125, 26, 70, 126, 69, 127, 132, 133, 134, 128, 129, 130, 131]; |
| 120, 0 × 17085 | [2, 4, 6, 7, 8, 10, 11, 13, 14, 15, 17, 19, 20, 22, 23, 24, 25, 26, 28, 32, 34, 36, 37, 38, 39, 43, 44, 45, 48, 54, 55, 56, 58, 60, 61, 62, 65, |

TABLE 3-continued

| Typical K, typical CRC polynomial | Interleaved sequence |
|---|---|
| | 66, 68, 69, 71, 75, 76, 77, 78, 79, 80, 82, 83, 86, 87, 88, 89, 90, 91, 92, 93, 94, 95, 96, 97, 99, 101, 102, 106, 109, 110, 112, 114, 115, 116, 117, 118, 119, 121, 1, 3, 5, 9, 12, 16, 18, 21, 27, 31, 33, 35, 42, 47, 53, 57, 59, 64, 67, 70, 74, 81, 85, 98, 100, 105, 108, 111, 113, 120, 122, 30, 41, 46, 52, 63, 73, 84, 104, 107, 123, 29, 40, 51, 72, 103, 124, 50, 125, 49, 126, 127, 128, 129, 130, 131, 132, 133, 134, 135, 136]; or [5, 7, 9, 10, 12, 14, 18, 19, 21, 25, 28, 30, 35, 38, 39, 41, 42, 44, 45, 46, 48, 52, 53, 55, 59, 61, 62, 63, 64, 65, 67, 68, 71, 73, 74, 79, 81, 82, 83, 84, 85, 96, 100, 101, 102, 104, 106, 107, 108, 109, 113, 118, 123, 1, 8, 13, 15, 17, 22, 24, 31, 33, 47, 49, 51, 56, 58, 66, 70, 76, 77, 86, 87, 88, 99, 103, 105, 110, 111, 112, 116, 134, 4, 6, 11, 20, 27, 29, 34, 37, 40, 43, 54, 60, 72, 78, 80, 95, 117, 120, 124, 3, 16, 23, 26, 36, 50, 57, 69, 94, 98, 119, 125, 32, 75, 89, 90, 92, 93, 114, 115, 128, 91, 129, 2, 97, 126, 127, 130, 131, 132, 133, 121, 135, 122, 136]; |
| 120, 0 × 1D169 | [3, 5, 8, 9, 10, 11, 13, 16, 18, 19, 21, 24, 25, 27, 28, 29, 30, 32, 33, 36, 39, 41, 42, 43, 44, 45, 53, 55, 58, 60, 63, 64, 66, 67, 68, 69, 73, 74, 77, 79, 80, 83, 84, 85, 86, 87, 88, 92, 93, 95, 97, 99, 100, 101, 102, 103, 105, 109, 110, 111, 112, 113, 114, 115, 119, 121, 2, 4, 7, 12, 15, 17, 20, 23, 26, 31, 35, 38, 40, 52, 54, 57, 59, 62, 65, 72, 76, 78, 82, 91, 94, 96, 98, 104, 108, 118, 122, 1, 6, 14, 22, 34, 37, 51, 56, 61, 71, 75, 81, 90, 107, 117, 120, 123, 50, 70, 89, 106, 116, 124, 49, 125, 48, 126, 47, 127, 46, 128, 129, 130, 131, 132, 133, 134, 135, 136]; or [1, 3, 4, 7, 8, 10, 11, 16, 17, 18, 19, 20, 21, 25, 26, 27, 28, 29, 32, 33, 38, 39, 44, 45, 48, 50, 51, 53, 56, 58, 59, 60, 64, 65, 71, 73, 83, 91, 94, 95, 96, 97, 100, 102, 104, 106, 109, 110, 115, 118, 119, 120, 126, 2, 6, 9, 15, 22, 40, 43, 52, 57, 61, 67, 68, 69, 70, 76, 79, 81, 82, 86, 87, 88, 89, 90, 93, 98, 101, 103, 105, 107, 108, 113, 114, 116, 124, 5, 14, 31, 37, 42, 49, 66, 72, 75, 78, 80, 85, 92, 112, 125, 30, 34, 35, 41, 47, 63, 74, 99, 129, 24, 36, 46, 62, 77, 111, 130, 13, 23, 55, 131, 12, 54, 84, 117, 132, 135, 127, 121, 122, 128, 123, 136, 133, 134]; |
| 120, 0 × 1B55D | [2, 3, 6, 7, 8, 9, 10, 13, 18, 19, 23, 24, 25, 26, 28, 29, 32, 35, 36, 38, 42, 46, 51, 52, 54, 55, 56, 60, 61, 62, 64, 69, 70, 75, 77, 78, 82, 83, 84, 86, 88, 89, 90, 91, 92, 95, 97, 98, 99, 104, 111, 112, 113, 114, 119, 120, 121, 1, 5, 12, 17, 22, 27, 31, 34, 37, 41, 45, 50, 53, 59, 63, 68, 74, 76, 81, 85, 87, 94, 96, 103, 110, 118, 122, 4, 11, 16, 21, 30, 33, 40, 44, 49, 58, 67, 73, 80, 93, 102, 109, 117, 123, 15, 20, 39, 43, 48, 57, 66, 72, 79, 101, 108, 116, 124, 14, 47, 65, 71, 100, 107, 115, 125, 106, 126, 105, 127, 128, 129, 130, 131, 132, 133, 134, 135, 136]; or [2, 5, 11, 12, 14, 19, 20, 21, 24, 25, 27, 29, 31, 36, 39, 43, 44, 45, 47, 48, 49, 50, 51, 54, 56, 60, 63, 65, 68, 70, 75, 78, 83, 85, 86, 87, 91, 92, 93, 99, 100, 101, 102, 104, 105, 106, 108, 109, 110, 111, 118, 120, 127, 1, 4, 10, 13, 18, 23, 26, 28, 30, 35, 38, 42, 46, 53, 55, 59, 62, 64, 67, 69, 74, 77, 82, 84, 90, 98, 103, 107, 117, 119, 128, 3, 6, 8, 15, 16, 22, 32, 34, 37, 40, 41, 66, 71, 73, 79, 81, 88, 89, 95, 97, 113, 134, 7, 33, 52, 58, 61, 72, 76, 80, 94, 96, 112, 116, 135, 9, 114, 121, 57, 115, 136, 17, 122, 129, 133, 124, 130, 123, 125, 131, 126, 132]; |
| 120, 0 × 197CB | [1, 2, 4, 6, 8, 9, 10, 11, 14, 15, 17, 21, 22, 25, 26, 27, 29, 32, 35, 36, 38, 39, 40, 41, 42, 43, 44, 45, 47, 48, 51, 52, 53, 54, 57, 61, 62, 63, 65, 66, 67, 69, 75, 76, 78, 79, 81, 83, 85, 86, 87, 90, 91, 92, 97, 99, 102, 108, 110, 114, 115, 116, 117, 118, 119, 120, 121, 3, 5, 7, 13, 16, 20, 24, 28, 31, 34, 37, 46, 50, 56, 60, 64, 68, 74, 77, 80, 82, 84, 89, 96, 98, 101, 107, 109, 113, 122, 12, 19, 23, 30, 33, 49, 55, 59, 73, 88, 95, 100, 106, 112, 123, 18, 58, 72, 94, 105, 111, 124, 71, 93, 104, 125, 70, 103, 126, 127, 128, 129, 130, 131, 132, 133, 134, 135, 136]; or [3, 5, 6, 8, 10, 13, 17, 18, 20, 21, 30, 34, 36, 38, 39, 40, 41, 42, 45, 46, 47, 51, 53, 55, 57, 58, 63, 69, 72, 74, 76, 77, 80, 82, 83, 86, 91, 92, 94, 95, 96, 100, 102, 105, 106, 107, 110, 111, 114, 115, 116, 117, 120, 124, 2, 4, 7, 9, 12, 16, 19, 29, 33, 35, 37, 44, 50, 52, 54, 56, 62, 68, 71, 73, 75, 79, 81, 85, 90, 93, 99, 101, 104, 109, 113, 119, 125, 1, 11, 15, 28, 32, 43, 49, 61, 67, 70, 78, 84, 89, 98, 103, 108, 112, 118, 126, 22, 24, 27, 31, 48, 60, 64, 87, 97, 122, 26, 88, 133, 14, 23, 25, 59, 66, 134, 65, 135, 123, 127, 130, 129, 128, 121, 131, 136, 132]; |
| 120, 0 × 1A80B | [1, 2, 4, 7, 8, 9, 14, 20, 23, 24, 25, 28, 30, 31, 32, 33, 34, 39, 40, 44, 46, 47, 48, 50, 51, 55, 59, 60, 65, 67, 68, 69, 71, 72, 75, 76, 77, 82, 84, 88, 91, 92, 93, 95, 100, 102, 104, 105, 107, 108, 111, 112, 113, 116, 117, 119, 120, 121, 3, 6, 13, 19, 22, 27, 29, 38, 43, 45, 49, 54, 58, 64, 66, 70, 74, 81, 83, 87, 90, 94, 99, 101, 103, 106, 110, 115, 118, 122, 5, 12, 18, 21, 26, 37, 42, 53, 57, 63, 73, 80, 86, 89, 98, 109, 114, 123, 11, 17, 36, 41, 52, 56, 62, 79, 85, 97, 124, 10, 16, 35, 61, 78, 96, 125, 15, 126, 127, 128, 129, 130, 131, 132, 133, 134, 135, 136]; or [2, 3, 6, 7, 8, 10, 14, 16, 18, 19, 22, 24, 26, 35, 36, 39, 41, 42, 43, 45, 46, 52, 54, 56, 57, 59, 60, 61, 62, 63, 65, 67, 73, 75, |

TABLE 3-continued

| Typical K, typical CRC polynomial | Interleaved sequence |
|---|---|
| | 78, 82, 84, 87, 88, 89, 90, 92, 94, 97, 98, 99, 100, 102, 105, 108, 109, 111, 114, 119, 120, 132, 1, 5, 9, 13, 15, 17, 21, 23, 25, 34, 38, 40, 44, 51, 53, 55, 58, 64, 66, 72, 74, 77, 81, 83, 86, 91, 93, 96, 101, 104, 107, 110, 113, 118, 133, 4, 20, 28, 30, 31, 32, 33, 47, 48, 50, 68, 69, 71, 76, 95, 112, 116, 117, 121, 29, 49, 70, 85, 103, 106, 136, 27, 115, 122, 12, 37, 80, 134, 123, 11, 79, 135, 124, 125, 126, 127, 128, 129, 130, 131]; |
| 120, 0 × 1E771 | [4, 5, 6, 9, 14, 19, 22, 23, 24, 26, 28, 31, 36, 37, 41, 44, 47, 48, 49, 52, 53, 55, 57, 58, 62, 63, 66, 69, 72, 74, 75, 78, 79, 81, 82, 83, 84, 85, 87, 89, 91, 93, 95, 96, 99, 103, 104, 105, 106, 108, 109, 110, 111, 114, 116, 117, 118, 120, 121, 3, 8, 13, 18, 21, 25, 27, 30, 35, 40, 43, 46, 51, 54, 56, 61, 65, 68, 71, 73, 77, 80, 86, 88, 90, 92, 94, 98, 102, 107, 113, 115, 119, 122, 2, 7, 12, 17, 20, 29, 34, 39, 42, 45, 50, 60, 64, 67, 70, 76, 97, 101, 112, 123, 1, 11, 16, 33, 38, 59, 100, 124, 10, 15, 32, 125, 126, 127, 128, 129, 130, 131, 132, 133, 134, 135, 136]; or [1, 4, 8, 11, 14, 16, 18, 19, 21, 27, 28, 30, 32, 34, 36, 40, 42, 44, 46, 47, 48, 56, 58, 62, 63, 64, 65, 66, 67, 70, 71, 72, 73, 74, 76, 77, 80, 82, 83, 84, 87, 88, 91, 92, 94, 96, 97, 110, 113, 114, 115, 116, 117, 118, 130, 2, 6, 9, 10, 15, 20, 23, 26, 31, 33, 41, 43, 45, 51, 52, 54, 55, 57, 59, 68, 69, 93, 100, 101, 102, 103, 107, 108, 109, 111, 112, 120, 125, 5, 22, 24, 37, 49, 53, 75, 78, 79, 81, 85, 89, 95, 99, 104, 105, 106, 121, 3, 13, 25, 35, 61, 86, 90, 98, 119, 122, 7, 12, 29, 38, 39, 50, 127, 128, 136, 17, 60, 123, 124, 131, 129, 132, 133, 135, 126, 134]; |
| 120, 0 × 1D5D3 | [1, 2, 3, 5, 6, 8, 9, 10, 12, 14, 15, 16, 17, 19, 22, 23, 25, 26, 29, 30, 31, 35, 36, 37, 39, 40, 41, 42, 43, 45, 46, 49, 50, 53, 57, 58, 59, 60, 62, 63, 66, 69, 71, 74, 78, 82, 83, 85, 86, 87, 90, 93, 95, 99, 100, 106, 107, 108, 110, 112, 116, 117, 118, 119, 121, 4, 7, 11, 13, 18, 21, 24, 28, 34, 38, 44, 48, 52, 56, 61, 65, 68, 70, 73, 77, 81, 84, 89, 92, 94, 98, 105, 109, 111, 115, 120, 122, 20, 27, 33, 47, 51, 55, 64, 67, 72, 76, 80, 88, 91, 97, 104, 114, 123, 32, 54, 75, 79, 96, 103, 113, 124, 102, 125, 101, 126, 127, 128, 129, 130, 131, 132, 133, 134, 135, 136]; or [2, 4, 5, 6, 7, 12, 17, 18, 19, 20, 21, 22, 26, 28, 29, 30, 34, 36, 37, 39, 42, 46, 47, 59, 65, 67, 68, 69, 70, 75, 80, 81, 82, 83, 84, 85, 89, 91, 92, 93, 97, 99, 100, 102, 105, 109, 110, 125, 1, 3, 11, 16, 25, 27, 33, 35, 38, 41, 45, 58, 64, 66, 74, 79, 88, 90, 96, 98, 101, 104, 108, 126, 13, 24, 31, 32, 40, 43, 50, 51, 52, 53, 57, 61, 72, 73, 94, 111, 112, 114, 116, 117, 118, 120, 129, 10, 15, 23, 49, 56, 60, 71, 78, 95, 103, 113, 115, 119, 130, 8, 9, 14, 44, 62, 86, 106, 127, 54, 55, 76, 77, 133, 48, 63, 107, 135, 87, 122, 134, 123, 121, 124, 131, 132, 136, 128]; |
| 120, 0 × 1F29F | [1, 5, 6, 7, 10, 12, 13, 14, 17, 20, 21, 23, 25, 26, 27, 28, 30, 33, 36, 37, 38, 44, 45, 46, 47, 50, 52, 54, 55, 56, 60, 62, 64, 65, 70, 71, 72, 73, 74, 78, 79, 81, 82, 84, 89, 91, 94, 95, 97, 98, 102, 104, 105, 109, 110, 111, 114, 115, 116, 117, 118, 119, 120, 121, 4, 9, 11, 16, 19, 22, 24, 29, 32, 35, 43, 49, 51, 53, 59, 61, 63, 69, 77, 80, 83, 88, 90, 93, 96, 101, 103, 108, 113, 122, 3, 8, 15, 18, 31, 34, 42, 48, 58, 68, 76, 87, 92, 100, 107, 112, 123, 2, 41, 57, 67, 75, 86, 99, 106, 124, 40, 66, 85, 125, 39, 126, 127, 128, 129, 130, 131, 132, 133, 134, 135, 136]; or [1, 2, 4, 5, 8, 10, 11, 12, 15, 16, 20, 23, 24, 26, 27, 29, 31, 32, 35, 36, 38, 41, 43, 45, 48, 52, 53, 54, 56, 57, 58, 62, 65, 67, 69, 72, 74, 75, 78, 79, 81, 83, 84, 86, 87, 90, 94, 95, 98, 99, 100, 102, 105, 106, 108, 109, 113, 124, 7, 9, 14, 17, 19, 21, 22, 28, 30, 33, 47, 49, 50, 51, 59, 60, 61, 63, 77, 80, 82, 88, 89, 91, 93, 96, 101, 103, 111, 122, 6, 39, 40, 42, 66, 71, 73, 76, 85, 104, 110, 112, 117, 133, 3, 13, 18, 34, 64, 68, 92, 114, 115, 116, 118, 119, 130, 25, 37, 55, 97, 107, 135, 44, 46, 120, 131, 70, 132, 134, 121, 136, 123, 125, 126, 127, 128, 129]; |
| 120, 0 × 15935 | [2, 5, 6, 9, 10, 11, 14, 16, 17, 18, 21, 25, 27, 28, 29, 30, 31, 34, 37, 38, 40, 41, 42, 43, 45, 46, 48, 53, 54, 55, 56, 58, 59, 60, 62, 63, 69, 70, 71, 76, 78, 80, 81, 84, 88, 89, 90, 92, 93, 94, 96, 98, 103, 104, 106, 107, 111, 113, 114, 115, 116, 119, 121, 1, 4, 8, 13, 15, 20, 24, 26, 33, 36, 39, 44, 47, 52, 57, 61, 68, 75, 77, 79, 83, 87, 91, 95, 97, 102, 105, 110, 112, 118, 122, 3, 7, 12, 19, 23, 32, 35, 51, 67, 74, 82, 86, 101, 109, 117, 120, 123, 22, 50, 66, 73, 85, 100, 108, 124, 49, 65, 72, 99, 125, 64, 126, 127, 128, 129, 130, 131, 132, 133, 134, 135, 136]; or [3, 4, 5, 8, 11, 13, 14, 16, 17, 20, 22, 23, 24, 26, 27, 28, 30, 31, 34, 35, 37, 39, 44, 45, 48, 51, 53, 59, 61, 63, 64, 69, 70, 71, 72, 76, 78, 80, 81, 83, 85, 89, 90, 91, 92, 97, 98, 100, 102, 108, 110, 113, 116, 117, 129, 2, 7, 10, 12, 15, 19, 21, 25, 29, 33, 36, 38, 43, 47, 50, 52, 58, 60, 62, 68, 75, 77, 79, 82, 84, 88, 96, 99, 101, 107, 109, 112, 115, 130, 1, 6, 9, 18, 32, 42, 46, 49, 57, 67, 74, 87, 95, 106, 111, 114, 120, 131, 41, 54, 65, 86, 94, 103, 105, 118, 126, 40, 56, 66, 93, 104, 119, 127, 55, 73, 132, 128, 121, 122, 125, 135, 136, 133, 134, 123, 124]; |

TABLE 3-continued

| Typical K, typical CRC polynomial | Interleaved sequence |
|---|---|
| 120, 0 × 18DED | [2, 3, 4, 5, 6, 8, 13, 15, 16, 17, 20, 21, 22, 23, 25, 26, 29, 30, 34, 36, 41, 42, 44, 50, 51, 52, 53, 54, 56, 60, 61, 62, 63, 64, 65, 66, 69, 72, 74, 75, 77, 80, 84, 85, 86, 87, 88, 90, 96, 97, 104, 106, 107, 109, 113, 116, 117, 118, 119, 120, 121, 1, 7, 12, 14, 19, 24, 28, 33, 35, 40, 43, 49, 55, 59, 68, 71, 73, 76, 79, 83, 89, 95, 103, 105, 108, 112, 115, 122, 11, 18, 27, 32, 39, 48, 58, 67, 70, 78, 82, 94, 102, 111, 114, 123, 10, 31, 38, 47, 57, 81, 93, 101, 110, 124, 9, 37, 46, 92, 100, 125, 45, 91, 99, 126, 98, 127, 128, 129, 130, 131, 132, 133, 134, 135, 136]; or [1, 6, 7, 8, 11, 12, 14, 15, 16, 17, 21, 23, 24, 31, 33, 34, 37, 38, 40, 46, 47, 48, 49, 53, 54, 55, 57, 59, 60, 61, 62, 63, 66, 67, 68, 72, 75, 79, 81, 82, 83, 91, 93, 94, 101, 104, 105, 106, 109, 110, 111, 117, 120, 128, 4, 5, 13, 18, 19, 22, 28, 29, 35, 39, 41, 45, 64, 71, 73, 74, 76, 77, 78, 80, 84, 85, 88, 95, 100, 102, 108, 112, 113, 114, 118, 132, 3, 10, 27, 30, 32, 44, 58, 70, 87, 92, 99, 107, 116, 119, 133, 2, 9, 20, 26, 36, 43, 52, 69, 86, 98, 115, 134, 25, 42, 51, 56, 90, 97, 135, 65, 96, 123, 50, 103, 126, 121, 129, 89, 136, 122, 130, 127, 131, 124, 125]; |
| 120, 0 × 1AAE5 | [2, 4, 5, 7, 8, 10, 12, 13, 17, 18, 20, 27, 28, 33, 34, 35, 36, 38, 39, 40, 41, 42, 45, 46, 47, 49, 50, 52, 53, 54, 55, 56, 58, 59, 60, 62, 66, 70, 75, 78, 81, 83, 85, 86, 87, 89, 91, 92, 94, 96, 98, 101, 102, 105, 108, 112, 113, 114, 115, 116, 117, 118, 119, 120, 121, 1, 3, 6, 9, 11, 16, 19, 26, 32, 37, 44, 48, 51, 57, 61, 65, 69, 74, 77, 80, 82, 84, 88, 90, 93, 95, 97, 100, 104, 107, 111, 122, 15, 25, 31, 43, 64, 68, 73, 76, 79, 99, 103, 106, 110, 123, 14, 24, 30, 63, 67, 72, 109, 124, 23, 29, 71, 125, 22, 126, 21, 127, 128, 129, 130, 131, 132, 133, 134, 135, 136]; or [1, 5, 6, 7, 10, 12, 18, 19, 20, 21, 22, 23, 24, 26, 27, 31, 32, 33, 36, 38, 39, 40, 45, 48, 50, 53, 55, 56, 57, 58, 61, 64, 65, 70, 71, 72, 77, 78, 81, 83, 84, 86, 88, 89, 90, 92, 93, 99, 100, 101, 105, 106, 108, 111, 127, 3, 4, 11, 13, 15, 16, 17, 25, 28, 35, 37, 41, 42, 43, 44, 46, 49, 51, 59, 62, 66, 68, 73, 75, 76, 79, 91, 98, 102, 103, 110, 123, 2, 14, 30, 34, 47, 54, 63, 67, 69, 74, 85, 97, 104, 107, 109, 124, 9, 29, 60, 82, 96, 125, 94, 95, 112, 113, 114, 115, 116, 117, 118, 119, 120, 126, 52, 80, 87, 130, 8, 131, 134, 135, 121, 136, 122, 132, 133, 128, 129]; |
| 120, 0 × 193B5 | [2, 5, 6, 7, 10, 11, 13, 14, 20, 23, 24, 27, 29, 35, 41, 43, 45, 46, 47, 48, 49, 51, 55, 56, 57, 58, 59, 62, 63, 64, 65, 67, 69, 70, 72, 73, 75, 77, 78, 79, 84, 85, 86, 87, 88, 89, 90, 93, 94, 96, 97, 99, 100, 102, 103, 104, 105, 107, 112, 113, 114, 115, 116, 117, 118, 119, 120, 121, 1, 4, 9, 12, 19, 22, 26, 28, 34, 40, 42, 44, 50, 54, 61, 66, 68, 71, 74, 76, 83, 92, 95, 98, 101, 106, 111, 122, 3, 8, 18, 21, 25, 33, 39, 53, 60, 82, 91, 110, 123, 17, 32, 38, 52, 81, 109, 124, 16, 31, 37, 80, 108, 125, 15, 30, 36, 126, 127, 128, 129, 130, 131, 132, 133, 134, 135, 136]; or [2, 3, 5, 6, 10, 12, 14, 15, 17, 18, 21, 24, 27, 28, 29, 30, 32, 34, 35, 36, 40, 42, 43, 44, 45, 48, 49, 54, 55, 56, 57, 58, 59, 67, 69, 70, 71, 74, 80, 83, 86, 87, 88, 89, 93, 94, 96, 97, 100, 104, 105, 106, 108, 111, 126, 1, 4, 9, 11, 13, 16, 20, 23, 26, 31, 33, 39, 41, 47, 53, 66, 68, 73, 79, 82, 85, 92, 95, 99, 103, 107, 110, 127, 7, 8, 22, 25, 51, 60, 61, 64, 72, 76, 78, 90, 91, 98, 101, 123, 19, 38, 50, 52, 63, 75, 77, 81, 109, 124, 46, 65, 102, 115, 133, 37, 62, 114, 134, 113, 135, 84, 119, 129, 112, 116, 117, 118, 120, 125, 130, 131, 132, 121, 136, 122, 128]; |
| 120, 0 × 12341 | [6, 8, 9, 12, 13, 20, 21, 22, 24, 27, 28, 29, 30, 31, 32, 33, 35, 37, 39, 44, 46, 48, 49, 51, 52, 55, 56, 60, 61, 62, 63, 65, 66, 72, 74, 77, 78, 84, 88, 90, 91, 92, 97, 100, 106, 107, 109, 110, 112, 113, 114, 115, 116, 117, 118, 119, 120, 121, 5, 7, 11, 19, 23, 26, 34, 36, 38, 43, 45, 47, 50, 54, 59, 64, 71, 73, 76, 83, 87, 89, 96, 99, 105, 108, 111, 122, 4, 10, 18, 25, 42, 53, 58, 70, 75, 82, 86, 95, 98, 104, 123, 3, 17, 41, 57, 69, 81, 85, 94, 103, 124, 2, 16, 40, 68, 80, 93, 102, 125, 1, 15, 67, 79, 101, 126, 14, 127, 128, 129, 130, 131, 132, 133, 134, 135, 136]; or [2, 3, 7, 8, 9, 12, 13, 14, 15, 16, 18, 20, 23, 25, 26, 28, 30, 32, 35, 37, 38, 39, 40, 42, 43, 44, 45, 48, 50, 51, 52, 54, 57, 59, 61, 62, 63, 65, 68, 71, 74, 77, 82, 85, 86, 88, 90, 92, 94, 97, 101, 103, 104, 108, 111, 127, 4, 10, 17, 19, 24, 27, 29, 33, 41, 46, 58, 60, 64, 66, 72, 73, 76, 78, 79, 84, 91, 96, 98, 99, 107, 110, 118, 130, 6, 11, 31, 47, 49, 67, 75, 81, 83, 87, 93, 95, 100, 106, 109, 117, 131, 5, 22, 36, 56, 70, 80, 89, 105, 116, 132, 1, 21, 55, 69, 115, 133, 34, 112, 113, 119, 120, 134, 53, 102, 128, 114, 135, 121, 136, 122, 129, 123, 124, 125, 126]; |
| 120, 0 × 14D79 | [3, 4, 5, 9, 10, 11, 15, 17, 18, 19, 20, 27, 28, 29, 30, 31, 35, 37, 41, 42, 44, 47, 48, 49, 50, 51, 54, 57, 60, 65, 69, 70, 71, 72, 75, 76, 77, 78, 79, 81, 84, 89, 90, 91, 92, 94, 95, 96, 97, 98, 99, 102, 104, 105, 108, 109, 116, 117, 118, 121, 2, 8, 14, 16, 26, 34, 36, 40, 43, 46, 53, 56, 59, 64, 68, 74, 80, 83, 88, 93, 101, 103, 107, 115, 122, 1, 7, 13, 25, 33, 39, 45, 52, 55, 58, 63, 67, 73, 82, 87, 100, 106, 114, 123, 6, 12, 24, 32, 38, 62, 66, 86, 113, 120, 124, 23, 61, 85, 112, 119, 125, 22, 111, 126, 21, 110, 127, 128, 129, 130, 131, 132, 133, 134, 135, |

TABLE 3-continued

| Typical K, typical CRC polynomial | Interleaved sequence |
|---|---|
| | 136]; or [3, 4, 5, 9, 10, 11, 15, 17, 18, 19, 20, 27, 28, 29, 30, 31, 35, 37, 41, 42, 44, 47, 48, 49, 50, 51, 54, 57, 60, 65, 69, 70, 71, 72, 75, 76, 77, 78, 79, 81, 84, 89, 90, 91, 92, 94, 95, 96, 97, 98, 99, 102, 104, 105, 108, 109, 116, 117, 118, 121, 2, 8, 14, 16, 26, 34, 36, 40, 43, 46, 53, 56, 59, 64, 68, 74, 80, 83, 88, 93, 101, 103, 107, 115, 122, 1, 7, 13, 25, 33, 39, 45, 52, 55, 58, 63, 67, 73, 82, 87, 100, 106, 114, 123, 6, 23, 24, 38, 61, 66, 85, 86, 112, 113, 119, 120, 125, 21, 22, 32, 62, 110, 111, 127, 128, 12, 131, 135, 136, 129, 130, 132, 133, 134, 124, 126]; |
| 120, 0 × 13613 | [1, 2, 3, 5, 7, 8, 9, 10, 15, 19, 21, 22, 25, 26, 33, 36, 38, 40, 42, 44, 45, 47, 51, 55, 57, 58, 59, 61, 63, 64, 65, 67, 68, 70, 72, 73, 75, 76, 77, 78, 79, 84, 85, 86, 89, 91, 92, 94, 95, 99, 100, 101, 103, 106, 107, 112, 114, 116, 117, 118, 121, 4, 6, 14, 18, 20, 24, 32, 35, 37, 39, 41, 43, 46, 50, 54, 56, 60, 62, 66, 69, 71, 74, 83, 88, 90, 93, 98, 102, 105, 111, 113, 115, 122, 13, 17, 23, 31, 34, 49, 53, 82, 87, 97, 104, 110, 120, 123, 12, 16, 30, 48, 52, 81, 96, 109, 119, 124, 11, 29, 80, 108, 125, 28, 126, 27, 127, 128, 129, 130, 131, 132, 133, 134, 135, 136]; or [2, 11, 14, 15, 16, 17, 18, 22, 23, 28, 29, 31, 32, 35, 36, 38, 40, 41, 43, 45, 49, 51, 54, 58, 59, 61, 62, 67, 68, 70, 72, 77, 78, 79, 81, 83, 84, 85, 86, 89, 90, 93, 96, 97, 100, 104, 107, 108, 109, 110, 112, 113, 114, 115, 116, 117, 120, 131, 1, 10, 13, 21, 27, 30, 34, 37, 39, 42, 44, 48, 50, 53, 57, 60, 66, 69, 71, 76, 80, 82, 88, 92, 95, 99, 103, 106, 111, 119, 132, 5, 8, 9, 12, 25, 26, 52, 55, 56, 64, 73, 75, 87, 91, 94, 98, 101, 102, 125, 4, 7, 24, 33, 47, 63, 65, 74, 105, 126, 3, 19, 118, 121, 6, 20, 46, 127, 134, 128, 130, 135, 136, 129, 122, 123, 124, 133]; |
| 120, 0 × 1F497 | [1, 3, 8, 9, 20, 21, 23, 25, 26, 29, 33, 34, 40, 41, 43, 48, 49, 50, 51, 53, 58, 59, 60, 61, 63, 65, 66, 69, 70, 71, 74, 75, 76, 79, 80, 81, 84, 88, 89, 105, 106, 108, 113, 114, 121, 2, 7, 19, 22, 24, 28, 32, 39, 42, 47, 52, 57, 62, 64, 68, 73, 78, 83, 87, 104, 107, 112, 122, 6, 18, 27, 31, 38, 46, 56, 67, 72, 77, 82, 86, 103, 111, 123, 5, 17, 30, 37, 45, 55, 85, 102, 110, 124, 4, 16, 36, 44, 54, 101, 109, 125, 15, 35, 100, 120, 126, 14, 99, 119, 127, 13, 98, 118, 128, 12, 97, 117, 129, 11, 96, 116, 130, 10, 95, 115, 131, 94, 132, 93, 133, 92, 134, 91, 135, 90, 136]; or [1, 3, 8, 9, 20, 21, 23, 25, 26, 29, 33, 34, 40, 41, 43, 48, 49, 50, 51, 53, 58, 59, 60, 61, 63, 65, 66, 69, 70, 71, 74, 75, 76, 79, 80, 81, 84, 88, 89, 105, 106, 108, 113, 114, 121, 2, 6, 18, 22, 27, 28, 31, 38, 42, 46, 52, 56, 62, 67, 72, 77, 82, 83, 86, 103, 107, 111, 123, 5, 17, 30, 37, 45, 47, 55, 57, 68, 73, 78, 85, 102, 110, 124, 7, 19, 24, 32, 39, 64, 87, 104, 112, 122, 4, 16, 36, 44, 54, 101, 109, 125, 12, 92, 117, 134, 10, 35, 90, 115, 136, 15, 100, 120, 126, 14, 99, 119, 127, 13, 93, 118, 133, 11, 91, 116, 135, 98, 128, 97, 129, 96, 130, 95, 131, 94, 132]; |
| 120, 0 × 3CBED | [2, 3, 4, 5, 6, 8, 9, 10, 17, 18, 19, 20, 25, 27, 29, 30, 34, 36, 40, 41, 42, 47, 49, 50, 51, 52, 53, 54, 55, 56, 57, 60, 61, 63, 66, 67, 68, 69, 71, 77, 78, 81, 82, 83, 84, 85, 86, 88, 91, 92, 96, 97, 98, 99, 101, 102, 103, 104, 108, 110, 112, 115, 116, 117, 120, 121, 1, 7, 16, 24, 26, 28, 33, 35, 39, 46, 48, 59, 62, 65, 70, 76, 80, 87, 90, 95, 100, 107, 109, 111, 114, 119, 122, 15, 23, 32, 38, 45, 58, 64, 75, 79, 89, 94, 106, 113, 118, 123, 14, 22, 31, 37, 44, 74, 93, 105, 124, 13, 21, 43, 73, 125, 12, 72, 126, 11, 127, 128, 129, 130, 131, 132, 133, 134, 135, 136, 137]; or [1, 2, 3, 4, 6, 8, 11, 13, 15, 16, 17, 20, 21, 23, 27, 31, 34, 35, 36, 42, 47, 48, 51, 52, 53, 56, 60, 63, 65, 72, 77, 84, 85, 86, 87, 90, 96, 100, 102, 111, 112, 113, 114, 115, 116, 120, 128, 9, 12, 18, 22, 26, 28, 29, 30, 32, 37, 38, 41, 44, 49, 50, 59, 61, 64, 67, 71, 73, 78, 80, 82, 88, 89, 92, 94, 97, 101, 106, 109, 110, 119, 136, 10, 14, 19, 24, 55, 58, 62, 66, 68, 69, 70, 79, 83, 91, 93, 98, 99, 104, 105, 118, 127, 7, 33, 43, 45, 46, 54, 74, 76, 103, 108, 117, 132, 5, 39, 57, 75, 95, 123, 25, 126, 40, 107, 133, 134, 81, 129, 130, 131, 124, 125, 121, 135, 137, 122]; |
| 120, 0 × 3D173 | [1, 2, 3, 6, 8, 9, 10, 11, 13, 14, 15, 16, 18, 19, 20, 23, 25, 26, 27, 28, 30, 31, 35, 38, 40, 41, 42, 43, 45, 46, 47, 48, 49, 51, 52, 53, 54, 57, 59, 60, 61, 62, 66, 67, 68, 71, 73, 74, 77, 79, 82, 83, 85, 87, 89, 90, 91, 92, 94, 95, 98, 100, 101, 103, 104, 111, 112, 113, 114, 116, 117, 118, 120, 121, 5, 7, 12, 17, 22, 24, 29, 34, 37, 39, 44, 50, 56, 58, 65, 70, 72, 76, 78, 81, 84, 86, 88, 93, 97, 99, 102, 110, 115, 119, 122, 4, 21, 33, 36, 55, 64, 69, 75, 80, 96, 109, 123, 32, 63, 108, 124, 107, 125, 106, 126, 105, 127, 128, 129, 130, 131, 132, 133, 134, 135, 136, 137]; or [1, 4, 6, 10, 11, 15, 16, 17, 18, 21, 23, 27, 30, 32, 34, 36, 38, 42, 43, 45, 48, 49, 52, 55, 57, 60, 61, 65, 66, 69, 75, 76, 77, 78, 79, 80, 81, 84, 87, 91, 96, 99, 100, 103, 104, 107, 113, 114, 115, 117, 118, 119, 120, 125, 3, 7, 8, 12, 24, 25, 28, 29, 37, 39, 40, 44, 50, 54, 58, 59, 62, 63, 67, 71, 72, 73, 82, 83, 89, 92, 93, 98, 112, 135, 2, 5, 13, 19, 22, 33, 46, 53, 56, 64, 85, 86, 94, 101, 102, 106, 111, 126, 14, 26, 31, 41, 70, 74, 95, 97, 108, 109, 110, 116, 129, 20, |

TABLE 3-continued

| Typical K, typical CRC polynomial | Interleaved sequence |
|---|---|
| | 35, 47, 68, 88, 130, 131, 122, 123, 9, 90, 105, 132, 51, 136, 124, 133, 134, 121, 137, 127, 128]; |
| 120, 0 × 38355 | [2, 9, 10, 12, 13, 15, 16, 17, 18, 19, 20, 21, 24, 27, 28, 29, 30, 34, 35, 36, 37, 38, 41, 47, 49, 50, 51, 54, 57, 59, 67, 70, 74, 79, 80, 81, 82, 84, 85, 91, 92, 93, 94, 96, 97, 98, 99, 100, 103, 104, 106, 107, 108, 110, 112, 113, 114, 116, 117, 118, 119, 121, 1, 8, 11, 14, 23, 26, 33, 40, 46, 48, 53, 56, 58, 66, 69, 73, 78, 83, 90, 95, 102, 105, 109, 111, 115, 122, 7, 22, 25, 32, 39, 45, 52, 55, 65, 68, 72, 77, 89, 101, 123, 6, 31, 44, 64, 71, 76, 88, 124, 5, 43, 63, 75, 87, 125, 4, 42, 62, 86, 120, 126, 3, 61, 127, 60, 128, 129, 130, 131, 132, 133, 134, 135, 136, 137]; or [1, 2, 3, 4, 10, 12, 13, 15, 16, 23, 25, 26, 28, 32, 35, 40, 42, 43, 48, 49, 50, 53, 55, 56, 58, 59, 60, 61, 68, 69, 71, 72, 75, 76, 80, 84, 85, 87, 92, 96, 97, 102, 104, 106, 107, 110, 111, 112, 113, 116, 117, 136, 5, 9, 11, 14, 17, 18, 24, 30, 34, 38, 39, 44, 45, 46, 47, 52, 54, 63, 64, 65, 66, 67, 73, 78, 79, 83, 86, 90, 91, 93, 98, 100, 105, 109, 114, 118, 120, 127, 8, 27, 29, 31, 33, 37, 51, 62, 77, 82, 89, 95, 99, 101, 108, 119, 128, 7, 20, 21, 22, 41, 70, 74, 81, 103, 115, 123, 6, 19, 36, 88, 94, 124, 125, 126, 57, 121, 122, 130, 131, 132, 133, 129, 134, 137, 135]; |
| 120, 0 × 3B43B | [1, 2, 5, 6, 8, 9, 11, 12, 13, 14, 17, 20, 21, 23, 27, 28, 29, 32, 33, 35, 37, 40, 44, 45, 46, 47, 50, 53, 55, 56, 59, 60, 61, 65, 66, 67, 68, 71, 72, 73, 75, 79, 80, 81, 83, 88, 90, 91, 92, 97, 99, 100, 103, 106, 108, 109, 111, 113, 114, 115, 116, 121, 4, 7, 10, 16, 19, 22, 26, 31, 34, 36, 39, 43, 49, 52, 54, 58, 64, 70, 74, 78, 82, 87, 89, 96, 98, 102, 105, 107, 110, 112, 120, 122, 3, 15, 18, 25, 30, 38, 42, 48, 51, 57, 63, 69, 77, 86, 95, 101, 104, 119, 123, 24, 41, 62, 76, 85, 94, 118, 124, 84, 93, 117, 125, 126, 127, 128, 129, 130, 131, 132, 133, 134, 135, 136, 137]; or [1, 4, 6, 7, 9, 11, 13, 15, 19, 23, 24, 28, 31, 34, 38, 40, 41, 44, 46, 48, 51, 52, 53, 54, 55, 60, 61, 62, 65, 67, 75, 76, 83, 85, 86, 87, 88, 91, 92, 94, 95, 96, 97, 98, 99, 101, 104, 105, 106, 107, 110, 111, 113, 115, 116, 118, 124, 5, 10, 14, 16, 32, 33, 35, 37, 42, 43, 47, 56, 59, 63, 64, 68, 70, 78, 82, 84, 90, 93, 100, 108, 112, 114, 126, 2, 12, 17, 18, 20, 21, 26, 30, 39, 45, 49, 50, 58, 66, 71, 72, 77, 89, 102, 117, 119, 120, 131, 22, 36, 69, 74, 81, 103, 109, 127, 25, 29, 57, 132, 3, 8, 73, 80, 128, 79, 129, 27, 130, 125, 121, 122, 123, 136, 137, 133, 134, 135]; |
| 120, 0 × 3D5F3 | [1, 2, 3, 6, 7, 8, 12, 14, 18, 20, 25, 26, 27, 28, 30, 31, 32, 35, 36, 37, 39, 41, 44, 47, 50, 52, 54, 55, 58, 60, 61, 62, 65, 72, 74, 75, 76, 79, 82, 86, 87, 88, 90, 91, 92, 95, 97, 98, 100, 103, 105, 107, 109, 111, 112, 113, 115, 116, 117, 118, 119, 120, 121, 5, 11, 13, 17, 19, 24, 29, 34, 38, 40, 43, 46, 49, 51, 53, 57, 59, 64, 71, 73, 78, 81, 85, 89, 94, 96, 99, 102, 104, 106, 108, 110, 114, 122, 4, 10, 16, 23, 33, 42, 45, 48, 56, 63, 70, 77, 80, 84, 93, 101, 123, 9, 15, 22, 69, 83, 124, 21, 68, 125, 67, 126, 66, 127, 128, 129, 130, 131, 132, 133, 134, 135, 136, 137]; or [2, 3, 7, 9, 10, 11, 12, 15, 17, 19, 20, 22, 23, 25, 27, 29, 39, 40, 43, 44, 46, 48, 54, 55, 58, 59, 60, 61, 63, 66, 68, 72, 73, 77, 78, 80, 82, 84, 87, 88, 90, 92, 93, 94, 98, 99, 100, 101, 102, 105, 106, 108, 110, 114, 116, 119, 120, 129, 1, 6, 8, 14, 16, 18, 21, 24, 26, 28, 38, 42, 45, 47, 53, 57, 62, 65, 67, 71, 76, 79, 81, 83, 86, 89, 91, 97, 104, 107, 109, 113, 115, 118, 130, 4, 5, 30, 32, 33, 35, 36, 41, 50, 52, 64, 69, 74, 75, 117, 126, 34, 49, 51, 56, 70, 95, 103, 111, 127, 13, 31, 85, 96, 131, 37, 112, 132, 125, 121, 137, 122, 133, 134, 123, 136, 124, 128, 135]; |
| 120, 0 × 32861 | [5, 6, 10, 11, 12, 13, 15, 18, 20, 21, 22, 24, 26, 32, 35, 36, 37, 38, 41, 42, 44, 45, 47, 50, 51, 54, 56, 57, 60, 63, 68, 72, 74, 78, 79, 81, 84, 86, 88, 89, 90, 91, 92, 93, 95, 96, 97, 98, 99, 100, 101, 102, 103, 104, 105, 107, 110, 112, 113, 115, 116, 119, 121, 4, 9, 14, 17, 19, 23, 25, 31, 34, 40, 43, 46, 49, 53, 55, 59, 62, 67, 71, 73, 77, 80, 83, 85, 87, 94, 106, 109, 111, 114, 118, 120, 122, 3, 8, 16, 30, 33, 39, 48, 52, 58, 61, 66, 70, 76, 82, 108, 117, 123, 2, 7, 29, 65, 69, 75, 124, 1, 28, 64, 125, 27, 126, 127, 128, 129, 130, 131, 132, 133, 134, 135, 136, 137]; or [1, 7, 8, 11, 12, 16, 17, 18, 19, 20, 22, 24, 26, 27, 30, 31, 33, 35, 38, 39, 40, 41, 44, 46, 47, 49, 50, 52, 54, 55, 56, 57, 58, 60, 67, 68, 69, 72, 73, 76, 78, 83, 85, 87, 89, 94, 101, 103, 104, 108, 111, 112, 113, 114, 115, 118, 126, 5, 6, 10, 13, 15, 21, 32, 36, 37, 42, 45, 51, 63, 74, 79, 81, 84, 86, 88, 90, 91, 92, 93, 95, 96, 97, 98, 99, 100, 102, 105, 107, 110, 116, 119, 121, 23, 25, 29, 34, 43, 48, 53, 59, 66, 71, 75, 77, 82, 117, 120, 127, 4, 28, 62, 65, 70, 80, 128, 3, 14, 61, 64, 109, 129, 134, 2, 9, 135, 106, 122, 123, 130, 131, 136, 137, 124, 125, 132, 133]; |
| 120, 0 × 37B89 | [3, 6, 7, 8, 11, 14, 17, 18, 19, 22, 29, 30, 31, 32, 36, 39, 40, 41, 44, 50, 51, 52, 54, 56, 57, 62, 63, 64, 66, 67, 68, 69, 73, 74, 76, 78, 80, 81, 82, 84, 85, 88, 94, 95, 96, 98, 101, 103, 110, 112, 113, 114, 119, 120, 121, 2, 5, 10, 13, 16, 21, 28, 35, 38, 43, 49, 53, 55, 61, 65, 72, 75, 77, 79, 83, 87, 93, 97, 100, 102, 109, 111, 118, 122, 1, 4, 9, 12, 15, 20, 27, 34, 37, 42, 48, 60, 71, 86, 92, 99, 108, 117, 123, 26, 33, |

TABLE 3-continued

| Typical K, typical CRC polynomial | Interleaved sequence |
|---|---|
| | 47, 59, 70, 91, 107, 116, 124, 25, 46, 58, 90, 106, 115, 125, 24, 45, 89, 105, 126, 23, 104, 127, 128, 129, 130, 131, 132, 133, 134, 135, 136, 137]; or [1, 3, 6, 8, 14, 17, 19, 25, 26, 30, 31, 33, 36, 37, 39, 41, 47, 48, 51, 52, 55, 56, 59, 61, 63, 64, 67, 70, 73, 74, 75, 76, 77, 78, 80, 85, 87, 91, 92, 95, 96, 99, 100, 101, 105, 106, 107, 111, 118, 120, 134, 2, 12, 23, 27, 34, 38, 45, 49, 58, 60, 62, 69, 71, 82, 83, 88, 89, 93, 104, 108, 112, 113, 114, 115, 119, 133, 7, 11, 18, 22, 29, 32, 40, 44, 50, 54, 57, 66, 68, 81, 84, 94, 98, 103, 110, 121, 5, 10, 13, 16, 21, 28, 35, 43, 53, 65, 72, 79, 97, 102, 109, 122, 4, 9, 15, 20, 42, 86, 117, 123, 137, 24, 46, 90, 135, 116, 136, 129, 132, 124, 125, 128, 126, 130, 127, 131]; |
| 120, 0 × 24001 | [14, 17, 28, 34, 42, 45, 48, 51, 56, 68, 70, 73, 82, 84, 85, 90, 96, 98, 101, 102, 104, 107, 110, 112, 113, 116, 119, 121, 13, 16, 27, 33, 41, 44, 47, 50, 55, 67, 69, 72, 81, 83, 89, 95, 97, 100, 103, 106, 109, 111, 115, 118, 122, 12, 15, 26, 32, 40, 43, 46, 49, 54, 66, 71, 80, 88, 94, 99, 105, 108, 114, 117, 123, 11, 25, 31, 39, 53, 65, 79, 87, 93, 124, 10, 24, 30, 38, 52, 64, 78, 86, 92, 125, 9, 23, 29, 37, 63, 77, 91, 126, 8, 22, 36, 62, 76, 120, 127, 7, 21, 35, 61, 75, 128, 6, 20, 60, 74, 129, 5, 19, 59, 130, 4, 18, 58, 131, 3, 57, 132, 2, 133, 1, 134, 135, 136, 137]; or [14, 17, 28, 34, 42, 45, 48, 51, 56, 68, 70, 73, 82, 84, 85, 90, 96, 98, 101, 102, 104, 107, 110, 112, 113, 116, 119, 121, 13, 16, 27, 33, 41, 44, 47, 50, 55, 67, 69, 72, 81, 83, 89, 95, 97, 100, 103, 106, 109, 111, 115, 118, 122, 12, 15, 26, 32, 40, 43, 46, 49, 54, 66, 71, 80, 88, 94, 99, 105, 108, 114, 117, 123, 11, 25, 31, 39, 53, 65, 79, 87, 93, 124, 10, 24, 30, 38, 52, 64, 78, 86, 92, 125, 9, 23, 29, 37, 63, 77, 91, 126, 3, 20, 59, 76, 135, 2, 19, 36, 58, 75, 136, 8, 22, 62, 120, 127, 7, 21, 35, 61, 128, 6, 60, 74, 129, 1, 18, 57, 137, 5, 130, 4, 131, 132, 133, 134]; |
| 120, 0 × 374D1 | [4, 6, 7, 8, 10, 12, 13, 14, 15, 16, 17, 18, 19, 22, 23, 24, 26, 28, 32, 33, 34, 35, 37, 41, 43, 45, 46, 50, 51, 52, 54, 57, 64, 66, 71, 72, 75, 76, 79, 80, 81, 84, 85, 89, 90, 91, 92, 93, 95, 97, 98, 99, 100, 105, 111, 112, 113, 114, 116, 119, 120, 121, 3, 5, 9, 11, 21, 25, 27, 31, 36, 40, 42, 44, 49, 53, 56, 63, 65, 70, 74, 78, 83, 88, 94, 96, 104, 110, 115, 118, 122, 2, 20, 30, 39, 48, 55, 62, 69, 73, 77, 82, 87, 103, 109, 117, 123, 1, 29, 38, 47, 61, 68, 86, 102, 108, 124, 60, 67, 101, 107, 125, 59, 106, 126, 58, 127, 128, 129, 130, 131, 132, 133, 134, 135, 136, 137]; or [3, 5, 6, 9, 10, 11, 13, 14, 17, 19, 20, 21, 23, 24, 25, 29, 32, 35, 37, 39, 41, 43, 45, 46, 48, 50, 51, 52, 53, 56, 59, 61, 66, 70, 72, 78, 84, 87, 88, 89, 91, 97, 98, 100, 102, 106, 107, 108, 111, 112, 117, 118, 120, 128, 2, 4, 8, 12, 16, 18, 22, 28, 31, 34, 36, 38, 40, 42, 44, 47, 49, 55, 58, 60, 65, 69, 71, 77, 83, 86, 90, 96, 99, 101, 105, 110, 116, 119, 129, 1, 7, 15, 27, 30, 33, 54, 57, 64, 68, 76, 82, 85, 95, 104, 109, 115, 130, 67, 73, 75, 79, 81, 103, 113, 135, 26, 62, 80, 93, 94, 114, 127, 74, 136, 92, 121, 125, 63, 126, 137, 122, 123, 124, 131, 132, 134, 133]; |
| 120, 0 × 3B001 | [12, 13, 15, 16, 17, 24, 26, 30, 32, 34, 36, 37, 38, 40, 44, 47, 50, 51, 52, 61, 63, 64, 67, 69, 73, 74, 75, 76, 79, 80, 83, 86, 88, 89, 90, 94, 95, 96, 97, 101, 102, 103, 105, 106, 107, 109, 110, 111, 112, 113, 114, 117, 118, 120, 121, 11, 14, 23, 25, 29, 31, 33, 35, 39, 43, 46, 49, 60, 62, 66, 68, 72, 78, 82, 85, 87, 93, 100, 104, 108, 116, 119, 122, 10, 22, 28, 42, 45, 48, 59, 65, 71, 77, 81, 84, 92, 99, 115, 123, 9, 21, 27, 41, 58, 70, 91, 98, 124, 8, 20, 57, 125, 7, 19, 56, 126, 6, 18, 55, 127, 5, 54, 128, 4, 53, 129, 3, 130, 2, 131, 1, 132, 133, 134, 135, 136, 137]; or [12, 13, 15, 16, 17, 24, 26, 30, 32, 34, 36, 37, 38, 40, 44, 47, 50, 51, 52, 61, 63, 64, 67, 69, 73, 74, 75, 76, 79, 80, 83, 86, 88, 89, 90, 94, 95, 96, 97, 101, 102, 103, 105, 106, 107, 109, 110, 111, 112, 113, 114, 117, 118, 120, 121, 1, 2, 19, 25, 27, 28, 31, 33, 35, 41, 42, 45, 46, 48, 49, 54, 62, 66, 68, 70, 71, 78, 82, 84, 85, 87, 92, 99, 116, 136, 14, 18, 39, 53, 65, 77, 81, 91, 98, 104, 108, 115, 119, 137, 11, 23, 29, 43, 60, 72, 93, 100, 122, 10, 22, 59, 123, 9, 21, 58, 124, 8, 20, 57, 125, 7, 56, 126, 6, 55, 127, 5, 128, 3, 4, 133, 129, 130, 131, 132, 134, 135]; |
| 120, 0 × 3CADD | [2, 3, 6, 21, 22, 26, 27, 28, 29, 42, 45, 47, 49, 50, 52, 63, 64, 65, 66, 67, 69, 74, 75, 84, 86, 87, 88, 91, 92, 95, 98, 105, 106, 109, 111, 112, 115, 116, 117, 118, 119, 120, 121, 1, 5, 20, 25, 41, 44, 46, 48, 51, 62, 68, 73, 83, 85, 90, 94, 97, 104, 108, 110, 114, 122, 4, 19, 24, 40, 43, 61, 72, 82, 89, 93, 96, 103, 107, 113, 123, 18, 23, 39, 60, 71, 81, 102, 124, 17, 38, 59, 70, 80, 101, 125, 16, 37, 58, 79, 100, 126, 15, 36, 57, 78, 99, 127, 14, 35, 56, 77, 128, 13, 34, 55, 76, 129, 12, 33, 54, 130, 11, 32, 53, 131, 10, 31, 132, 9, 30, 133, 8, 134, 7, 135, 136, 137]; or [2, 3, 6, 21, 22, 26, 27, 28, 29, 42, 45, 47, 49, 50, 52, 63, 64, 65, 66, 67, 69, 74, 75, 84, 86, 87, 88, 91, 92, 95, 98, 105, 106, 109, 111, 112, 115, 116, 117, 118, 119, 120, 121, 4, 10, 11, 12, 24, 31, 33, 35, 46, 53, 55, 57, 58, 68, 71, 72, 77, 81, 90, 99, 100, 102, 103, 104, 108, 113, 132, 5, 9, 23, 30, 32, 34, 44, 48, 54, 56, 70, 73, 76, 80, 89, 101, 107, 114, 133, 1, 8, 43, 51, 79, 85, 97, 134, 7, |

TABLE 3-continued

| Typical K, typical CRC polynomial | Interleaved sequence |
|---|---|
| | 93, 96, 110, 137, 20, 25, 41, 62, 83, 94, 122, 136, 18, 19, 39, 60, 61, 124, 78, 135, 40, 82, 123, 17, 38, 59, 125, 13, 14, 37, 130, 16, 126, 15, 128, 36, 129, 131, 127]; |
| 120, 0 × 2E49D | [2, 3, 9, 11, 15, 16, 21, 23, 24, 26, 28, 29, 30, 31, 35, 40, 43, 45, 46, 49, 51, 52, 53, 54, 55, 57, 58, 61, 62, 66, 68, 69, 70, 72, 75, 76, 77, 79, 82, 85, 86, 88, 89, 90, 93, 94, 98, 100, 102, 104, 107, 109, 110, 111, 113, 114, 115, 120, 121, 1, 8, 10, 14, 20, 22, 25, 27, 34, 39, 42, 44, 48, 50, 56, 60, 65, 67, 71, 74, 78, 81, 84, 87, 92, 97, 99, 101, 103, 106, 108, 112, 119, 122, 7, 13, 19, 33, 38, 41, 47, 59, 64, 73, 80, 83, 91, 96, 105, 118, 123, 6, 12, 18, 32, 37, 63, 95, 117, 124, 5, 17, 36, 116, 125, 4, 126, 127, 128, 129, 130, 131, 132, 133, 134, 135, 136, 137]; or [3, 5, 8, 10, 12, 13, 16, 17, 22, 24, 26, 27, 28, 29, 33, 34, 35, 36, 38, 40, 45, 46, 49, 50, 52, 54, 57, 59, 66, 79, 80, 83, 84, 85, 86, 88, 89, 91, 97, 98, 99, 100, 101, 104, 107, 110, 111, 113, 115, 116, 118, 119, 120, 125, 1, 6, 9, 11, 14, 18, 23, 31, 32, 37, 39, 44, 51, 56, 60, 62, 63, 69, 70, 71, 73, 76, 77, 78, 81, 92, 94, 95, 102, 103, 117, 124, 2, 4, 7, 15, 21, 25, 48, 53, 58, 65, 82, 87, 90, 96, 106, 109, 112, 114, 126, 20, 43, 47, 55, 64, 105, 108, 127, 30, 61, 68, 72, 75, 93, 121, 42, 67, 74, 122, 19, 128, 41, 129, 130, 136, 137, 131, 132, 133, 135, 123, 134]; |
| 120, 0 × 3685B | [1, 2, 7, 10, 11, 15, 17, 18, 19, 20, 22, 24, 27, 31, 33, 34, 37, 38, 39, 40, 41, 48, 49, 50, 52, 55, 56, 57, 59, 63, 64, 65, 68, 73, 77, 78, 79, 81, 82, 83, 84, 85, 91, 93, 96, 99, 103, 104, 105, 106, 108, 110, 111, 112, 116, 117, 119, 121, 6, 9, 14, 16, 21, 23, 26, 30, 32, 36, 47, 51, 54, 58, 62, 67, 72, 76, 80, 90, 92, 95, 98, 102, 107, 109, 115, 118, 120, 122, 5, 8, 13, 25, 29, 35, 46, 53, 61, 66, 71, 75, 89, 94, 97, 101, 114, 123, 4, 12, 28, 45, 60, 70, 74, 88, 100, 113, 124, 3, 44, 69, 87, 125, 43, 86, 126, 42, 127, 128, 129, 130, 131, 132, 133, 134, 135, 136, 137]; or [2, 5, 9, 10, 12, 14, 17, 18, 19, 23, 24, 25, 26, 27, 29, 30, 33, 34, 35, 37, 39, 44, 50, 53, 54, 55, 57, 60, 61, 62, 65, 68, 70, 71, 75, 76, 79, 82, 83, 88, 93, 94, 95, 96, 98, 99, 101, 102, 105, 109, 110, 111, 112, 115, 118, 120, 135, 1, 7, 11, 15, 20, 22, 31, 38, 40, 41, 48, 49, 52, 56, 59, 63, 64, 73, 77, 78, 81, 84, 85, 91, 103, 104, 106, 108, 116, 117, 119, 121, 4, 13, 21, 28, 32, 45, 66, 74, 89, 90, 97, 100, 107, 113, 124, 8, 16, 36, 43, 67, 69, 87, 92, 114, 136, 6, 47, 51, 58, 72, 80, 122, 46, 123, 42, 86, 127, 132, 133, 3, 137, 128, 125, 126, 129, 130, 131, 134]; |
| 120, 0 × 35FB1 | [4, 5, 7, 9, 11, 13, 14, 17, 19, 22, 24, 25, 26, 27, 28, 31, 32, 33, 35, 36, 38, 39, 41, 43, 44, 45, 47, 50, 57, 60, 61, 62, 63, 65, 67, 69, 70, 75, 76, 77, 78, 79, 80, 82, 84, 89, 90, 94, 96, 97, 98, 105, 109, 112, 116, 117, 118, 119, 120, 121, 3, 6, 8, 10, 12, 16, 18, 21, 23, 30, 34, 37, 40, 42, 46, 49, 56, 59, 64, 66, 68, 74, 81, 83, 88, 93, 95, 104, 108, 111, 115, 122, 2, 15, 20, 29, 48, 55, 58, 73, 87, 92, 103, 107, 110, 114, 123, 1, 54, 72, 86, 91, 102, 106, 113, 124, 53, 71, 85, 101, 125, 52, 100, 126, 51, 99, 127, 128, 129, 130, 131, 132, 133, 134, 135, 136, 137]; or [1, 2, 3, 4, 7, 8, 11, 13, 16, 17, 18, 19, 22, 26, 27, 28, 29, 31, 32, 33, 38, 41, 43, 48, 53, 56, 58, 62, 63, 64, 66, 67, 71, 73, 76, 81, 82, 83, 84, 86, 87, 88, 92, 93, 94, 97, 103, 106, 107, 109, 111, 114, 118, 119, 128, 5, 6, 20, 21, 23, 30, 35, 45, 46, 47, 49, 57, 59, 68, 75, 77, 79, 80, 85, 89, 91, 96, 98, 100, 105, 110, 112, 115, 117, 120, 131, 9, 14, 24, 25, 36, 39, 44, 50, 60, 61, 65, 69, 70, 78, 90, 116, 121, 10, 37, 52, 55, 72, 95, 108, 113, 126, 15, 40, 51, 54, 74, 99, 104, 127, 12, 34, 42, 137, 122, 123, 101, 125, 102, 124, 130, 133, 132, 134, 135, 136, 129]; |
| 120, 0 × 3B15D | [2, 3, 6, 7, 8, 9, 13, 14, 16, 17, 18, 19, 20, 21, 23, 24, 25, 26, 34, 37, 38, 41, 43, 45, 46, 63, 65, 66, 69, 70, 71, 72, 76, 77, 79, 80, 81, 82, 83, 84, 86, 87, 88, 89, 97, 100, 101, 104, 106, 108, 109, 121, 1, 5, 12, 15, 22, 33, 36, 40, 42, 44, 62, 64, 68, 75, 78, 85, 96, 99, 103, 105, 107, 122, 4, 11, 32, 35, 39, 61, 67, 74, 95, 98, 102, 123, 10, 31, 60, 73, 94, 124, 30, 59, 93, 125, 29, 58, 92, 126, 28, 57, 91, 120, 127, 27, 56, 90, 119, 128, 55, 118, 129, 54, 117, 130, 53, 116, 131, 52, 115, 132, 51, 114, 133, 50, 113, 134, 49, 112, 135, 48, 111, 136, 47, 110, 137]; or [1, 4, 6, 9, 10, 11, 12, 13, 16, 17, 18, 20, 23, 26, 31, 33, 35, 36, 41, 44, 46, 60, 64, 67, 69, 72, 73, 74, 75, 76, 79, 80, 81, 83, 86, 89, 94, 96, 98, 99, 104, 107, 109, 124, 2, 3, 5, 7, 14, 24, 28, 38, 40, 42, 43, 45, 48, 65, 66, 68, 70, 77, 87, 91, 101, 103, 105, 106, 108, 111, 136, 8, 15, 21, 22, 27, 30, 37, 39, 50, 71, 78, 84, 85, 90, 93, 100, 102, 113, 134, 19, 29, 49, 82, 92, 112, 135, 25, 34, 63, 88, 97, 121, 62, 122, 32, 61, 95, 123, 59, 125, 58, 126, 55, 118, 129, 54, 117, 130, 53, 116, 131, 52, 115, 132, 51, 114, 133, 47, 110, 137, 57, 120, 127, 56, 119, 128]; |
| 120, 0 × 67A71 | [4, 5, 6, 8, 9, 10, 11, 12, 14, 15, 16, 17, 18, 20, 22, 23, 24, 28, 29, 30, 31, 33, 40, 41, 43, 45, 46, 47, 48, 51, 54, 61, 62, 64, 65, 67, 69, 70, 72, 73, 74, 75, 80, 82, 83, 85, 86, 87, 88, 89, 91, 92, 95, 97, 101, 102, 104, 105, 106, 108, 113, 114, 115, 116, 117, 121, 3, 7, 13, 19, 21, 27, 32, 39, 42, 44, 50, 53, 60, 63, 66, 68, 71, 79, 81, 84, 90, 94, |

TABLE 3-continued

| Typical K, typical CRC polynomial | Interleaved sequence |
|---|---|
| | 96, 100, 103, 107, 112, 120, 122, 2, 26, 38, 49, 52, 59, 78, 93, 99, 111, 119, 123, 1, 25, 37, 58, 77, 98, 110, 118, 124, 36, 57, 76, 109, 125, 35, 56, 126, 34, 55, 127, 128, 129, 130, 131, 132, 133, 134, 135, 136, 137, 138]; or [2, 3, 4, 5, 6, 10, 11, 17, 18, 25, 26, 28, 32, 33, 34, 35, 36, 37, 38, 40, 41, 45, 49, 50, 52, 53, 54, 55, 58, 60, 62, 66, 67, 71, 77, 78, 79, 82, 83, 84, 85, 87, 90, 94, 99, 102, 104, 105, 107, 108, 110, 111, 113, 116, 120, 130, 7, 16, 22, 23, 24, 31, 43, 46, 47, 48, 57, 64, 69, 70, 72, 74, 75, 88, 93, 96, 98, 100, 101, 106, 112, 135, 1, 9, 27, 39, 44, 51, 59, 61, 65, 76, 81, 86, 89, 103, 109, 115, 119, 131, 15, 21, 30, 42, 56, 63, 68, 73, 92, 95, 97, 136, 8, 14, 20, 29, 91, 114, 137, 117, 126, 13, 19, 80, 118, 134, 12, 132, 121, 122, 123, 124, 138, 125, 133, 127, 128, 129]; |
| 120, 0 × 72001 | [13, 16, 17, 18, 26, 32, 34, 36, 39, 42, 43, 44, 45, 47, 48, 51, 52, 53, 54, 64, 65, 69, 70, 72, 77, 78, 80, 82, 89, 91, 95, 97, 99, 100, 102, 104, 105, 106, 109, 110, 111, 113, 114, 115, 117, 118, 121, 12, 15, 25, 31, 33, 35, 38, 41, 46, 50, 63, 68, 71, 76, 79, 81, 88, 90, 94, 96, 98, 101, 103, 108, 112, 116, 122, 11, 14, 24, 30, 37, 40, 49, 62, 67, 75, 87, 93, 107, 123, 10, 23, 29, 61, 66, 74, 86, 92, 120, 124, 9, 22, 28, 60, 73, 85, 119, 125, 8, 21, 27, 59, 84, 126, 7, 20, 58, 83, 127, 6, 19, 57, 128, 5, 56, 129, 4, 55, 130, 3, 131, 2, 132, 1, 133, 134, 135, 136, 137, 138]; or [13, 16, 17, 18, 26, 32, 34, 36, 39, 42, 43, 44, 45, 47, 48, 51, 52, 53, 54, 64, 65, 69, 70, 72, 77, 78, 80, 82, 89, 91, 95, 97, 99, 100, 102, 104, 105, 106, 109, 110, 111, 113, 114, 115, 117, 118, 121, 12, 15, 25, 31, 33, 35, 38, 41, 46, 50, 63, 68, 71, 76, 79, 81, 88, 90, 94, 96, 98, 101, 103, 108, 112, 116, 122, 11, 14, 24, 30, 37, 40, 49, 62, 67, 75, 87, 93, 107, 123, 10, 23, 29, 61, 66, 74, 86, 92, 120, 124, 9, 22, 28, 60, 73, 85, 119, 125, 1, 19, 27, 55, 83, 138, 8, 21, 59, 84, 126, 7, 20, 58, 127, 6, 57, 128, 5, 56, 129, 4, 130, 3, 134, 2, 135, 136, 131, 132, 133, 137]; |
| 120, 0 × 5F471 | [4, 5, 6, 8, 12, 14, 17, 18, 20, 27, 28, 30, 31, 33, 37, 38, 40, 42, 43, 44, 45, 47, 50, 51, 52, 53, 54, 55, 59, 60, 61, 65, 66, 68, 72, 73, 77, 80, 85, 87, 89, 92, 97, 98, 99, 102, 108, 110, 111, 112, 114, 115, 116, 121, 3, 7, 11, 13, 16, 19, 26, 29, 32, 36, 39, 41, 46, 49, 58, 64, 67, 71, 76, 79, 84, 86, 88, 91, 96, 101, 107, 109, 113, 122, 2, 10, 15, 25, 35, 48, 57, 63, 70, 75, 78, 83, 90, 95, 100, 106, 123, 1, 9, 24, 34, 56, 62, 69, 74, 82, 94, 105, 120, 124, 23, 81, 93, 104, 119, 125, 22, 103, 118, 126, 21, 117, 127, 128, 129, 130, 131, 132, 133, 134, 135, 136, 137, 138]; or [1, 2, 3, 7, 9, 14, 16, 18, 19, 25, 28, 32, 33, 43, 46, 47, 48, 51, 52, 53, 54, 57, 59, 62, 65, 76, 77, 79, 80, 81, 83, 85, 86, 87, 89, 90, 91, 93, 95, 97, 98, 100, 105, 107, 109, 110, 115, 116, 120, 134, 4, 5, 6, 8, 12, 17, 20, 27, 30, 31, 37, 38, 40, 42, 44, 45, 50, 55, 60, 61, 66, 68, 72, 73, 92, 99, 102, 108, 111, 112, 114, 121, 11, 13, 26, 29, 36, 39, 41, 49, 58, 64, 67, 71, 84, 88, 96, 101, 113, 122, 10, 15, 35, 63, 70, 75, 78, 106, 123, 24, 34, 56, 69, 74, 82, 94, 124, 22, 104, 117, 118, 137, 21, 103, 138, 119, 135, 133, 23, 136, 126, 131, 132, 125, 127, 128, 129, 130]; |
| 120, 0 × 7E42D | [2, 3, 4, 5, 7, 10, 12, 13, 14, 16, 17, 18, 19, 21, 24, 25, 27, 29, 30, 31, 38, 40, 41, 42, 43, 45, 46, 47, 49, 50, 52, 54, 55, 56, 58, 62, 67, 68, 69, 72, 75, 78, 81, 83, 86, 88, 89, 90, 93, 94, 97, 101, 105, 106, 108, 109, 110, 111, 116, 117, 121, 1, 6, 9, 11, 15, 20, 23, 26, 28, 37, 39, 44, 48, 51, 53, 57, 61, 66, 71, 74, 77, 80, 82, 85, 87, 92, 96, 100, 104, 107, 115, 120, 122, 8, 22, 36, 60, 65, 70, 73, 76, 79, 84, 91, 95, 99, 103, 114, 119, 123, 35, 59, 64, 98, 102, 113, 118, 124, 34, 63, 112, 125, 33, 126, 32, 127, 128, 129, 130, 131, 132, 133, 134, 135, 136, 137, 138]; or [1, 2, 4, 9, 14, 16, 23, 26, 28, 29, 30, 31, 33, 34, 36, 39, 40, 42, 49, 52, 53, 54, 55, 56, 58, 60, 62, 64, 65, 66, 67, 68, 70, 71, 72, 73, 75, 78, 81, 90, 92, 93, 94, 95, 98, 100, 101, 103, 104, 105, 109, 114, 116, 117, 134, 5, 6, 13, 18, 19, 20, 22, 24, 25, 35, 46, 48, 50, 57, 59, 61, 74, 77, 82, 91, 96, 97, 102, 108, 111, 113, 115, 118, 119, 120, 124, 3, 8, 10, 12, 15, 21, 27, 37, 41, 44, 63, 69, 76, 86, 89, 106, 107, 131, 7, 11, 38, 43, 45, 47, 85, 88, 99, 110, 112, 132, 51, 84, 87, 133, 17, 80, 125, 79, 83, 126, 32, 127, 128, 129, 130, 121, 122, 138, 123, 136, 137, 135]; |
| 120, 0 × 75761 | [5, 6, 8, 9, 14, 15, 16, 19, 22, 23, 25, 28, 29, 32, 34, 36, 39, 40, 41, 42, 43, 44, 45, 46, 48, 51, 52, 53, 54, 55, 56, 59, 60, 64, 65, 66, 69, 70, 73, 75, 76, 83, 86, 88, 89, 95, 97, 98, 101, 102, 103, 106, 108, 110, 112, 113, 114, 116, 118, 120, 121, 4, 7, 13, 18, 21, 24, 27, 31, 33, 35, 38, 47, 50, 58, 63, 68, 72, 74, 82, 85, 87, 94, 96, 100, 105, 107, 109, 111, 115, 117, 119, 122, 3, 12, 17, 20, 26, 30, 37, 49, 57, 62, 67, 71, 81, 84, 93, 99, 104, 123, 2, 11, 61, 80, 92, 124, 1, 10, 79, 91, 125, 78, 90, 126, 77, 127, 128, 129, 130, 131, 132, 133, 134, 135, 136, 137, 138]; or [2, 4, 5, 6, 7, 8, 9, 10, 11, 15, 16, 17, 20, 21, 22, 23, 26, 27, 32, 34, 35, 37, 38, 39, 44, 49, 56, 59, 60, 61, 63, 67, 70, 71, 73, 75, 76, 82, 85, 87, 89, 95, 97, 103, 107, 108, 109, 111, 112, 113, 114, 116, 120, 133, 1, 3, 14, 19, 25, 31, 33, 36, 43, 48, 55, 58, 62, 66, 69, 72, 74, 81, 84, 86, 88, 94, 96, 102, 106, 110, 115, |

TABLE 3-continued

| Typical K, typical CRC polynomial | Interleaved sequence |
|---|---|
| | 119, 134, 13, 28, 42, 47, 51, 53, 64, 65, 68, 77, 91, 98, 99, 101, 105, 117, 130, 12, 29, 30, 40, 45, 50, 54, 57, 90, 100, 104, 131, 18, 41, 46, 52, 83, 132, 24, 80, 92, 127, 118, 121, 122, 79, 93, 128, 138, 123, 124, 78, 129, 125, 137, 135, 136, 126]; |
| 120, 0 × 5ADF5 | [2, 5, 7, 9, 10, 13, 14, 15, 16, 20, 24, 28, 30, 31, 32, 34, 35, 37, 39, 40, 41, 42, 43, 44, 45, 46, 50, 51, 52, 54, 56, 58, 59, 62, 64, 65, 66, 67, 69, 70, 71, 72, 73, 74, 75, 77, 79, 81, 82, 83, 86, 87, 88, 90, 92, 93, 95, 97, 98, 100, 101, 102, 103, 104, 105, 106, 107, 110, 113, 114, 117, 119, 120, 121, 1, 4, 6, 8, 12, 19, 23, 27, 29, 33, 36, 38, 49, 53, 55, 57, 61, 63, 68, 76, 78, 80, 85, 89, 91, 94, 96, 99, 109, 112, 116, 118, 122, 3, 11, 18, 22, 26, 48, 60, 84, 108, 111, 115, 123, 17, 21, 25, 47, 124, 125, 126, 127, 128, 129, 130, 131, 132, 133, 134, 135, 136, 137, 138]; or [1, 2, 3, 5, 7, 8, 10, 12, 13, 19, 23, 24, 25, 26, 29, 34, 36, 39, 40, 43, 45, 46, 47, 48, 50, 54, 56, 60, 61, 62, 65, 69, 71, 72, 73, 79, 80, 84, 86, 87, 88, 89, 92, 93, 94, 95, 100, 101, 105, 106, 120, 127, 6, 11, 14, 15, 18, 21, 27, 32, 37, 41, 49, 51, 52, 63, 66, 77, 83, 85, 90, 99, 102, 109, 110, 111, 113, 114, 115, 116, 117, 118, 136, 16, 17, 28, 30, 33, 35, 44, 53, 55, 64, 68, 70, 75, 78, 97, 98, 103, 104, 108, 112, 131, 9, 20, 22, 31, 38, 57, 58, 59, 74, 82, 91, 96, 107, 119, 123, 67, 81, 124, 4, 42, 76, 126, 129, 130, 132, 133, 125, 128, 134, 135, 137, 121, 122, 138]; |
| 120, 0 × 649DD | [2, 3, 6, 8, 9, 12, 13, 14, 18, 22, 23, 25, 28, 29, 30, 34, 35, 36, 37, 41, 42, 44, 45, 46, 49, 51, 52, 53, 54, 55, 59, 61, 63, 64, 65, 67, 68, 69, 70, 75, 76, 77, 82, 83, 84, 85, 88, 90, 91, 92, 94, 95, 97, 99, 100, 101, 103, 105, 108, 112, 113, 114, 115, 118, 120, 121, 1, 5, 7, 11, 17, 21, 24, 27, 33, 40, 43, 48, 50, 58, 60, 62, 66, 74, 81, 87, 89, 93, 96, 98, 102, 104, 107, 111, 117, 119, 122, 4, 10, 16, 20, 26, 32, 39, 47, 57, 73, 80, 86, 106, 110, 116, 123, 15, 19, 31, 38, 56, 72, 79, 109, 124, 71, 78, 125, 126, 127, 128, 129, 130, 131, 132, 133, 134, 135, 136, 137, 138]; or [1, 7, 10, 14, 15, 17, 18, 19, 20, 21, 22, 23, 24, 26, 30, 31, 32, 34, 37, 38, 39, 40, 41, 51, 52, 55, 56, 59, 64, 67, 70, 72, 73, 77, 79, 80, 82, 91, 93, 94, 95, 100, 101, 103, 104, 107, 108, 109, 110, 112, 119, 120, 124, 3, 5, 8, 9, 11, 13, 33, 45, 48, 50, 53, 54, 58, 65, 69, 71, 78, 81, 84, 85, 86, 87, 92, 96, 97, 98, 99, 105, 106, 114, 116, 117, 132, 2, 4, 6, 12, 16, 25, 29, 44, 47, 49, 57, 63, 68, 76, 83, 90, 111, 113, 115, 133, 28, 36, 43, 46, 62, 75, 89, 134, 27, 66, 74, 102, 135, 61, 88, 118, 136, 35, 42, 60, 137, 128, 125, 126, 121, 138, 122, 123, 129, 130, 131, 127]; |
| 120, 0 × 6F159 | [3, 4, 9, 10, 11, 12, 13, 14, 15, 16, 17, 18, 19, 20, 21, 22, 23, 26, 27, 29, 30, 33, 36, 38, 40, 42, 44, 46, 51, 53, 54, 59, 60, 61, 62, 65, 66, 69, 70, 72, 75, 76, 77, 78, 81, 82, 84, 85, 90, 94, 96, 98, 99, 102, 103, 104, 105, 107, 110, 111, 114, 115, 117, 121, 2, 8, 25, 28, 32, 35, 37, 39, 41, 43, 45, 50, 52, 58, 64, 68, 71, 74, 80, 83, 89, 93, 95, 97, 101, 106, 109, 113, 116, 120, 122, 1, 7, 24, 31, 34, 49, 57, 63, 67, 73, 79, 88, 92, 100, 108, 112, 119, 123, 6, 48, 56, 87, 91, 118, 124, 5, 47, 55, 86, 125, 126, 127, 128, 129, 130, 131, 132, 133, 134, 135, 136, 137, 138]; or [1, 3, 4, 6, 7, 8, 21, 22, 24, 29, 35, 36, 37, 38, 39, 40, 41, 42, 43, 44, 46, 48, 50, 53, 54, 56, 57, 58, 60, 61, 63, 65, 67, 70, 73, 74, 76, 77, 79, 84, 85, 87, 90, 91, 93, 94, 95, 98, 100, 101, 103, 105, 108, 110, 112, 115, 117, 118, 119, 120, 124, 2, 5, 11, 26, 28, 30, 31, 33, 45, 47, 49, 55, 69, 71, 75, 81, 83, 86, 88, 92, 96, 97, 99, 102, 104, 109, 114, 116, 136, 10, 25, 27, 32, 34, 52, 64, 66, 68, 72, 80, 82, 107, 111, 113, 137, 9, 12, 13, 14, 15, 18, 51, 62, 89, 106, 129, 17, 59, 130, 16, 78, 131, 132, 19, 20, 23, 121, 122, 138, 123, 127, 128, 134, 125, 126, 133, 135]; |
| 120, 0 × 67785 | [2, 4, 6, 7, 9, 11, 12, 15, 16, 17, 19, 20, 22, 23, 25, 26, 33, 38, 39, 40, 41, 42, 46, 48, 51, 53, 56, 57, 59, 60, 62, 64, 65, 67, 69, 70, 73, 74, 75, 78, 79, 80, 86, 88, 89, 91, 92, 93, 94, 98, 102, 103, 104, 106, 109, 110, 111, 114, 116, 119, 120, 121, 1, 3, 5, 8, 10, 14, 18, 21, 24, 32, 37, 45, 47, 50, 52, 55, 58, 61, 63, 66, 68, 72, 77, 85, 87, 90, 97, 101, 105, 108, 113, 115, 118, 122, 13, 31, 36, 44, 49, 54, 71, 76, 84, 96, 100, 107, 112, 117, 123, 30, 35, 43, 83, 95, 99, 124, 29, 34, 82, 125, 28, 81, 126, 27, 127, 128, 129, 130, 131, 132, 133, 134, 135, 136, 137, 138]; or [1, 2, 4, 5, 8, 12, 13, 14, 15, 21, 22, 23, 25, 28, 31, 32, 33, 36, 37, 38, 40, 41, 42, 43, 44, 46, 49, 50, 54, 56, 57, 58, 60, 62, 63, 66, 71, 72, 73, 78, 80, 82, 83, 85, 86, 92, 94, 95, 96, 101, 104, 105, 107, 109, 110, 112, 113, 116, 117, 119, 128, 6, 7, 9, 11, 16, 17, 19, 20, 26, 39, 48, 51, 53, 59, 64, 65, 67, 69, 70, 74, 75, 79, 88, 89, 91, 93, 98, 102, 103, 106, 111, 114, 120, 121, 3, 10, 18, 24, 45, 47, 52, 55, 61, 68, 77, 87, 90, 97, 108, 115, 118, 122, 27, 34, 76, 81, 99, 138, 29, 134, 30, 35, 133, 84, 100, 123, 124, 129, 125, 126, 127, 135, 136, 137, 131, 132, 130]; |
| 120, 0 × 46001 | [13, 14, 18, 26, 28, 36, 39, 40, 41, 42, 44, 46, 49, 50, 52, 54, 56, 65, 66, 69, 72, 74, 78, 80, 82, 84, 85, 86, 88, 90, 91, 93, 94, 95, 97, 98, 101, 104, 105, 108, 110, 111, 113, 114, 116, 117, 121, 12, 17, 25, 27, 35, 38, 43, 45, 48, 51, 53, 55, 64, 68, 71, 73, 77, 79, 81, 83, 87, |

TABLE 3-continued

| Typical K, typical CRC polynomial | Interleaved sequence |
|---|---|
| | 89, 92, 96, 100, 103, 107, 109, 112, 115, 120, 122, 11, 16, 24, 34, 37, 47, 63, 67, 70, 76, 99, 102, 106, 119, 123, 10, 15, 23, 33, 62, 75, 118, 124, 9, 22, 32, 61, 125, 8, 21, 31, 60, 126, 7, 20, 30, 59, 127, 6, 19, 29, 58, 128, 5, 57, 129, 4, 130, 3, 131, 2, 132, 1, 133, 134, 135, 136, 137, 138]; or [13, 14, 18, 26, 28, 36, 39, 40, 41, 42, 44, 46, 49, 50, 52, 54, 56, 65, 66, 69, 72, 74, 78, 80, 82, 84, 85, 86, 88, 90, 91, 93, 94, 95, 97, 98, 101, 104, 105, 108, 110, 111, 113, 114, 116, 117, 121, 1, 5, 15, 23, 27, 29, 31, 33, 37, 43, 53, 59, 61, 67, 71, 73, 75, 77, 81, 92, 100, 103, 112, 119, 134, 4, 17, 22, 30, 32, 45, 48, 58, 60, 70, 76, 89, 99, 102, 109, 115, 118, 120, 135, 12, 25, 35, 38, 51, 55, 64, 68, 79, 83, 87, 96, 107, 122, 11, 16, 24, 34, 47, 63, 106, 123, 10, 62, 124, 9, 125, 3, 21, 57, 136, 2, 20, 137, 19, 138, 8, 126, 7, 127, 6, 128, 129, 130, 131, 132, 133]; |
| 120, 0 × 72BE9 | [3, 5, 7, 8, 10, 12, 13, 16, 21, 22, 23, 24, 25, 26, 27, 32, 35, 36, 42, 46, 48, 52, 53, 54, 58, 61, 62, 64, 65, 67, 72, 75, 76, 77, 81, 82, 84, 85, 86, 91, 93, 96, 98, 101, 106, 111, 112, 114, 115, 117, 119, 120, 121, 2, 4, 6, 9, 11, 15, 20, 31, 34, 41, 45, 47, 51, 57, 60, 63, 66, 71, 74, 80, 83, 90, 92, 95, 97, 100, 105, 110, 113, 116, 118, 122, 1, 14, 19, 30, 33, 40, 44, 50, 56, 59, 70, 73, 79, 89, 94, 99, 104, 109, 123, 18, 29, 39, 43, 49, 55, 69, 78, 88, 103, 108, 124, 17, 28, 38, 68, 87, 102, 107, 125, 37, 126, 127, 128, 129, 130, 131, 132, 133, 134, 135, 136, 137, 138]; or [3, 5, 7, 8, 10, 12, 13, 16, 21, 22, 23, 24, 25, 26, 27, 32, 35, 36, 42, 46, 48, 52, 53, 54, 58, 61, 62, 64, 65, 67, 72, 75, 76, 77, 81, 82, 84, 85, 86, 91, 93, 96, 98, 101, 106, 111, 112, 114, 115, 117, 119, 120, 121, 1, 4, 6, 9, 11, 14, 17, 28, 33, 37, 43, 47, 49, 55, 59, 63, 66, 68, 73, 78, 83, 87, 92, 94, 97, 99, 102, 107, 113, 116, 118, 138, 2, 15, 20, 31, 34, 41, 45, 51, 57, 60, 71, 74, 80, 90, 95, 100, 105, 110, 122, 19, 30, 40, 44, 50, 56, 70, 79, 89, 104, 109, 123, 39, 88, 103, 127, 18, 126, 29, 38, 69, 128, 108, 124, 132, 125, 133, 130, 131, 134, 137, 129, 135, 136]; |
| 120, 0 × 5EF9D | [2, 3, 8, 12, 13, 14, 15, 16, 18, 19, 20, 21, 23, 24, 25, 26, 28, 31, 32, 33, 34, 38, 40, 41, 42, 43, 45, 46, 49, 50, 51, 53, 55, 56, 58, 59, 60, 66, 67, 68, 69, 70, 73, 74, 80, 82, 83, 86, 87, 88, 90, 92, 93, 95, 98, 100, 103, 106, 107, 108, 110, 111, 113, 114, 117, 118, 120, 121, 1, 7, 11, 17, 22, 27, 30, 37, 39, 44, 48, 52, 54, 57, 65, 72, 79, 81, 85, 89, 91, 94, 97, 99, 102, 105, 109, 112, 116, 119, 122, 6, 10, 29, 36, 47, 64, 71, 78, 84, 96, 101, 104, 115, 123, 5, 9, 35, 63, 77, 124, 4, 62, 76, 125, 61, 75, 126, 127, 128, 129, 130, 131, 132, 133, 134, 135, 136, 137, 138]; or [3, 4, 6, 7, 9, 11, 13, 15, 16, 17, 18, 20, 21, 22, 23, 30, 31, 32, 38, 39, 40, 42, 45, 51, 54, 55, 56, 58, 60, 62, 63, 65, 67, 68, 69, 71, 74, 76, 82, 88, 91, 95, 97, 100, 101, 107, 109, 110, 113, 115, 116, 119, 120, 125, 2, 5, 8, 10, 12, 14, 19, 29, 37, 41, 44, 50, 53, 57, 59, 61, 64, 66, 70, 73, 75, 81, 87, 90, 94, 96, 99, 106, 108, 112, 114, 118, 126, 1, 28, 36, 43, 49, 52, 72, 80, 86, 89, 93, 98, 105, 111, 117, 127, 26, 27, 33, 35, 77, 78, 92, 102, 103, 104, 131, 24, 25, 47, 79, 84, 130, 34, 124, 46, 48, 83, 85, 129, 135, 123, 128, 132, 136, 133, 121, 122, 137, 138, 134]; |
| 120, 0 × 4F779 | [3, 4, 5, 10, 12, 13, 15, 16, 17, 23, 26, 27, 28, 29, 31, 33, 34, 37, 46, 51, 52, 56, 59, 62, 64, 65, 68, 69, 70, 71, 72, 74, 77, 78, 87, 88, 89, 95, 96, 97, 98, 100, 101, 107, 109, 110, 111, 112, 113, 116, 117, 118, 119, 121, 2, 9, 11, 14, 22, 25, 30, 32, 36, 45, 50, 55, 58, 61, 63, 67, 73, 76, 86, 94, 99, 106, 108, 115, 122, 1, 8, 21, 24, 35, 44, 49, 54, 57, 60, 66, 75, 85, 93, 105, 114, 120, 123, 7, 20, 43, 48, 53, 84, 92, 104, 124, 6, 19, 42, 47, 83, 91, 103, 125, 18, 41, 82, 90, 102, 126, 40, 81, 127, 39, 80, 128, 38, 79, 129, 130, 131, 132, 133, 134, 135, 136, 137, 138]; or [3, 6, 7, 8, 13, 15, 16, 18, 19, 20, 26, 29, 30, 31, 32, 34, 36, 37, 40, 49, 54, 55, 59, 62, 65, 67, 68, 71, 72, 73, 74, 75, 77, 80, 81, 90, 91, 92, 98, 99, 100, 101, 103, 104, 110, 112, 113, 114, 115, 116, 119, 120, 136, 4, 5, 10, 12, 17, 23, 27, 28, 33, 46, 51, 52, 56, 64, 69, 70, 78, 87, 88, 89, 95, 96, 97, 107, 109, 111, 117, 118, 121, 2, 9, 11, 14, 22, 25, 45, 50, 58, 61, 63, 76, 86, 94, 106, 108, 122, 35, 39, 48, 53, 66, 79, 102, 137, 1, 21, 24, 44, 57, 60, 85, 93, 105, 123, 38, 47, 138, 41, 82, 135, 42, 83, 84, 125, 43, 124, 134, 126, 127, 128, 129, 130, 133, 131, 132]; |
| 120, 0 × 658D3 | [1, 2, 3, 5, 6, 9, 10, 11,12, 13, 14, 15, 17, 18, 19, 20, 21, 23, 27, 30, 31, 34, 36, 38, 39, 43, 45, 46, 50, 53, 58, 59, 62, 65, 66, 67, 68, 74, 75, 76, 78, 80, 82, 86, 88, 90, 91, 92, 93, 95, 96, 99, 102, 106, 107, 108, 109, 111, 113, 114, 116, 117, 118, 119, 121, 4, 8, 16, 22, 26, 29, 33, 35, 37, 42, 44, 49, 52, 57, 61, 64, 73, 77, 79, 81, 85, 87, 89, 94, 98, 101, 105, 110, 112, 115, 122, 7, 25,28, 32,41,48,51,56, 60, 63, 72, 84, 97, 100, 104, 123, 24, 40, 47, 55, 71, 83, 103, 124, 54, 70, 120, 125, 69, 126, 127, 128, 129, 130, 131, 132, 133, 134, 135, 136, 137, 138]; or [2, 6, 9, 10, 11, 14, 15, 17, 21, 24, 26, 27, 28, 32, 33, 38, 40, 41, 45, 47, 49, 53, 54, 56, 61, 62, 66, 67, 68, 70, 73, 77, 79, 80, 83, 84, 85, 88, 92, 98, 112, 113, 114, 117, 118, 119, 120, 125, 1, 5, 8, 13, 16, 20, 23, 25, 31, 37, 39, 44, 46, 48, 52, 55, |

TABLE 3-continued

| Typical K, typical CRC polynomial | Interleaved sequence |
|---|---|
| | 60, 65, 69, 72, 76, 78, 82, 87, 91, 97, 111, 116, 126, 4, 7, 12, 18, 22, 30, 34, 36, 43, 51, 57, 58, 63, 74, 86, 93, 94, 95, 96, 99, 101, 102, 105, 128, 3, 29, 35, 42, 50, 64, 100, 104, 115, 129, 59, 71, 103, 110, 130, 19, 75, 90, 109, 131, 81, 106, 107, 108, 127, 89, 132, 122, 123, 124, 135, 136, 137, 133, 134, 121, 138]; |
| 120, 0 × 72AA7 | [1, 3, 4, 5, 6, 7, 9, 13, 15, 17, 18, 19, 22, 23, 26, 28, 30, 33, 36, 37, 40, 41, 42, 43, 46, 47, 49, 50, 52, 54, 55, 58, 62, 63, 64, 65, 66, 67, 69, 70, 74, 77, 78, 79, 80, 81, 82, 84, 91, 93, 98, 99, 102, 105, 106, 107, 109, 111, 113, 114, 116, 117, 120, 121, 2, 8, 12, 14, 16, 21, 25, 27, 29, 32, 35, 39, 45, 48, 51, 53, 57, 61, 68, 73, 76, 83, 90, 92, 97, 101, 104, 108, 110, 112, 115, 119, 122, 11, 20, 24, 31, 34, 38, 44, 56, 60, 72, 75, 89, 96, 100, 103, 118, 123, 10, 59, 71, 88, 95, 124, 87, 94, 125, 86, 126, 85, 127, 128, 129, 130, 131, 132, 133, 134, 135, 136, 137, 138]; or [2, 3, 4, 7, 11, 12, 14, 15, 16, 21, 23, 25, 26, 27, 28, 29, 30, 31, 32, 34, 37, 42, 43, 44, 45, 48, 49, 50, 51, 52, 54, 56, 57, 59, 61, 65, 66, 67, 73, 76, 78, 79, 81, 85, 87, 88, 89, 91, 93, 94, 95, 99, 102, 104, 105, 106, 114, 115, 119, 128, 1, 6, 10, 13, 20, 22, 24, 33, 36, 41, 47, 53, 55, 58, 60, 64, 72, 75, 77, 80, 84, 86, 90, 92, 98, 101, 103, 113, 118, 129, 17, 18, 35, 62, 69, 70, 71, 82, 83, 97, 100, 107, 109, 111, 112, 116, 120, 130, 5, 9, 68, 96, 108, 110, 131, 8, 19, 38, 39, 46, 63, 134, 74, 135, 40, 117, 121, 132, 133, 136, 138, 123, 137, 122, 124, 126, 125, 127]; |
| 120, 0 × 55BE9 | [3, 5, 7, 8, 10, 14, 16, 17, 18, 19, 20, 21, 23, 24, 25, 26, 28, 29, 33, 36, 37, 38, 43, 45, 63, 66, 68, 70, 71, 73, 77, 79, 80, 81, 82, 83, 84, 86, 87, 88, 89, 91, 92, 96, 99, 100, 101, 106, 108, 121, 2, 4, 6, 9, 13, 15, 22, 27, 32, 35, 42, 44, 62, 65, 67, 69, 72, 76, 78, 85, 90, 95, 98, 105, 107, 122, 1, 12, 31, 34, 41, 61, 64, 75, 94, 97, 104, 123, 11, 30, 40, 60, 74, 93, 103, 124, 39, 59, 102, 125, 58, 126, 57, 120, 127, 56, 119, 128, 55, 118, 129, 54, 117, 130, 53, 116, 131, 52, 115, 132, 51, 114, 133, 50, 113, 134, 49, 112, 135, 48, 111, 136, 47, 110, 137, 46, 109, 138]; or [2, 3, 6, 11, 17, 18, 22, 23, 24, 26, 28, 29, 32, 33, 35, 37, 38, 40, 44, 45, 54, 65, 66, 69, 74, 80, 81, 85, 86, 87, 89, 91, 92, 95, 96, 98, 100, 101, 103, 107, 108, 117, 130, 1, 5, 10, 16, 21, 25, 27, 31, 34, 36, 39, 43, 53, 64, 68, 73, 79, 84, 88, 90, 94, 97, 99, 102, 106, 116, 131, 7, 8, 9, 12, 15, 20, 41, 55, 70, 71, 72, 75, 78, 83, 104, 118, 129, 4, 14, 19, 42, 49, 67, 77, 82, 105, 112, 135, 13, 30, 48, 76, 93, 111, 136, 56, 119, 128, 51, 114, 133, 50, 113, 134, 60, 124, 59, 125, 63, 121, 62, 122, 61, 123, 47, 110, 137, 46, 109, 138, 57, 120, 127, 52, 115, 132, 58, 126]; |
| 120, 0 × F56FB | [1, 2, 5, 7, 9, 10, 11, 14, 17, 18, 19, 20, 21, 23, 25, 28, 30, 31, 32, 34, 35, 37, 38, 39, 40, 41, 43, 45, 47, 49, 54, 58, 60, 61, 65, 68, 69, 74, 76, 77, 80, 84, 85, 86, 88, 95, 96, 98, 99, 101, 102, 103, 112, 117, 118, 119, 120, 121, 4, 6, 8, 13, 16, 22, 24, 27, 29, 33, 36, 42, 44, 46, 48, 53, 57, 59, 64, 67, 73, 75, 79, 83, 87, 94, 97, 100, 111, 116, 122, 3, 12, 15, 26, 52, 56, 63, 66, 72, 78, 82, 93, 110, 115, 123, 51, 55, 62, 71, 81, 92, 109, 114, 124, 50, 70, 91, 108, 113, 125, 90, 107, 126, 89, 106, 127, 105, 128, 104, 129, 130, 131, 132, 133, 134, 135, 136, 137, 138, 139]; or [1, 2, 4, 9, 11, 12, 16, 19, 23, 24, 25, 32, 33, 35, 36, 38, 39, 41, 48, 49, 54, 55, 57, 58, 59, 61, 63, 66, 69, 75, 78, 79, 80, 81, 83, 84, 86, 91, 94, 95, 96, 102, 104, 106, 107, 109, 110, 111, 115, 117, 118, 120, 130, 3, 5, 7, 8, 14, 15, 17, 20, 21, 22, 28, 30, 43, 45, 53, 56, 62, 76, 82, 88, 90, 93, 98, 99, 105, 108, 112, 114, 116, 131, 6, 13, 18, 27, 29, 40, 42, 44, 47, 52, 60, 68, 77, 85, 87, 89, 92, 97, 101, 113, 132, 10, 26, 31, 34, 46, 51, 65, 67, 100, 133, 37, 50, 64, 103, 119, 134, 74, 121, 70, 128, 139, 71, 72, 126, 127, 129, 137, 73, 125, 124, 122, 138, 123, 135, 136]; |
| 120, 0 × FC809 | [3, 6, 9, 11, 12, 14, 16, 19, 20, 26, 30, 34, 35, 38, 39, 40, 41, 44, 45, 48, 50, 53, 55, 58, 59, 60, 66, 67, 69, 71, 73, 74, 75, 77, 79, 80, 85, 87, 91, 94, 95, 97, 102, 106, 107, 108, 112, 121, 2, 5, 8, 10, 13, 15, 18, 25, 29, 33, 37, 43, 47, 49, 52, 54, 57, 65, 68, 70, 72, 76, 78, 84, 86, 90, 93, 96, 101, 105, 111, 120, 122, 1, 4, 7, 17, 24, 28, 32, 36, 42, 46, 51, 56, 64, 83, 89, 92, 100, 104, 110, 119, 123, 23, 27, 31, 63, 82, 88, 99, 103, 109, 118, 124, 22, 62, 81, 98, 117, 125, 21, 61, 116, 126, 115, 127, 114, 128, 113, 129, 130, 131, 132, 133, 134, 135, 136, 137, 138, 139]; or [3, 6, 9, 11, 12, 14, 16, 19, 20, 26, 30, 34, 35, 38, 39, 40, 41, 44, 45, 48, 50, 53, 55, 58, 59, 60, 66, 67, 69, 71, 73, 74, 75, 77, 79, 80, 85, 87, 91, 94, 95, 97, 102, 106, 107, 108, 112, 121, 2, 5, 8, 10, 13, 15, 18, 25, 29, 33, 37, 43, 47, 49, 52, 54, 57, 65, 68, 70, 72, 76, 78, 84, 86, 90, 93, 96, 101, 105, 111, 120, 122, 1, 4, 7, 17, 21, 27, 31, 36, 42, 46, 51, 56, 61, 81, 88, 92, 98, 103, 109, 113, 139, 24, 28, 32, 64, 83, 89, 100, 104, 110, 119, 123, 22, 23, 62, 99, 114, 115, 117, 118, 132, 63, 116, 133, 82, 134, 136, 124, 125, 126, 127, 128, 135, 138, 129, 130, 137, 131]; |
| 120, 0 × AEC81 | [7, 10, 11, 13, 15, 17, 19, 20, 21, 22, 24, 25, 26, 28, 32, 38, 39, 40, 42, 44, 47, 48, 52, 55, 57, 59, 60, 63, 65, 69, 70, 71, 73, 74, 76, 77, 79, 80, 81, 84, 85, 86, 92, 93, 94, 95, 96, 97, 99, 101, 102, 103, 106, |

TABLE 3-continued

| Typical K, typical CRC polynomial | Interleaved sequence |
|---|---|
| | 107, 108, 111, 119, 121, 6, 9, 12, 14, 16, 18, 23, 27, 31, 37, 41, 43, 46, 51, 54, 56, 58, 62, 64, 68, 72, 75, 78, 83, 91, 98, 100, 105, 110, 118, 120, 122, 5, 8, 30, 36, 45, 50, 53, 61, 67, 82, 90, 104, 109, 117, 123, 4, 29, 35, 49, 66, 89, 116, 124, 3, 34, 88, 115, 125, 2, 33, 87, 114, 126, 1, 113, 127, 112, 128, 129, 130, 131, 132, 133, 134, 135, 136, 137, 138, 139]; or [1, 3, 4, 5, 7, 8, 9, 10, 13, 20, 22, 23, 24, 26, 30, 34, 35, 36, 40, 41, 48, 50, 53, 54, 56, 60, 61, 62, 64, 65, 68, 70, 71, 74, 75, 76, 78, 79, 80, 87, 90, 92, 93, 95, 96, 100, 102, 104, 105, 106, 107, 109, 115, 117, 118, 131, 2, 6, 11, 12, 15, 17, 28, 29, 32, 33, 38, 42, 44, 49, 57, 67, 81, 84, 85, 89, 91, 97, 111, 114, 116, 119, 132, 14, 16, 19, 25, 27, 31, 37, 43, 47, 52, 63, 66, 77, 83, 88, 101, 103, 110, 113, 120, 133, 51, 69, 72, 82, 86, 94, 108, 112, 136, 21, 39, 55, 59, 73, 99, 121, 137, 46, 98, 138, 18, 58, 122, 45, 123, 124, 125, 139, 126, 134, 127, 135, 128, 129, 130]; |
| 120, 0 × E645B | [1, 2, 7, 12, 13, 14, 16, 17, 18, 22, 23, 25, 26, 27, 28, 34, 36, 37, 40, 44, 49, 50, 51, 52, 55, 57, 58, 61, 62, 63, 64, 68, 71, 72, 73, 74, 75, 76, 77, 78, 83, 86, 91, 97, 98, 100, 101, 102, 104, 105, 106, 108, 110, 115, 117, 118, 119, 121,6, 11, 15,21,24, 33,35,39, 43,48, 54, 56, 60, 67, 70, 82, 85, 90, 96, 99, 103, 107, 109, 114, 116, 122, 5, 10, 20, 32, 38, 42, 47, 53, 59, 66, 69, 81, 84, 89, 95, 113, 120, 123, 4, 9, 19, 31, 41, 46, 65, 80, 88, 94, 112, 124, 3, 8, 30, 45, 79, 87, 93, 111, 125, 29, 92, 126, 127, 128, 129, 130, 131, 132, 133, 134, 135, 136, 137, 138, 139]; or [2, 6, 7, 11, 14, 15, 18, 21, 23, 24, 28, 33, 34, 35, 37, 39, 40, 43, 44, 48, 52, 54, 55, 56, 58, 60, 64, 67, 68, 70, 78, 82, 83, 85, 86, 90, 91, 96, 98, 99, 102, 103, 106, 107, 108, 109, 110, 114, 115, 116, 119, 122, 1, 4, 8, 9, 13, 16, 17, 20, 25, 26, 30, 36, 41, 42, 45, 46, 50, 57, 62, 66, 69, 72, 80, 84, 87, 88, 92, 93, 100, 101, 104, 105, 111, 112, 117, 118, 138, 5, 10, 22, 27, 32, 38, 47, 51, 53, 59, 63, 77, 81, 89, 95, 97, 113, 120, 123, 12, 49, 61, 71, 73, 74, 75, 76, 121, 3, 19, 29, 65, 79, 139, 31, 127, 128, 94, 129, 131, 132, 130, 133, 134, 135, 136, 137, 124, 125, 126]; |
| 120, 0 × 9C7D1 | [4, 6, 7, 9, 10, 14, 16, 17, 20, 25, 26, 28, 31, 32, 36, 38, 40, 42, 44, 47, 48, 50, 5 1, 52, 53, 55, 57, 59, 60, 61, 62, 63, 64, 67, 68, 70, 73, 74, 75, 76, 77, 78, 84, 85, 86, 89, 90, 91, 92, 93, 95, 96, 97, 98, 101, 104, 105, 109, 110, 111, 113, 114, 115, 118, 119, 120, 121, 3, 5, 8, 13, 15, 19, 24, 27, 30, 35, 37, 39, 41, 43, 46, 49, 54, 56, 58, 66, 69, 72, 83, 88, 94, 100, 103, 108, 112, 117, 122, 2, 12, 18, 23, 29, 34, 45, 65, 71, 82, 87, 99, 102, 107, 116, 123, 1, 11, 22, 33, 81, 106, 124, 21, 80, 125, 79, 126, 127, 128, 129, 130, 131, 132, 133, 134, 135, 136, 137, 138, 139]; or [4, 5, 6, 8, 13, 15, 24, 33, 37, 38, 43, 50, 53, 59, 61, 64, 65, 67, 69, 72, 73, 75, 80, 81, 83, 85, 86, 87, 88, 90, 92, 94, 96, 97, 98, 99, 100, 108, 110, 111, 114, 115, 118, 120, 131, 3, 7, 12, 14, 23, 32, 36, 42, 49, 52, 58, 60, 63, 66, 68, 71, 74, 79, 82, 84, 89, 91, 93, 95, 107, 109, 113, 117, 119, 132, 2, 11, 22, 31, 35, 41, 48, 51, 57, 62, 70, 78, 106, 112, 116, 133, 1, 10, 21, 30, 34, 40, 47, 56, 77, 105, 134, 9, 17, 20, 25, 26, 27, 46, 76, 104, 125, 16, 19, 45, 55, 103, 126, 28, 29, 44, 101, 129, 18, 54, 102, 127, 130, 39, 136, 137, 135, 138, 121, 139, 122, 123, 124, 128]; |
| 120, 0 × FE757 | [1, 3, 6, 7, 8, 9, 10, 11, 12, 17, 20, 22, 23, 24, 27, 31, 32, 33, 34, 35, 39, 41, 42, 44, 45, 46, 48, 49, 50, 51, 53, 54, 55, 57, 59, 60, 61, 62, 63, 64, 65, 67, 68, 71, 77, 78, 79, 80, 82, 83, 86, 87, 88, 91, 93, 94, 97, 98, 100, 101, 102, 107, 108, 109, 110, 111, 113, 114, 116, 119, 121, 2, 5, 16, 19, 21, 26, 30, 38, 40, 43, 47, 52, 56, 58, 66, 70, 76, 81, 85, 90, 92, 96, 99, 106, 112, 115, 118, 122, 4, 15, 18, 25, 29, 37, 69, 75, 84, 89, 95, 105, 117, 123, 14, 28, 36, 74, 104, 120, 124, 13, 73, 103, 125, 72, 126, 127, 128, 129, 130, 131, 132, 133, 134, 135, 136, 137, 138, 139]; or [1, 2, 10, 11, 12, 14, 16, 20, 24, 25, 26, 28, 32, 34, 35, 39, 41, 42, 43, 44, 53, 54, 55, 57, 58, 62, 68, 72, 73, 76, 77, 78, 81, 84, 86, 87, 89, 95, 98, 100, 101, 102, 103, 106, 107, 108, 113, 114, 116, 117, 119, 130, 3, 5, 17, 19, 21, 27, 30, 38, 40, 46, 47, 51, 52, 56, 65, 66, 70, 71, 80, 83, 85, 88, 90, 91, 92, 94, 96, 99, 111, 112, 115, 118, 122, 4, 7, 18, 22, 23, 29, 37, 45, 48, 49, 59, 60, 67, 82, 93, 104, 120, 138, 8, 9, 15, 50, 61, 64, 74, 110, 129, 6, 13, 63, 75, 79, 105, 109, 131, 31, 97, 132, 33, 36, 133, 69, 127, 125, 128, 137, 123, 126, 135, 124, 136, 134, 121, 139]; |
| 120, 0 × A2B79 | [3, 4, 5, 11, 13, 14, 17, 18, 22, 25, 27, 31, 34, 37, 38, 39, 41, 48, 51, 52, 55, 56, 60, 63, 66, 67, 69, 70, 71, 72, 73, 75, 87, 88, 90, 91, 93, 95, 96, 97, 100, 106, 107, 110, 111, 114, 115, 121, 2, 10, 12, 16, 21, 24, 26, 30, 33, 36, 40, 47, 50, 54, 59, 62, 65, 68, 74, 86, 89, 92, 94, 99, 105, 109, 113, 122, 1, 9, 15, 20, 23, 29, 32, 35, 46, 49, 53, 58, 61, 64, 85, 98, 104, 108, 112, 123, 8, 19, 28, 45, 57, 84, 103, 124, 7, 44, 83, 102, 120, 125, 6, 43, 82, 101, 119, 126, 42, 81, 118, 127, 80, 117, 128, 79, 116, 129, 78, 130, 77, 131, 76, 132, 133, 134, 135, 136, 137, 138, 139]; or [3, 4, 5, 11, 13, 14, 17, 18, 22, 25, 27, 31, 34, 37, 38, 39, 41, 48, 51, 52, 55, 56, 60, 63, 66, 67, 69, 70, 71, 72, 73, 75, 87, 88, 90, 91, 93, 95, 96, 97, 100, 106, 107, 110, 111, 114, |

TABLE 3-continued

| Typical K, typical CRC polynomial | Interleaved sequence |
|---|---|
| | 115, 121, 2, 10, 12, 16, 21, 24, 26, 30, 33, 36, 40, 47, 50, 54, 59, 62, 65, 68, 74, 86, 89, 92, 94, 99, 105, 109, 113, 122, 1, 9, 15, 20, 23, 29, 32, 35, 46, 49, 53, 58, 61, 64, 85, 98, 104, 108, 112, 123, 6, 7, 19, 43, 57, 77, 102, 116, 117, 138, 28, 42, 76, 101, 139, 8, 45, 84, 103, 124, 44, 83, 120, 125, 79, 80, 129, 81, 82, 118, 127, 128, 119, 132, 133, 126, 78, 134, 135, 136, 137, 130, 131]; |
| 120, 0 × E4001 | [14, 17, 18, 19, 28, 34, 36, 38, 42, 45, 46, 47, 48, 50, 51, 54, 57, 68, 70, 72, 73, 74, 75, 76, 82, 84, 85, 87, 89, 90, 91, 92, 93, 95, 96, 98, 100, 101, 103, 104, 106, 107, 108, 112, 114, 115, 116, 117, 118, 120, 121, 13, 16, 27, 33, 35, 37, 41, 44, 49, 53, 56, 67, 69, 71, 81, 83, 86, 88, 94, 97, 99, 102, 105, 111, 113, 119, 122, 12, 15, 26, 32, 40, 43, 52, 55, 66, 80, 110, 123, 11, 25, 31, 39, 65, 79, 109, 124, 10, 24, 30, 64, 78, 125, 9, 23, 29, 63, 77, 126, 8, 22, 62, 127, 7, 21, 61, 128, 6, 20, 60, 129, 5, 59, 130, 4, 58, 131, 3, 132, 2, 133, 1, 134, 135, 136, 137, 138, 139]; or [14, 17, 18, 19, 28, 34, 36, 38, 42, 45, 46, 47, 48, 50, 51, 54, 57, 68, 70, 72, 73, 74, 75, 76, 82, 84, 85, 87, 89, 90, 91, 92, 93, 95, 96, 98, 100, 101, 103, 104, 106, 107, 108, 112, 114, 115, 116, 117, 118, 120, 121, 3, 4, 5, 20, 22, 24, 31, 32, 33, 37, 40, 43, 56, 58, 59, 60, 61, 62, 71, 77, 78, 79, 81, 86, 94, 102, 111, 113, 119, 135, 1, 15, 29, 35, 39, 49, 52, 55, 69, 83, 88, 97, 99, 105, 109, 139, 13, 16, 27, 41, 44, 53, 67, 122, 2, 21, 23, 30, 80, 110, 136, 137, 12, 26, 66, 123, 11, 25, 65, 124, 10, 64, 125, 138, 9, 63, 126, 8, 127, 7, 128, 6, 129, 130, 131, 132, 133, 134]; |
| 120, 0 × 99AE9 | [3, 5, 7, 10, 14, 15, 17, 18, 19, 21, 26, 27, 28, 29, 32, 33, 35, 36, 37, 38, 39, 42, 45, 53, 54, 56, 58, 59, 60, 61, 62, 64, 65, 72, 73, 75, 76, 77, 78, 79, 82, 83, 84, 85, 91, 92, 94, 95, 100, 101, 102, 103, 105, 108, 114, 115, 116, 117, 118, 119, 121, 2, 4, 6, 9, 13, 16, 20, 25, 31, 34, 41, 44, 52, 55, 57, 63, 71, 74, 81, 90, 93, 99, 104, 107, 113, 122, 1, 8, 12, 24, 30, 40, 43, 51, 70, 80, 89, 98, 106, 112, 120, 123, 11, 23, 50, 69, 88, 97, 111, 124, 22, 49, 68, 87, 96, 110, 125, 48, 67, 86, 109, 126, 47, 66, 127, 46, 128, 129, 130, 131, 132, 133, 134, 135, 136, 137, 138, 139]; or [1, 6, 7, 8, 9, 14, 15, 16, 20, 21, 23, 25, 27, 28, 29, 31, 32, 34, 38, 41, 42, 49, 54, 55, 58, 59, 61, 64, 68, 69, 73, 74, 78, 81, 82, 84, 85, 87, 88, 89, 92, 93, 98, 99, 101, 102, 103, 105, 107, 112, 115, 116, 117, 136, 2, 3, 4, 5, 10, 11, 12, 17, 19, 24, 30, 37, 45, 50, 51, 57, 60, 65, 70, 77, 80, 83, 94, 95, 97, 108, 111, 113, 118, 120, 124, 18, 22, 26, 33, 36, 44, 53, 56, 63, 76, 79, 96, 100, 110, 119, 125, 13, 35, 39, 40, 43, 46, 47, 66, 75, 90, 91, 106, 109, 128, 48, 52, 71, 72, 86, 133, 67, 104, 114, 127, 129, 62, 132, 134, 126, 135, 137, 121, 122, 138, 123, 139, 130, 131]; |
| 120, 0 × F86F7 | [1, 3, 5, 6, 7, 10, 11, 14, 16, 19, 21, 23, 25, 26, 31, 33, 38, 42, 43, 44, 46, 47, 50, 53, 54, 55, 59, 61, 62, 66, 69, 71, 73, 75, 79, 81, 85, 86, 87, 88, 90, 91, 93, 94, 96, 98, 99, 100, 101, 105, 106, 108, 113, 116, 117, 118, 119, 121, 2, 4, 9, 13, 15, 18, 20, 22, 24, 30, 32, 37, 41, 45, 49, 52, 58, 60, 65, 68, 70, 72, 74, 78, 80, 84, 89, 92, 95, 97, 104, 107, 112, 115, 120, 122, 8, 12, 17, 29, 36, 40, 48, 51, 57, 64, 67, 77, 83, 103, 111, 114, 123, 28, 35, 39, 56, 63, 76, 82, 102, 110, 124, 27, 34, 109, 125, 126, 127, 128, 129, 130, 131, 132, 133, 134, 135, 136, 137, 138, 139]; or [1, 2, 3, 4, 5, 9, 14, 15, 17, 20, 25, 28, 30, 34, 37, 40, 42, 43, 44, 45, 46, 48, 50, 54, 55, 57, 60, 61, 63, 65, 67, 71, 72, 73, 75, 76, 78, 79, 80, 82, 83, 85, 86, 91, 94, 97, 98, 101, 104, 109, 110, 111, 114, 116, 117, 127, 6, 7, 10, 11, 16, 19, 21, 23, 26, 31, 33, 38, 47, 53, 59, 62, 66, 69, 81, 87, 88, 90, 93, 96, 99, 100, 105, 106, 108, 113, 118, 119, 121, 8, 13, 24, 27, 29, 36, 39, 41, 49, 56, 64, 70, 74, 77, 84, 103, 115, 120, 128, 32, 35, 68, 89, 92, 102, 131, 12, 18, 52, 58, 107, 112, 132, 22, 51, 95, 139, 129, 130, 133, 134, 135, 123, 124, 136, 126, 137, 125, 138, 122]; |
| 120, 0 × 94001 | [14, 16, 19, 28, 32, 38, 42, 44, 46, 47, 48, 51, 52, 54, 56, 57, 64, 70, 72, 75, 76, 78, 80, 83, 84, 88, 90, 94, 95, 96, 98, 100, 103, 106, 107, 108, 111, 113, 114, 115, 116, 120, 121, 13, 15, 18, 27, 31, 37, 41, 43, 45, 50, 53, 55, 63, 69, 71, 74, 77, 79, 82, 87, 89, 93, 97, 99, 102, 105, 110, 112, 119, 122, 12, 17, 26, 30, 36, 40, 49, 62, 68, 73, 81, 86, 92, 101, 104, 109, 118, 123, 11, 25, 29, 35, 39, 61, 67, 85, 91, 117, 124, 10, 24, 34, 60, 66, 125, 9, 23, 33, 59, 65, 126, 8, 22, 58, 127, 7, 21, 128, 6, 20, 129, 5, 130, 4, 131, 3, 132, 2, 133, 1, 134, 135, 136, 137, 138, 139]; or [14, 16, 19, 28, 32, 38, 42, 44, 46, 47, 48, 51, 52, 54, 56, 57, 64, 70, 72, 75, 76, 78, 80, 83, 84, 88, 90, 94, 95, 96, 98, 100, 103, 106, 107, 108, 111, 113, 114, 115, 116, 120, 121, 3, 17, 22, 31, 35, 41, 45, 49, 50, 55, 59, 60, 67, 73, 79, 81, 86, 87, 91, 93, 97, 99, 101, 109, 110, 117, 118, 119, 137, 2, 18, 21, 30, 34, 40, 53, 58, 66, 74, 77, 82, 85, 92, 102, 105, 138, 1, 15, 20, 29, 33, 39, 43, 65, 71, 89, 104, 112, 139, 13, 27, 37, 63, 69, 122, 12, 26, 36, 62, 68, 123, 11, 25, 61, 124, 10, 24, 125, 9, 23, 126, 8, 127, 7, 128, 6, 129, 5, 130, 4, 131, 132, 133, 134, 135, 136]; |
| 120, 0 × CF5C5 | [2, 4, 7, 10, 11, 13, 16, 17, 18, 20, 22, 27, 32, 33, 34, 37, 39, 40, 41, 43, 44, 46, 47, 48, 51, 52, 57, 60, 61, 63, 66, 67, 68, 69, 71, 72, 75, |

TABLE 3-continued

| Typical K, typical CRC polynomial | Interleaved sequence |
|---|---|
| | 77, 80, 81, 82, 86, 87, 91, 95, 98, 99, 100, 102, 106, 107, 108, 109, 111, 112, 113, 116, 118, 119, 120, 121, 1, 3, 6, 9, 12, 15, 19, 21, 26, 31, 36, 38, 42, 45, 50, 56, 59, 62, 65, 70, 74, 76, 79, 85, 90, 94, 97, 101, 105, 110, 115, 117, 122, 5, 8, 14, 25, 30, 35, 49, 55, 58, 64, 73, 78, 84, 89, 93, 96, 104, 114, 123, 24, 29, 54, 83, 88, 92, 103, 124, 23, 28, 53, 125, 126, 127, 128, 129, 130, 131, 132, 133, 134, 135, 136, 137, 138, 139]; or [2, 5, 6, 9, 11, 12, 13, 14, 22, 24, 26, 28, 29, 30, 35, 37, 41, 42, 43, 44, 45, 48, 51, 53, 54, 55, 56, 59, 63, 65, 71, 74, 75, 77, 79, 81, 82, 83, 84, 85, 94, 95, 99, 101, 108, 117, 129, 1, 4, 8, 10, 21, 23, 25, 27, 34, 36, 40, 47, 50, 52, 58, 62, 64, 70, 73, 76, 78, 80, 93, 98, 100, 107, 116, 120, 130, 3, 16, 17, 18, 32, 49, 60, 66, 67, 68, 86, 87, 91, 92, 97, 102, 109, 111, 112, 113, 115, 118, 131, 15, 31, 33, 46, 72, 90, 96, 106, 110, 114, 132, 20, 39, 57, 61, 89, 105, 133, 7, 38, 104, 127, 69, 119, 121, 19, 122, 88, 103, 139, 134, 135, 136, 137, 138, 128, 123, 124, 125, 126]; |
| 120, 0 × D7791 | [4, 7, 9, 10, 13, 15, 17, 19, 22, 23, 24, 25, 28, 29, 30, 31, 32, 33, 34, 35, 36, 38, 39, 41, 48, 49, 53, 56, 58, 61, 63, 65, 67, 71, 72, 73, 74, 78, 80, 81, 82, 83, 84, 89, 91, 92, 94, 96, 97, 101, 102, 103, 104, 106, 107, 109, 110, 111, 112, 113, 114, 117, 118, 120, 121, 3, 6, 8, 12, 14, 16, 18, 21, 27, 37, 40, 47, 52, 55, 57, 60, 62, 64, 66, 70, 77, 79, 88, 90, 93, 95, 100, 105, 108, 116, 119, 122, 2, 5, 11, 20, 26, 46, 51, 54, 59, 69, 76, 87, 99, 115, 123, 1, 45, 50, 68, 75, 86, 98, 124, 44, 85, 125, 43, 126, 42, 127, 128, 129, 130, 131, 132, 133, 134, 135, 136, 137, 138, 139]; or [1, 2, 4, 8, 10, 12, 15, 21, 22, 23, 25, 27, 29, 32, 33, 34, 35, 36, 39, 44, 47, 48, 50, 54, 56, 57, 58, 60, 62, 63, 68, 69, 70, 72, 73, 74, 75, 80, 81, 83, 85, 86, 87, 88, 93, 96, 101, 105, 112, 114, 115, 116, 120, 129, 3, 11, 13, 14, 17, 19, 20, 26, 30, 41, 43, 46, 55, 59, 65, 78, 79, 89, 91, 94, 95, 97, 100, 102, 103, 106, 107, 109, 110, 117, 118, 119, 130, 6, 7, 9, 16, 18, 24, 28, 40, 42, 52, 61, 64, 66, 67, 77, 82, 92, 98, 108, 111, 137, 31, 45, 51, 71, 76, 90, 104, 128, 5, 37, 38, 135, 49, 99, 138, 53, 84, 113, 136, 121, 131, 132, 139, 122, 125, 126, 123, 127, 124, 133, 134]; |
| 120, 0 × AD0B5 | [2, 5, 6, 7, 8, 9, 10, 11, 12, 17, 20, 21, 23, 24, 25, 28, 29, 33, 34, 35, 36, 37, 40, 41, 43, 45, 46, 48, 50, 52, 53, 54, 55, 57, 58, 61, 62, 64, 66, 68, 69, 70, 74, 77, 80, 87, 91, 92, 96, 99, 100, 101, 105, 106, 107, 109, 112, 113, 114, 116, 119, 120, 121, 1, 4, 16, 19, 22, 27, 32, 39, 42, 44, 47, 49, 51, 56, 60, 63, 65, 67, 73, 76, 79, 86, 90, 95, 98, 104, 108, 111, 115, 118, 122, 3, 15, 18, 26, 31, 38, 59, 72, 75, 78, 85, 89, 94, 97, 103, 110, 117, 123, 14, 30, 71, 84, 88, 93, 102, 124, 13, 83, 125, 82, 126, 81, 127, 128, 129, 130, 131, 132, 133, 134, 135, 136, 137, 138, 139]; or [2, 3, 4, 7, 9, 10, 11, 15, 18, 20, 26, 27, 28, 29, 30, 31, 33, 34, 36, 38, 39, 40, 42, 43, 49, 50, 53, 54, 59, 64, 69, 70, 73, 74, 80, 81, 83, 84, 85, 87, 89, 90, 92, 93, 94, 95, 96, 97, 103, 105, 108, 112, 113, 114, 116, 119, 120, 133, 5, 8, 13, 17, 22, 23, 32, 35, 44, 46, 47, 51, 57, 60, 62, 63, 66, 67, 71, 78, 82, 86, 88, 98, 99, 100, 102, 104, 106, 111, 128, 12, 16, 19, 21, 25, 41, 45, 52, 56, 61, 65, 72, 77, 101, 107, 110, 129, 6, 24, 48, 55, 58, 76, 109, 130, 14, 37, 68, 75, 79, 91, 131, 1, 132, 115, 118, 134, 126, 117, 127, 138, 121, 122, 139, 136, 135, 137, 123, 124, 125]; |
| 120, 0 × C9685 | [2, 4, 6, 7, 8, 9, 11, 13, 14, 16, 17, 19, 22, 24, 27, 30, 31, 32, 33, 35, 36, 37, 38, 39, 40, 42, 46, 47, 49, 50, 52, 53, 55, 56, 58, 59, 61, 62, 63, 64, 68, 69, 72, 73, 83, 86, 87, 88, 89, 90, 91, 92, 93, 96, 97, 99, 102, 104, 105, 106, 107, 121, 1, 3, 5, 10, 12, 15, 18, 21, 23, 26, 29, 34, 41, 45, 48, 51, 54, 57, 60, 67, 71, 82, 85, 95, 98, 101, 103, 122, 20, 25, 28, 44, 66, 70, 81, 84, 94, 100, 123, 43, 65, 80, 124, 79, 125, 78, 126, 77, 120, 127, 76, 119, 128, 75, 118, 129, 74, 117, 130, 116, 131, 115, 132, 114, 133, 113, 134, 112, 135, 111, 136, 110, 137, 109, 138, 108, 139]; or [3, 5, 6, 8, 14, 18, 20, 21, 24, 26, 27, 28, 29, 31, 35, 38, 39, 42, 43, 45, 47, 48, 50, 53, 54, 56, 57, 59, 60, 62, 63, 65, 72, 74, 75, 78, 80, 86, 91, 93, 94, 95, 96, 99, 104, 106, 107, 114, 133, 2, 4, 7, 13, 17, 19, 23, 25, 30, 34, 37, 41, 44, 46, 49, 52, 55, 58, 61, 64, 71, 73, 77, 79, 85, 90, 92, 98, 103, 105, 113, 134, 1, 12, 16, 22, 33, 36, 40, 51, 70, 76, 84, 89, 97, 102, 112, 135, 9, 10, 15, 32, 66, 67, 69, 83, 101, 119, 128, 68, 82, 100, 118, 129, 81, 123, 11, 124, 125, 126, 88, 120, 127, 87, 117, 130, 111, 136, 110, 137, 109, 138, 116, 131, 115, 132, 121, 122, 108, 139]; |
| 120, 0 × F1CF7 | [1, 3, 5, 6, 7, 9, 10, 11, 12, 13, 16, 19, 20, 24, 25, 29, 31, 32, 36, 38, 41, 42, 45, 46, 47, 48, 49, 50, 51, 52, 53, 54, 55, 56, 57, 58, 59, 60, 61, 62, 65, 67, 71, 77, 78, 80, 81, 84, 85, 86, 89, 90, 91, 93, 96, 97, 98, 100, 102, 103, 106, 107, 121, 2, 4, 8, 15, 18, 23, 28, 30, 35, 37, 40, 44, 64, 66, 70, 76, 79, 83, 88, 92, 95, 99, 101, 105, 122, 14, 17, 22, 27, 34, 39, 43, 63, 69, 75, 82, 87, 94, 104, 123, 21, 26, 33, 68, 74, 124, 73, 125, 72, 126, 120, 127, 119, 128, 118, 129, 117, 130, 116, 131, 115, 132, 114, 133, 113, 134, 112, 135, 111, 136, 110, 137, 109, 138, 108, 139]; or [4, 7, 10, 11, 12, 13, 14, 15, 18, 21, 22, 27, 28, 32, 33, 34, 36, 39, 40, 41, 44, 51, 67, 70, 73, 74, 75, 76, 77, |

TABLE 3-continued

| Typical K, typical CRC polynomial | Interleaved sequence |
|---|---|
| | 78, 81, 84, 85, 90, 91, 95, 96, 97, 99, 102, 103, 104, 107, 114, 133, 3, 6, 9, 17, 20, 26, 31, 35, 38, 43, 50, 66, 69, 72, 80, 83, 89, 94, 98, 101, 106, 113, 134, 2, 5, 8, 16, 19, 25, 30, 37, 42, 49, 65, 68, 71, 79, 82, 88, 93, 100, 105, 112, 135, 1, 24, 29, 48, 64, 87, 92, 111, 136, 23, 57, 86, 120, 127, 62, 122, 59, 125, 46, 109, 138, 53, 116, 131, 45, 47, 52, 54, 55, 56, 58, 60, 61, 121, 63, 123, 124, 126, 119, 128, 118, 129, 117, 130, 115, 132, 110, 137, 108, 139]; |
| 120, 0 × BBBCF | [1, 4, 5, 6, 7, 8, 9, 10, 12, 15, 16, 18, 19, 20, 21, 24, 25, 26, 28, 31, 32, 33, 35, 37, 41, 45, 46, 47, 48, 49, 51, 62, 63, 64, 66, 69, 70, 71, 73, 74, 75, 76, 77, 78, 81, 83, 84, 88, 89, 90, 91, 94, 95, 96, 98, 99, 100, 101, 103, 106, 107, 108, 110, 111, 112, 115, 118, 119, 121, 3, 11, 14, 17, 23, 27, 30, 34, 36, 40, 44, 50, 61, 65, 68, 72, 80, 82, 87, 93, 97, 102, 105, 109, 114, 117, 120, 122, 2, 13, 22, 29, 39, 43, 60, 67, 79, 86, 92, 104, 113, 116, 123, 38, 42, 59, 85, 124, 58, 125, 57, 126, 56, 127, 55, 128, 54, 129, 53, 130, 52, 131, 132, 133, 134, 135, 136, 137, 138, 139]; or [1, 3, 4, 8, 9, 10, 11, 18, 20, 22, 24, 38, 41, 42, 43, 45, 46, 49, 50, 55, 63, 75, 77, 78, 79, 81, 83, 84, 85, 86, 87, 88, 89, 92, 94, 100, 102, 112, 115, 117, 136, 5, 7, 12, 13, 14, 15, 26, 28, 47, 53, 54, 59, 67, 82, 90, 91, 93, 96, 98, 104, 106, 116, 119, 132, 16, 17, 19, 30, 32, 51, 57, 58, 71, 95, 97, 108, 110, 120, 128, 21, 23, 27, 33, 34, 35, 36, 37, 40, 44, 61, 64, 65, 66, 68, 72, 80, 101, 103, 105, 109, 114, 122, 2, 25, 29, 56, 62, 69, 73, 99, 129, 39, 48, 76, 113, 118, 130, 52, 60, 70, 74, 111, 131, 134, 31, 127, 6, 107, 135, 124, 125, 126, 133, 137, 123, 121, 138, 139]; |
| 120, 0 × 90CBF | [1, 6, 9, 10, 11, 14, 15, 17, 19, 21, 25, 26, 28, 29, 30, 32, 33, 34, 35, 37, 44, 45, 48, 49, 51, 52, 54, 58, 59, 61, 62, 65, 68, 69, 72, 73, 75, 76, 79, 82, 83, 86, 87, 88, 90, 93, 94, 96, 98, 99, 100, 101, 103, 104, 105, 108, 109, 110, 112, 115, 116, 119, 120, 121, 5, 8, 13, 16, 18, 20, 24, 27, 31, 36, 43, 47, 50, 53, 57, 60, 64, 67, 71, 74, 78, 81, 85, 89, 92, 95, 97, 102, 107, 111, 114, 118, 122, 4, 7, 12, 23, 42, 46, 56, 63, 66, 70, 77, 80, 84, 91, 106, 113, 117, 123, 3, 22, 41, 55, 124, 2, 40, 125, 39, 126, 38, 127, 128, 129, 130, 131, 132, 133, 134, 135, 136, 137, 138, 139]; or [3, 5, 13, 17, 23, 25, 27, 29, 33, 41, 43, 45, 51, 57, 61, 63, 67, 69, 71, 75, 77, 83, 85, 89, 93, 97, 99, 101, 103, 105, 107, 119, 128, 2, 4, 12, 16, 22, 24, 26, 28, 32, 40, 42, 44, 50, 56, 60, 62, 66, 68, 70, 74, 76, 82, 84, 88, 92, 96, 98, 100, 102, 104, 106, 118, 129, 1, 11, 15, 21, 31, 39, 49, 55, 59, 65, 73, 81, 87, 91, 95, 117, 130, 8, 9, 14, 20, 30, 34, 36, 37, 48, 53, 54, 58, 64, 72, 78, 86, 108, 109, 111, 124, 6, 7, 18, 46, 79, 80, 90, 112, 113, 116, 123, 35, 52, 94, 110, 114, 115, 132, 10, 19, 38, 120, 133, 47, 134, 135, 136, 131, 137, 138, 121, 126, 127, 139, 122, 125]; |

Table 3 lists interleaved sequences when a CRC length is 19, 18, 17, or 16, and K is equal to 80, 100, or 120. A value whose sequence number in the interleaved sequence is less than or equal to K is corresponding to a reverse number of K information bits. For example, a sequence number 1 is corresponding to a $K^{th}$ information bit, and a sequence number 2 is corresponding to a $(K-1)^{th}$ information bit. Values whose sequence numbers in the interleaved sequence are greater than K are corresponding to J2 check bits. For example, a sequence number (K+1) is corresponding to the first check bit, and a sequence number (K+J2) is corresponding to a $J2^{th}$ check bit.

Figure 9:
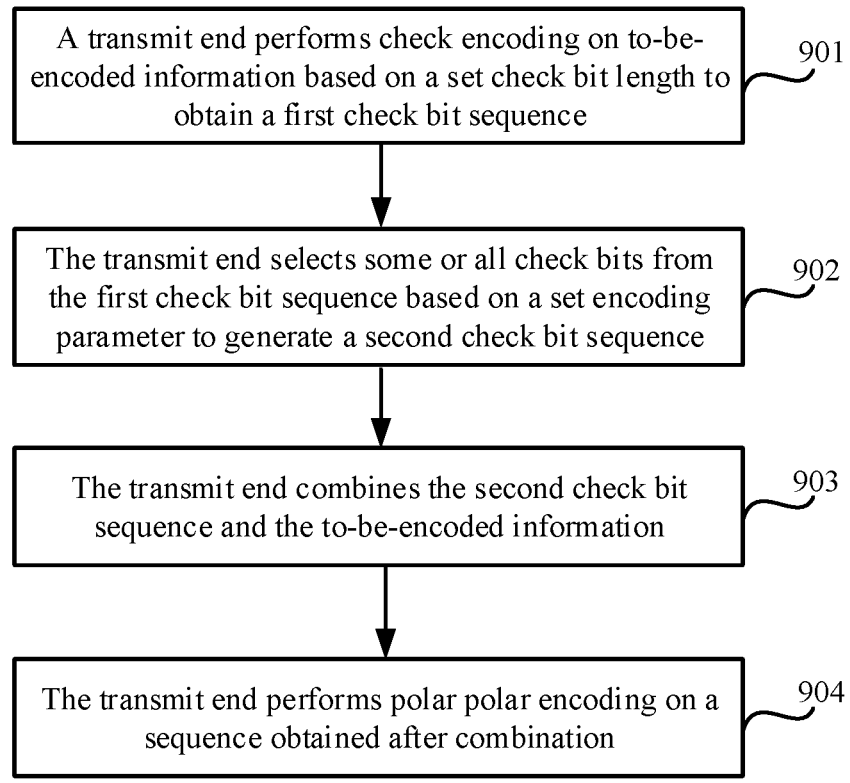
FIG. 9 is a schematic diagram 6 of a polar code encoding method according to an embodiment of this application.

Based on a same inventive concept, as shown in FIG. 9, an embodiment of this application further provides another polar code encoding method. A quantity of check bits is determined based on a polar code parameter, and a universal set or a subset is selected from all check bits and form precoding bits together with information bits. Polar encoding is performed on the precoding bits. A specific process is as follows:

Step 901: Perform check encoding on K information bits based on a set check bit length to obtain a first check bit sequence.

Step 902: Select some or all check bits from the first check bit sequence based on a set encoding parameter to obtain a second check bit sequence.

The set encoding parameter includes at least one of the following parameters or a derivative parameter of at least one of the following parameters: a length of the K information bits, a mother code length, an encoding length, a bit rate, and a path width.

Specifically, some check bits with relatively high reliability are selected to obtain the second check bit sequence. Alternatively, the transmit end selects some check bits with relatively low reliability to obtain the second check bit sequence. Alternatively, the transmit end selects some specified check bits to obtain the second check bit sequence.

Step 903: Combine the second check bit sequence and the K information bits.

Check bits in the second check bit sequence are continuously placed before or after locations of the K information bits or at specified locations. Alternatively, check bits in the second check bit sequence are continuously placed at specified locations in the K information bits based on a set cyclic shift value. Alternatively, the second check bit sequence and the K information bits are interleaved.

Step 904: Perform polar encoding on a sequence obtained after combination.

The following further describes in detail the polar code encoding method shown in FIG. 9 by using an example in which an encoding scheme is CRC encoding.

When a fixed CRC polynomial length is Jmax, for different code parameters, different quantities J of CRC bits J are selected from Jmax as precoding bits in polar encoding.

The code parameters may include at least one of the following: an information bit length K, an encoding length M, a bit rate R=K/M, a mother code length N, and a path width (that is, a list size) L agreed with a decoding side. Alternatively, the code parameters are derivative parameters determined by the foregoing parameters.

Figure 10A:
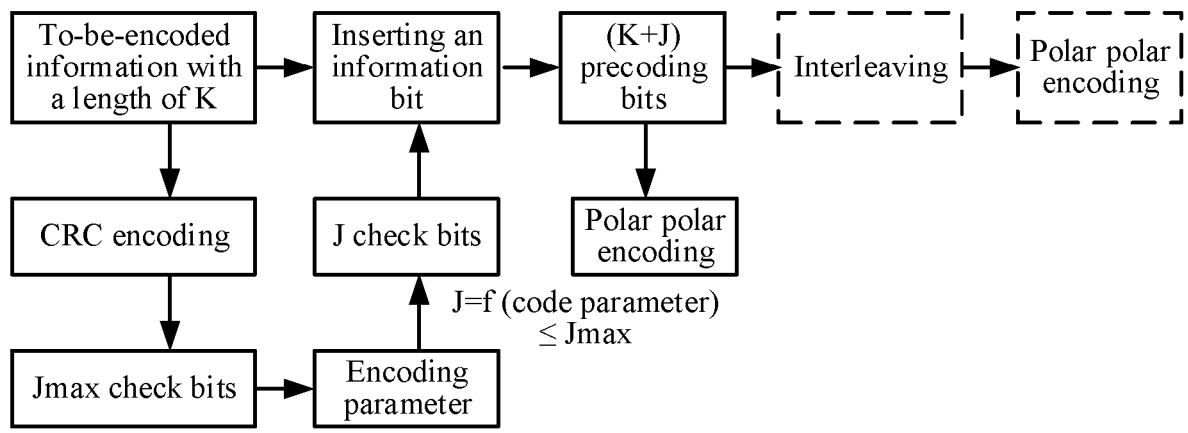
FIG. 10a is a schematic diagram 7 of a polar code encoding method according to an embodiment of this application.

FIG. 10a is a brief schematic diagram of the polar code encoding method shown in FIG. 9. The transmit end performs CRC encoding on the K information bits with a length of K to obtain a first check bit sequence with a length of Jmax, selects a second check bit sequence with a length of J from the first check bit sequence with a length of Jmax based on the encoding parameter, where J<Jmax, inserts the second check bit sequence with a length of J into information bits to obtain a precoding bit sequence with a length of (K+J), and performs polar code encoding on the precoding bit sequence. Optionally, the precoding bit sequence with a length of (K+J) is interleaved, and polar code encoding is performed on an interleaved sequence.

Specifically, a quantity J of check bits required in a process of performing check encoding by the transmit end may meet the following equation: J=Jref+J', where $J_{ref}$ represents a quantity of CRC bits that meet a false alarm probability requirement. Optionally, $$J' = \text{integer}\left(\frac{1}{2}\log_2 \text{integer}\left(\frac{M-K}{\text{scale}(J_{ref})}\right)\right),$$

where integer represents any rounding function, for example, rounding up, rounding down, or rounding off; and scale ($J_{ref}$) represents a function of $J_{ref}$ and can be $4 \times J_{ref} + \beta$.

Alternatively, a quantity J of CRC bits required in a process of performing check encoding by the transmit end is determined by a segment function based on a value of (M−K). For example, a specific determining manner is shown in Table 4.

TABLE 4

| M-K | 0-256 | 256-512 | 512-1024 | ... |
|---|---|---|---|---|
| $J_{ref}$ + J' | $J_{ref}$ + 0 | $J_{ref}$ + 1 | $J_{ref}$ + 2 | ... |

It can be learned that a larger value of (M-K) indicates that a larger quantity of CRC bits is required.

In this case, the quantity of CRC bits required for performing check encoding by the transmit end may be flexibly obtained. Only one check encoding setting is required to obtain a CRC bit of Jmax that has a largest length, and then a proper quantity of CRC bits are selected.

The required J CRC bits are selected from the Jmax CRC bits, and the following selection methods are available:

J least significant bits in the Jmax CRC bits are selected, or J most significant bits in the Jmax CRC bits are selected, or bits at J locations specified in the Jmax CRC bits are selected, and the J locations are specified by vectors ($i_1$, $i_2$, ..., $i_j$).

Specifically, locations of inserted information bits may be determined in the following manners:

(1) Continuous Placement

A location in an information bit sequence is used as a start location, and J CRC bits are continuously placed. In a special case, the J CRC bits are continuously placed before information bits with a length of K, or placed after information bits with a length of K.

(2) Cyclic Continuous Placement

Based on the continuous placement, a cyclic shift with a given offset is further performed. For example, a location in an information bit sequence is used as a start location, a location in the information bit sequence is determined as an end location with reference to the cyclic shift, and J CRC bits are placed.

(3) Distributed Placement

If the precoding bit sequence with a length of (K+J) is interleaved, the interleaving operation is performed by using an interleaved sequence, and the information bits and the CRC bits are interleaved together. Interleaved CRC bits are distributed among the information bits.

Only a part of CRC bits and the information bits may be interleaved. Alternatively, the CRC bits may be directly distributed among the information bits according to a specified proportion, and the information bits are not involved in interleaving.

Figure 10B:
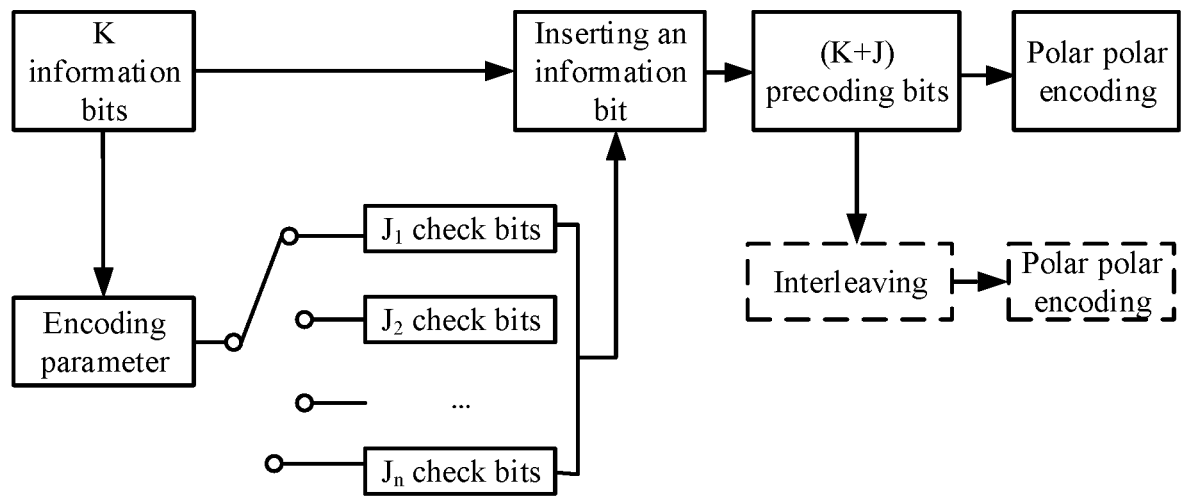
FIG. 10b is a schematic diagram 8 of a polar code encoding method according to an embodiment of this application.

Based on the polar code encoding method shown in FIG. 9 or FIG. 10a, in a possible design, the transmit end determines the quantity of check bits based on the encoding parameter, and correspondingly selects a check polynomial to perform check encoding on the K information bits, where obtained check bits and the K information bits together form precoding bits, and performs polar encoding on the precoding bits. The set encoding parameter includes at least one of the following parameters or a derivative parameter of at least one of the following parameters: a length of the K information bits, a mother code length, an encoding length, a bit rate, and a path width. Specifically, for example, check encoding is the CRC encoding. As shown in FIG. 10b, the transmit end determines a quantity of CRC check bits (or referred to as a length of a CRC check bit sequence) based on the encoding parameter. For example, the quantity of CRC check bits includes $J_1, J_2, \ldots,$ and $J_n$. The quantity of CRC check bits selected by the transmit end is J. The transmit end performs check encoding on the K information bits based on the selected quantity of CRC check bits to obtain the check bits. The transmit end inserts the J check bits into the K information bits to obtain precoding bits with a length of (K+J). The transmit end performs polar encoding on the precoding bits. Optionally, the transmit end interleaves the precoding bit sequence with a length of (K+J), and performs the polar code encoding on the interleaved sequence. A method for determining the quantity J of check bits required in a process of performing check encoding by the transmit end, a method for determining the locations of the inserted information bits, and the like are the same as those described in the polar code encoding method shown in FIG. 10a, and details are not described again.

Figure 11:
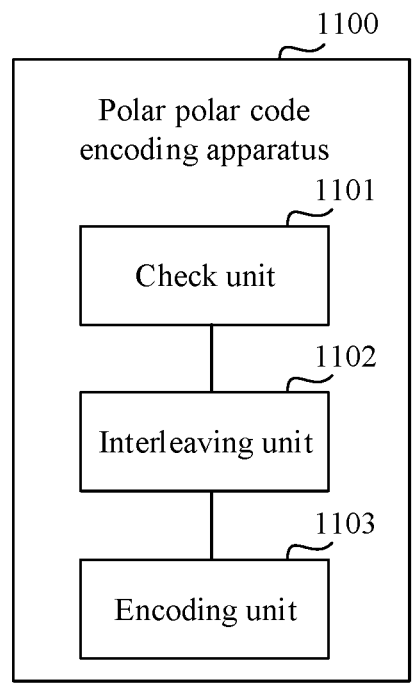
FIG. 11 is a schematic structural diagram 1 of a polar code encoding apparatus according to an embodiment of this application.

Based on a same inventive concept as the polar code encoding method shown in FIG. 3, as shown in FIG. 11, an embodiment of this application further provides a polar code encoding apparatus 1100. The polar code encoding apparatus 1100 is configured to perform the polar code encoding method shown in FIG. 3. The polar code encoding apparatus 1100 includes:

a check unit 1101, configured to separately perform check encoding on at least two to-be-checked first bit sequences to obtain at least two check bit sequences, where a union set of the at least two to-be-checked first bit sequences includes K information bits, and K is a positive integer;

an interleaving unit 1102, configured to: interleave the K information bits and the at least two check bit sequences to obtain a second bit sequence, or interleave a first part of information bit sequence and a first check bit sequence to obtain an interleaved third bit sequence, and sort a second check bit sequence, a third check bit sequence, and a second part of information bit sequence in a sequence of all information bits except the first part of information bit sequence to obtain the second bit sequence; and an encoding unit 1103, configured to perform polar encoding on the second bit sequence.

Optionally, the at least two to-be-checked first bit sequences include: a first part of information bit sequence with a length of $K_1$, and a sequence of all information bits with a length of K, where $K_1<K$, and $K_1$ and K are both positive integers.

Optionally, the check unit 1101 is specifically configured to: perform check encoding on the first part of information bit sequence to obtain the first check bit sequence; and perform check encoding on the sequence of all information bits to obtain the second check bit sequence.

Optionally, the interleaving unit 1102 performs an interleaving operation by using an interleaved sequence S. The interleaved sequence S includes J subsequences. An $i^{th}$ subsequence includes a location index value of an element 1 in an immediate result vector Ti and a value of (K+i), $1 \le i \le J$, i is an integer, $Ti=(\sim M) \& (V_i)$, $M=M|(V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AND operation, and | represents a bit-by-bit OR operation.

Optionally, before performing the interleaving operation, the interleaving unit 1102 calculates the interleaved sequence S, or the interleaving unit 1102 calculates and stores the interleaved sequence S offline, reads the stored interleaved sequence S based on a length of a part of information bits in the K information bits and a determined check polynomial, and performs the interleaving operation based on the read interleaved sequence S.

Figure 12:
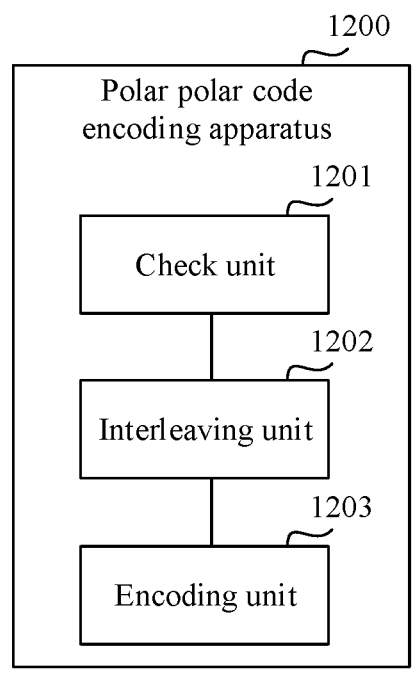
FIG. 12 is a schematic structural diagram 2 of a polar code encoding apparatus according to an embodiment of this application.

Based on a same inventive concept as the polar code encoding method shown in FIG. 3, as shown in FIG. 12, an embodiment of this application further provides a polar code encoding apparatus 1200. The polar code encoding apparatus 1200 is configured to perform the steps performed by the transmit end in the encoding and decoding methods shown in FIG. 3. The polar code encoding apparatus 1200 includes:

a check unit 1201, configured to: perform check encoding on an empty set bit sequence with a length of 0 to obtain a first check bit sequence, and perform check encoding on K information bits to obtain a second check bit sequence;

an interleaving unit 1202, configured to interleave the K information bits, the first check bit sequence, and the second check bit sequence; and an encoding unit 1203, configured to perform polar encoding on a sequence obtained after the interleaving operation.

Optionally, the first check bit sequence is an all-zero vector.

Optionally, an interleaved sequence S used by the interleaving unit 1202 to perform the interleaving operation includes J subsequences, and an $i^{th}$ subsequence includes a location index value of an element 1 in an immediate result vector Ti and a value of (K+i), where $1 \le i \le J$, i is an integer, $Ti=(\sim M) \& (V_i)$, $M=M|(V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AND operation, and | represents a bit-by-bit OR operation.

Optionally, before performing the interleaving operation, the interleaving unit 1202 calculates the interleaved sequence S, or, the interleaving unit 1202 calculates and stores the interleaved sequence S offline, reads the stored interleaved sequence S based on a value of K and a determined check polynomial, and performs the interleaving operation based on the read interleaved sequence S.

Figure 13:
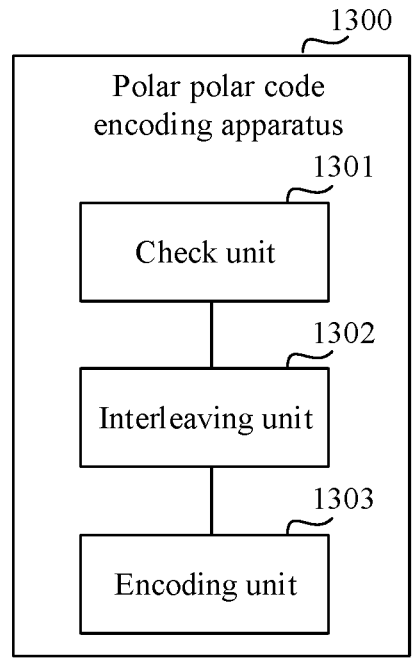
FIG. 13 is a schematic structural diagram 3 of a polar code encoding apparatus according to an embodiment of this application.

Based on a same inventive concept as the polar code encoding method shown in FIG. 3, as shown in FIG. 13, an embodiment of this application further provides a polar code encoding apparatus 1300. The polar code encoding apparatus 1300 is configured to perform the polar code encoding method shown in FIG. 3. The polar code encoding apparatus 1300 includes:

a check unit 1301, configured to perform check encoding on a first part of information bit sequence in K information bits;

an interleaving unit 1302, configured to interleave codewords obtained after check encoding to obtain a first check encoding codeword, where K is a positive integer, the first check encoding codeword includes the first part of information bit sequence and a first check bit sequence, where the check unit 1301 is further configured to perform check encoding on a sequence obtained by combining a first check encoding sequence and a second part of information bit sequence in the K information bits except the first part of information bit sequence, to obtain a second check encoding codeword, where the second check encoding codeword includes the first part of information bit sequence, the first check bit sequence, the second part of information bit sequence, and a second check bit sequence; and an encoding unit 1303, configured to perform polar encoding on the second check encoding codeword.

Optionally, an interleaved sequence S used by the interleaving unit 1302 to perform the interleaving operation includes J subsequences, and an $i^{th}$ subsequence includes a location index value of an element 1 in an immediate result vector Ti and a value of (K+i), where $1 \le i \le J$, i is an integer, $Ti=(\sim M) \& (V_i)$, $M=M|(V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AND operation, and | represents a bit-by-bit OR operation.

Before performing the interleaving operation, the interleaving unit 1302 calculates the interleaved sequence S, or the interleaving unit 1302 calculates and stores the interleaved sequence S offline, performs check encoding on the first part of information bit sequence in the K information bits, reads the stored interleaved sequence S based on a length of the first part of information bit sequence and a determined check polynomial, and performs the interleaving operation based on the read interleaved sequence S.

Figure 14:
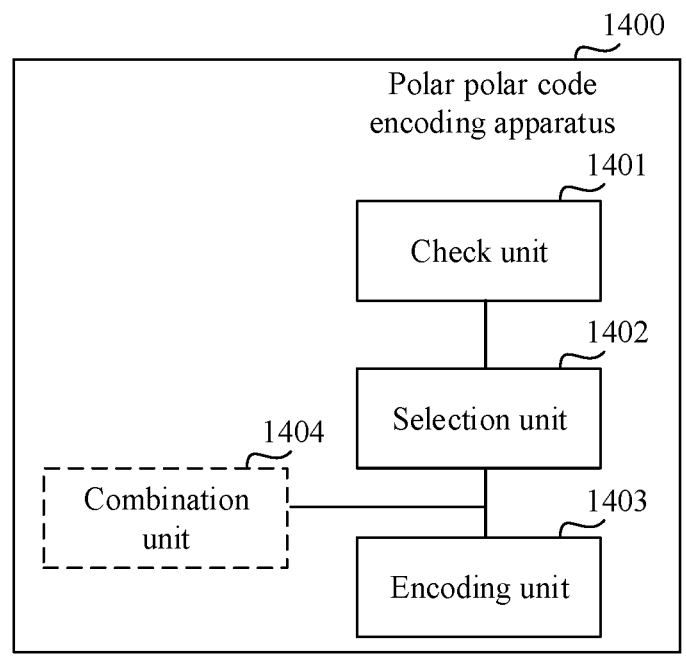
FIG. 14 is a schematic structural diagram 4 of a polar code encoding apparatus according to an embodiment of this application.

Based on a same inventive concept as the polar code encoding method shown in FIG. 9, as shown in FIG. 14, an embodiment of this application further provides a polar code encoding apparatus 1400. The polar code encoding apparatus 1400 includes:

a check unit 1401, configured to perform check encoding on K information bits based on a set check bit length to obtain a first check bit sequence;

a selection unit 1402, configured to select a second check bit sequence from the first check bit sequence based on a set encoding parameter; and an encoding unit 1403, configured to perform polar encoding on a sequence obtained by combining the second check bit sequence and the K information bits.

Optionally, the set encoding parameter includes at least one of the following parameters or a derivative parameter of at least one of the following parameters: a length of the K information bits, a mother code length, an encoding length, a bit rate, and a path width.

Optionally, the selection unit 1402 is specifically configured to: select a second check bit sequence with relatively high reliability, or select a second check bit sequence with relatively low reliability; or select a specified second check bit sequence.

Optionally, the polar code encoding apparatus 1400 further includes a combination unit 1404, configured to: continuously place check bits in the second check bit sequence before or after locations of the K information bits or at specified locations; or continuously place check bits in the second check bit sequence at specified locations in the K information bits based on a set cyclic shift value; or interleave the second check bit sequence and the K information bits.

Figure 15:
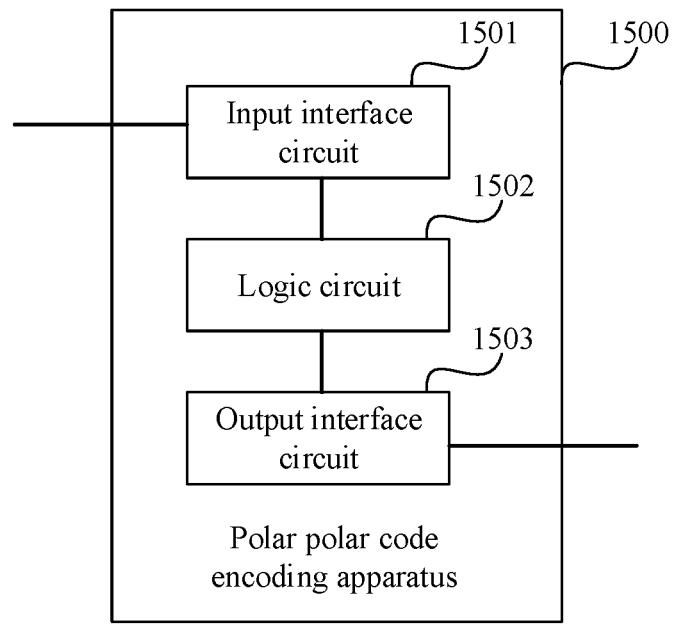
FIG. 15 is a schematic structural diagram 5 of a polar code encoding apparatus according to an embodiment of this application.

Based on a same inventive concept as the polar code encoding method shown in FIG. 3 or FIG. 9, as shown in FIG. 15, an embodiment of this application further provides a polar code encoding apparatus 1500. The polar code encoding apparatus 1500 is configured to perform the polar code encoding method shown in FIG. 3 or FIG. 9. A part or all of the polar code encoding method in the foregoing embodiments may be implemented by hardware or may be implemented by software. When the method is implemented by hardware, the polar code encoding apparatus 1500 includes: an input interface circuit 1501, configured to obtain K information bits; a logic circuit 1502, configured to perform the polar code encoding method shown in FIG. 3 or FIG. 9, where for details, refer to description in the foregoing method embodiments, and details are not described herein again; and an output interface circuit 1503, configured to output a bit sequence obtained after polar encoding.

Optionally, during specific implementation, the polar code encoding apparatus 1500 may be a chip or an integrated circuit.

Figure 16:
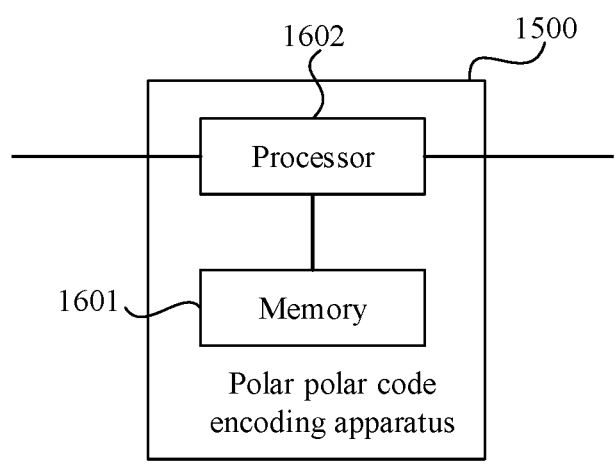
FIG. 16 a schematic structural diagram 6 of a polar code encoding apparatus according to an embodiment of this application.

Optionally, when a part or all of the polar code encoding method in the foregoing embodiments is implemented by software, as shown in FIG. 16, the polar code encoding apparatus 1500 includes: a memory 1601, configured to store a program; and a processor 1602, configured to execute the program stored in the memory 1601. When the program is executed, the polar code encoding apparatus 1500 may be enabled to implement the polar code encoding method provided in the foregoing embodiments.

Figure 17:
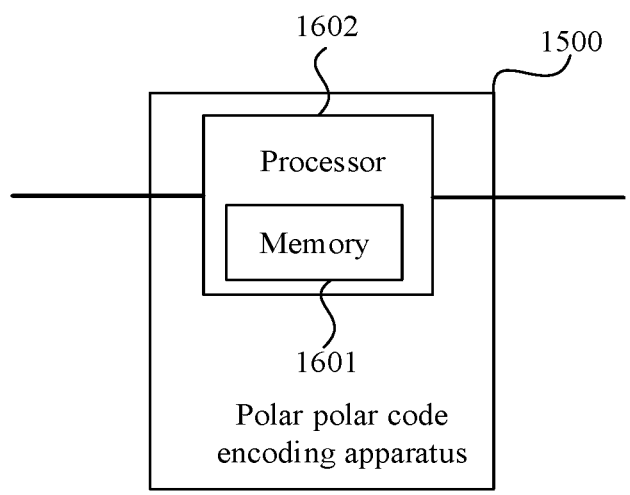
FIG. 17 a schematic structural diagram 7 of a polar code encoding apparatus according to an embodiment of this application.

Optionally, the memory 1601 may be a physically independent unit, or as shown in FIG. 17, the memory 1601 is integrated with the processor 1602.

Optionally, when a part or all of the polar code encoding method in the foregoing embodiments is implemented by software, the polar code encoding apparatus 1500 may alternatively include only the processor 1602. The memory 1601 configured to store the program is located outside the polar code encoding apparatus 1500. The processor 1602 is connected to the memory 1601 by using a circuit/wire, and is configured to read and execute the program stored in the memory 1601.

An embodiment of this application provides a computer storage medium. The computer storage medium is configured to store a computer program. The computer program includes an instruction used to perform the polar code encoding method shown in FIG. 3 or FIG. 9.

An embodiment of this application provides a computer program product including an instruction. When the computer program product is run on a computer, the computer is enabled to perform the polar code encoding method shown in FIG. 3 or FIG. 9.

The polar code encoding apparatus shown in FIG. 11 to FIG. 15 in the embodiments of this application may further be a system chip.

The processor 1602 may be a central processing unit (central processing unit, CPU), a network processor (network processor, NP), or a combination of a CPU and an NP.

The processor 1602 may further include a hardware chip. The hardware chip may be an application-specific integrated circuit (application-specific integrated circuit, ASIC), a programmable logic device (programmable logic device, PLD), or a combination thereof. The PLD may be a complex programmable logic device (complex programmable logic device, CPLD), a field-programmable gate array (field-programmable gate array, FPGA), a generic array logic (generic array logic, GAL), or any combination thereof.

The memory 1601 may include a volatile memory (volatile memory), such as a random-access memory (random-access memory, RAM). Alternatively, the memory 1601 may include a non-volatile memory (non-volatile memory), such as a flash memory (flash memory), a hard disk drive (hard disk drive, HDD), or a solid-state drive (solid-state drive, SSD). Alternatively, the memory 1601 may include a combination of the foregoing types of memories.

A person skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specified function in one or more processes in the flowcharts and/or in one or more blocks in the block diagrams.

These computer program instructions may alternatively be stored in a computer readable memory that can instruct the computer or another programmable data processing device to work in a specific manner, so that the instructions stored in the computer readable memory generate an artifact that includes an instruction apparatus. The instruction apparatus implements a specified function in one or more procedures in the flowcharts and/or in one or more blocks in the block diagrams.

These computer program instructions may alternatively be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specified function in one or more procedures in the flowcharts and/or in one or more blocks in the block diagrams.

Although preferred embodiments of this application have been described, a person skilled in the art can make additional changes and modifications to these embodiments once they learn the basic inventive concept. Therefore, the following claims are intended to be construed as to cover the preferred embodiments and all changes and modifications falling within the scope of this application.

Obviously, a person skilled in the art can make various modifications and variations to the embodiments of this application without departing from the scope of the embodiments of this application. This application is intended to cover these modifications and variations provided that they fall within the scope of protection defined by the following claims and their equivalent technologies of this application.

What is claimed is:

1. A polar code encoding method, comprising:
separately performing check encoding on at least two to-be-checked first bit sequences to obtain at least two check bit sequences, wherein a union set of the at least two to-be-checked first bit sequences comprises K information bits, and wherein K is a positive integer;
interleaving the K information bits and the at least two check bit sequences to obtain a second bit sequence, or interleaving a first part of information bit sequence and a first check bit sequence to obtain an interleaved third bit sequence, wherein a second check bit sequence, a third check bit sequence, and a second part of information bit sequence in a sequence of all information bits except the first part of information bit sequence form the second bit sequence; and
performing polar encoding on the second bit sequence.

2. The method according to claim 1, wherein the at least two to-be-checked first bit sequences comprise:
the first part of information bit sequence with a length of $K_1$ and the sequence of all information bits with a length of K, wherein $K_1 < K$, and $K_1$ and K are both positive integers.

3. The method according to claim 2, wherein the separately performing check on the at least two to-be-checked first bit sequences to obtain at least two check bit sequences comprises:
performing check encoding on the first part of information bit sequence to obtain the first check bit sequence; and
performing check encoding on the sequence of all information bits to obtain the second check bit sequence.

4. The method according to claim 1, wherein an interleaved sequence S used to perform the interleaving operation comprises J subsequences, and an $i^{th}$ subsequence comprises a location index value of an element 1 in an immediate result vector $T_i$ and a value of (K+i), wherein $1 \leq i \leq J$, i is an integer, $T_i=(\sim M)$ & $(V_i)$, $M=M|(V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AND operation, and represents a bit-by-bit OR operation.

5. A polar code encoding method, comprising:
performing check encoding on an empty set bit sequence with a length of 0 to obtain a first check bit sequence, and performing check encoding on K information bits to obtain a second check bit sequence;
interleaving the K information bits, the first check bit sequence, and the second check bit sequence; and
performing polar encoding on a sequence obtained after the interleaving operation.

6. The method according to claim 5, wherein the first check bit sequence is an all-zero vector.

7. The method according to claim 5, wherein an interleaved sequence S used to perform the interleaving operation comprises J subsequences, and an $i^{th}$ subsequence comprises a location index value of an element 1 in an immediate result vector $T_i$ and a value of (K+i), wherein $1 \leq i \leq J$, i is an integer, $T_i=(\sim M)$ & $(V_i)$, $M=M|(V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AND operation, and | represents a bit-by-bit OR operation.

8. A polar code encoding apparatus, comprising:
a check unit, configured to separately perform check encoding on at least two to-be-checked first bit sequences to obtain at least two check bit sequences, wherein a union set of the at least two to-be-checked first bit sequences comprises K information bits, and wherein K is a positive integer;
an interleaving unit, configured to interleave the K information bits and the at least two check bit sequences to obtain a second bit sequence, or interleave a first part of information bit sequence and a first check bit sequence to obtain an interleaved third bit sequence, wherein a second check bit sequence, a third check bit sequence, and a second part of information bit sequence in a sequence of all information bits except the first part of information bit sequence form the second bit sequence; and
an encoding unit, configured to perform polar encoding on the second bit sequence.

9. The apparatus according to claim 8, wherein the at least two to-be-checked first bit sequences comprise:
a first part of information bit sequence with a length of $K_1$, and the sequence of all information bits with a length of K, wherein $K_1 < K$, and $K_1$ and K are both positive integers.

10. The apparatus according to claim 9, wherein the check unit is configured to:
perform check encoding on the first part of information bit sequence to obtain the first check bit sequence; and
perform check encoding on the sequence of all information bits to obtain the second check bit sequence.

11. The apparatus according to claim 8, wherein an interleaved sequence S used by the interleaving unit to perform the interleaving operation comprises J subsequences, and an $i^{th}$ subsequence comprises a location index value of an element 1 in an immediate result vector $T_i$ and a value of (K+i), wherein $1 \leq i \leq J$, i is an integer, $T_i=(\sim M)$ & $(V_i)$, $M=M|(V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AM) operation, and | represents a bit-by-bit OR operation.

12. A polar code encoding apparatus, comprising:
at least one processor; and
a non-transitory computer-readable storage medium coupled to the at least one processor and storing programming instructions for execution by the at least one processor, wherein the programming instructions instruct the at least one processor to:

perform check encoding on an empty set bit sequence with a length of 0 to obtain a first check bit sequence, and perform check encoding on K information bits to obtain a second check bit sequence;

interleave the K information bits, the first check bit sequence; and the second check bit sequence; and perform polar encoding on a sequence obtained after the interleaving operation.

13. The apparatus according to claim 12, wherein the first check bit sequence is an all-zero vector.

14. The apparatus according to claim 12, wherein an interleaved sequence S used to perform the interleaving operation comprises subsequences, and an $i^{th}$ subsequence comprises a location index value of an element 1 in an immediate result vector $T_i$ and a value of (K+i), wherein $1 \le i \le j$, i is an integer, $T_i = (\sim M)$ & $(V_i)$, $M = M | (V_i)$, M represents a mask vector, Vi represents a column vector of a check part matrix P, P represents a submatrix of a systematic generator matrix G of check encoding, $\sim$ represents a bit-by-bit NOT operation, & represents a bit-by-bit AND operation, and | represents a bit-by-bit OR operation.

15. A polar code encoding apparatus, comprising:
at least one processor; and
a non-transitory computer-readable storage medium coupled to the at least one processor and storing programming instructions for execution by the at least one processor, wherein the programming instructions instruct the at least one processor to:
separately perform check encoding on at least two to-be-checked first bit sequences to obtain at least two check bit sequences, wherein a union set of the at least two to-be-checked first bit sequences comprises K information bits, and wherein K is a positive integer;

interleave the K information bits and the at least two check bit sequences to obtain a second bit sequence, or interleave a first part of information bit sequence a the first check bit sequence to obtain an interleaved third bit sequence, wherein a second check bit sequence; a third check bit sequence, and a second part of information bit sequence in a sequence of all information bits except the first part of information bit sequence form the second bit sequence; and perform polar encoding on the second bit sequence.

16. The apparatus according to claim 15, wherein the at least two to-be-checked first bit sequences comprise the first part of information bit sequence with a length of $K_1$ and the sequence of all information bits with a length of K, wherein $K_1 < K$, and wherein $K_1$ and K are both positive integers.

17. The apparatus according to claim 15, wherein the programming instructions instruct the at least one process to:
perform check encoding on the first part of information bit sequence to obtain the first check bit sequence; and
perform check encoding on the sequence of all information bits to obtain the second check bit sequence.

18. The apparatus according to claim 15, wherein an interleaved sequence S used to perform the interleaving operation comprises subsequences, and an $i^{th}$ subsequence comprises a location index value of an element 1 in an immediate result vector $T_i$ and a value of (K+i), wherein $1 \le i \le J$, i is an integer, $T_i$, $(\sim M)$ & $(V_i)$, $M = M | (V_i)$, M represents a mask vector, $V_i$ represents a column vector of a check part matrix P, P represents a submatrix of a systematic generator matrix G of check encoding, $\sim$ represents a bit-by-bit NOT operation, & represents a bit-by-bit AND operation, and | represents a bit-by-bit OR operation.

19. The apparatus according to claim 15, wherein the apparatus is a chip or an integrated circuit.

* * * * *